US009941448B2

(12) United States Patent
Tischler et al.

(10) Patent No.: US 9,941,448 B2
(45) Date of Patent: Apr. 10, 2018

(54) LIGHT-EMITTING DIES INCORPORATING WAVELENGTH-CONVERSION MATERIALS AND RELATED METHODS

(71) Applicants: Michael A. Tischler, Vancouver (CA); Alborz Amini, Vancouver (CA); Thomas Pinnington, Vancouver (CA); Henry Ip, Richmond (CA); Gianmarco Spiga, Vancouver (CA)

(72) Inventors: Michael A. Tischler, Vancouver (CA); Alborz Amini, Vancouver (CA); Thomas Pinnington, Vancouver (CA); Henry Ip, Richmond (CA); Gianmarco Spiga, Vancouver (CA)

(73) Assignee: COOLEDGE LIGHTING INC., Richmond, British Columbia (CA)

( * ) Notice: Subject to any disclaimer, the term of this patent is extended or adjusted under 35 U.S.C. 154(b) by 0 days.

(21) Appl. No.: 15/647,928

(22) Filed: Jul. 12, 2017

(65) Prior Publication Data

US 2017/0309792 A1    Oct. 26, 2017

Related U.S. Application Data

(63) Continuation of application No. 15/096,548, filed on Apr. 12, 2016, now Pat. No. 9,741,906, which is a
(Continued)

(51) Int. Cl.
*H01L 33/50* (2010.01)
*H01L 25/16* (2006.01)
(Continued)

(52) U.S. Cl.
CPC .......... *H01L 33/502* (2013.01); *H01L 25/165* (2013.01); *H01L 33/0095* (2013.01); *H01L 33/486* (2013.01); *H01L 33/505* (2013.01); *H01L 33/56* (2013.01); *H01L 33/58* (2013.01); *H01L 33/60* (2013.01); *H01L 33/62* (2013.01);
(Continued)

(58) Field of Classification Search
CPC ..... H01L 33/502; H01L 33/60; H01L 25/165; H01L 33/62; H01L 33/486; H01L 33/505; H01L 33/0095; H01L 33/56; H01L 33/58; H01L 33/54
See application file for complete search history.

(56) References Cited

U.S. PATENT DOCUMENTS 7,755,099 B2    7/2010  Chio
8,966,748 B2    3/2015  Lieb et al.
(Continued)

FOREIGN PATENT DOCUMENTS

KR    10-1012-0040549 A    4/2012
WO    2013/118076 A1    8/2013

OTHER PUBLICATIONS

PCT International Patent Application No. PCT/US2015/013803, International Search Report and Written Opinion dated May 29, 2015, 31 pages.

*Primary Examiner* — William Coleman
(74) *Attorney, Agent, or Firm* — Morgan, Lewis & Bockius LLP

(57) ABSTRACT

In accordance with certain embodiments, electronic devices feature a polymeric binder, a frame defining an aperture therethrough, and a semiconductor die (e.g., a light-emitting or a light-detecting element) suspended in the binder and within the aperture of the frame.

20 Claims, 138 Drawing Sheets

Related U.S. Application Data continuation of application No. 14/661,742, filed on Mar. 18, 2015, now Pat. No. 9,343,444, which is a continuation of application No. 14/610,324, filed on Jan. 30, 2015, now Pat. No. 9,343,443.

(60) Provisional application No. 61/936,050, filed on Feb. 5, 2014, provisional application No. 61/971,748, filed on Mar. 28, 2014.

(51) Int. Cl.
  *H01L 33/00* (2010.01)
  *H01L 33/60* (2010.01)
  *H01L 33/56* (2010.01)
  *H01L 33/48* (2010.01)
  *H01L 33/62* (2010.01)
  *H01L 33/58* (2010.01)
  *H01L 33/54* (2010.01)

(52) U.S. Cl.
  CPC .......... *H01L 33/54* (2013.01); *H01L 2224/11* (2013.01); *H01L 2224/19* (2013.01); *H01L 2924/0002* (2013.01); *H01L 2933/005* (2013.01); *H01L 2933/0033* (2013.01); *H01L 2933/0041* (2013.01); *H01L 2933/0058* (2013.01); *H01L 2933/0091* (2013.01)

(56) References Cited

U.S. PATENT DOCUMENTS

| | | | |
|---|---|---|---|
| 8,987,771 | B2 | 3/2015 | Bierhuizen et al. |
| 9,343,443 | B2 | 5/2016 | Tischler et al. |
| 9,343,444 | B2 | 5/2016 | Tischler et al. |
| 2009/0267108 | A1 | 10/2009 | Lin et al. |
| 2010/0015575 | A1 | 1/2010 | Donofrio |
| 2012/0068209 | A1 | 3/2012 | Andrews |
| 2013/0265661 | A1 | 10/2013 | Goto |
| 2014/0138725 | A1 | 5/2014 | Oyamada |
| 2014/0231635 | A1 | 8/2014 | Kemess et al. |
| 2014/0335658 | A1 | 11/2014 | Scanlan et al. |
| 2014/0377894 | A1 | 12/2014 | Kwon et al. |
| 2015/0060891 | A1 | 3/2015 | Jin |
| 2015/0075607 | A1 | 3/2015 | Tischler |
| 2015/0079709 | A1 | 3/2015 | Tischler |
| 2015/0155248 | A1 | 6/2015 | Lin et al. |
| 2015/0162504 | A1 | 6/2015 | Tischler |
| 2015/0211712 | A1 | 7/2015 | Yoshimura et al. |

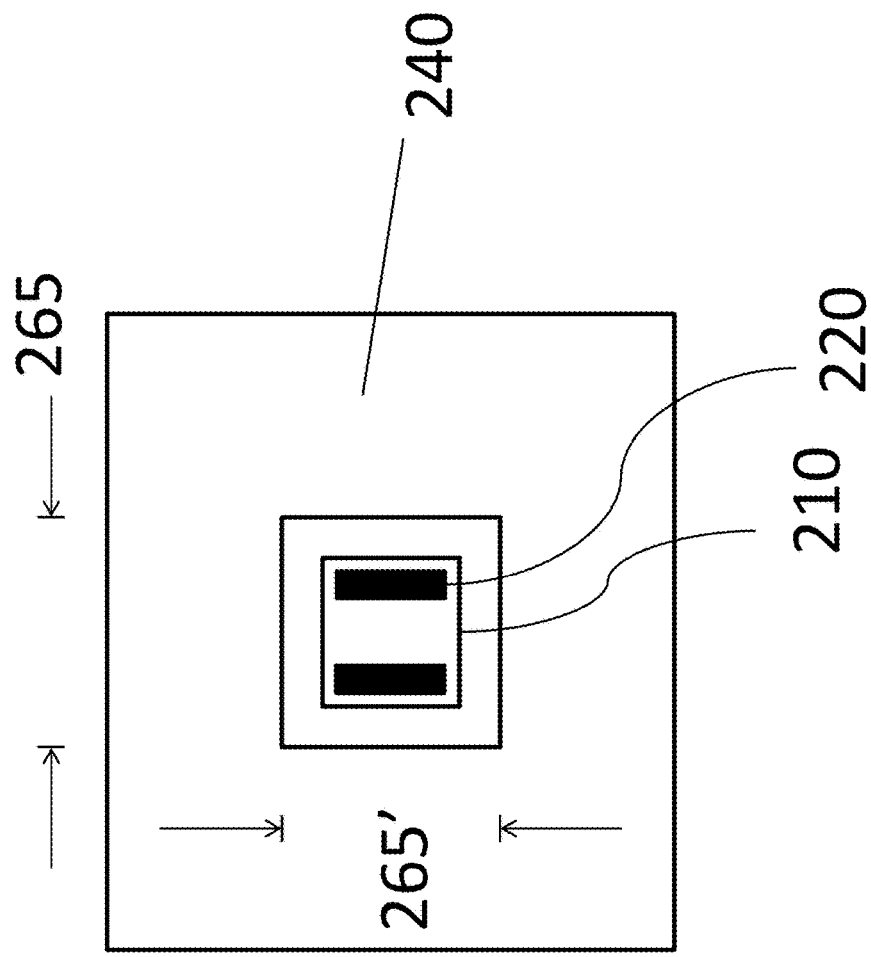

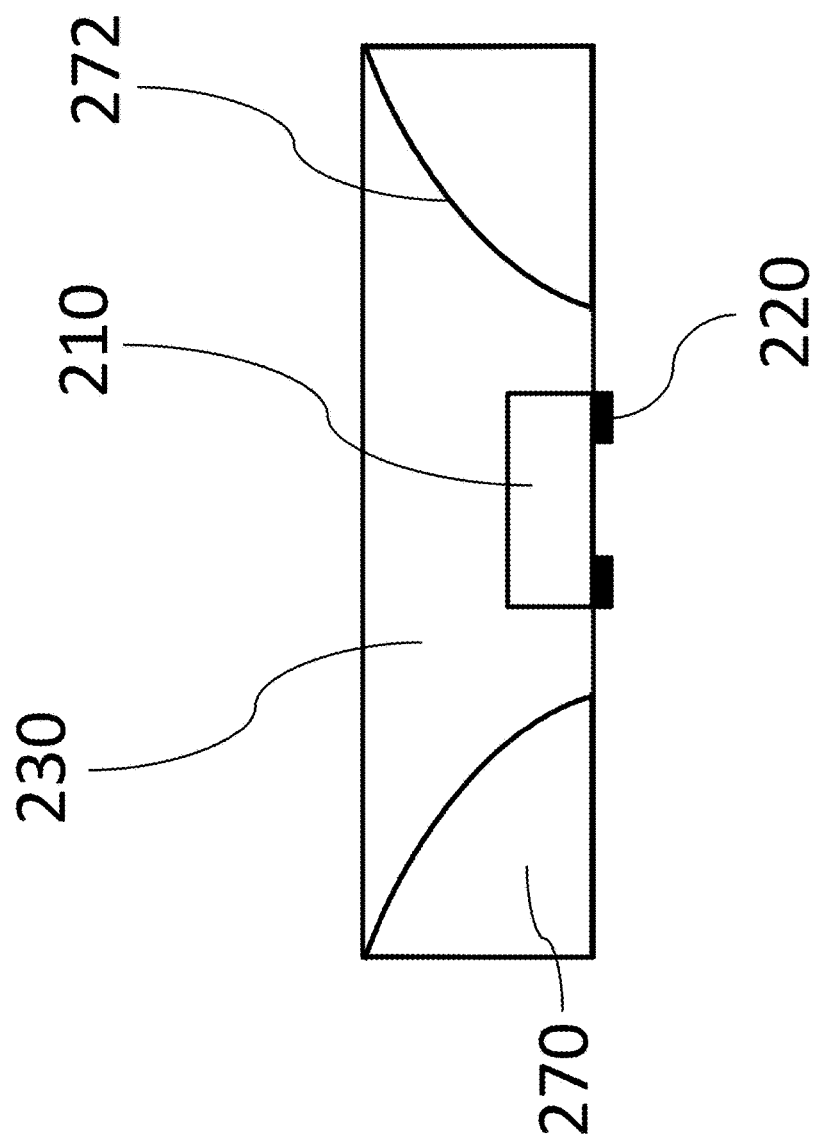

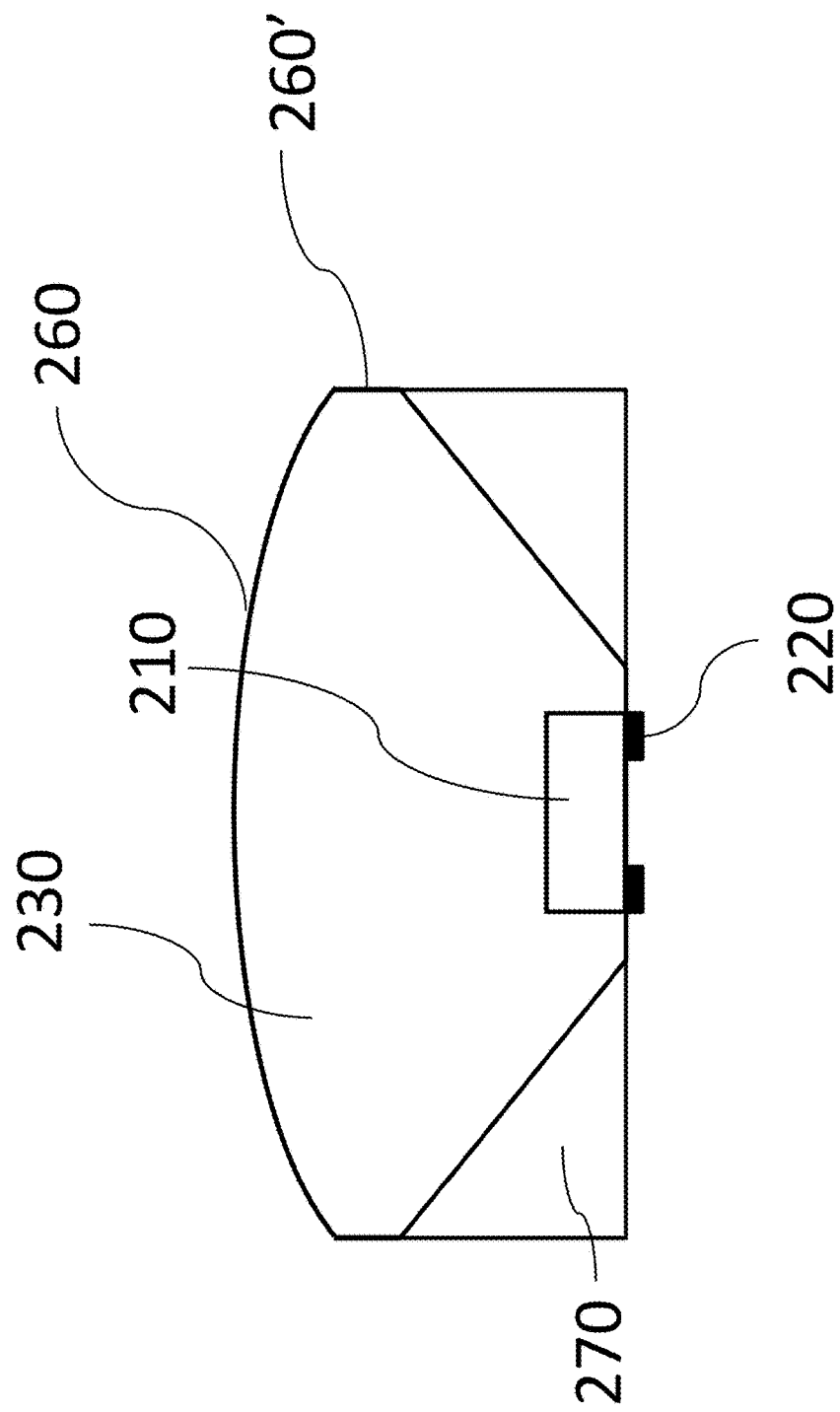

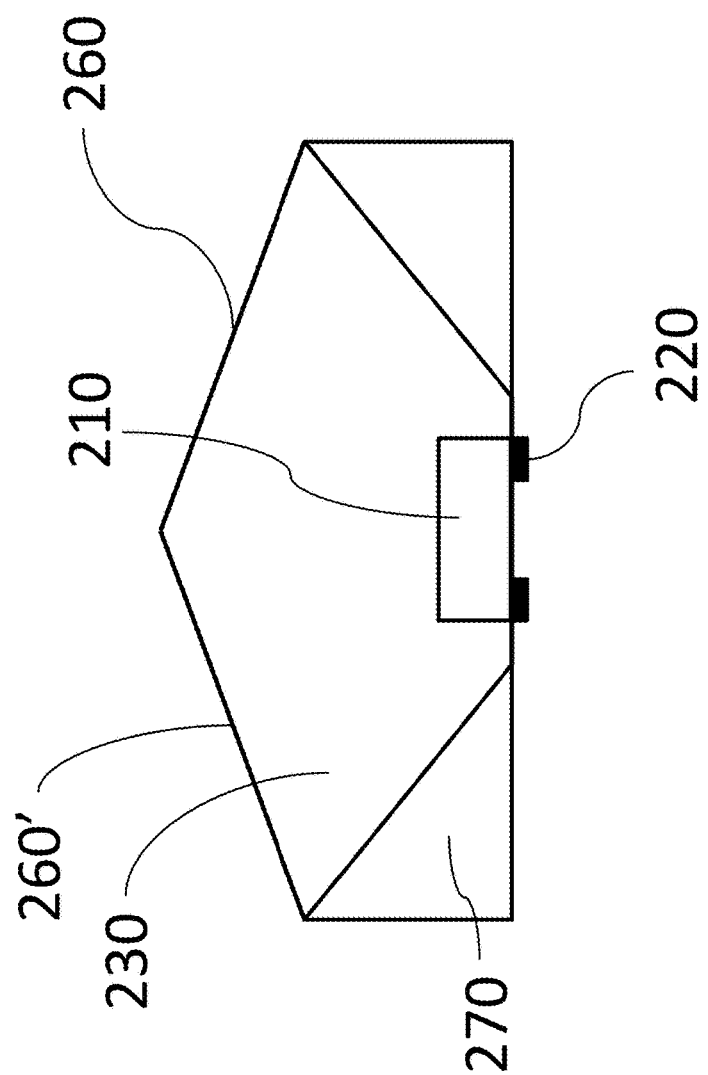

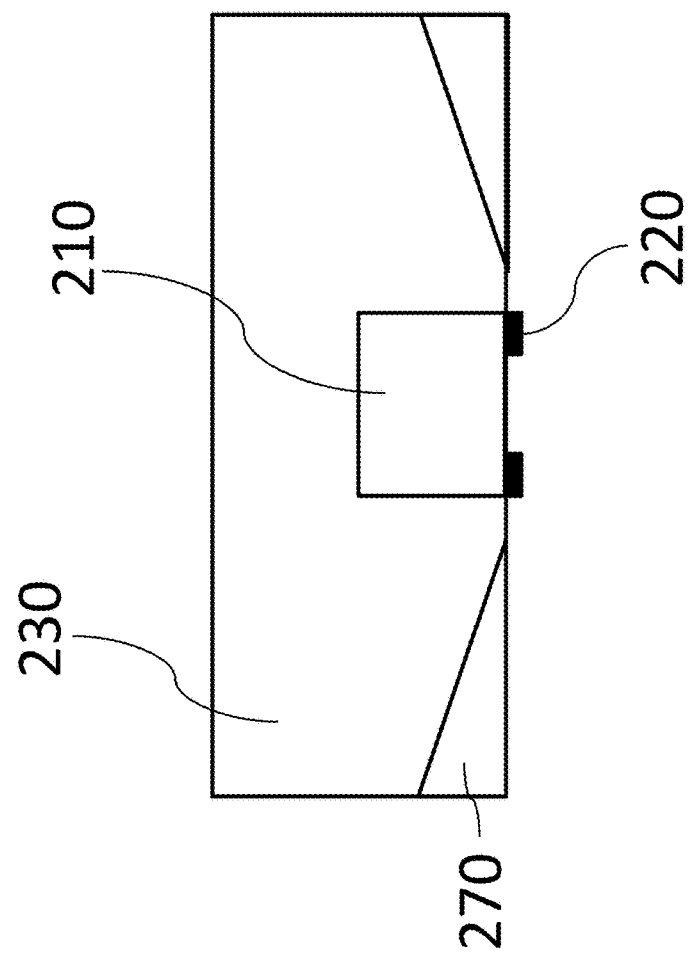

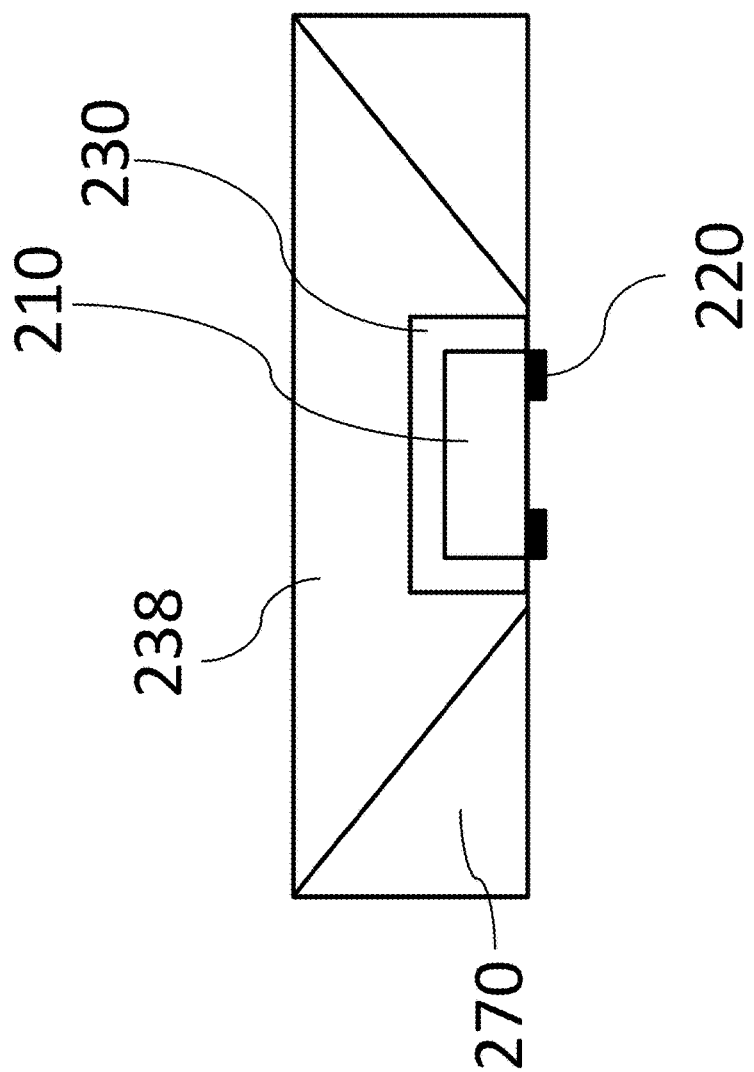

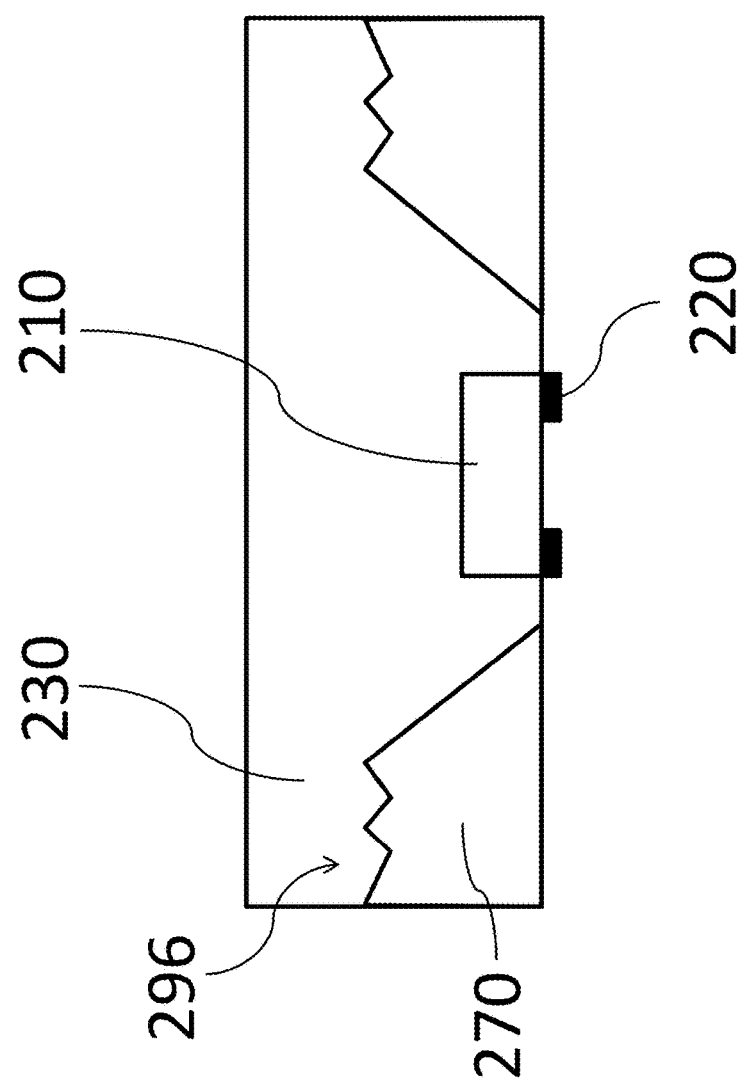

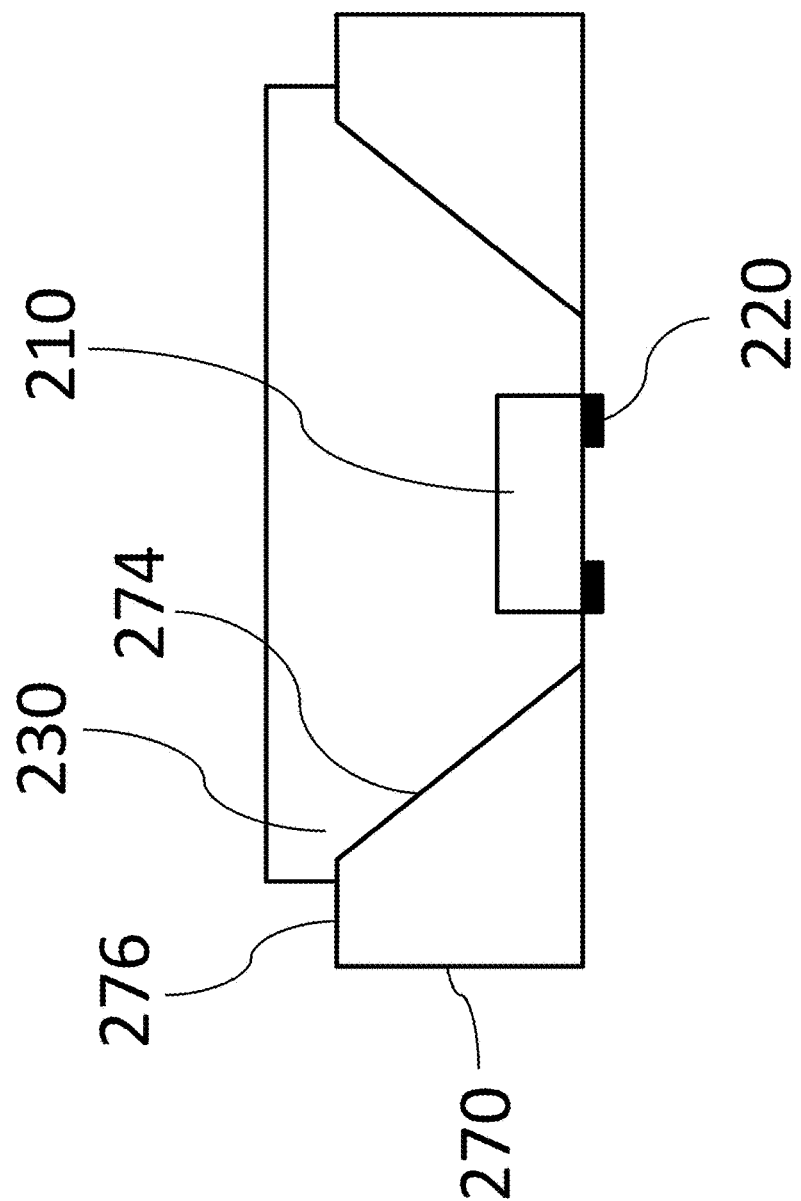

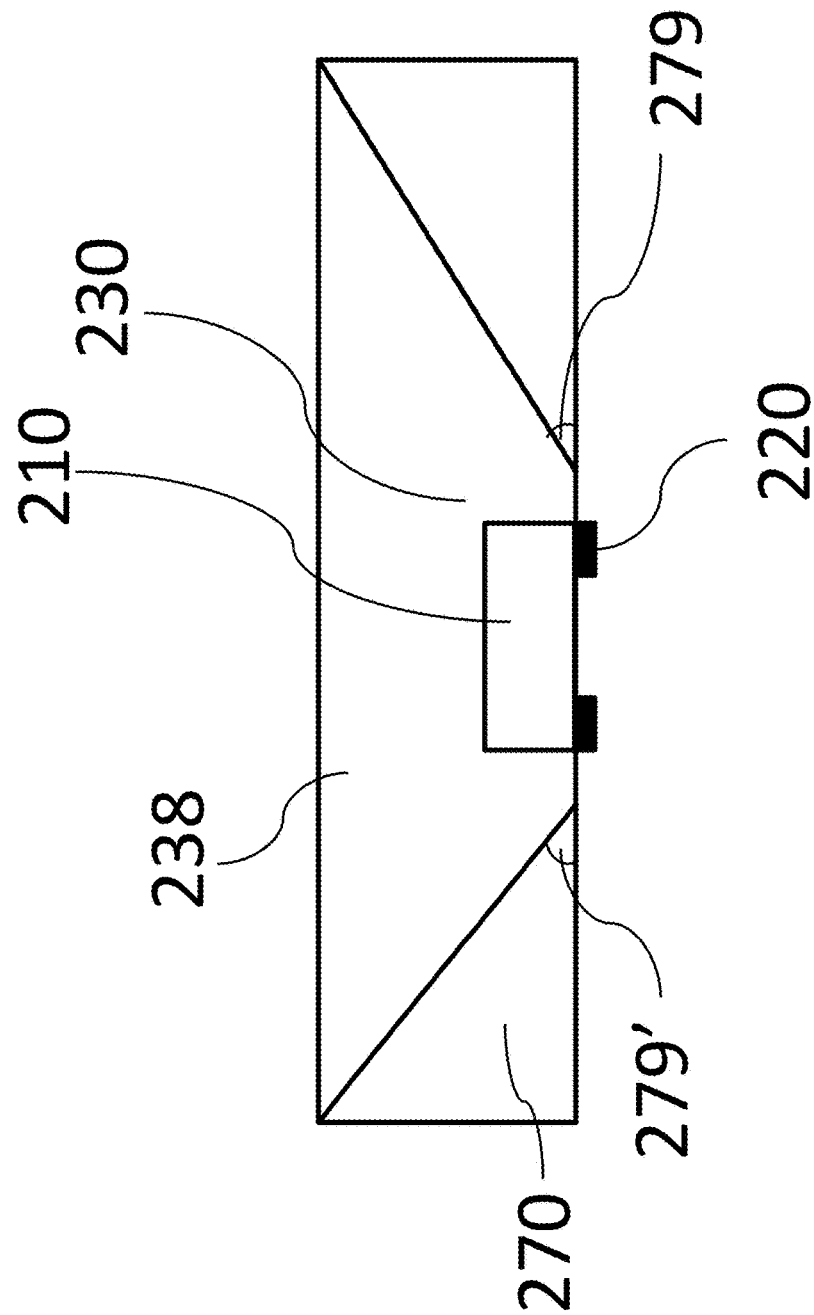

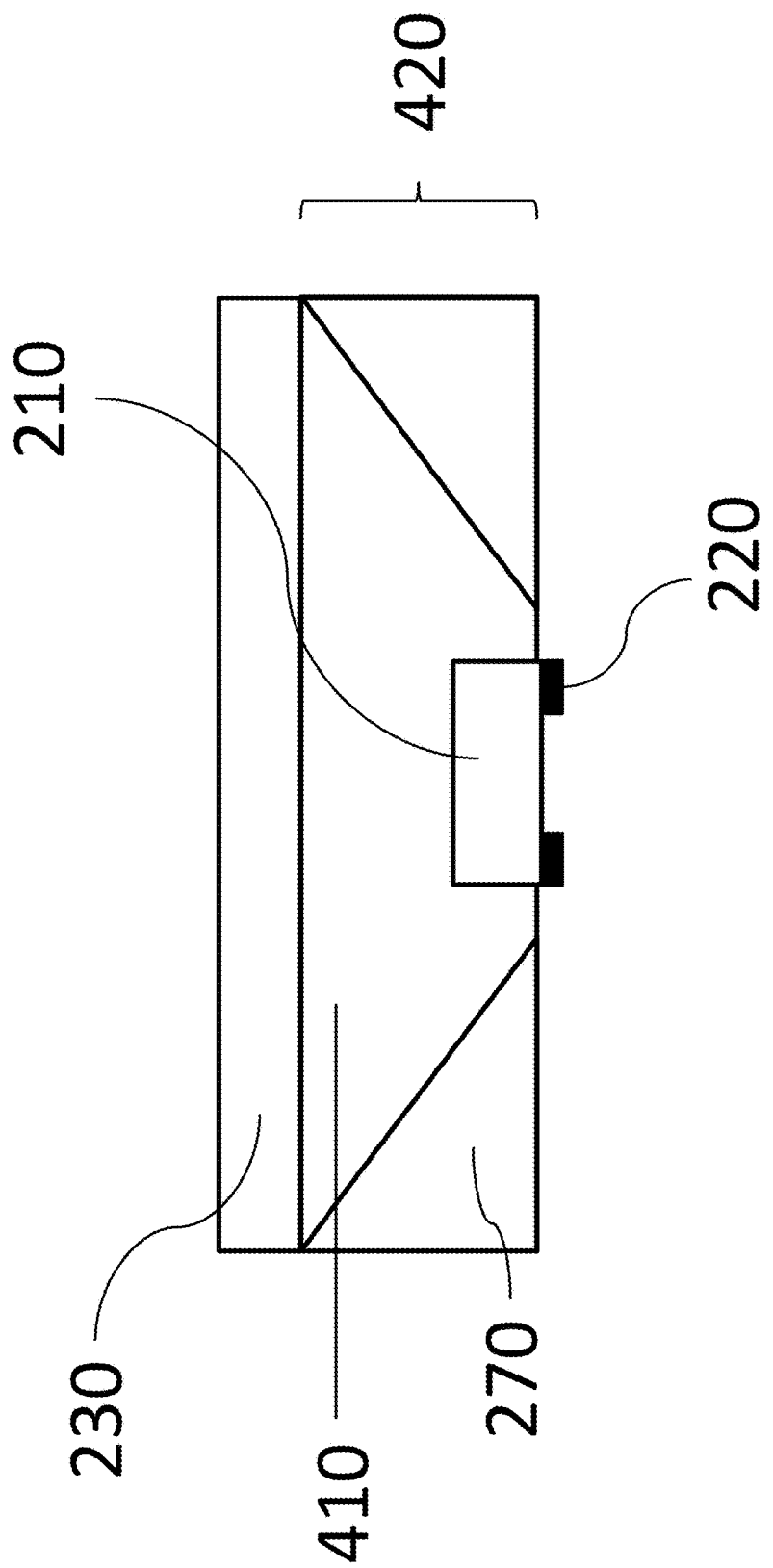

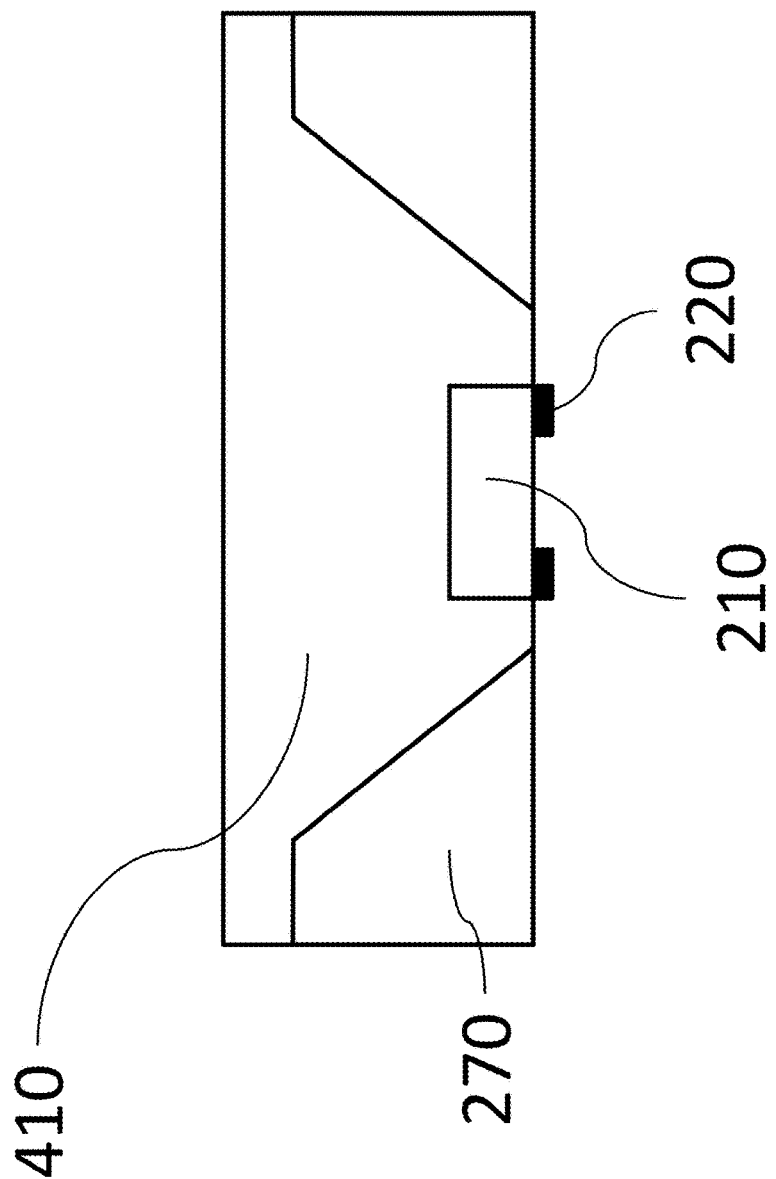

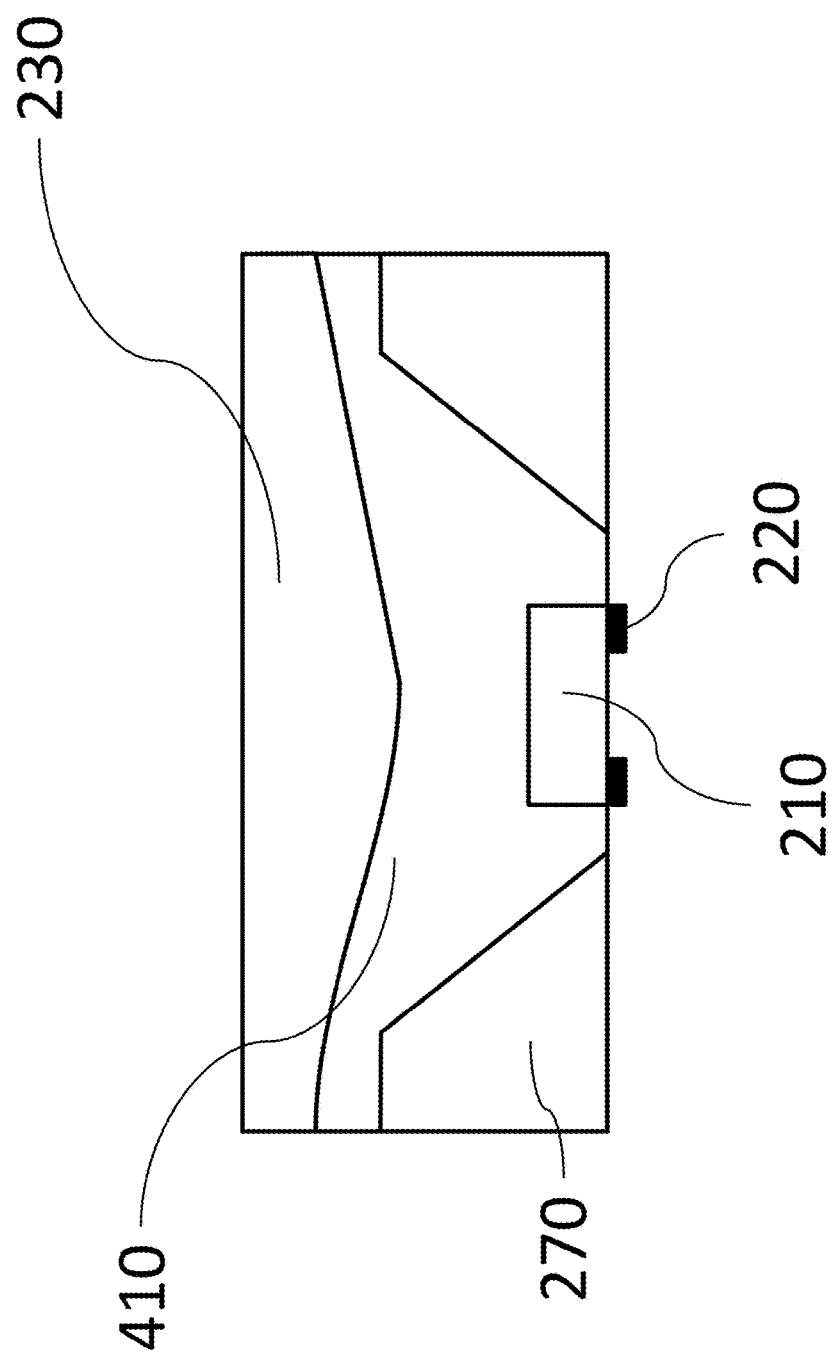

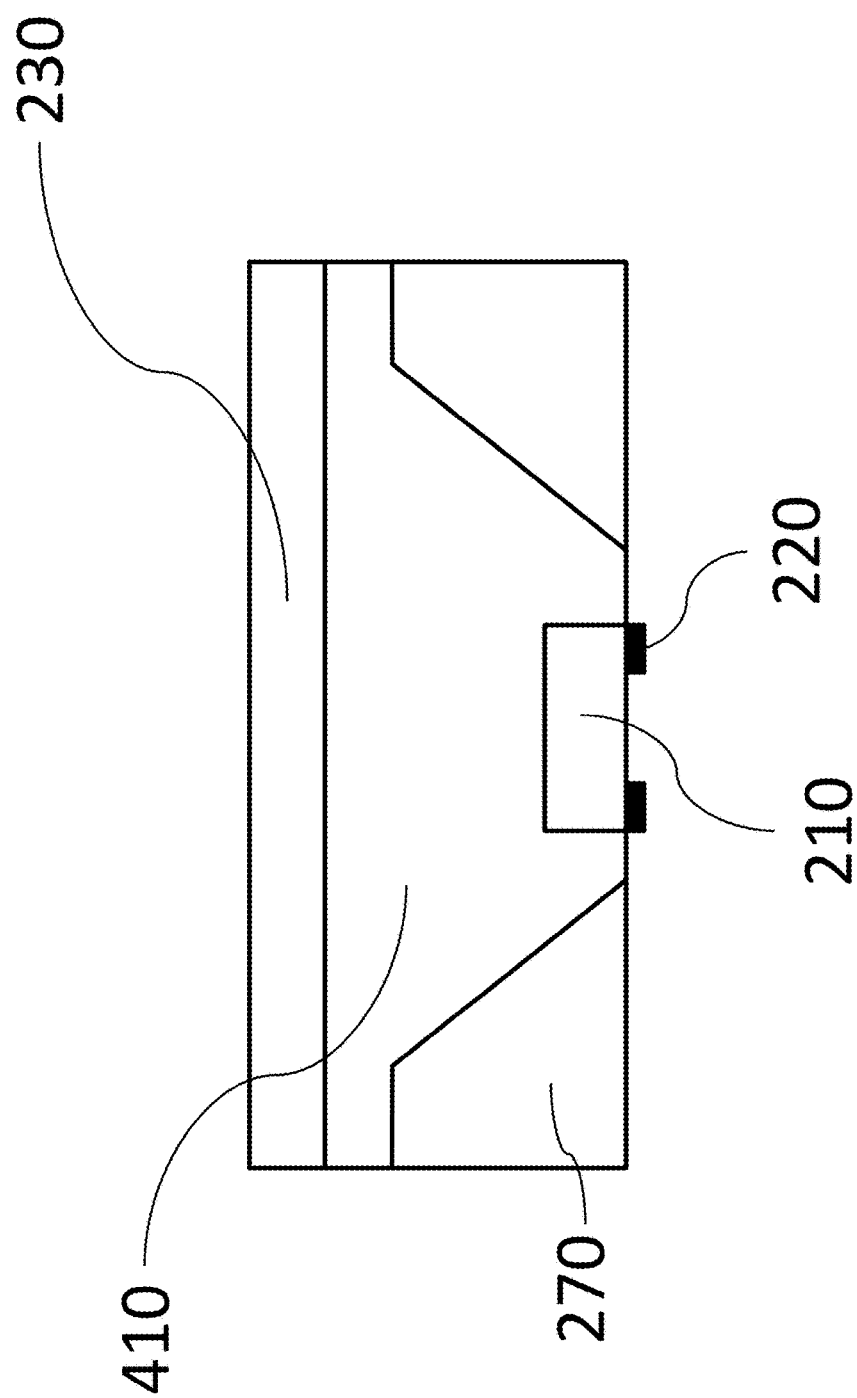

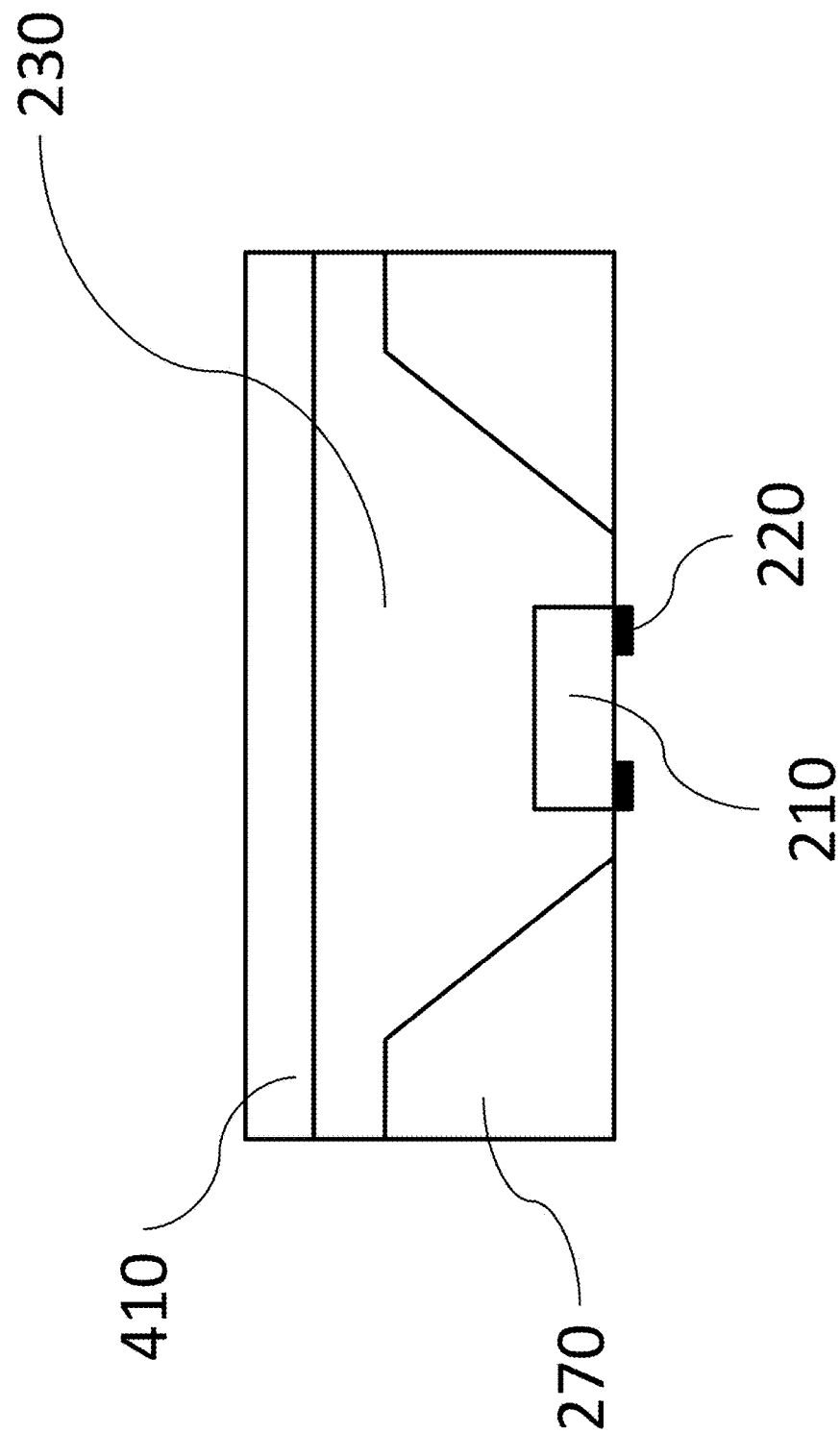

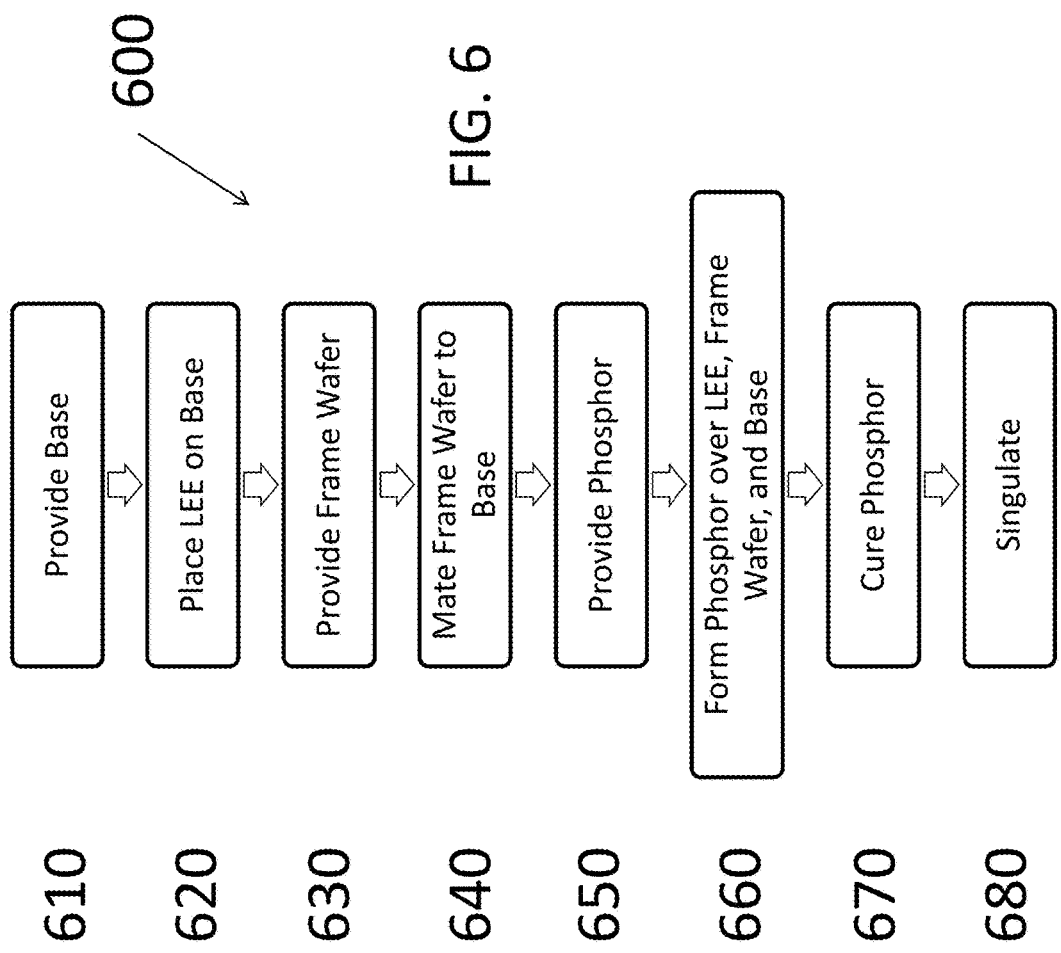

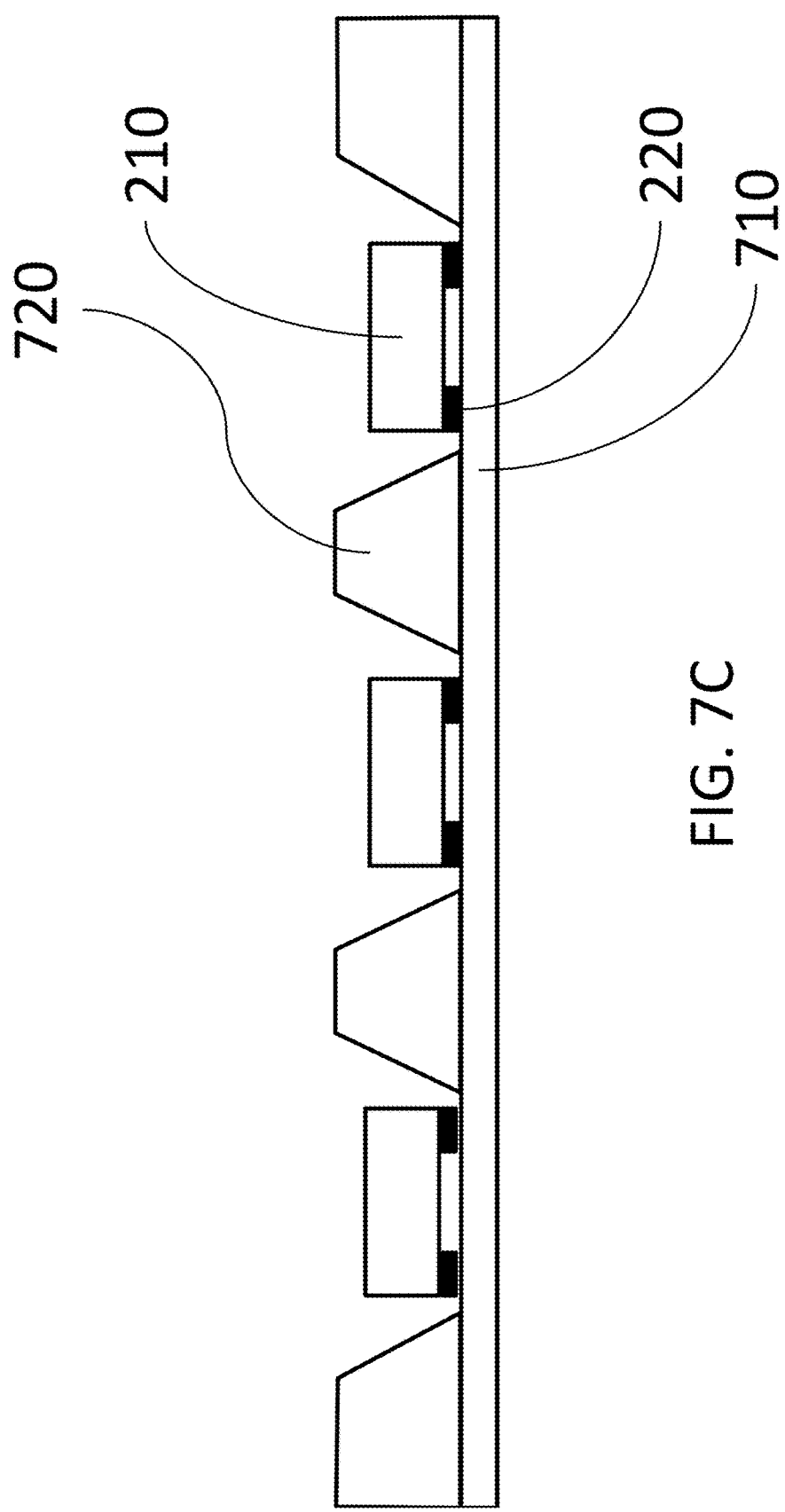

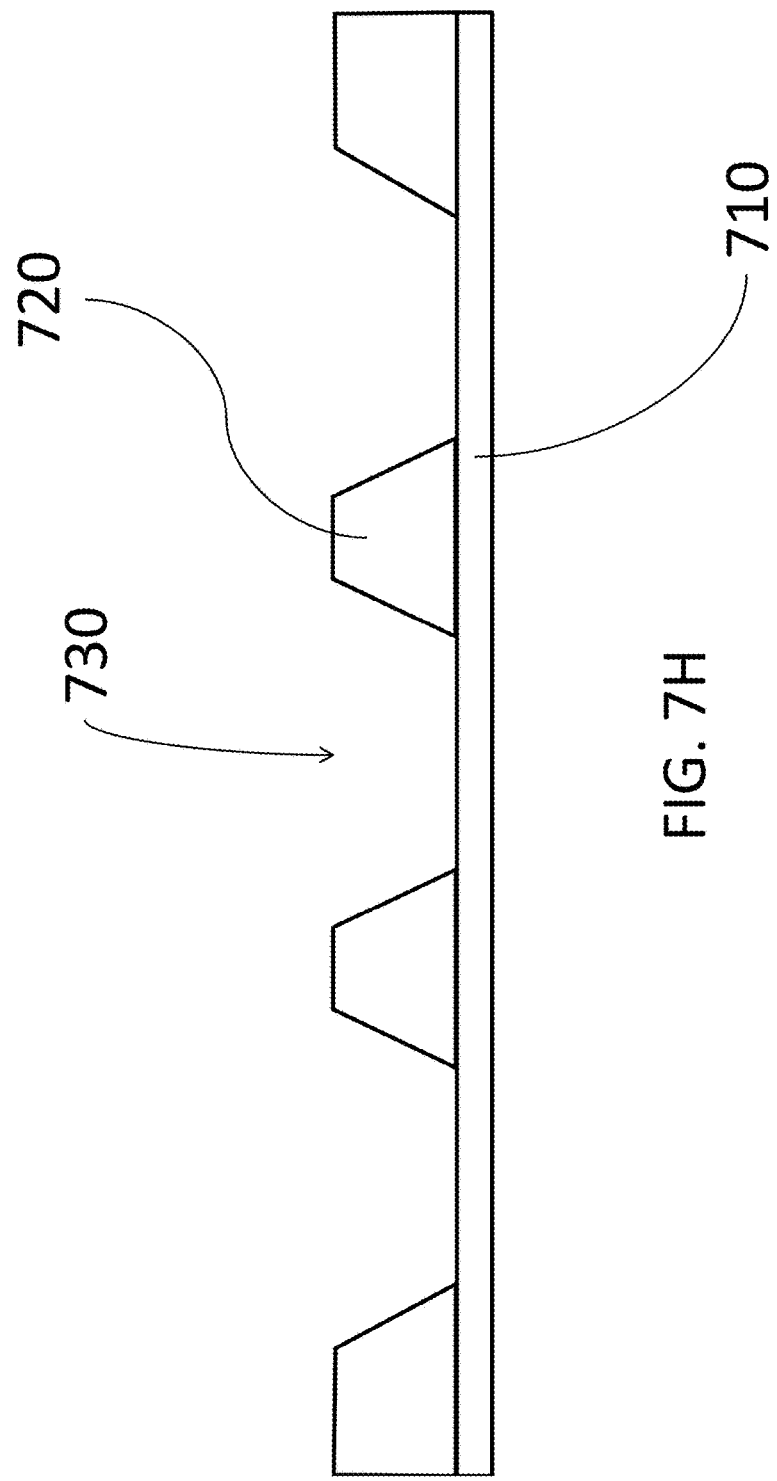

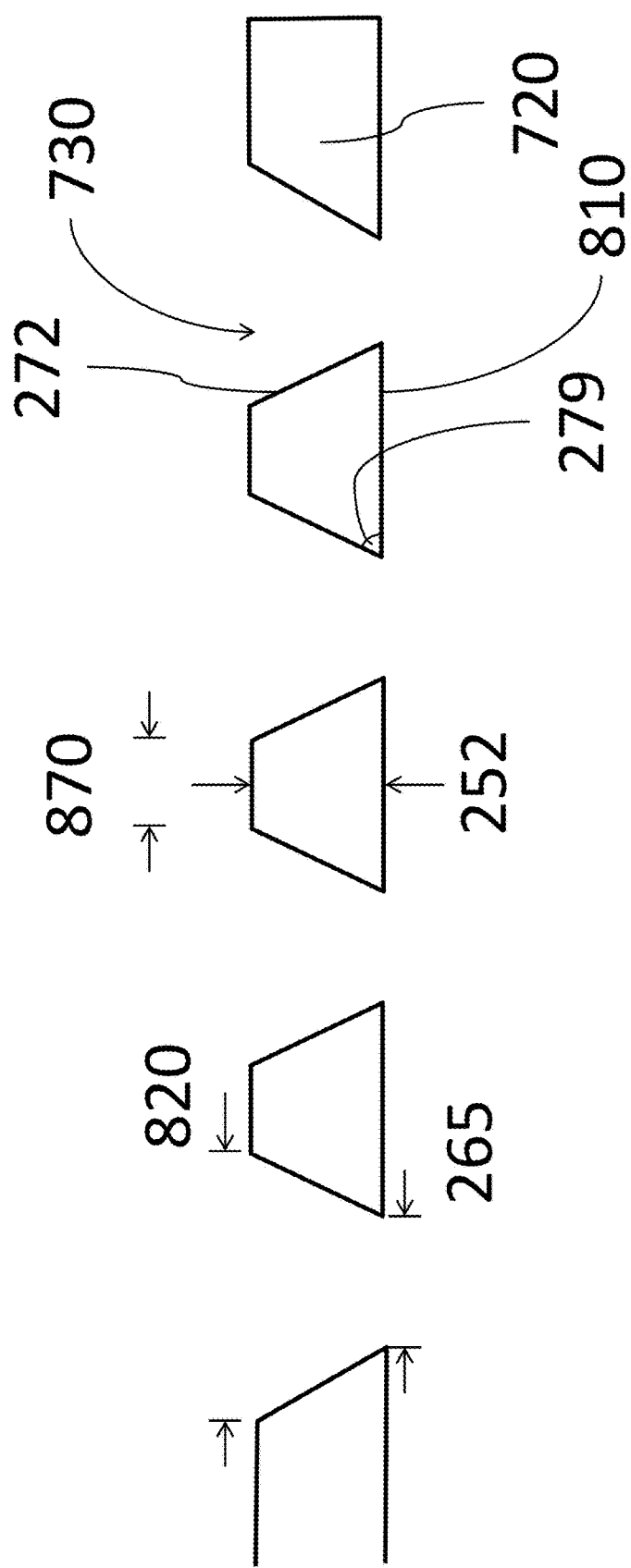

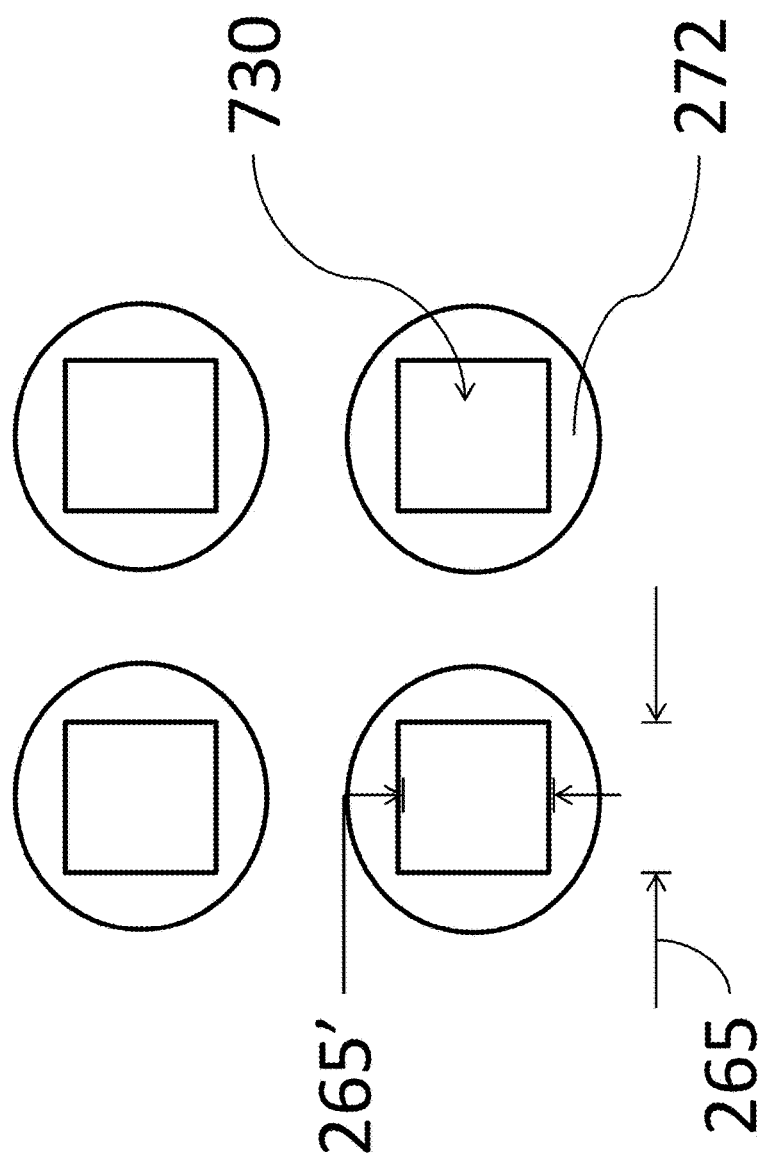

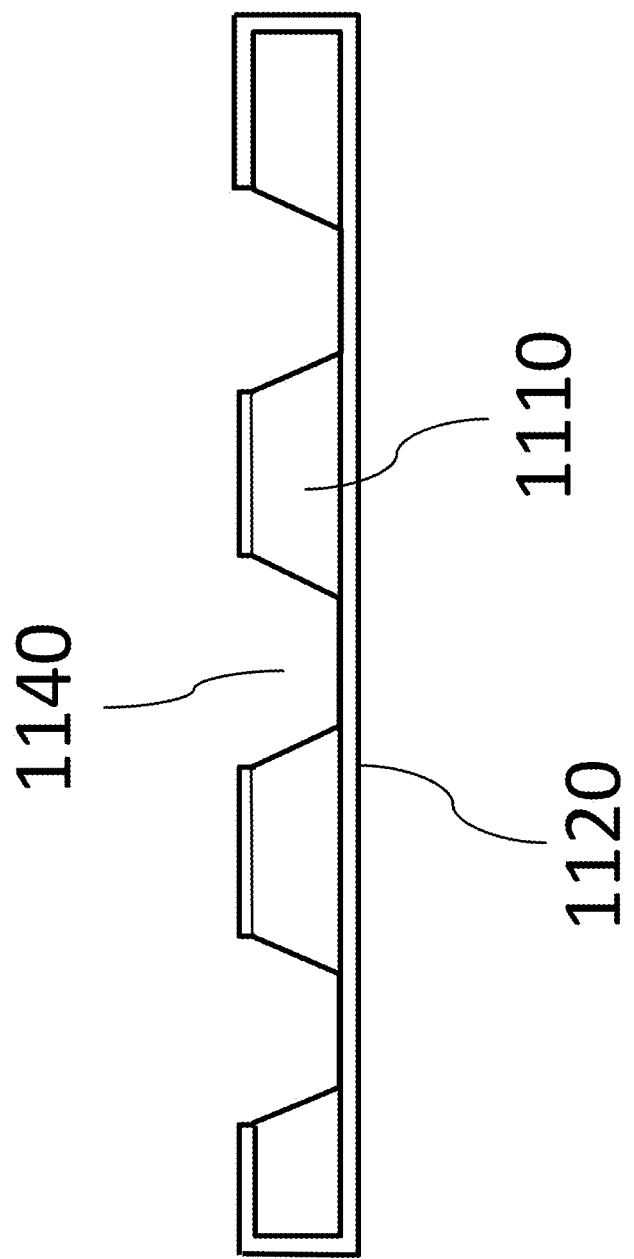

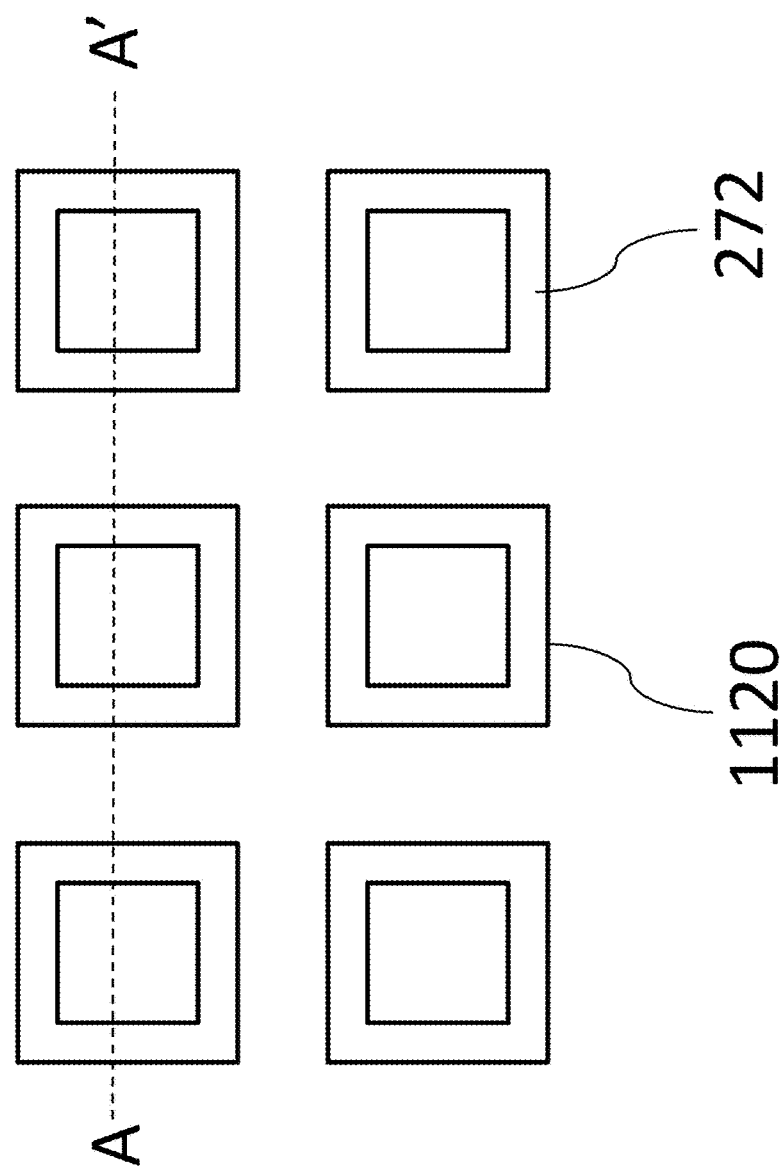

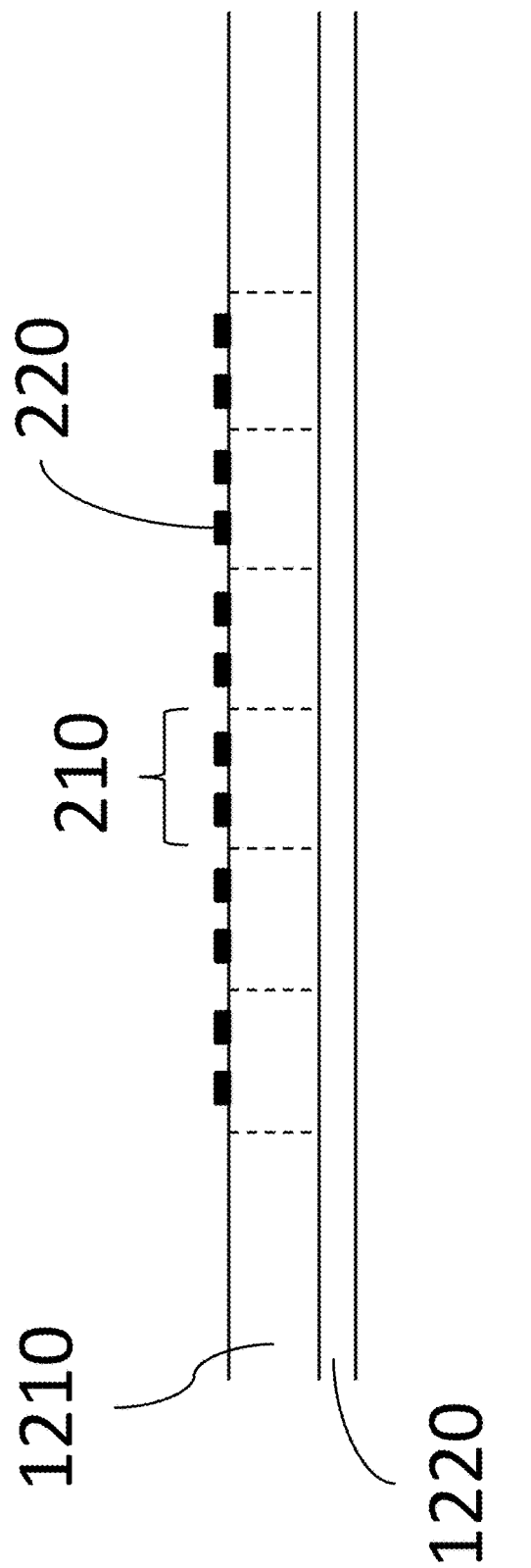

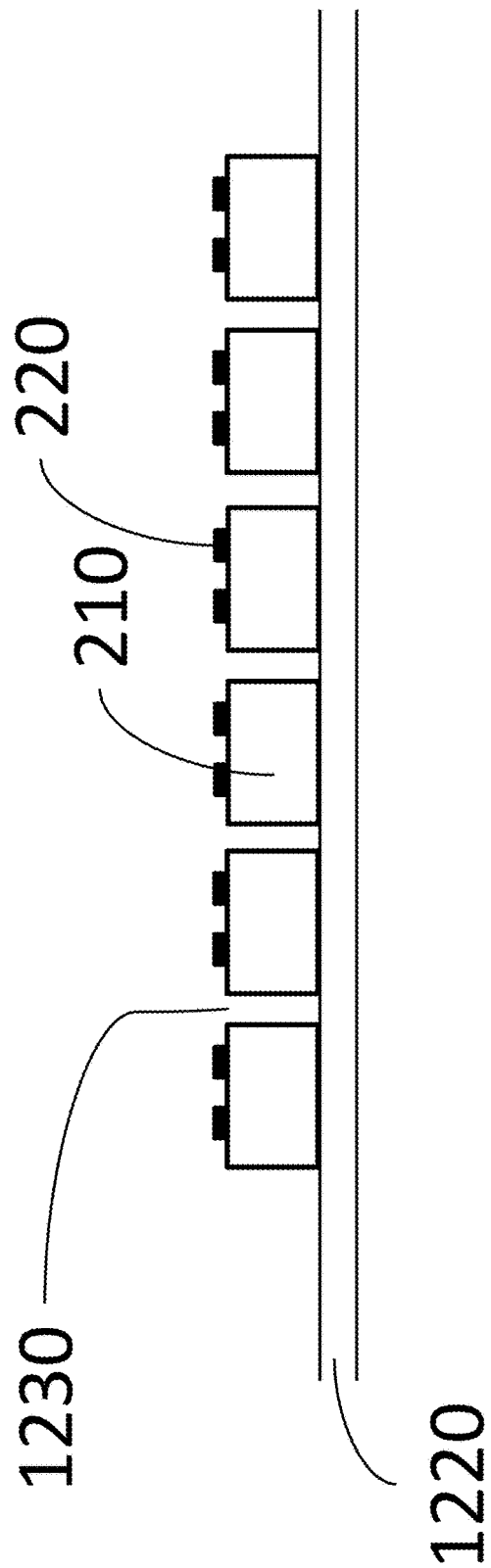

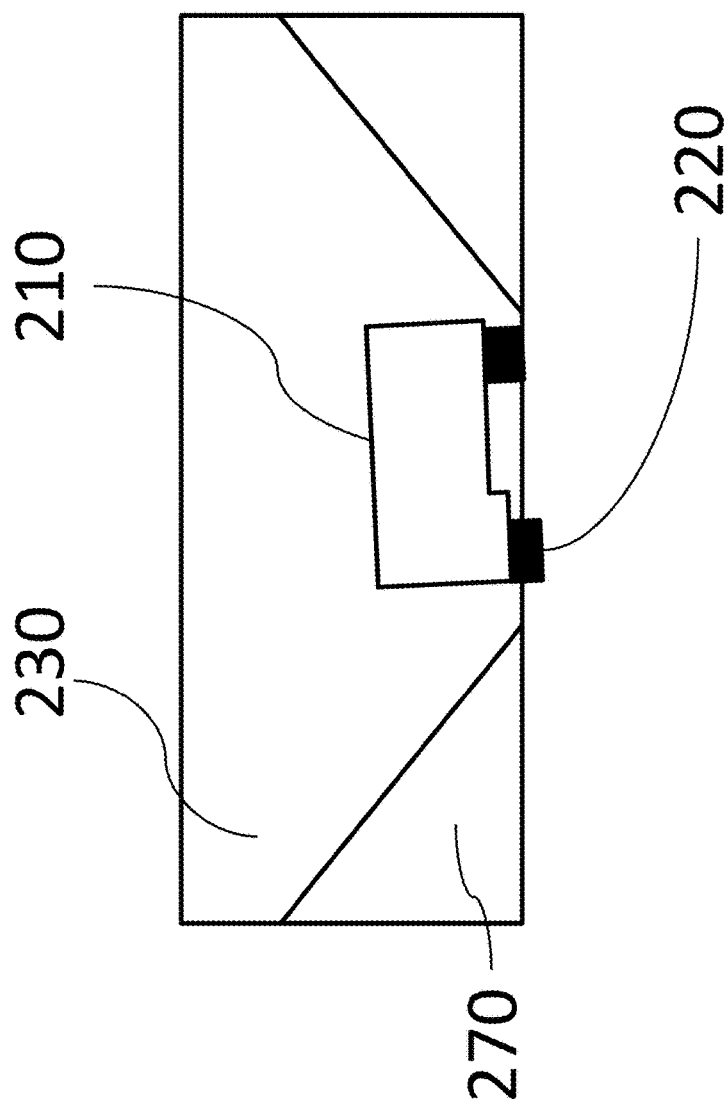

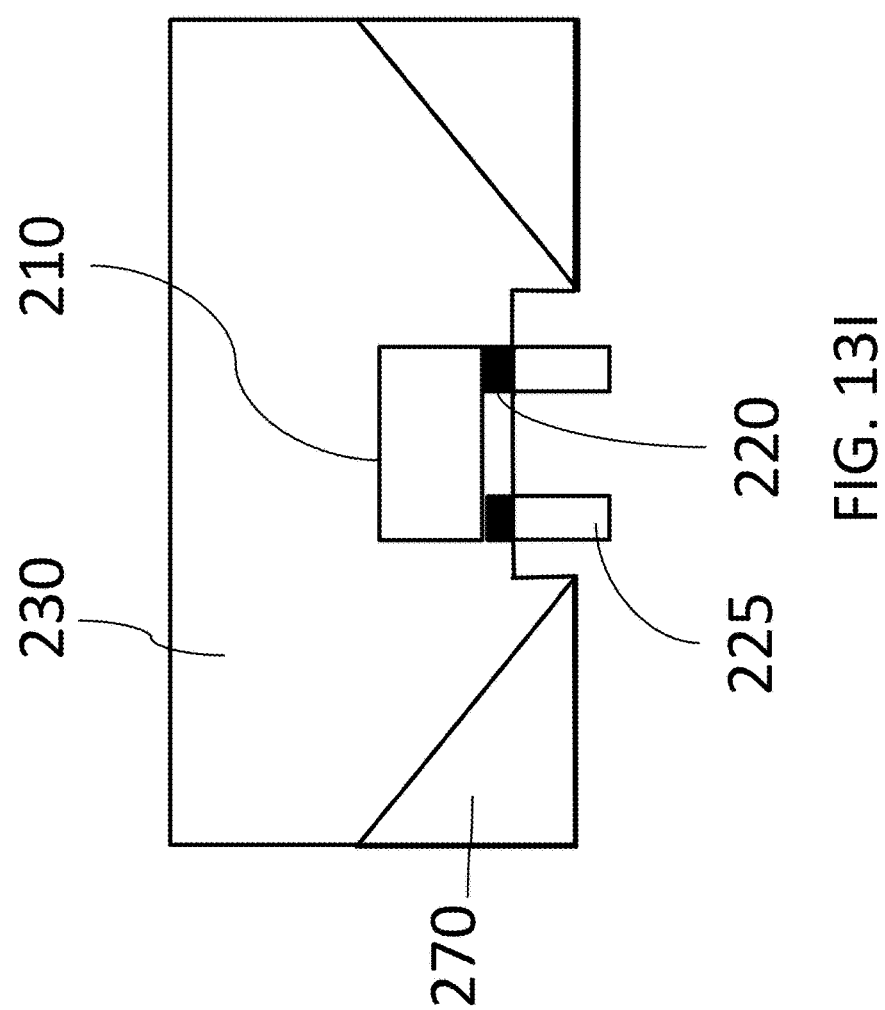

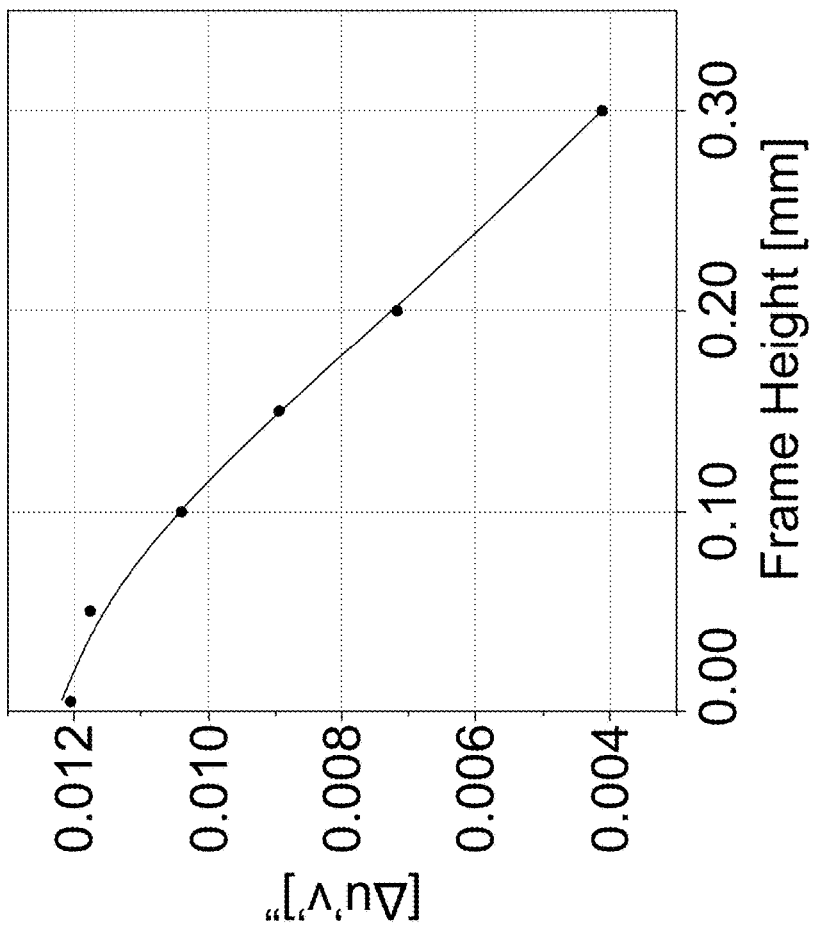

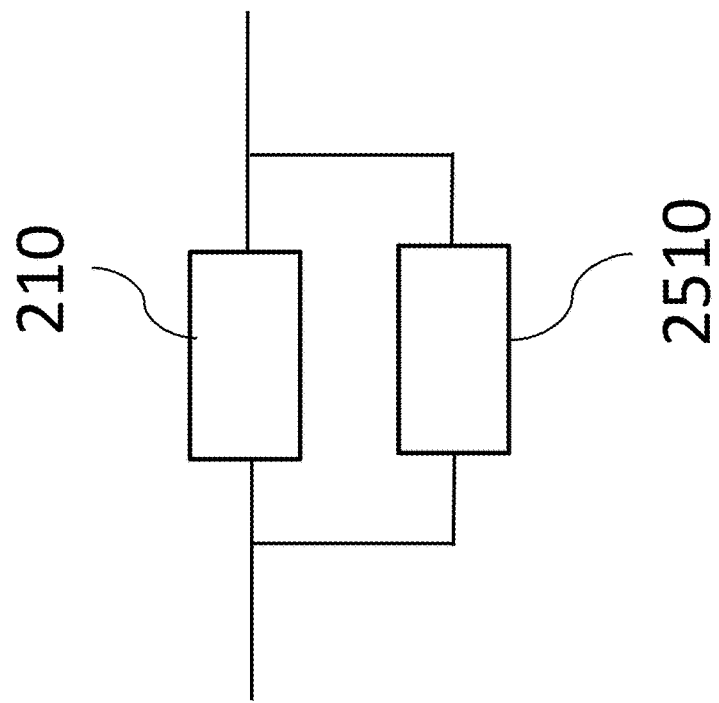

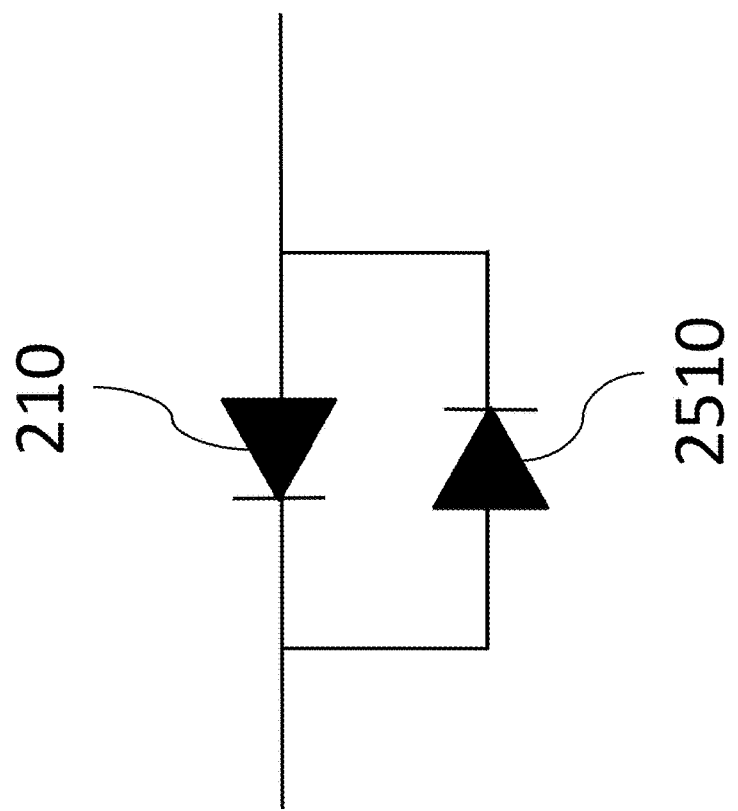

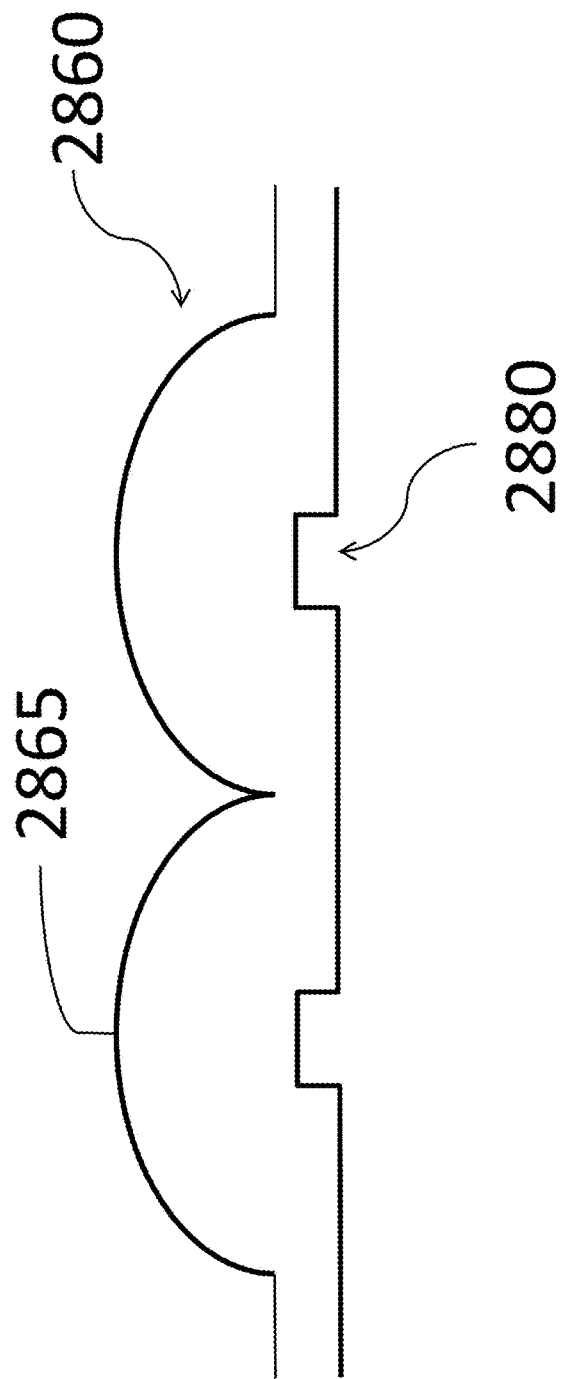

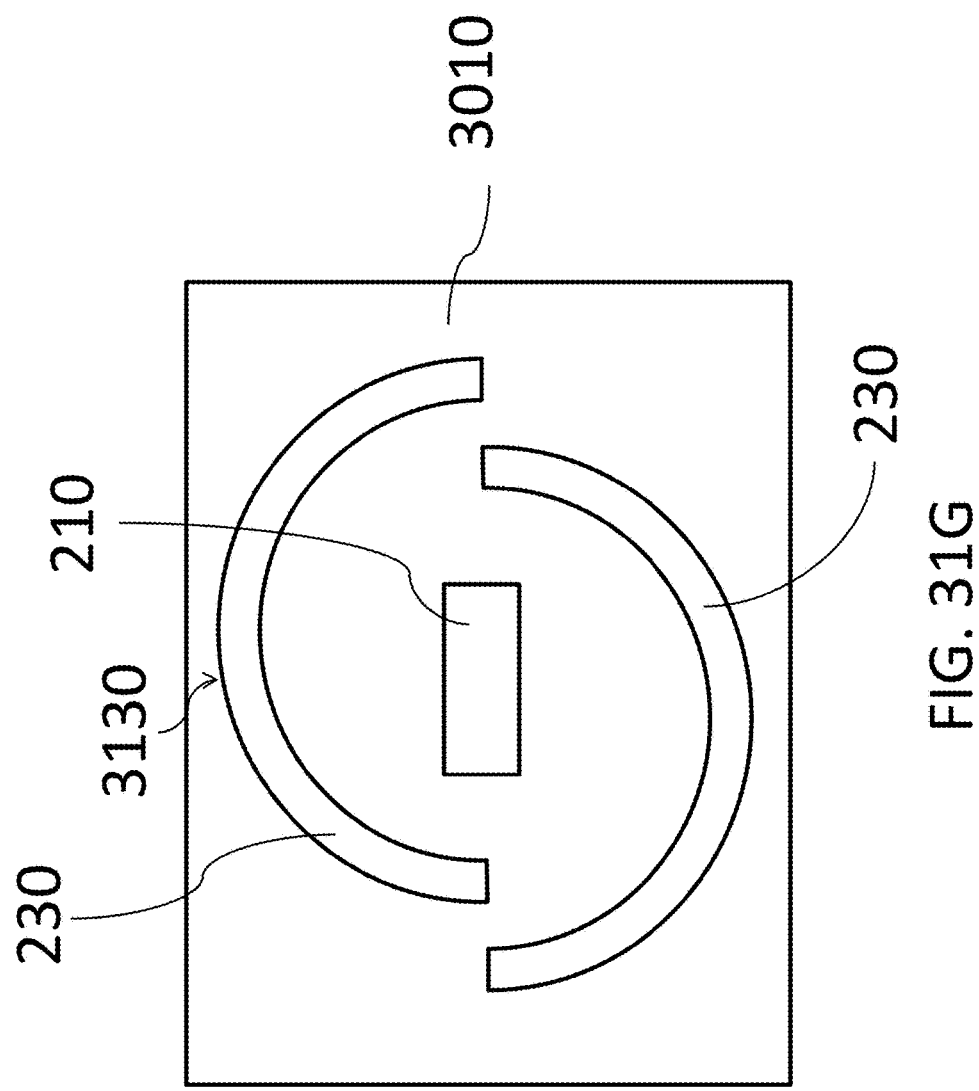

LIGHT-EMITTING DIES INCORPORATING WAVELENGTH-CONVERSION MATERIALS AND RELATED METHODS

RELATED APPLICATIONS

This application is a continuation of U.S. patent application Ser. No. 15/096,548, filed Apr. 12, 2016, which is a continuation of U.S. patent application Ser. No. 14/661,742, filed Mar. 18, 2015, which is a continuation of U.S. patent application Ser. No. 14/610,324, filed Jan. 30, 2015, which claims the benefit of and priority to U.S. Provisional Patent Application No. 61/936,050, filed Feb. 5, 2014, and U.S. Provisional Patent Application No. 61/971,748, filed Mar. 28, 2014, the entire disclosure of each of which is hereby incorporated herein by reference.

FIELD OF THE INVENTION

In various embodiments, the present invention generally relates to light sources, and more specifically to phosphor-converted light sources.

BACKGROUND

Light sources such as light-emitting diodes (LEDs) are an attractive alternative to incandescent and fluorescent light bulbs in illumination devices due to their higher efficiency, smaller form factor, longer lifetime, and enhanced mechanical robustness. However, the high cost of LED-based lighting systems has limited their widespread utilization, particularly in broad-area general lighting applications.

The high cost of LED-based lighting systems has several contributors. LED chips are typically encased in a package, and multiple packaged LEDs are used in each lighting system to achieve the desired light intensity. For general illumination, which utilizes white light, such white light may be generated in a number of ways. One approach is to utilize two or more LEDs operating at different wavelengths, where the different wavelengths combine to appear white to the human eye. For example, LEDs emitting in the red, green and blue wavelength ranges may be utilized together. Such an arrangement typically requires careful control of the operating currents of each LED, such that the resulting combination of wavelengths is stable over time and different operating conditions, for example temperature. The different LEDs may also be formed from different materials, for example, AlInGaP for red LEDs and AlInGaN for blue and green LEDs. These different materials may have different operating current requirements as well as different temperature dependencies of the light output power and wavelength. Furthermore, changes in light-output power with time may be different for each type of LED. Therefore, such systems typically utilize some form of active control of the current in each LED to maintain the light output power of each LED at the desired level. In some implementations, one or more sensors (for example to sense light intensity, light color, temperature or the like) may be used to provide feedback to the current-control system, while in some other implementations the current may be adjusted over time based on values in a look-up table. Such control systems add cost and complexity to lighting solutions, as well as creating additional potential failure points. A further disadvantage of multi-LED arrangements is that they typically require some form of light combiner, diffuser or mixing chamber, so that the eye observes white light rather than the discrete different colors of each of the different LEDs. Such light-mixing systems typically add cost and bulk to lighting systems and may reduce their efficiency.

White light may also be produced in LED-based systems for general illumination by means of light-conversion materials such as phosphors. LEDs generally emit in a relatively narrow wavelength range, for example on the order of about 20-100 nm. When broader spectra (for example "white" light) or colors different from that of the LED are desired, the LED may be combined with one or more light-conversion materials. An LED combined with one or more phosphors typically generates white light by combining the short-wavelength emission from the semiconductor LED with long-wavelength emission from the phosphor(s). This occurs because a portion of the LED light passes unconverted through the phosphor to combine with the phosphor-converted light. Phosphors are typically composed of phosphorescent particles such as $Y_3Al_5O_{12}:Ce^{3+}$ (cerium-activated yttrium-aluminum-garnet, or YAG:Ce) embedded in a transparent binder such as optical epoxy or silicone and applied as a layer. However, phosphor integration is often difficult, particularly in terms of uniformity and reproducibility of the resulting light.

In some phosphor implementations, the phosphor layer absorbs a portion of the incident short-wavelength radiant flux and re-emits long-wavelength radiant flux. In an exemplary YAG:Ce phosphor, a blue LED typically has a peak wavelength of 450 nm-460 nm, corresponding to the peak of the phosphor-excitation spectrum, while the phosphor emission has a broadband spectrum with a peak at approximately 560 nm. Combining the blue LED emission with the yellow phosphor emission yields visible white light with a specific chromaticity (color) that depends on the ratio of blue to yellow light.

The geometry of the phosphor relative to the LED generally has a very strong impact on the uniformity of the light characteristics. For example, the LED may emit from more than one surface, for example from the top and the sides of the LED, producing non-uniform color if the phosphor composition is not uniform over these LED surfaces. More complicated structures may be used to attempt to mitigate this problem, but these add cost and complexity and may be additional sources for reliability problems.

Furthermore, if the thickness of the phosphor layer, formed of a uniformly dispersed phosphor in a binder, is not uniform over the surface of the LED, relatively larger amounts of blue light will be present where the phosphor-infused binder layer is thinner and relatively smaller amounts of blue light will be present where the phosphor-infused binder is thicker. In view of the foregoing, a need exists for structures, systems and procedures enabling the uniform and low-cost integration of phosphors with illumination devices such as LEDs.

SUMMARY

In accordance with certain embodiments, semiconductor dies such as light-emitting elements (LEEs) are positioned within a frame and coated with a binder, which is subsequently cured to form a composite frame wafer that includes or consists essentially of the frame, the solid binder material, and the dies suspended therein. The composite frame wafer may be divided into free-standing "frame dies" each composed of the die and a portion of the cured binder that at least partially surrounds the die and a portion of the frame that at least partially surrounds the binder. The binder may advantageously contain a wavelength-conversion material such as a phosphor or a collection of quantum dots. Various mold substrates and/or molds may be utilized to secure the semiconductor dies and/or to prevent coating of the contacts of the dies during the coating process.

In an aspect, embodiments of the invention feature a method of forming a composite frame wafer comprising or consisting essentially of (i) a frame wafer defining a plurality of apertures therethrough and (ii) a plurality of discrete semiconductor dies suspended in a cured polymeric binder within the apertures. A frame wafer is provided. The frame wafer (i) has a bottom surface, (ii) has a top surface opposite the bottom surface, (iii) has a thickness spanning the top and bottom surfaces, and (iv) defines a plurality of apertures fully through the thickness. The top surface of the frame wafer surrounds each aperture. The apertures may each have a sidewall not perpendicular to the bottom surface of the frame wafer. The frame wafer is disposed over or on a mold substrate. The plurality of discrete semiconductor dies are disposed over or on the mold substrate within the apertures. Each semiconductor die has at least two spaced-apart contacts adjacent the mold substrate. At least a portion of the frame wafer and the plurality of semiconductor dies are coated with a polymeric binder. The polymeric binder is cured to form the composite frame wafer. The contacts of each semiconductor die remain at least partially uncoated by the polymeric binder.

Embodiments of the invention may include one or more of the following in any of a variety of combinations. One or more of the semiconductor dies may be a bare-die light-emitting element. The polymeric binder may be transparent to a wavelength of light emitted by the one or more semiconductor dies. The frame wafer may be transparent to a wavelength of light emitted by a light-emitting element. A reflective layer may be formed on at least a portion of the frame wafer. At least a portion of the sidewall of at least one of the apertures (i.e., all or a portion of the sidewall material itself and/or a reflective coating disposed thereon) may be reflective to a wavelength of light emitted by the light-emitting element. A reflectance of the at least a portion of the sidewall may vary with incident angle (of light incident upon the at least a portion of the sidewall) and/or incident wavelength (of light incident upon the at least a portion of the sidewall). The at least a portion of the sidewall may have a reflectance greater than 80%, or even greater than 90%, to a wavelength of light emitted by the light-emitting element. The at least a portion of the sidewall may be a substantially diffuse reflector or a substantially specular reflector. The at least a portion of the sidewall may be coated with a reflective coating that is reflective to a wavelength of light emitted by the light-emitting element. The reflective coating may include, consist essentially of, or consist of aluminum, silver, gold, silicon dioxide, titanium dioxide, and/or silicon nitride. The reflective coating may include, consist essentially of, or consist of (i) a reflecting film and/or (ii) a plurality of particles.

The polymeric binder may contain a wavelength-conversion material for absorption of at least a portion of light emitted from the semiconductor dies and emission of converted light having a different wavelength, and converted light and unconverted light emitted by the semiconductor dies may combine to form mixed light. The wavelength-conversion material may include, consist essentially of, or consist of a phosphor and/or quantum dots. At least a portion of the sidewall of at least one of the apertures may be coated with reflective coating having a reflectance greater than 80%, or even greater than 90%, to a wavelength of light emitted by the light-emitting element and/or the wavelength-conversion material. The polymeric binder may include, consist essentially of, or consist of a plurality of discrete regions, at least one of which includes, consists essentially of, or consists of the polymeric binder without the wavelength-conversion material. The mixed light may include, consist essentially of, or consist of substantially white light. The substantially white light may have a correlated color temperature in the range of 2000 K to 10,000 K. The variation in the color temperature of the substantially white light emitted when each semiconductor die is individually energized may be less than four MacAdam ellipses, or even less than two MacAdam ellipses, across the composite frame wafer. The variation in the color temperature of the substantially white light emitted when each semiconductor die is individually energized may be less than 500 K, or even less than 250 K, across the composite frame wafer. The maximum divergence of color uniformity in terms of the radially averaged Δu'v' deviation from the spatially weighted average when each semiconductor die is individually energized may be less than 0.01, or even less than 0.006, across the composite frame wafer. The divergence of color temperature of the substantially white light emitted when each semiconductor die is individually energized, may vary, over an angular range of 0° to 80°, no more than 0.006 in terms of Δu'v' deviation from a spatially weighted averaged chromaticity across the composite frame wafer. The divergence of color temperature of the substantially white light emitted when each semiconductor die is individually energized, may vary, over an angular range of 10° to 75°, no more than 0.005 in terms of Δu'v' deviation from a spatially weighted averaged chromaticity across the composite frame wafer.

The composite frame wafer may be separated into a plurality of discrete portions. Each portion may include, consist essentially of, or consist of (i) a portion of the frame wafer defining an aperture therethrough and (ii) disposed within the aperture, at least one semiconductor die coated with cured polymeric binder. After separation, the volume of polymeric binder surrounding each semiconductor die may be substantially equal. Each discrete portion of the composite frame wafer may contain only one semiconductor die. Each discrete portion of the composite frame wafer may be a rectangular solid having approximately 90° corners between adjacent faces thereof. After separating the composite frame wafer, additional material may be removed from each of the discrete portions, whereby each portion has a desired shape thereafter. The contacts of the at least one semiconductor die in one of the discrete portions may be electrically coupled to spaced-apart conductive traces on a substrate. Electrically coupling the contacts to the conductive traces may include or consist essentially of adhering the contacts to the conductive traces with a conductive adhesive, anisotropic conductive adhesive, and/or solder. The at least one semiconductor die may be electrically connected to circuitry for powering the at least one semiconductor die.

Only one semiconductor die may be disposed within each aperture. The frame wafer may be disposed over the mold substrate after disposing the plurality of semiconductor dies on the mold substrate. The composite frame wafer may be separated from the mold substrate. A second substrate may be disposed in contact with the composite frame wafer, and the mold substrate may be removed from the composite frame wafer, the composite frame wafer remaining attached to the second substrate. The composite frame wafer may be separated from the second substrate. Before curing the polymeric binder, the contacts of the plurality of semiconductor dies may be at least partially embedded within the mold substrate. After curing the polymeric binder, at least a portion of each of the contacts of the plurality of semiconductor dies may protrude from the cured binder. Coating at least a portion of the frame wafer and the plurality of semiconductor dies with a polymeric binder may include or consist essentially of dispensing the polymeric binder into a mold, and disposing the mold substrate over the mold, whereby the plurality of semiconductor dies are suspended within the polymeric binder. Curing the polymeric binder may include or consist essentially of at least partially curing the polymeric binder, and thereafter, removing the mold substrate from the mold. The mold may include or consist essentially of a plurality of discrete compartments in which the polymeric binder is disposed. One or more semiconductor dies may be suspended within or above each compartment prior to curing the polymeric binder. Each compartment may impart a complementary shape to a portion of the polymeric binder. The complementary shapes may be substantially identical to each other. At least one complementary shape may be different from the other complementary shapes.

Coating the plurality of semiconductor dies with the polymeric binder may include or consist essentially of dispensing the polymeric binder over the mold substrate. Curing the polymeric binder may include or consist essentially of at least partially curing the polymeric binder, and thereafter, removing the mold substrate from the plurality of semiconductor dies. A mold cover may be disposed over and in contact with at least a portion of the polymeric binder and/or the frame wafer. The mold cover may include or consist essentially of a plurality of discrete compartments. One or more semiconductor dies may be suspended within or beneath each compartment prior to curing the polymeric binder. Each compartment may impart a complementary shape to a portion of the polymeric binder. The complementary shapes may be substantially identical to each other. At least one complementary shape may be different from the other complementary shapes. The composite frame wafer may have a first surface and a second surface opposite the first surface, and a variation in thickness between the first and second surfaces may be less than 10%. The thickness of the polymeric binder above each of the semiconductor dies may be the same to within 5%. At least one semiconductor die may include or consist essentially of one or more active layers (e.g., layers that cooperate to emit or detect light) over a substrate (e.g., a semiconductor substrate), and the substrate may be partially or completely removed before coating with the polymeric binder. The substrate of the at least one semiconductor die may be partially or completely removed after disposing the at least one semiconductor die over the mold substrate.

An optical element may be associated with one or more of the semiconductor dies. An array of optical elements may be disposed over or on the polymeric binder prior to curing. Curing the binder may adhere the array of optical elements to the cured polymeric binder. The composite frame wafer may include the array of optical elements, and the composite frame wafer may be separated into discrete portions each including at least one optical element. The sidewall of at least one of the apertures may be beveled (i.e., angled with respect to the bottom surface of the frame and substantially straight). The sidewall of at least one of the apertures may be contoured (i.e., curved). The top surface of the frame wafer may be substantially parallel to the bottom surface of the frame wafer. The polymeric binder may be contained within the thickness of the frame wafer. The polymeric binder may extend beyond the thickness of the frame wafer in a direction away from the bottom surface of the frame wafer (i.e., toward a top surface of the frame wafer and/or toward a top of the aperture). A top surface of the polymeric binder may be substantially parallel to a face of at least one of the semiconductor dies. Only a portion of a sidewall of at least one of the semiconductor dies may protrude from the polymeric binder, a second portion of the sidewall of the at least one of the semiconductor dies being covered with the polymeric binder. The polymeric binder may include, consist essentially of, or consist of silicone and/or epoxy. At least one of the semiconductor dies may include, consist essentially of, or consist of a semiconductor material including, consisting essentially of, or consisting of GaAs, AlAs, InAs, GaP, AlP, InP, ZnO, CdSe, CdTe, ZnTe, GaN, AlN, InN, silicon, germanium, and/or an alloy or mixture thereof.

At least one of the semiconductor dies may include or consist essentially of a bare-die (i.e., unpackaged) light-emitting diode. A first conductive pad may be (i) electrically coupled to one of the two spaced-apart contacts of a semiconductor die and/or (ii) disposed over at least a portion of the bottom surface of the frame wafer. A second conductive pad may be (i) electrically coupled to the other of the two spaced-apart contacts of the semiconductor die, (ii) electrically insulated from the first conductive pad, and/or (iii) disposed over at least a portion of the bottom surface of the frame wafer. An insulating layer may be formed over at least a portion of a surface (e.g., the bottom surface) of the frame wafer. An active and/or a passive electronic component may be formed on or over the bottom surface of the frame wafer. The frame wafer may include, consist essentially of, or consist of a semiconductor material, and the active and/or passive electronic component may be formed within or on the semiconductor material. The active and/or passive electronic component may include or consist essentially of a diode (e.g., a Zener diode), a resistor, a capacitor, an inductor, an antenna, and/or a transistor. At least a portion of the sidewall of at least one of the apertures may be textured or patterned. The frame wafer may include, consist essentially of, or consist of a semiconductor, a plastic, a polymer, a glass, a ceramic, and/or a metal. The frame wafer may include, consist essentially of, or consist of silicon and/or gallium arsenide. The plurality of apertures may be formed using wet chemical etching, dry chemical etching, ablation, bonding, machining, three-dimensional printing, ultrasonic machining, abrasive machining, and/or molding. The frame wafer may include, consist essentially of, or consist of a semiconductor material, and the plurality of apertures may be formed using an anisotropic etch process. The thickness of the polymeric binder above a first semiconductor die may be different from the thickness of the polymeric binder above a second semiconductor die different from the first semiconductor die. The polymeric binder may include or consist essentially of a plurality of shaped regions. Each shaped region may be associated with at least one semiconductor die and/or may have a shape substantially identical to shapes of the other shaped regions. The sidewall of at least one of the apertures may form an angle selected from the range of 15° to 60° with the bottom surface of the frame. The semiconductor dies may be arranged in an array having substantially equal distances between semiconductor dies in at least a first direction. The array of semiconductor dies may be spaced apart at substantially equal distances between semiconductor dies in a second direction different from the first direction.

In an aspect, embodiments of the invention feature an illumination device including, consisting essentially of, or consisting of a polymeric binder, a bare-die light-emitting element suspended within the polymeric binder, and a frame.

The light-emitting element has (i) a first face, (ii) a second face opposite the first face, (iii) at least one sidewall spanning the first and second faces, and (iv) disposed on the first face of the light-emitting element, at least two spaced-apart contacts each having a free terminal end. The frame (i) has a bottom surface, (ii) has a top surface opposite the bottom surface, (iii) has a thickness spanning the top and bottom surfaces, and (iv) defines an aperture fully through the thickness. The top surface of the frame surrounds the aperture. The sidewall of the aperture may not be perpendicular to the bottom surface of the frame. The light-emitting element is disposed within the aperture of the frame such that (i) the second face of the light-emitting element is opposite the bottom surface of the frame, (ii) the sidewall of the aperture redirects light emitted from the light-emitting element away from the bottom surface of the frame, and (iii) the free terminal ends of the contacts of the light-emitting element are (a) not covered by the polymeric binder and (b) available for electrical connection.

Embodiments of the invention may include one or more of the following in any of a variety of combinations. The sidewall of the aperture may be beveled (i.e., angled with respect to the bottom surface of the frame and substantially straight). The sidewall of the aperture may be contoured (i.e., curved). The top surface of the frame may be substantially parallel to the bottom surface of the frame. The polymeric binder may be contained within the thickness of the frame. The polymeric binder may extend beyond the thickness of the frame in a direction away from the bottom surface of the frame. The polymeric binder may have a top surface disposed over the second face of the light-emitting element. The top surface of the polymeric binder may be curved. The top surface of the polymeric binder may be substantially flat. The top surface of the polymeric binder may be substantially parallel to the first face of the light-emitting element. At least portions of the contacts may protrude from the polymeric binder. Only a portion of each said sidewall of the light-emitting element may protrude from the polymeric binder, a portion of the sidewall of the light-emitting element being covered with the polymeric binder. The exterior of the frame may define a hollow rectangular solid having approximately 90° corners between adjacent faces thereof. The exterior of the frame and the polymeric binder may collectively define a hollow rectangular solid having approximately 90° corners between adjacent faces thereof.

The polymeric binder may include, consist essentially of, or consist of silicone and/or epoxy. One or more additional light-emitting elements (e.g., bare-die light-emitting elements) may be at least partially suspended within the polymeric binder. The light-emitting element may include, consist essentially of, or consist of a semiconductor material including, consisting essentially of, or consisting of GaAs, AlAs, InAs, GaP, AlP, InP, ZnO, CdSe, CdTe, ZnTe, GaN, AlN, InN, silicon, germanium, and/or an alloy or mixture thereof. The light-emitting element may include, consist essentially of, or consist of a bare-die light-emitting diode. The light-emitting element may include, consist essentially of, or consist of active semiconductor layers that are not disposed on a semiconductor substrate. A reflective layer may be disposed over or within at least a portion of the polymeric binder. An optical element may be positioned to receive light from the light-emitting element. A first conductive pad may be electrically coupled to one of the two spaced-apart contacts and/or disposed over at least a portion of the bottom surface of the frame. A second conductive pad may be (i) electrically coupled to the other of the two spaced-apart contacts, (ii) electrically insulated from the first conductive pad, and/or (iii) disposed over at least a portion of the bottom surface of the frame. The frame may include, consist essentially of, or consist of an electrically conductive material.

An active and/or a passive electronic component may be disposed over or on the bottom surface of the frame. The frame may include, consist essentially of, or consist of a semiconductor material, and an active and/or passive electronic component may be disposed within or on the semiconductor material. The active and/or passive electronic component may include, consist essentially of, or consist of a Zener diode, a resistor, a capacitor, an inductor, an antenna, and/or a transistor. At least a portion of the sidewall of the aperture may be textured or patterned. The frame may have at least one exterior face spanning the thickness, and the polymeric binder may be disposed on at least a portion of at least one exterior face of the frame. A second bare-die light-emitting element may be suspended within the polymeric binder. The second bare-die light-emitting element may have (i) a first face, (ii) a second face opposite the first face, (iii) at least one sidewall spanning the first and second faces, and (iv) disposed on the first face of the second light-emitting element, at least two spaced-apart contacts each having a free terminal end. The frame may define a second aperture fully through the thickness of the frame. The second aperture may have a sidewall not perpendicular to the bottom surface of the frame. The second light-emitting element may be disposed within the second aperture of the frame such that (i) the second face of the second light-emitting element is opposite the bottom surface of the frame, (ii) the sidewall of the second aperture redirects light emitted from the second light-emitting element away from the bottom surface of the frame, and (iii) the free terminal ends of the contacts of the second light-emitting element are (a) not covered by the polymeric binder and (b) available for electrical connection. A wavelength of light emitted by the second light-emitting element may be different from a wavelength of light emitted by the light-emitting element.

The frame may include, consist essentially of, or consist of a semiconductor, a plastic, a polymer, a glass, a ceramic, and/or a metal. The frame may include, consist essentially of, or consist of silicon and/or gallium arsenide. At least a portion of the sidewall of the aperture (i.e., all or a portion of the frame material itself and/or a reflective coating thereon) may be reflective to a wavelength of light emitted by the light-emitting element. The reflectance of the at least a portion of the sidewall of the aperture may vary with incident angle and/or incident wavelength (i.e., of light incident on the at least a portion of the sidewall of the aperture). The at least a portion of the sidewall of the aperture may have a reflectance greater than 80%, or even greater than 90%, to a wavelength of light emitted by the light-emitting element. The at least a portion of the sidewall of the aperture may be a substantially diffuse reflector. The at least a portion of the sidewall of the aperture may be a substantially specular reflector. The at least a portion of the sidewall of the aperture may be coated with a reflective coating that is reflective to a wavelength of light emitted by the light-emitting element. The reflective coating may include, consist essentially of, or consist of aluminum, silver, gold, silicon dioxide, titanium dioxide, and/or silicon nitride. The reflective coating may include, consist essentially of, or consist of (i) a reflecting film and/or (ii) a plurality of particles. At least a portion of the polymeric binder may be transparent to a wavelength of light emitted by the light-emitting element, and the polymeric binder may contain therein a light-scattering material that scatters the wavelength of light emitted by the light-emitting element.

At least a portion of the polymeric binder may be transparent to a wavelength of light emitted by the light-emitting element. The polymeric binder may contain therein a wavelength-conversion material for absorption of at least a portion of light emitted from the light-emitting element and emission of converted light having a different wavelength, converted light and unconverted light emitted by the light-emitting element combining to form mixed light. The polymeric binder may include or consist essentially of a plurality of discrete regions, at least one of which includes, consists essentially of, or consists of the polymeric binder without wavelength-conversion material therein. At least a portion of the sidewall of the aperture may be coated with a reflective coating having a reflectance greater than 80%, or even greater than 90%, to a wavelength of light emitted by the light-emitting element and/or the wavelength-conversion material. The wavelength-conversion material may include, consist essentially of, or consist of a phosphor and/or quantum dots.

The mixed light may be substantially white light. The substantially white light may have a correlated color temperature in the range of 2000 K to 10,000 K. A maximum divergence of color uniformity of the substantially white light in terms of the radially averaged Δu'v' deviation from a spatially weighted average chromaticity may be less than 0.01, or even less than 0.006. A divergence of color temperature of the substantially white light emitted from the device may vary, over an angular range of 0° to 80°, no more than 0.006 in terms of Δu'v' deviation from a spatially weighted averaged chromaticity. A divergence of color temperature of the substantially white light emitted from the device may vary, over an angular range of 10° to 75°, no more than 0.005 in terms of Δu'v' deviation from a spatially weighted averaged chromaticity. The sidewall of the aperture may form an angle with the bottom surface of the frame, and the angle may be within the range of 15° to 60° (inclusive of the end points (here 15° and 60°), as are all ranges disclosed herein unless specifically otherwise indicated). The polymeric binder may extend above the frame in a direction away from the bottom surface of the frame. The sum of the thickness of the frame and a thickness of the polymeric binder extending above the frame may be in the range of 0.4 mm to 1.8 mm. The ratio of the sum of the thickness of the frame and the thickness of the polymeric binder extending above the frame to a lateral dimension of the frame may be in the range of 0.4 to 1.8. The ratio of a lateral dimension of the frame (e.g., length, width, or diameter) to a lateral dimension of the light-emitting element (e.g., length, width, or diameter) may be in the range of 4.1 to 15.9. The ratio of the sum of the thickness of the frame and the thickness of the polymeric binder extending above the frame to a lateral dimension of the light-emitting element may be in the range of 0.61 to 2.44. The sidewall of the aperture may form an angle with the bottom surface of the frame, the angle having a value in the range of 15° to 50°, the polymeric binder may extend above the frame in a direction away from the bottom surface of the frame, and the sum of the thickness of the frame and a thickness of the polymeric binder extending above the frame may be in the range of 0.4 mm to 1.8 mm.

In another aspect, embodiments of the invention feature a composite wafer that includes or consists essentially of a frame wafer, a polymeric binder, and a plurality of bare-die light-emitting elements suspended within the polymeric binder. The frame wafer (i) has a bottom surface, (ii) has a top surface opposite the bottom surface, (iii) has a thickness spanning the top and bottom surfaces, and (iv) defines a plurality of apertures (a) each extending fully through the thickness and (b) each having a sidewall. The top surface of the frame wafer surrounds each aperture. One or more (or even each) of the apertures may have a sidewall not perpendicular to the bottom surface of the frame. The polymeric binder is disposed within at least a portion of each of the plurality of apertures (i.e., as a continuous connected volume having portions in each of the apertures, or as a plurality of individual unconnected volumes each in one of the apertures). Each light-emitting element has (i) a first face, (ii) a second face opposite the first face, (iii) at least one sidewall spanning the first and second faces, and (iv) disposed on the first face of the light-emitting element, at least two spaced-apart contacts each having a free terminal end. The second face of each light-emitting element is opposite the bottom surface of the frame. The sidewall of each aperture redirects light emitted from a light-emitting element away from the bottom surface of the frame. The free terminal ends of the contacts of each light-emitting element are (a) not covered by the polymeric binder and (b) available for electrical connection.

Embodiments of the invention may include one or more of the following in any of a variety of combinations. The sidewall of at least one aperture may be beveled (i.e., angled with respect to the bottom surface of the frame and substantially straight). The sidewall of at least one aperture may be contoured (i.e., curved). The top surface of the frame wafer may be substantially parallel to the bottom surface of the frame wafer. The polymeric binder may be contained within the thickness of the frame wafer. The polymeric binder may extend beyond the thickness of the frame wafer in a direction opposite the bottom surface of the frame wafer. The polymeric binder may have a top surface disposed over the light-emitting elements. At least a portion of the top surface of the polymeric binder may be curved (e.g., a portion of the top surface of the binder over each light-emitting element may be curved, and portions between apertures of the frame may be substantially flat or may simply be where individual curved portions meet). At least a portion of the top surface of the polymeric binder may be substantially flat. At least a portion of the top surface of the polymeric binder may be substantially parallel to the first face of at least one light-emitting element. At least portions of the contacts of the light-emitting elements may protrude from the polymeric binder. Only a portion of each said sidewall of at least one light-emitting element may protrude from the polymeric binder, and a second portion of each said sidewall of the at least one light-emitting element may be covered with the polymeric binder. The polymeric binder may include, consist essentially of, or consist of silicone and/or epoxy.

At least one light-emitting element may include, consist essentially of, or consist of a semiconductor material including, consisting essentially of, or consisting of GaAs, AlAs, InAs, GaP, AlP, InP, ZnO, CdSe, CdTe, ZnTe, GaN, AlN, InN, silicon, germanium, and/or an alloy or mixture thereof. At least one light-emitting element may include, consist essentially of, or consist of a (bare-die) light-emitting diode. At least one light-emitting element may include, consist essentially of, or consist of active semiconductor layers that are not disposed on a semiconductor substrate. A reflective layer may be disposed over or within at least a portion of the polymeric binder. An optical element may be positioned to receive light from at least one light-emitting element. A first conductive pad may be (i) electrically coupled to one of the two spaced-apart contacts of a light-emitting element and/or (ii) disposed over at least a portion of the bottom surface of the frame wafer. A second conductive pad may be (i) electrically coupled to the other of the two spaced-apart contacts of the light-emitting element, (ii) electrically insulated from the first conductive pad, and/or (iii) disposed over at least a portion of the bottom surface of the frame wafer. The frame wafer may include, consist essentially of, or consist of an electrically conductive material. An insulating layer may be disposed over at least a portion of a surface of the frame wafer. An active and/or a passive electronic component may be disposed over or on the bottom surface of the frame wafer. The frame wafer may include, consist essentially of, or consist of a semiconductor material, and an active and/or a passive electronic component may be disposed within and/or on the semiconductor material. The active and/or passive electronic component may include, consist essentially of, or consist of a diode (e.g., a Zener diode), a resistor, a capacitor, an inductor, an antenna, and/or a transistor.

At least a portion of the sidewall of at least one aperture may be textured or patterned. The frame wafer may include, consist essentially of, or consist of a semiconductor, a plastic, a polymer, a glass, a ceramic, and/or a metal. The frame wafer may include, consist essentially of, or consist of silicon and/or gallium arsenide. At least a portion of the sidewall of at least one aperture (i.e., at least a portion of the frame wafer material itself and/or a reflective coating disposed on the sidewall of the at least one aperture) may be reflective to a wavelength of light emitted by at least one light-emitting element (e.g., a light-emitting element disposed within the aperture). The reflectance of the at least a portion of the sidewall of at least one aperture may vary with incident angle and/or incident wavelength. The at least a portion of the sidewall of at least one aperture may have a reflectance greater than 80%, or even greater than 90%, to a wavelength of light emitted by at least one light-emitting element. The at least a portion of the sidewall of at least one aperture may be a substantially diffuse reflector. The at least a portion of the sidewall of at least one aperture may be a substantially specular reflector. The at least a portion of the sidewall of at least one aperture may be coated with a reflective coating that is reflective to a wavelength of light emitted by at least one light-emitting element (e.g., a light-emitting element disposed within the aperture). The reflective coating may include, consist essentially of, or consist of aluminum, silver, gold, silicon dioxide, titanium dioxide, and/or silicon nitride. The reflective coating may include, consist essentially of, or consist of (i) a reflecting film and/or (ii) a plurality of particles.

At least a portion of the polymeric binder may be transparent to a wavelength of light emitted by at least one light-emitting element. The polymeric binder may contain therein a wavelength-conversion material for absorption of at least a portion of light emitted from the at least one light-emitting element and emission of converted light having a different wavelength, and converted light and unconverted light emitted by the at least one light-emitting element may combine to form mixed light. The wavelength-conversion material may include, consist essentially of, or consist of a phosphor and/or quantum dots. The polymeric binder may include, consist essentially of, or consist of a plurality of discrete regions, at least one of which may include, consist essentially of, or consist of the polymeric binder without wavelength-conversion material therein. At least a portion of the sidewall of at least one aperture may be coated with reflective coating having a reflectance greater than 80%, or even greater than 90%, to a wavelength of light emitted by at least one light-emitting element and/or the wavelength-conversion material. The mixed light may be substantially white light. The substantially white light may have a correlated color temperature in the range of 2000 K to 10,000 K. The maximum divergence of color uniformity of the substantially white light in terms of the radially averaged $\Delta u'v'$ deviation from the spatially weighted averaged chromaticity may be less than 0.01, or even less than 0.006. The divergence of color temperature of the substantially white light may vary, over an angular range of 0° to 80°, no more than 0.006 in terms of $\Delta u'v'$ deviation from a spatially weighted averaged chromaticity. The divergence of color temperature of the substantially white light may vary, over an angular range of 10° to 75°, no more than 0.005 in terms of $\Delta u'v'$ deviation from a spatially weighted averaged chromaticity. The variation in color temperature of the substantially white light emitted when each light-emitting element is individually energized may be less than 500 K, or even less than 250 K. The variation in color temperature of the substantially white light emitted when each light-emitting element is individually energized may be less than four MacAdam ellipses, less than three MacAdam ellipses, or even less than two MacAdam ellipses.

A thickness of the polymeric binder disposed above each of the plurality of light-emitting elements may be the same to within 5%. The light-emitting elements may be arranged in an array having substantially equal distances between light-emitting elements in at least a first direction. The array of light-emitting elements may be spaced apart at substantially equal distances between light-emitting elements in a second direction different from the first direction. A thickness of the polymeric binder above a first light-emitting element may be different from a thickness of the polymeric binder above a second light-emitting element different from the first light-emitting element. The polymeric binder may include, consist essentially of, or consist of a plurality of shaped regions. Each shaped region may be associated with at least one light-emitting element. Each shaped region may have a shape substantially identical to shapes of the other shaped regions. At least one shaped region may have a shape different from shapes of the other shaped regions.

In another aspect, embodiments of the invention feature an electronic device that includes or consists essentially of a polymeric binder, a semiconductor die suspended within the polymeric binder, and a frame. The semiconductor die has a (i) first face, (ii) a second face opposite the first face, and (iii) at least one sidewall spanning the first and second faces. The semiconductor die is a bare-die light-detecting element including or consisting essentially of at least one semiconductor layer configured to absorb light over a detected wavelength range and produce electrical charge therefrom. At least two spaced-apart contacts are disposed on the first face of the semiconductor die. Each contact (i) has a free terminal end not covered by the polymeric binder, and (ii) is available for electrical connection. The contacts may each be (e.g., electrically) connected to a different semiconductor layer of the semiconductor die, or the contacts may contact the same semiconductor layer. For example, if the semiconductor die includes or consists essentially of a Schottky diode, two contacts may make contact to the same semiconductor layer—one contact may form an ohmic contact with the layer, and the other contact may form a rectifying contact with the layer. The frame (i) has a bottom surface, (ii) has a top surface opposite the bottom surface, (iii) has a thickness spanning the top and bottom surfaces, and (iv) defines an aperture (a) extending fully through the thickness and (b) having a sidewall. The top surface of the frame surrounds the aperture. The sidewall of the aperture may not be perpendicular to the bottom surface of the frame. At least a portion of the polymeric binder is transparent to a wavelength of light within the detected wavelength range. The semiconductor die is disposed within the aperture of the frame such that (i) the second face of the semiconductor die is opposite the bottom surface of the frame, (ii) the sidewall of the aperture redirects light toward the semiconductor die, and (iii) the free terminal ends of the contacts of the semiconductor die are (a) not covered by the polymeric binder and (b) available for electrical connection.

Embodiments of the invention may include one or more of the following in any of a variety of combinations. The polymeric binder may contain therein a wavelength-conversion material for absorption of at least a portion of light incident on the electronic device and emission of converted light having a different wavelength (e.g., emitted at least partially toward the semiconductor die). Substantially all of the light absorbed by the light-detecting element may be converted light. The different wavelength of the converted light may be within the detected wavelength range. The wavelength-conversion material may include, consist essentially of, or consist of a phosphor and/or quantum dots. The polymeric binder may include, consist essentially of, or consist of a plurality of discrete regions. At least one of the discrete regions may include, consist essentially of, or consist of the polymeric binder without wavelength-conversion material therein. At least a portion of the sidewall of the aperture may be reflective to a wavelength of light within the detected wavelength range and/or light emitted by the wavelength-conversion material. The reflectance of the at least a portion of the sidewall of the aperture may vary with incident angle and/or incident wavelength. The at least a portion of the sidewall of the aperture may have a reflectance greater than 80%, or even greater than 90%, to a wavelength of light within the detected wavelength range and/or light emitted by the wavelength-conversion material. The at least a portion of the sidewall of the aperture may be a substantially diffuse reflector. The at least a portion of the sidewall of the aperture may be a substantially specular reflector. The at least a portion of the sidewall of the aperture may be coated with a reflective coating that is reflective to a wavelength of light within the detected wavelength range and/or light emitted by the wavelength-conversion material. The reflective coating may include, consist essentially of, or consist of aluminum, silver, gold, silicon dioxide, titanium dioxide, and/or silicon nitride. The reflective coating may include, consist essentially of, or consist of (i) a reflecting film and/or (ii) a plurality of particles.

The polymeric binder may include therein an absorbing material for absorption of at least a portion of the spectrum of light incident upon the electronic device (e.g., upon the semiconductor die and/or upon the polymeric binder). A wavelength of the portion of the spectrum of light absorbed by the absorbing material may be within the detected wavelength range. A wavelength of the portion of the spectrum of light absorbed by the absorbing material may be longer or shorter than the detected wavelength range. The polymeric binder may include, consist essentially of, or consist of a plurality of discrete regions, at least one of which may include, consist essentially of, or consist of the polymeric binder without the absorbing material therein. The polymeric binder may include therein a reflective material for reflection of at least a portion of the spectrum of light incident upon electronic device (e.g., upon the semiconductor die and/or upon the polymeric binder). A wavelength of the portion of the spectrum of light reflected by the reflective material may be within the detected wavelength range. The polymeric binder may include, consist essentially of, or consist of a plurality of discrete regions, at least one of which may include, consist essentially of, or consist of the polymeric binder without the reflective material therein. The semiconductor die may include, consist essentially of, or consist of a bare-die photovoltaic cell. The semiconductor die may include, consist essentially of, or consist of a bare-die photovoltaic cell, a bare-die infrared detector, a bare-die ultraviolet detector, a bare-die visible light detector, and/or a bare-die x-ray detector. The semiconductor die may include, consist essentially of, or consist of a p-n junction, a Schottky junction, a photoelectric detector, a photocell, a photoresistor, a photodiode, a phototransistor, a charge-coupled device, and/or a bare-die imaging chip.

The sidewall of the aperture (or one or more portions thereof) may be beveled or contoured. The top surface of the frame may be substantially parallel to the bottom surface of the frame. The polymeric binder may be contained within the thickness of the frame. The polymeric binder may extend beyond the thickness of the frame in a direction away from the bottom face of the frame. The polymeric binder may have a top surface disposed over the light-detecting element. The top surface of the polymeric binder may be curved or substantially flat. The top surface of the polymeric binder may be substantially parallel to the first face of the semiconductor die. At least portions of the contacts may protrude from the polymeric binder. Only a portion of each said sidewall of the semiconductor die may protrude from the polymeric binder, and a portion of each said sidewall of the semiconductor die may be covered with the polymeric binder. An exterior of the frame may define a (hollow) rectangular solid having approximately 90° corners between adjacent faces thereof. The polymeric binder may include, consist essentially of, or consist of silicone and/or epoxy. One or more additional semiconductor dies (e.g., one or more bare-die light-detecting elements, each of which may (but do not necessarily) detect light over a different wavelength range) may be suspended within the polymeric binder. The light-detecting element may include, consist essentially of, or consist of a semiconductor material that includes, consists essentially of, or consists of GaAs, AlAs, InAs, GaP, AlP, InP, ZnO, CdSe, CdTe, ZnTe, GaN, AlN, InN, silicon, germanium, and/or an alloy or mixture thereof. The light-detecting element may include, consist essentially of, or consist of one or more active semiconductor layers that are not disposed on a semiconductor substrate. A reflective layer may be disposed over or within at least a portion of the polymeric binder. An optical element (e.g., a lens) may be positioned to couple light to the semiconductor die.

A first conductive pad may be electrically coupled to one of the two spaced-apart contacts and/or disposed over at least a portion of the bottom surface of the frame. A second conductive pad may be (i) electrically coupled to the other of the two spaced-apart contacts, (ii) electrically insulated from the first conductive pad, and/or (iii) disposed over at least a portion of the bottom surface of the frame. The frame may include, consist essentially of, or consist of an electrically conductive material. An insulating layer may be disposed over or on at least a portion of a surface of the frame. One or more active and/or passive electronic components may be disposed over or on the bottom surface of the frame. The frame may include, consist essentially of, or consist of a semiconductor material, and one or more active and/or passive electronic components may be formed within or on the semiconductor material. The active and/or passive electronic component may include, consist essentially of, or consist of a Zener diode, a resistor, a capacitor, an inductor, an antenna, and/or a transistor. At least a portion of the sidewall of the aperture may be textured or patterned. The frame may have at least one exterior face spanning the thickness of the frame, and the polymeric binder may be disposed on at least a portion of at least one exterior face of the frame.

A second bare-die light-detecting element may be suspended within the polymeric binder. The second bare-die light-detecting element may have (i) a first face, (ii) a second face opposite the first face, (iii) at least one sidewall spanning the first and second faces, and (iv) disposed on the first face of the second light-detecting element, at least two spaced-apart contacts each having a free terminal end. The frame may define a second aperture fully through the thickness of the frame, and the second aperture may have a sidewall not perpendicular to the bottom surface of the frame. The second light-detecting element may be disposed within the second aperture of the frame such that (i) the second face of the second light-detecting element is opposite the bottom surface of the frame, (ii) the sidewall of the second aperture redirects light toward the second light-detecting element, and (iii) the free terminal ends of the contacts of the second light-detecting element are (a) not covered by the polymeric binder and (b) available for electrical connection. The detected wavelength range of the bare-die light-detecting element may be different from a detected wavelength range of second bare-die light-detecting element. The second bare-die light-detecting element may include, consist essentially of, or consist of at least one semiconductor layer configured to absorb light over the detected wavelength range of second bare-die light-detecting element. The frame may include, consist essentially of, or consist of a semiconductor, a plastic, a polymer, a glass, a ceramic, and/or a metal. The frame may include, consist essentially of, or consist of silicon and/or gallium arsenide.

At least a portion of the sidewall of the aperture (i.e., all or a portion of the frame material itself and/or a reflective coating thereon) may be reflective to a wavelength of light within the detected wavelength range. The reflectance of the at least a portion of the sidewall of the aperture may vary with incident angle and/or incident wavelength. The at least a portion of the sidewall of the aperture may have a reflectance greater than 80%, or even greater than 90%, to a wavelength of light within the detected wavelength range. The at least a portion of the sidewall of the aperture may be a substantially diffuse reflector. The at least a portion of the sidewall of the aperture may be a substantially specular reflector. The at least a portion of the sidewall of the aperture may be coated with a reflective coating that is reflective to a wavelength of light within the detected wavelength range. The reflective coating may include, consist essentially of, or consist of aluminum, silver, gold, silicon dioxide, titanium dioxide, and/or silicon nitride. The reflective coating may include, consist essentially of, or consist of (i) a reflecting film and/or (ii) a plurality of particles. The frame may be substantially transparent to a wavelength of light within the detected wavelength range. A reflective layer may be disposed on at least a portion of a surface (e.g., an exterior surface facing away from the aperture, the bottom surface, the top surface, and/or all or part of the sidewall of the aperture) of the frame.

In another aspect, embodiments of the invention feature an electronic device that includes or consists essentially of a polymeric binder, a semiconductor die suspended within the polymeric binder, and a frame. The semiconductor die has (i) a first face, (ii) a second face opposite the first face, (iii) at least one sidewall spanning the first and second faces, and (iv) disposed on the first face of the semiconductor die, at least two spaced-apart contacts each having a free terminal end. The frame (i) has a bottom surface, (ii) has a top surface opposite the bottom surface, (iii) has a thickness spanning the top and bottom surfaces, and (iv) defines an aperture (a) extending fully through the thickness and (b) having a sidewall. The top surface of the frame surrounds the aperture. The sidewall of the aperture may not be perpendicular to the bottom surface of the frame. The semiconductor die is disposed within the aperture of the frame such that (i) the second face of the semiconductor die is opposite the bottom surface of the frame, and (ii) the free terminal ends of the contacts of the semiconductor die are (a) not covered by the polymeric binder and (b) available for electrical connection.

In another aspect, embodiments of the invention feature a composite wafer including or consisting essentially of a frame wafer, a polymeric binder, and a plurality of semiconductor dies suspended in the polymeric binder. The frame wafer (i) has a bottom surface, (ii) has a top surface opposite the bottom surface, (iii) has a thickness spanning the top and bottom surfaces, and (iv) defines a plurality of apertures (a) each extending fully through the thickness and (b) each having a sidewall. The top surface of the frame wafer surrounds each aperture. The sidewall of at least one of the apertures may not be perpendicular to the bottom surface of the frame wafer. The polymeric binder is disposed within at least a portion of each of the plurality of apertures. Each semiconductor die has (i) a first face, (ii) a second face opposite the first face, (iii) at least one sidewall spanning the first and second faces, and (iv) disposed on the first face of the semiconductor die, at least two spaced-apart contacts each having a free terminal end. The second face of each semiconductor die is opposite the bottom surface of the frame, and the free terminal ends of the contacts of each semiconductor die are (a) not covered by the polymeric binder and (b) available for electrical connection.

In yet another aspect, embodiments of the invention feature an illumination device that includes or consists essentially of a polymeric binder, a bare-die light-emitting element suspended within the polymeric binder, and a frame. The bare-die light-emitting element has (i) a first face, (ii) a second face opposite the first face, (iii) at least one sidewall spanning the first and second faces, and (iv) disposed on the first face of the light-emitting element, at least two spaced-apart contacts each having a free terminal end. The frame (i) has a bottom surface, (ii) has a top surface opposite the bottom surface, (iii) has a thickness spanning the top and bottom surfaces, and (iv) defines an aperture (a) extending fully through the thickness and (b) having a sidewall. The top surface of the frame surrounds the aperture. The sidewall of the aperture may not be perpendicular to the bottom surface of the frame. At least a portion of the frame is substantially transparent to a wavelength of light emitted by the light-emitting element. The light-emitting element is disposed within the aperture of the frame such that (i) the second face of the light-emitting element is opposite the bottom surface of the frame, and (ii) the free terminal ends of the contacts of the light-emitting element are (a) not covered by the polymeric binder and (b) available for electrical connection.

Embodiments of the invention may include one or more of the following in any of a variety of combinations. The sidewall of the aperture may redirect light emitted from the light-emitting element. An index of refraction of the frame may be substantially the same as an index of refraction of the polymeric binder. A reflective layer may be disposed on at least a portion of a surface of the frame (e.g., an exterior surface facing away from the aperture, the bottom surface, the top surface, and/or all or part of the sidewall of the aperture). The reflective layer may be a substantially diffuse reflector. The reflective layer may be a substantially specular reflector. The reflective layer may include, consist essentially of, or consist of aluminum, silver, gold, silicon dioxide, titanium dioxide, and/or silicon nitride. The reflective layer may include, consist essentially of, or consist of (i) a reflecting film and/or (ii) a plurality of particles. The reflective layer may have a reflectance greater than 80%, or even greater than 90%, to a wavelength of light emitted by the light-emitting element. At least a portion of the reflective layer may have a reflectance that varies with incident angle and/or incident wavelength. The top surface of the frame may be substantially parallel to the bottom surface of the frame. The polymeric binder may be contained within the thickness of the frame. The polymeric binder may extend beyond the thickness of the frame in a direction away from the bottom face of the frame. The polymeric binder may have a top surface disposed over the second face the light-emitting element. All or part of the top surface of the polymeric binder may be curved or substantially flat. The top surface of the polymeric binder may be substantially parallel to the first face of the light-emitting element. At least portions of the contacts may protrude from the polymeric binder. Only a portion of each said sidewall of the light-emitting element may protrude from the polymeric binder, and a portion of each said sidewall of the light-emitting element may be covered with the polymeric binder.

An exterior of the frame may define a rectangular solid (i.e., a hollow rectangular solid) having approximately 90° corners between adjacent faces thereof. The polymeric binder may include, consist essentially of, or consist of silicone and/or epoxy. One or more additional bare-die light-emitting elements may be at least partially suspended within the polymeric binder. The light-emitting element may include, consist essentially of, or consist of a semiconductor material including, consisting essentially of, or consisting of GaAs, AlAs, InAs, GaP, AlP, InP, ZnO, CdSe, CdTe, ZnTe, GaN, AlN, InN, silicon, germanium, and/or an alloy or mixture thereof. The light-emitting element may include, consist essentially of, or consist of a light-emitting diode. The light-emitting element may include, consist essentially of, or consist of one or more active semiconductor layers that are not disposed on a semiconductor substrate. A reflective layer may be disposed over and/or within at least a portion of the polymeric binder. An optical element may be positioned to receive light from the light-emitting element. A first conductive pad may be electrically coupled to one of the two spaced-apart contacts and/or disposed over at least a portion of the bottom surface of the frame. A second conductive pad may be (i) electrically coupled to the other of the two spaced-apart contacts, (ii) electrically insulated from the first conductive pad, and/or (iii) disposed over at least a portion of the bottom surface of the frame. The frame may include, consist essentially of, or consist of an electrically conductive material. An insulating layer may be disposed over at least a portion of the surface of the frame.

One or more active and/or passive electronic components may be disposed over or on the bottom surface of the frame. The frame may include, consist essentially of, or consist of a semiconductor material, and one or more active and/or passive electronic components (e.g., a Zener diode, a resistor, a capacitor, an inductor, an antenna, and/or a transistor) may be disposed within or on the semiconductor material. At least a portion of the sidewall of the aperture may be textured or patterned. The frame may have at least one exterior face spanning the thickness, and a portion of the polymeric binder may be disposed on at least a portion of at least one exterior face of the frame. A second bare-die light-emitting element may be suspended within the polymeric binder. The second bare-die light-emitting element may have (i) a first face, (ii) a second face opposite the first face, (iii) at least one sidewall spanning the first and second faces, and (iv) disposed on the first face of the light-emitting element, at least two spaced-apart contacts each having a free terminal end. The frame may define a second aperture fully through the thickness of the frame, and the second aperture may have a sidewall not perpendicular to the bottom surface of the frame. The second light-emitting element may be disposed within the second aperture of the frame such that (i) the second face of the second light-emitting element is opposite the bottom surface of the frame, and (ii) the free terminal ends of the contacts of the second light-emitting element are (a) not covered by the polymeric binder and (b) available for electrical connection. A wavelength of light emitted by the second light-emitting element may be different from a wavelength of light emitted by the light-emitting element.

The frame may include, consist essentially of, or consist of a semiconductor, a plastic, a polymer, a glass, a ceramic, and/or a metal. The frame may include, consist essentially of, or consist of silicon and/or gallium arsenide. At least a portion of the sidewall of the aperture may be reflective to a wavelength of light emitted by the light-emitting element. The reflectance of the at least a portion of the sidewall of the aperture may vary with incident angle and/or incident wavelength. The at least a portion of the sidewall of the aperture may have a reflectance greater than 80%, or even greater than 90%, to a wavelength of light emitted by the light-emitting element. The at least a portion of the sidewall of the aperture may be a substantially diffuse reflector. The at least a portion of the sidewall of the aperture may be a substantially specular reflector. The at least a portion of the sidewall of the aperture may include, consist essentially of, or consist of aluminum, silver, gold, silicon dioxide, titanium dioxide, and/or silicon nitride. The at least a portion of the sidewall of the aperture may be coated with a reflective coating that is reflective to a wavelength of light emitted by the light-emitting element. The reflective coating may include, consist essentially of, or consist of (i) a reflecting film and/or (ii) a plurality of particles.

At least a portion of the polymeric binder may be transparent to a wavelength of light emitted by the light-emitting element. The polymeric binder may contain therein a wavelength-conversion material for absorption of at least a portion of light emitted from the light-emitting element and emission of converted light having a different wavelength, and converted light and unconverted light emitted by the light-emitting element may combine to form mixed light. The wavelength-conversion material may include, consist essentially of, or consist of a phosphor and/or quantum dots. The mixed light may be substantially white light. The substantially white light may have a correlated color temperature in the range of 2000 K to 10,000 K. A reflective layer may be disposed on at least a portion of a surface of the frame (e.g., an exterior surface facing away from the aperture, the bottom surface, the top surface, and/or all or part of the sidewall of the aperture). The reflective layer may be a substantially diffuse reflector. The reflective layer may be a substantially specular reflector. The reflective layer may include, consist essentially of, or consist of aluminum, silver, gold, silicon dioxide, titanium dioxide, and/or silicon nitride. The reflective layer may include, consist essentially of, or consist of (i) a reflecting film and/or (ii) a plurality of particles. The reflective layer may have a reflectance greater than 80%, or even greater than 90%, to a wavelength of light emitted by the light-emitting element. At least a portion of the reflective layer may have a reflectance that varies with incident angle and/or incident wavelength.

The maximum divergence of color uniformity of the substantially white light in terms of the radially averaged Δu'v' deviation from a spatially weighted average chromaticity may be less than 0.01, or even less than 0.006. The polymeric binder may include, consist essentially of, or consist of a plurality of discrete regions. At least one of the discrete regions may include, consist essentially of, or consist of the polymeric binder without wavelength-conversion material therein. At least a portion of the sidewall of the aperture may be coated with reflective coating having a reflectance greater than 80%, or even greater than 90%, to a wavelength of light emitted by the light-emitting element and/or the wavelength-conversion material.

At least a portion of the polymeric binder may be transparent to a wavelength of light emitted by the light-emitting element. The polymeric binder may contain therein light-scattering material that scatters a wavelength of light emitted by the light-emitting element. The divergence of color temperature of the substantially white light emitted from the device may vary, over an angular range of 0° to 80°, no more than 0.006 in terms of Δu'v' deviation from a spatially weighted averaged chromaticity. The divergence of color temperature of the substantially white light emitted from the device may vary, over an angular range of 10° to 75°, no more than 0.005 in terms of Δu'v' deviation from a spatially weighted averaged chromaticity. The sidewall of the aperture may form an angle with the bottom surface of the frame, the angle having a value in the range of 15° to 60°. The polymeric binder may extend above the frame in a direction away from the bottom surface of the frame. The sum of the thickness of the frame and the thickness of the polymeric binder extending above the frame may be in the range of 0.4 mm to 1.8 mm. The ratio of the sum of the thickness of the frame and the thickness of the polymeric binder extending above the frame to a lateral dimension (e.g., length, width, or diameter) of the frame may be in the range of 0.4 to 1.8. The ratio of a lateral dimension of the frame to a lateral dimension of the light-emitting element may be in the range of 4.1 to 15.9. The ratio of the sum of the thickness of the frame and the thickness of the polymeric binder extending above the frame to a lateral dimension of the light-emitting element may be in the range of 0.61 to 2.44. The sidewall of the aperture may form an angle with the bottom surface of the frame, the angle having a value in the range of 15° to 50°, the polymeric binder may extend above the frame in a direction away from the bottom surface of the frame, and the sum of the thickness of the frame and the thickness of the phosphor extending above the frame may be in the range of 0.4 mm to 1.8 mm.

As utilized herein, the term "light-emitting element" (LEE) refers to any device that emits electromagnetic radiation within a wavelength regime of interest, for example, visible, infrared or ultraviolet regime, when activated, by applying a potential difference across the device or passing a current through the device. Examples of LEEs include solid-state, organic, polymer, phosphor-coated or high-flux LEDs, microLEDs (described below), laser diodes or other similar devices as would be readily understood. The emitted radiation of a LEE may be visible, such as red, blue or green, or invisible, such as infrared or ultraviolet. A LEE may produce radiation of a spread of wavelengths. A LEE may feature a phosphorescent or fluorescent material for converting a portion of its emissions from one set of wavelengths to another. A LEE may include multiple LEEs, each emitting essentially the same or different wavelengths. In some embodiments, a LEE is an LED that may feature a reflector over all or a portion of its surface upon which electrical contacts are positioned. The reflector may also be formed over all or a portion of the contacts themselves. In some embodiments, the contacts are themselves reflective.

An LEE may be of any size. In some embodiments, an LEE has one lateral dimension less than 500 μm, while in other embodiments an LEE has one lateral dimension greater than 500 μm. Exemplary sizes of a relatively small LEE may include about 175 μm by about 250 μm, about 250 μm by about 400 μm, about 250 μm by about 300 μm, or about 225 μm by about 175 μm. Exemplary sizes of a relatively large LEE may include about 1000 μm by about 1000 μm, about 500 μm by about 500 μm, about 250 μm by about 600 μm, or about 1500 μm by about 1500 μm. In some embodiments, an LEE includes or consists essentially of a small LED die, also referred to as a "microLED." A microLED generally has one lateral dimension less than about 300 μm. In some embodiments, the LEE has one lateral dimension less than about 200 μm or even less than about 100 μm. For example, a microLED may have a size of about 225 μm by about 175 μm or about 150 μm by about 100 μm or about 150 μm by about 50 μm. In some embodiments, the surface area of the top surface of a microLED is less than 50,000 μm$^2$ or less than 10,000 μm$^2$. The size of the LEE is not a limitation of the present invention, and in other embodiments the LEE may be relatively larger, e.g., the LEE may have one lateral dimension on the order of at least about 1000 μm or at least about 3000 μm.

As used herein, "phosphor" refers to any material that shifts the wavelengths of light irradiating it and/or that is fluorescent and/or phosphorescent. As used herein, a "phosphor" may refer to only the powder or particles (of one or more different types) or to the powder or particles with the binder, and in some circumstances may refer to region(s) containing only the binder (for example, in a remote-phosphor configuration in which the phosphor is spaced away from the LEE). The terms "wavelength-conversion material" and "light-conversion material" are utilized interchangeably with "phosphor" herein. The light-conversion material is incorporated to shift one or more wavelengths of at least a portion of the light emitted by LEEs to other (i.e., different) desired wavelengths (which are then emitted from the larger device alone or color-mixed with another portion of the original light emitted by the LEE). A light-conversion material may include or consist essentially of phosphor powders, quantum dots or the like within a transparent binder. Phosphors are typically available in the form of powders or particles, and in such case may be mixed in binders. An exemplary binder is silicone, i.e., polyorganosiloxane, which is most commonly polydimethylsiloxane (PDMS). Phosphors vary in composition, and may include lutetium aluminum garnet (LuAG or GAL), yttrium aluminum garnet (YAG) or other phosphors known in the art. GAL, LuAG, YAG and other materials may be doped with various materials including for example Ce, Eu, etc. The specific components and/or formulation of the phosphor and/or matrix material are not limitations of the present invention.

The binder may also be referred to as an encapsulant or a matrix material. In one embodiment, the binder includes or consists essentially of a transparent material, for example silicone-based materials or epoxy, having an index of refraction greater than 1.35. In one embodiment the binder and/or phosphor includes or consists essentially of other materials, for example fumed silica or alumina, to achieve other properties, for example to scatter light, or to reduce settling of the powder in the binder. An example of the binder material includes materials from the ASP series of silicone phenyls manufactured by Shin Etsu, or the Sylgard series manufactured by Dow Corning. In one embodiment the binder may be glass or ceramic material, or a low temperature glass or ceramic material.

Herein, two components such as light-emitting elements and/or optical elements being "aligned" or "associated" with each other may refer to such components being mechanically and/or optically aligned. By "mechanically aligned" is meant coaxial or situated along a parallel axis. By "optically aligned" is meant that at least some light (or other electromagnetic signal) emitted by or passing through one component passes through and/or is emitted by the other.

Various embodiments of the present invention also incorporate features, and/or are fabricated at least in part in accordance with techniques, described in U.S. patent application Ser. No. 13/748,864, filed Jan. 24, 2013 (the '864 application), U.S. patent application Ser. No. 13/949,543, filed Jul. 24, 2013 (the '543 application), U.S. patent application Ser. No. 13/828,498, filed Mar. 14, 2013, U.S. patent application Ser. No. 13/770,432, filed Feb. 19, 2013, and U.S. patent application Ser. No. 14/166,329, filed Jan. 28, 2014, the entire disclosure of each of which is incorporated by reference herein.

These and other objects, along with advantages and features of the invention, will become more apparent through reference to the following description, the accompanying drawings, and the claims. Furthermore, it is to be understood that the features of the various embodiments described herein are not mutually exclusive and may exist in various combinations and permutations. Reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. The term "light" broadly connotes any wavelength or wavelength band in the electromagnetic spectrum, including, without limitation, visible light, ultraviolet radiation, infrared, mid-infrared, and far infrared radiation. Similarly, photometric terms such as "illuminance," "luminous flux," and "luminous intensity" extend to and include their radiometric equivalents, such as "irradiance," "radiant flux," and "radiant intensity." Light produced by light-emitting devices (e.g., frame dies or composite wafers) in accordance with embodiments of the present invention may be white or any other color that is produced by one or more light emitters and/or one or more light-conversion materials. As used herein, the terms "substantially," "approximately," and "about" mean ±10%, and in some embodiments, ±5%. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 1AA is a cross-sectional view of a frame die electrically coupled to conductive traces in accordance with various embodiments of the invention;

FIGS. 3A, 3B, and 4A-4K are cross-sectional views of frame dies in accordance with various embodiments of the invention;

FIG. 6 is a flow chart of a process for forming a frame die in accordance with various embodiments of the invention;

FIGS. 7A-7G are cross-sectional views of various steps utilized to fabricate frame dies in accordance with various embodiments of the invention;

FIG. 7H is a cross-sectional view of a step utilized within an alternate process of fabricating frame dies in accordance with various embodiments of the invention;

FIG. 8A is a cross-sectional view of the frame wafer of FIG. 8B;

FIG. 8C is a plan view of a frame wafer in accordance with various embodiments of the invention;

FIGS. 11A-11C are cross-sectional views of steps for the fabrication of a frame wafer in accordance with various embodiments of the invention;

FIG. 11E is a plan view of the frame wafer of FIG. 11D;

FIGS. 12A-12D are cross-sectional views of steps for the singulation of light-emitting elements for the fabrication of frame dies in accordance with various embodiments of the invention;

FIGS. 13B-13I are cross-sectional views of frame dies in accordance with various embodiments of the invention;

FIG. 20B is a graph of the maximum divergence of color uniformity in terms of the radially averaged Δu'v' deviation from the spatially weighted average chromaticity over a view angle of about 0° to about 70° for the structures investigated in FIG. 20A;

FIG. 25A is a schematic diagram of a frame die having a light-emitting element coupled to another component in accordance with various embodiments of the invention;

FIG. 25B is an electrical schematic of a frame die having a light-emitting element coupled to a Zener diode in accordance with various embodiments of the invention;

FIG. 28E is a cross-sectional view of an optic that may be utilized with frame dies in accordance with various embodiments of the invention;

FIGS. 31F and 31G are plan views of frame dies in accordance with various embodiments of the invention.

DETAILED DESCRIPTION

Embodiments of the present invention provide a new approach to integration of phosphor and light-emitting elements, such as LED dies, that addresses a number of the deficiencies and difficulties present in the current manufacture of phosphor-converted LEDs. Embodiments of the present invention provide novel structures and techniques for producing such devices to achieve relatively high efficiency and relatively low cost. Advantageously, the phosphor may be integrated with a light-emitting element (LEE) (e.g., a light-emitting die) before it is mounted on a circuit board or placed into an intermediate-level package, for example as described in the '864 application and in the '543 application.

Figure 1A:
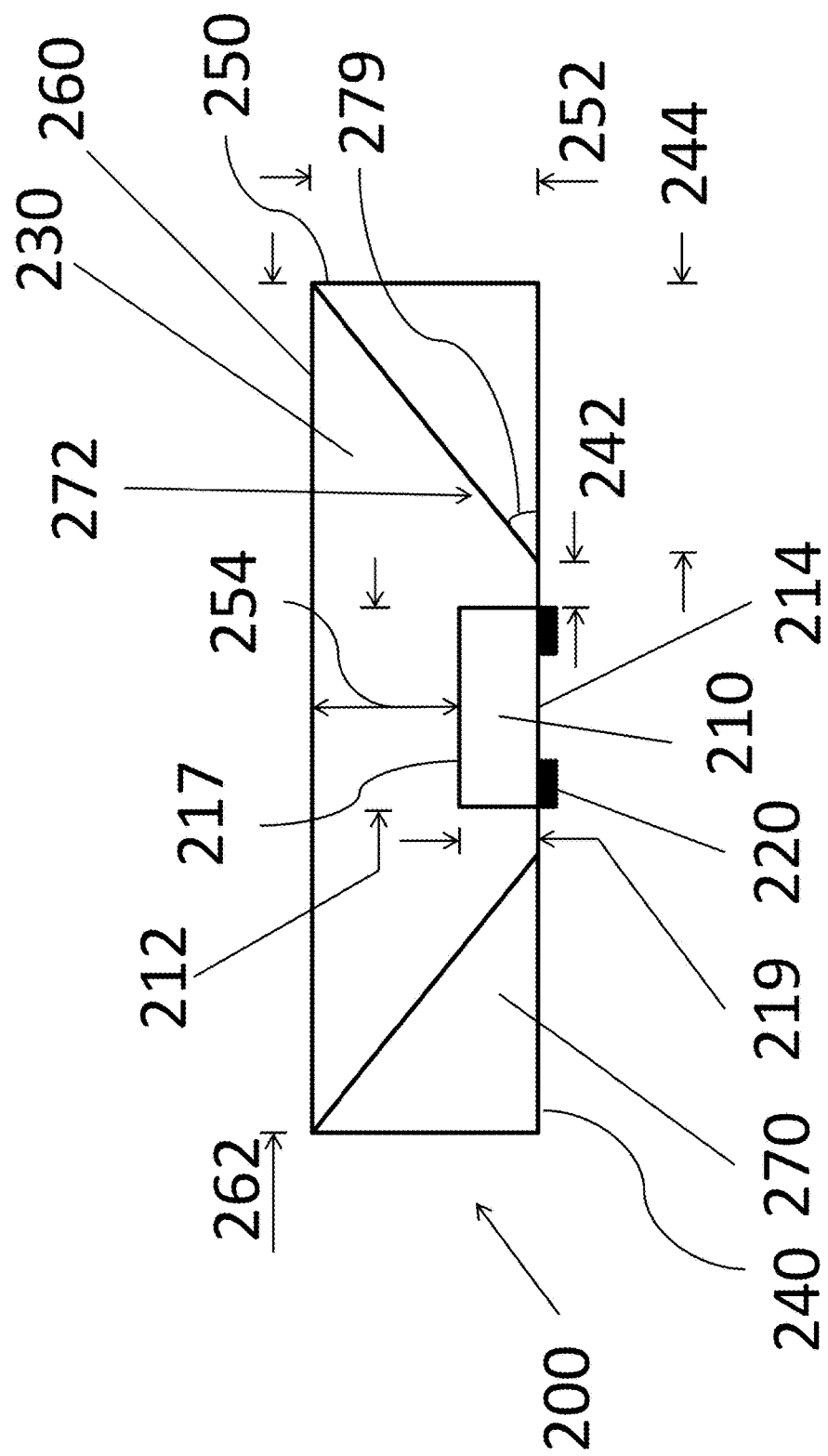
FIG. 1A is a cross-sectional view of a frame die in accordance with various embodiments of the invention.

FIG. 1A shows a cross-sectional schematic of one exemplary embodiment of the present invention. Structure 200, also referred to herein as a frame die, includes one or more LEEs 210, each of which features at least one contact 220. As shown, LEE 210 is partially surrounded by a phosphor 230, which is in turn supported by and optionally partially surrounded by a support structure (or "frame") 270. At least a portion of each contact 220 is typically not covered by phosphor 230. In the configuration shown in FIG. 1A, LEE 210 features two contacts 220 that are situated on the same face or side 214 of LEE 210. As shown, each of the contacts 220 preferably has a free terminal end that is not covered by the phosphor 230 and that is available for electrical connection. Herein, "available for electrical connection" means the contact has sufficient free area to permit attachment to, e.g., a conductive trace, a circuit board, etc., and "free" means lacking any electrical connection (and in preferred embodiments, any mechanical connection) thereto. In some embodiments of the present invention, phosphor 230 is partially bounded by frame 270, which in some embodiments includes a reflecting face 272 that is reflective to a wavelength of light emitted by LEE 210, phosphor 230, or both. A key aspect of various embodiments of the invention is that frame 270 surrounds LEE 210 but permits access to contacts 220 for attachment, for example to a circuit board or intermediate package, thus eliminating the need for a second die-attach step internal to frame die 200. Frame 270 advantageously provides a relatively highly reflecting surface 272 to achieve high luminous efficacy, structural support for phosphor 230, and access to contacts 220, resulting in package that provides high efficiency with a relatively low cost of materials and manufacture.

In some embodiments, a surface 260 of phosphor 230 is parallel or substantially parallel to a surface 217 of LEE 210. In some embodiments, surface 260 of phosphor 230 is parallel or substantially parallel to surface 214 and/or surface 217 of LEE 210. A thickness 254 of phosphor 230 over LEE 210 is shown in FIG. 1A as the same or substantially the same over the entirety of LEE 210; however, this is not a limitation of the present invention, and in other embodiments thickness 254 of phosphor 230 over LEE 210 varies. FIG. 1A shows surface 260 of phosphor 230 as flat or substantially flat; however, this is not a limitation of the present invention, and in other embodiments surface 260 is curved, roughened, patterned, or textured in a regular, periodic, or random pattern. In some embodiments, phosphor 230 has, at least in part, a smooth, substantially continuous shape. In some embodiments, shaping and/or patterning or texturing of surface 260 is achieved during the formation or molding process, while in other embodiments shaping and/or patterning or texturing is performed after the phosphor is molded or after it is cured or partially cured. (As discussed herein, "phosphor" may refer to a binder or matrix material alone or a mixture of the binder and wavelength-conversion material.)

Figure 1B:
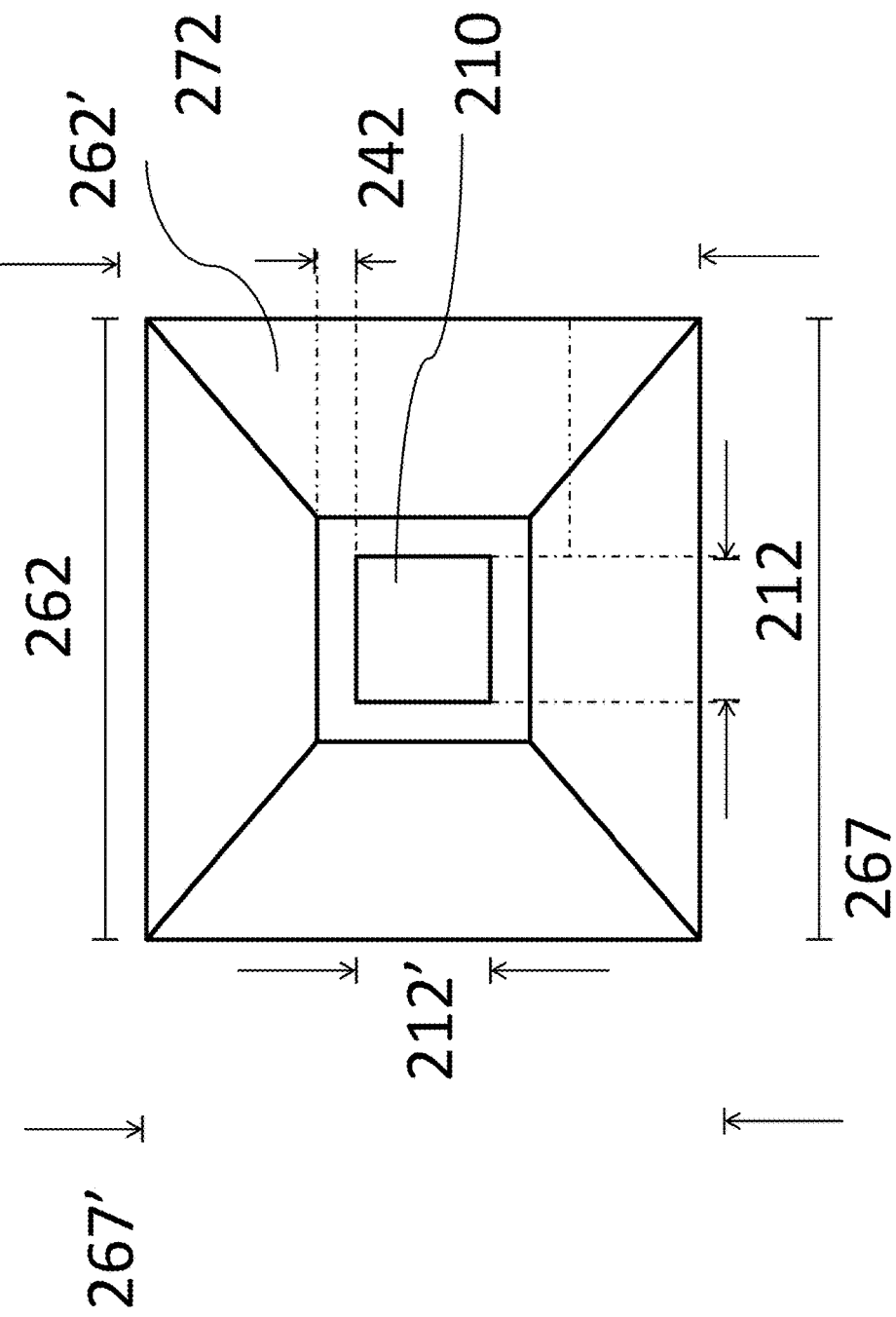
FIG. 1B is a top view of the frame die of FIG. 1A.

FIG. 1B shows a view of the top of the structure shown in FIG. 1A, and FIG. 1C shows a view of the bottom of the structure shown in FIG. 1A. LEE 210 in FIG. 1B is shown as having a square cross-sectional shape; however, this is not a limitation of the present invention, and in other embodiments LEE 210 is rectangular, hexagonal, circular, triangular, or has any arbitrary shape and/or may have sidewalls forming any angle with respect to surface 214 of LEE 210. In some embodiments, LEE 210 may have a rectangular shape, with one side having a length 212 and the orthogonal side having a length 212'. In some embodiments, LEE 210 may have a square shape, in which case length 212 is the same as or substantially the same as length 212'.

LEE 210 may be spaced apart from the edge of frame 270 by a gap 242. In some embodiments, it is desirable to minimize gap 242 in order to reduce the amount of light emitted out the back of frame die 200 and to achieve high efficiency; in such embodiments, gap 242 may have a value less than about 150 μm, less than about 100 μm, less than 50 μm, less than 25 μm, less than 10 μm, or even less than 5 μm. In some embodiments, gap 242 is the same or substantially the same on all sides of LEE 210; however, this is not a limitation of the present invention, and in other embodiments gap 242 may be different along different portions of LEE 210. In other embodiments, discussed herein, additional features may be incorporated into frame die 200 to reduce light loss out the back of frame die 200, and in such embodiments reducing the extent of gap 242 may have relatively less impact on efficiency.

Figure 1D:
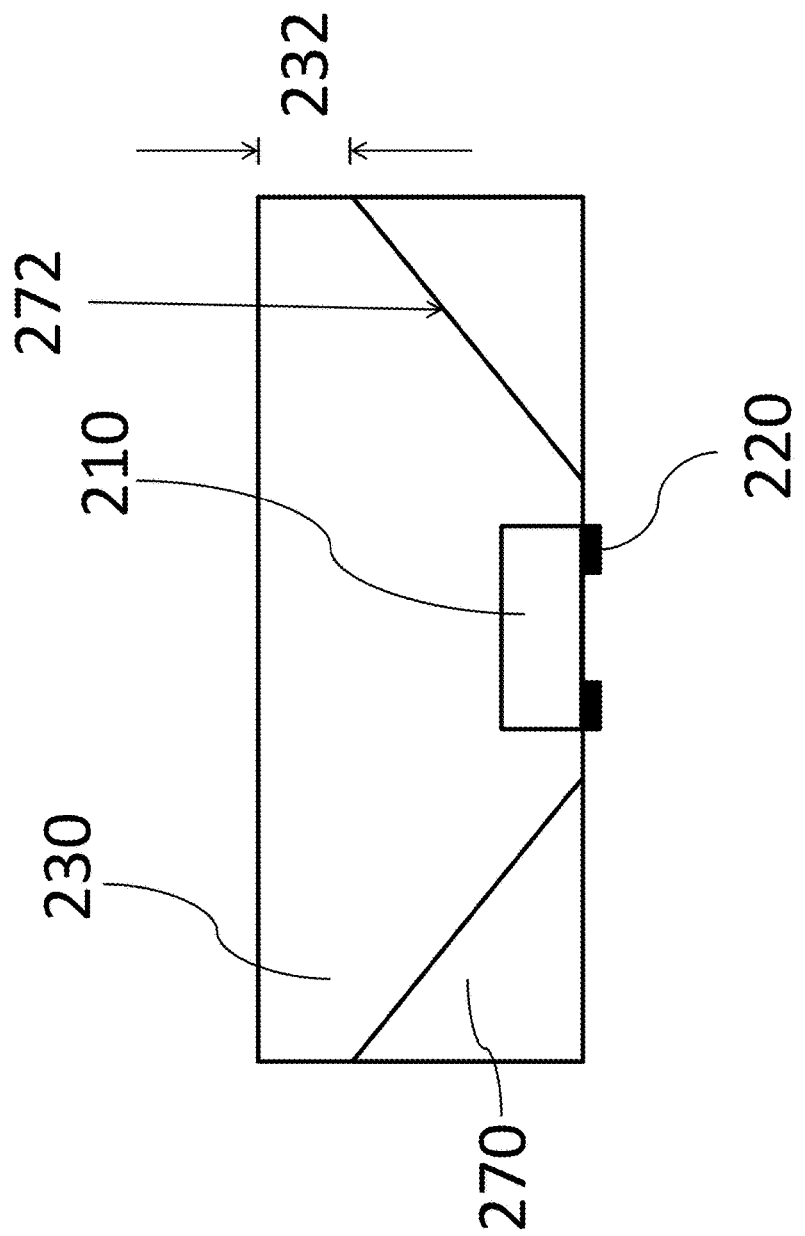
FIGS. 1D-1Z are cross-sectional views of frame dies in accordance with various embodiments of the invention.

In some embodiments, frame 270 has a height 252 that is greater than a height 219 of LEE 210, as shown in FIG. 1A, resulting in a thickness 254 of phosphor over LEE 210. In other embodiments, frame 270 may have a height 252 that is less than height 219 of LEE 210 or a height 252 that is substantially the same as LEE 210 height 219. In the embodiment shown in FIG. 1A, the top surface 260 of phosphor 230 is at the same or substantially the same as the top of frame 270; however, this is not a limitation of the present invention, and in other embodiments phosphor 230 may extend beyond the top of frame 270, for example as shown in FIG. 1D, or may be recessed below the top of frame 270. In FIG. 1D, the top surface of phosphor 230 extends a distance 232 above frame 270. In some embodiments, frame 270 has a height 252 in the range of about 1 μm to about 3000 μm, or in the range of about 25 μm to about 500 μm; however, the height of frame 270 is not a limitation of the present invention. In some embodiments, a height 232 of phosphor 230 extending over frame 270 may be less than about 3 mm, less than about 1 mm, less than about 0.5 mm, less than about 0.25 mm, or less than about 0.1 mm. While FIG. 1D shows phosphor 230 has having the same or substantially the same thickness within distance 232 above frame 270, this is not a limitation of the present invention, and in other embodiments the thickness within distance 232 may vary above LEE 210 and frame 270.

In some embodiments of the present invention, the value of frame dimension (or "frame width") 244 may be in the range of about 25 μm to about 5 mm; however, as will be discussed, other embodiments may have different dimensions 244. In some embodiments of the present invention, LEE 210 has a height 219 in the range of about 1 μm to about 1000 μm. In some embodiments, all or a portion of the substrate of LEE 210 may be removed, and LEE 210 may have a height 219 in the range of about 1 μm to about 25 μm. In some embodiments, the height 254 of phosphor 230 above LEE 210 is in the range of about 25 μm to about 1000 μm. The ranges for various dimensions given herein are for certain embodiments and as will be understood, other dimensions may be employed for different configurations, as described herein.

In some embodiments, the cross-sectional profile of frame 270 may be square or rectangular, i.e., in some embodiments dimension 244 or frame width 262 may be the same or substantially the same as height 252, while in other embodiments dimension 244 and/or frame width 262 may be greater than height 252, and in yet other embodiments dimension 244 and/or frame width 262 may be less than height 252. In some embodiments, surface 272 forms an angle 279 with the base of frame 270.

Figure 1E:
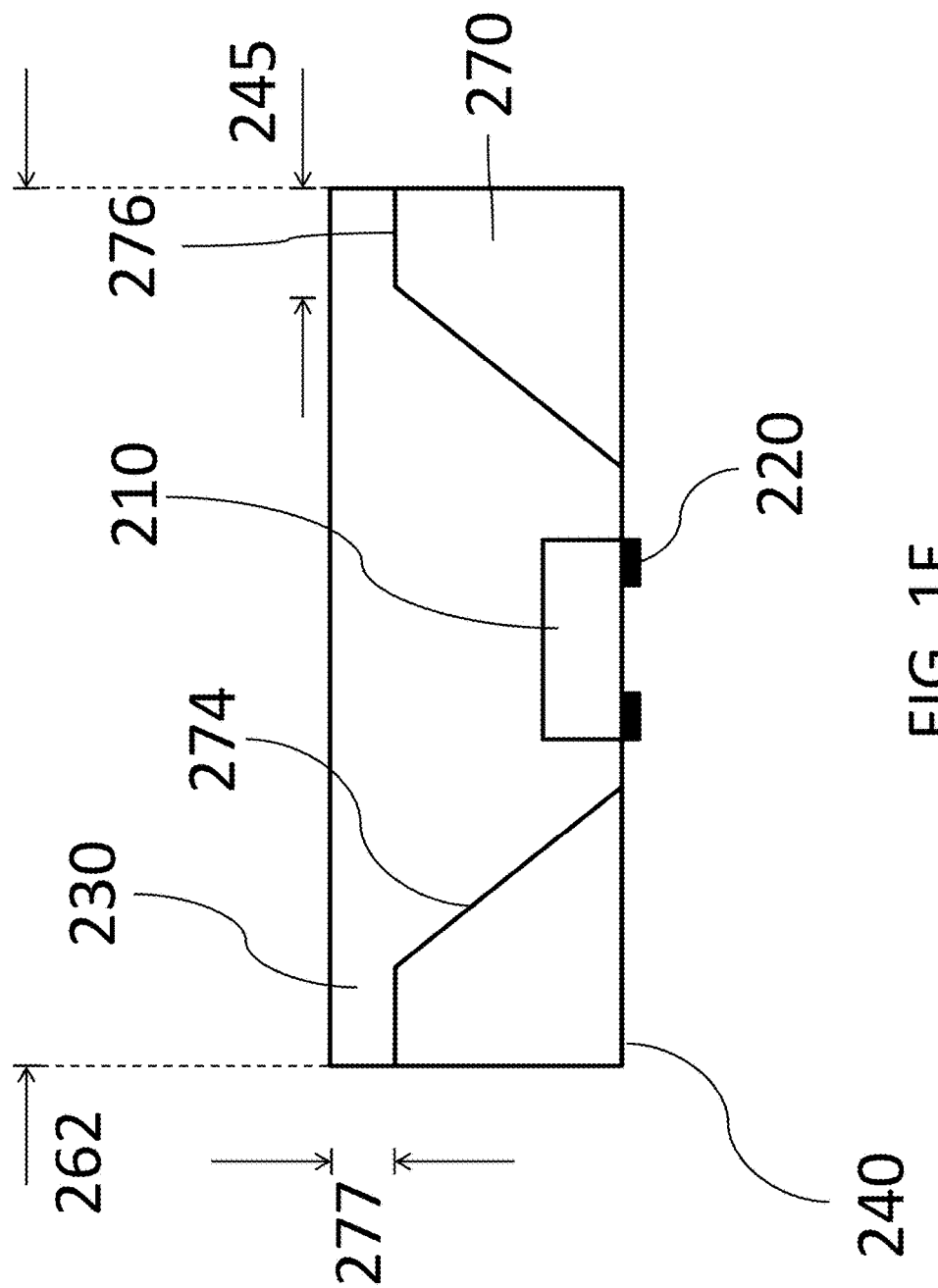
FIG. 1C is a bottom view of the frame die of FIG. 1A.

Frame 270 typically has a top opening and a bottom opening, for example a top opening and a bottom opening of the aperture that extends through the frame. In some embodiments, the top and bottom openings may have the same or substantially the same shape. In some embodiments, as shown in FIGS. 1A-1C, the top opening is rectangular having a width and a length of 267 and 267' respectively, and the bottom opening is rectangular and has a width and a length of 265 and 265' respectively. In some embodiments, top opening width 267 and length 267' may essentially the same as frame width 262 and length 262' as shown in FIG. 1B, while in other embodiments the top opening width may be different from the frame width, for example as shown in FIG. 1E. In some embodiments, the top opening is square, in which case dimensions 267 and 267' are the same or substantially the same. In some embodiments, the bottom opening is square, in which case dimensions 265 and 265' are the same or substantially the same. In some embodiments, the top opening and the bottom opening have substantially the same shape (but with the top opening being larger than the bottom opening), with dimensions 267, 267', 265, and 265' scaled appropriately.

Figure 2A:
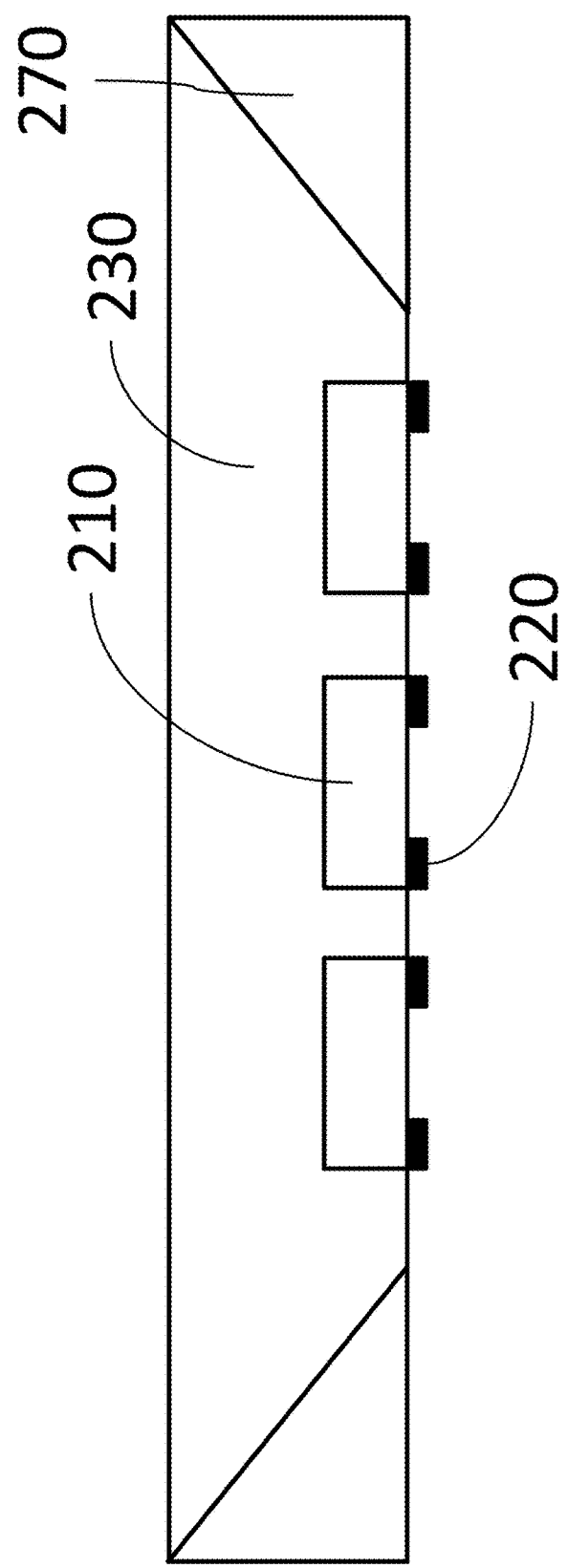
FIG. 2A is a cross-sectional view of a frame die incorporating multiple light-emitting elements in accordance with various embodiments of the invention.
Figure 2B:
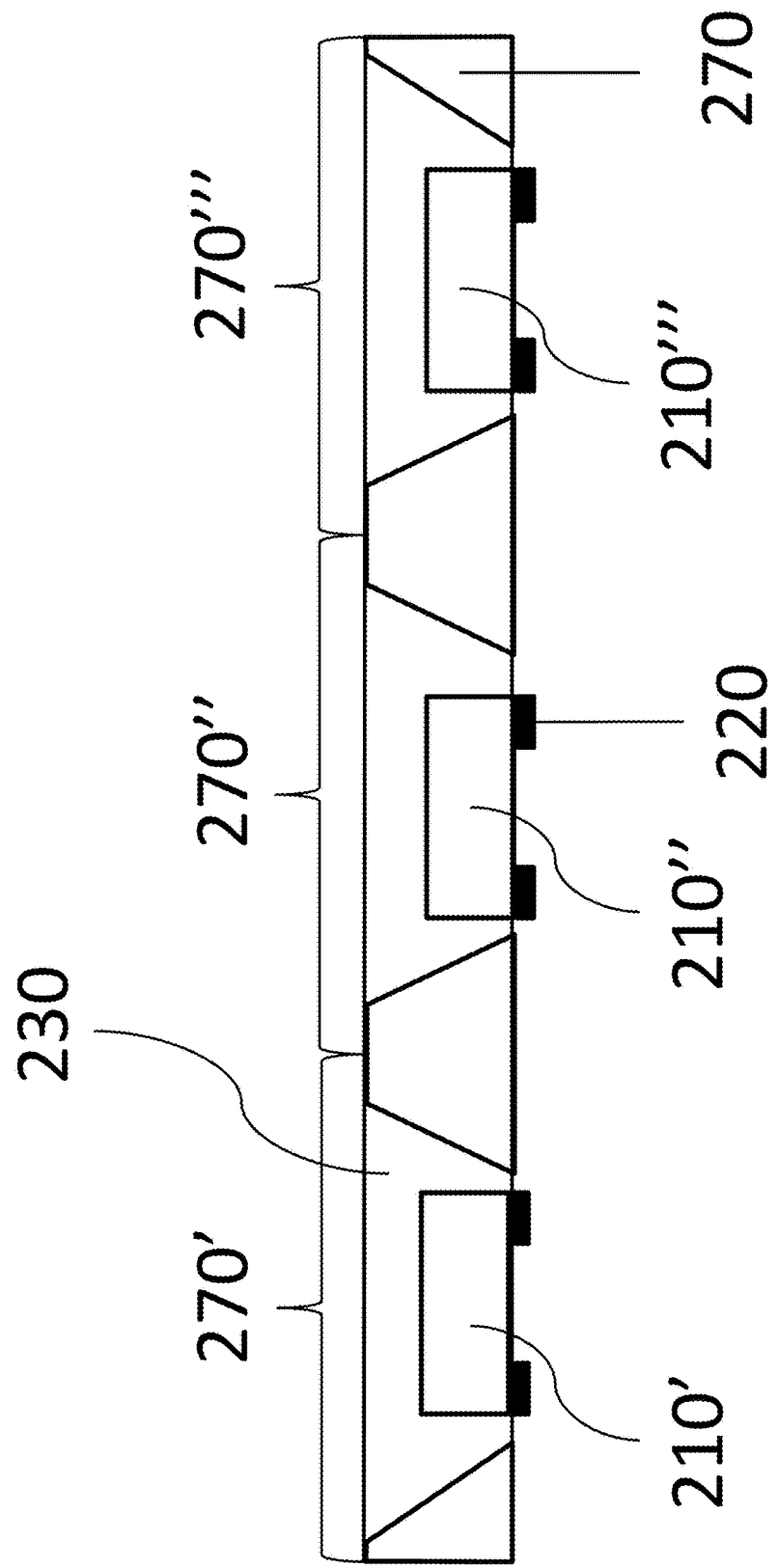
FIG. 2B is a cross-sectional view of a frame die incorporating multiple light-emitting elements each within a dedicated frame element in accordance with various embodiments of the invention.
Figure 2C:
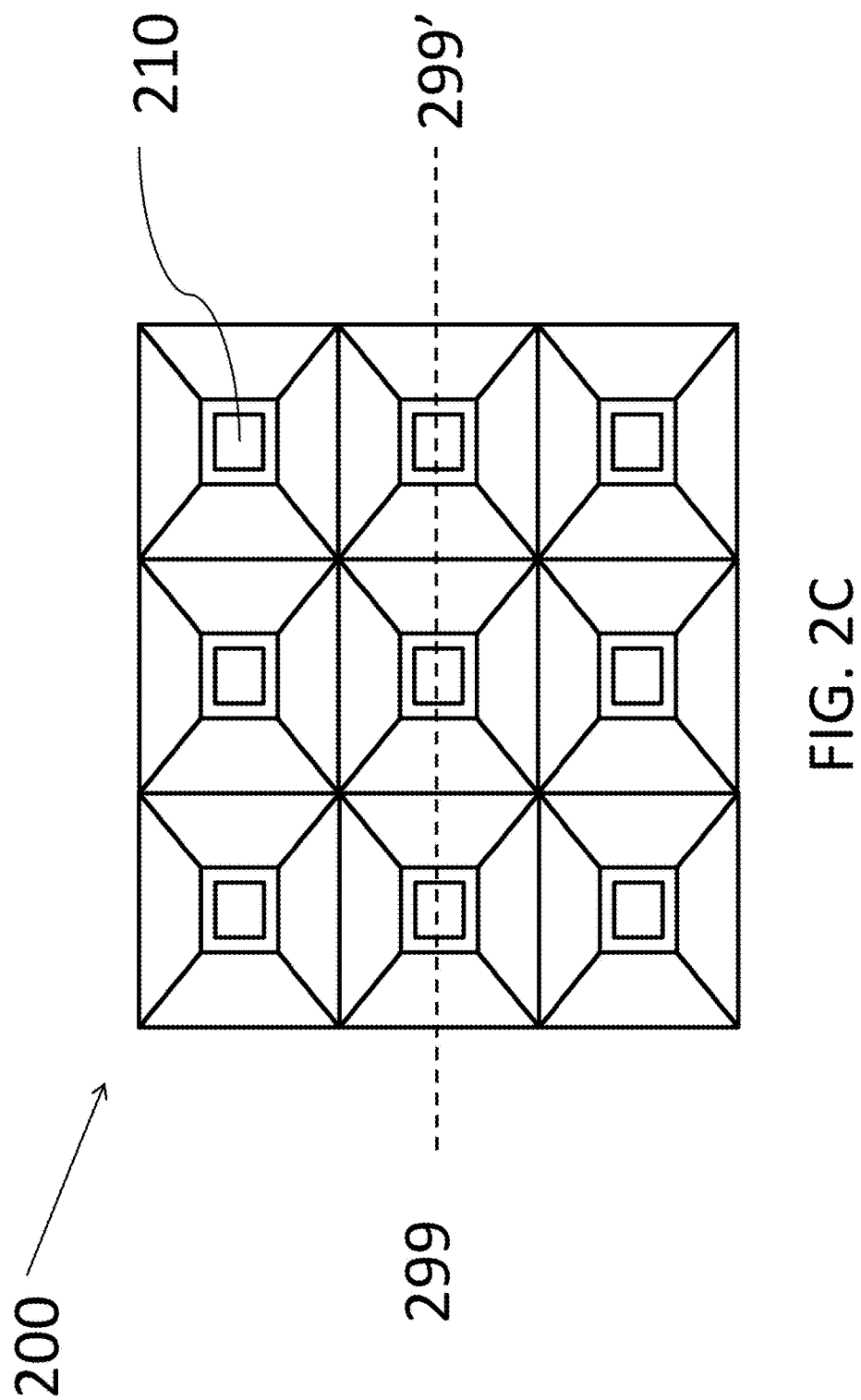
FIG. 2C is a plan view of the frame die of FIG. 2B.

In some embodiments, dimensions 265 and/or 265' may be in the range of about 0.15 mm to about 5 mm; however, this is not a limitation of the present invention, and in other embodiments these dimensions may be different. In some embodiments, dimensions 262 and/or 262' may be in the range of about 0.25 mm to about 5 mm; however, this is not a limitation of the present invention, and in other embodiments, for example as shown in FIGS. 2A-2C, where frame die 200 includes multiple sub-frames, the lateral dimension of frame 270 may be larger.

In the embodiments shown in FIGS. 1A and 1D, reflecting surface 272 is shown as a flat surface; however, this is not a limitation of the present invention, and in other embodiments reflecting surface 272 of frame 270 may have other profiles or shapes. For example, frame 270 may include more than one non-parallel surface, e.g., reflecting surface 272 may include or consist essentially of two or more non-parallel surfaces 274 and 276, as shown in FIG. 1E. In the example shown in FIG. 1E, surface 276 extends the lateral dimension of frame 270 (shown as 244 in FIG. 1A) by an extension length 245 as shown in FIG. 1E, and phosphor 230 extends above the frame, forming a phosphor cap 277. Frame width 262 and length 262' and dimension 244 include the extension length 245, when applicable. In various embodiments, frame width 262 and length 262' may be in the range of about 0.25 mm to about 10 mm. While FIG. 1E shows surface 276 as parallel or substantially parallel to surface 240, this is not a limitation of the present invention, and in other embodiments surface 276 is not parallel to surface 240. (As shown in FIG. 1A, the "top surface" of the frame 270 may simply be the apex formed by the intersection of the sidewall of the aperture and the exterior lateral surface of frame 270, i.e., a substantially linear "surface" with little lateral extent. In other embodiments, as shown in FIG. 1E, the top surface of the frame 270 may have a distinct lateral extent surrounding the aperture.)

Figure 1F:
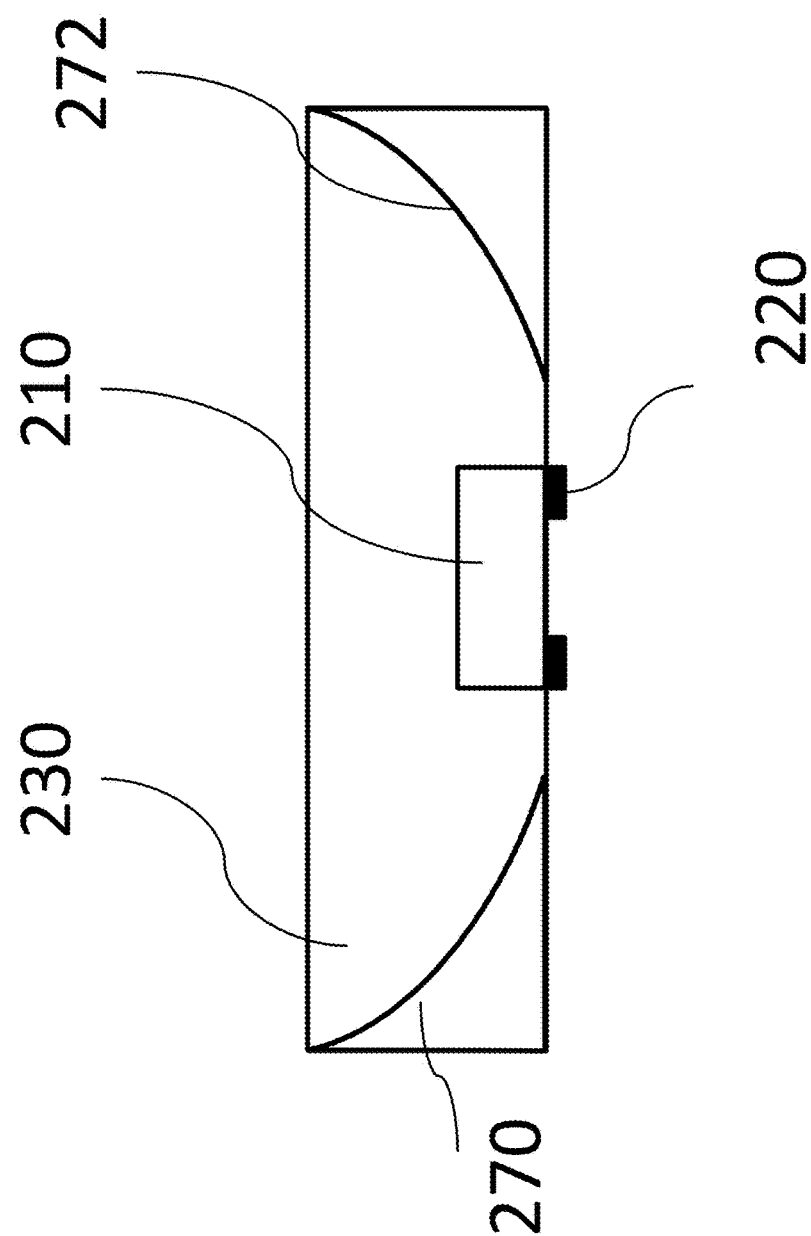

FIGS. 1F and 1G show other examples of embodiments of frame die 200, in which reflecting surface 272 of frame 270 is curved. In other embodiments, reflecting surface 272 may include flat surfaces, curved surfaces, combinations of flat and curved surfaces, or any arbitrary shape.

Figure 1H:
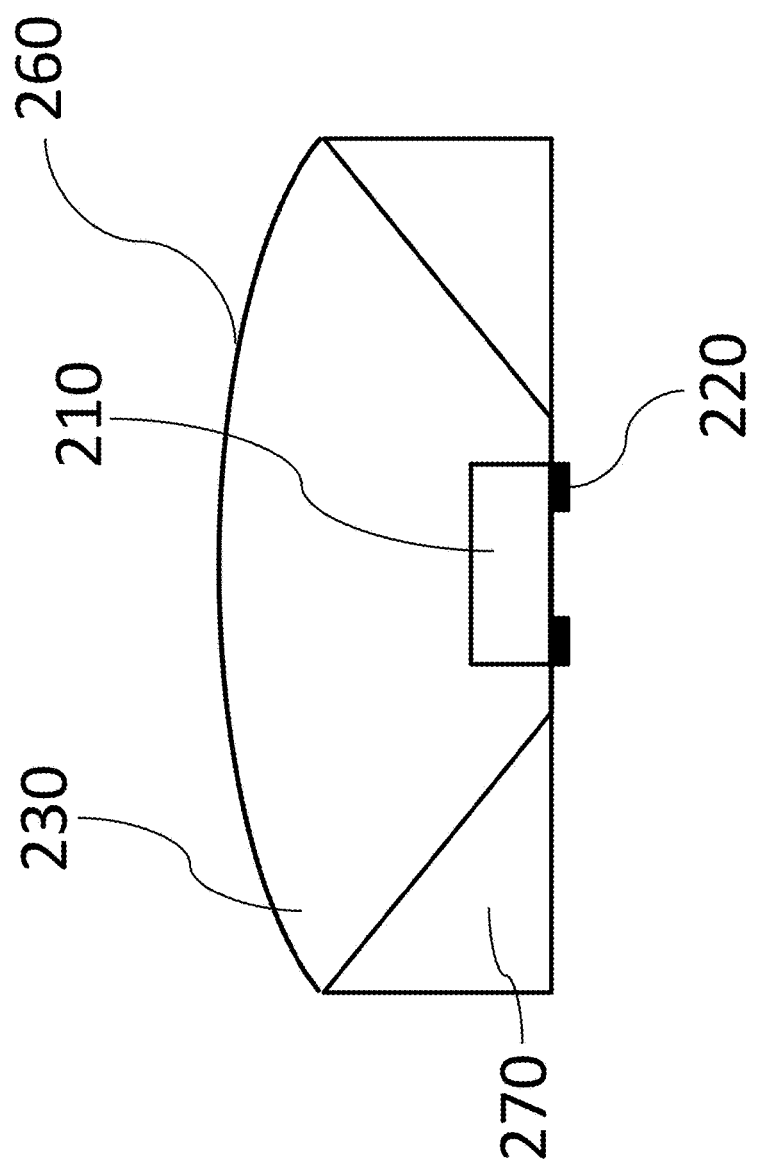
Figure 1K:
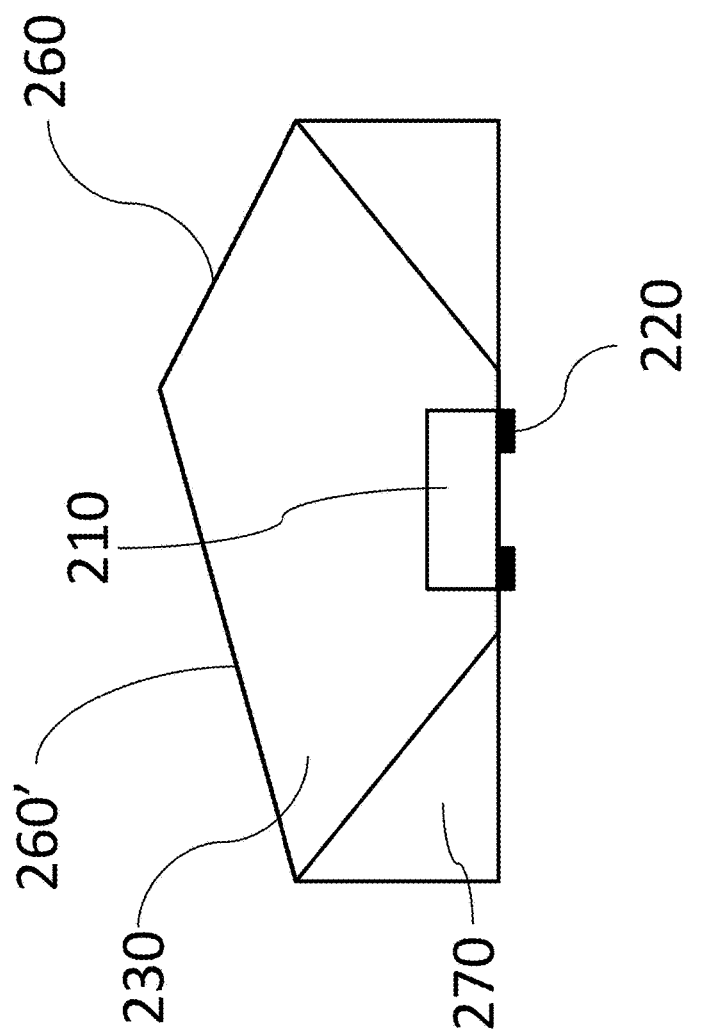

While face 260 of phosphor 230 is shown as a flat planar surface in FIGS. 1A and 1D-1G, this is not a limitation of the present invention, and in other embodiments face 260 may include multiple flat surfaces, for example surfaces 260 and 260' as shown in FIG. 1J, a curved surface as shown in FIG. 1H, combinations of flat and curved surfaces 260' and 260 respectively, as shown in FIG. 1I, or any arbitrary shape. While face 260 of phosphor 230 is shown as symmetric with respect to LEE 210 in FIGS. 1A and 1D-1J, this is not a limitation of the present invention, and in other embodiments face 260 may include or consist essentially of multiple faces that are not symmetric with respect to LEE 210, for example as shown in FIG. 1K.

Figure 1L:
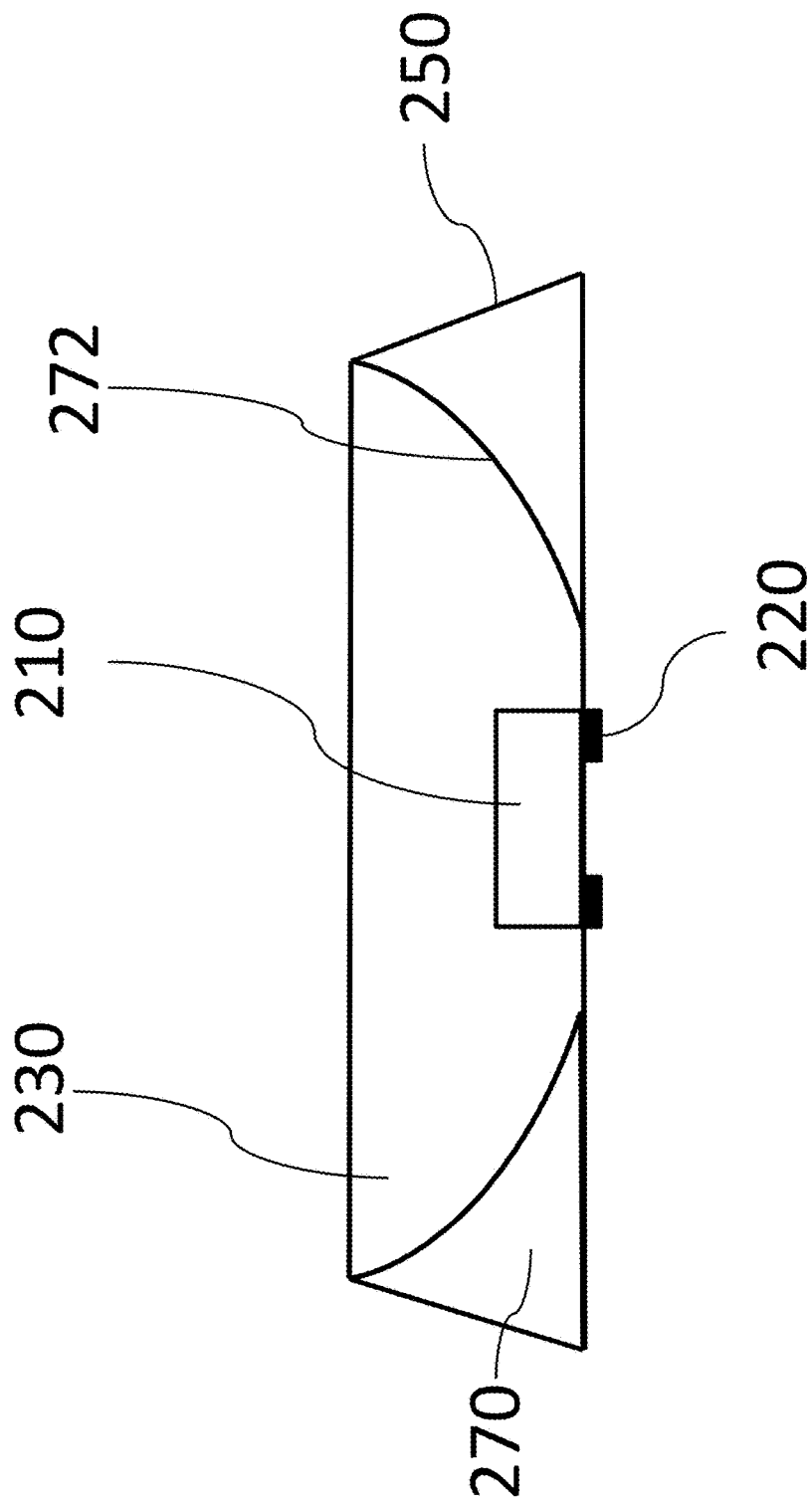

While sidewall 250 of frame 270 is shown in FIG. 1A as being flat and substantially perpendicular to face 240 of frame 270, this is not a limitation of the present invention, and in other embodiments sidewall 250 may include or consist essentially of multiple flat surfaces, a curved surface, multiple curved surfaces, combinations of curved and flat surfaces or any arbitrary shape, for example as shown in FIG. 1L.

Figure 1M:
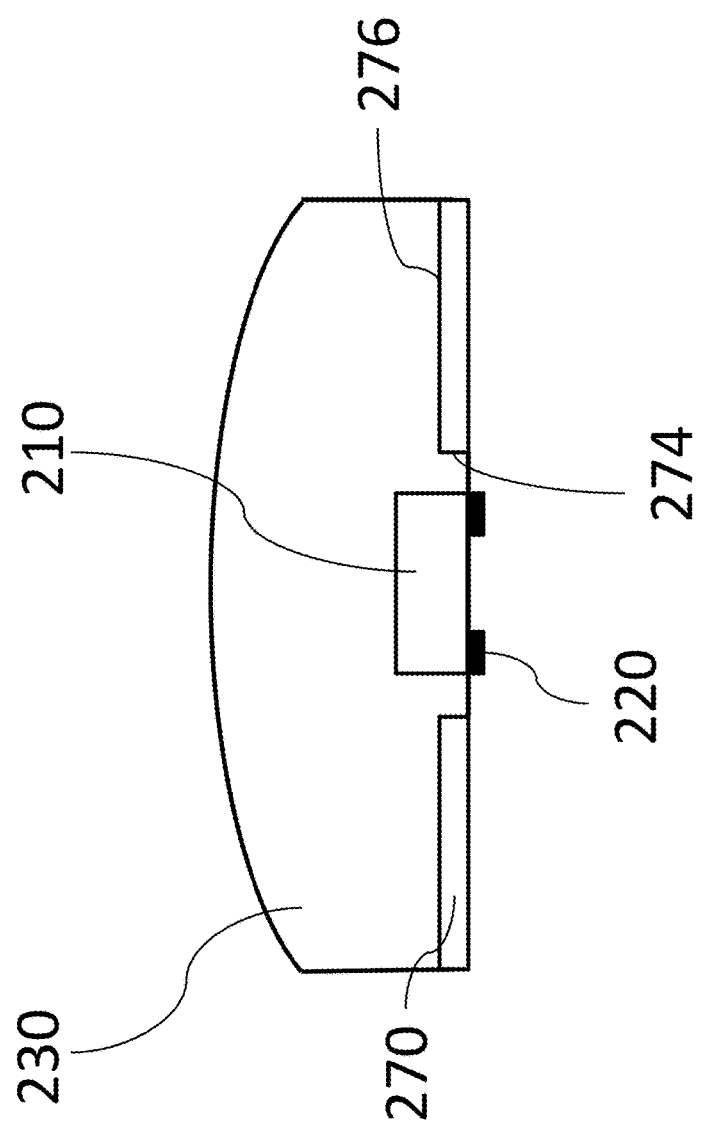

While surface 272 is shown in FIG. 1A as being flat, this is not a limitation of the present invention. FIG. 1L shows an embodiment of the present invention in which surface 272 is curved. FIG. 1M shows an embodiment of the present invention in which surface 274 of frame 270 is substantially perpendicular to surface 276 of frame 270. While FIG. 1M shows phosphor 230 having a curved shape, this is not a limitation of the present invention, and in other embodiments phosphor 230 may have different shapes.

FIG. 1N shows an embodiment of the present invention in which frame 270 has a height less than the height of LEE 210. The embodiment in FIG. 1N depicts a flat top of phosphor 230; however, this is not a limitation of the present invention, and in other embodiments phosphor 230 may have a different shape.

Figure 1P:
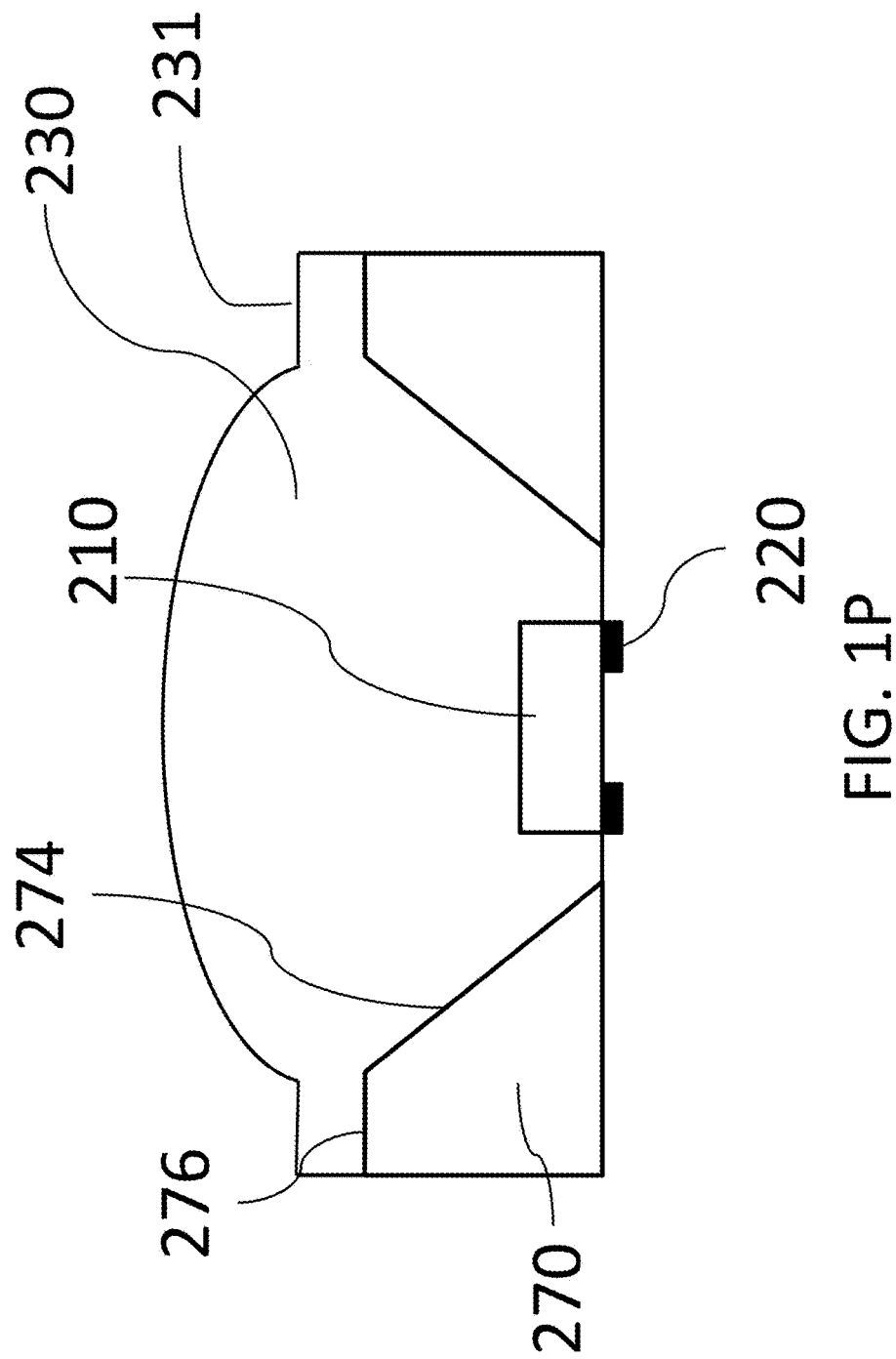

FIG. 1O shows an embodiment of the present invention in which at least a portion of surface 260 of phosphor 230 is below the top of frame 270 (i.e., the height of at least a portion of the phosphor is less than the height of at least a portion of the frame). FIG. 1P shows an embodiment in which there is a thin portion of phosphor, identified as a web 231, extending over a portion of frame 270. While FIG. 1P shows web 231 over all or substantially all of surface 276, this is not a limitation of the present invention, and in other embodiments web 231 may cover only one or more portions of surface 276 and/or may cover one or more portions of surface 274 and/or LEE 210. FIG. 1Q shows an embodiment in which phosphor 230 includes or consists essentially of a substantially conformal coating around LEE 210, which is in turn surrounded by a phosphor 238. In some embodiments, phosphor 230 contains one or more wavelength-conversion materials and phosphor 238 does not contain wavelength-conversion material, while in other embodiments phosphor 238 contains one or more wavelength-conversion materials and phosphor 230 does not contain wavelength-conversion material. In some embodiments, the conformal coating may have a thickness in the range of about 25 μm to about 400 μm; however, the thickness of the conformal coating is not a limitation of the present invention.

Figure 1R:
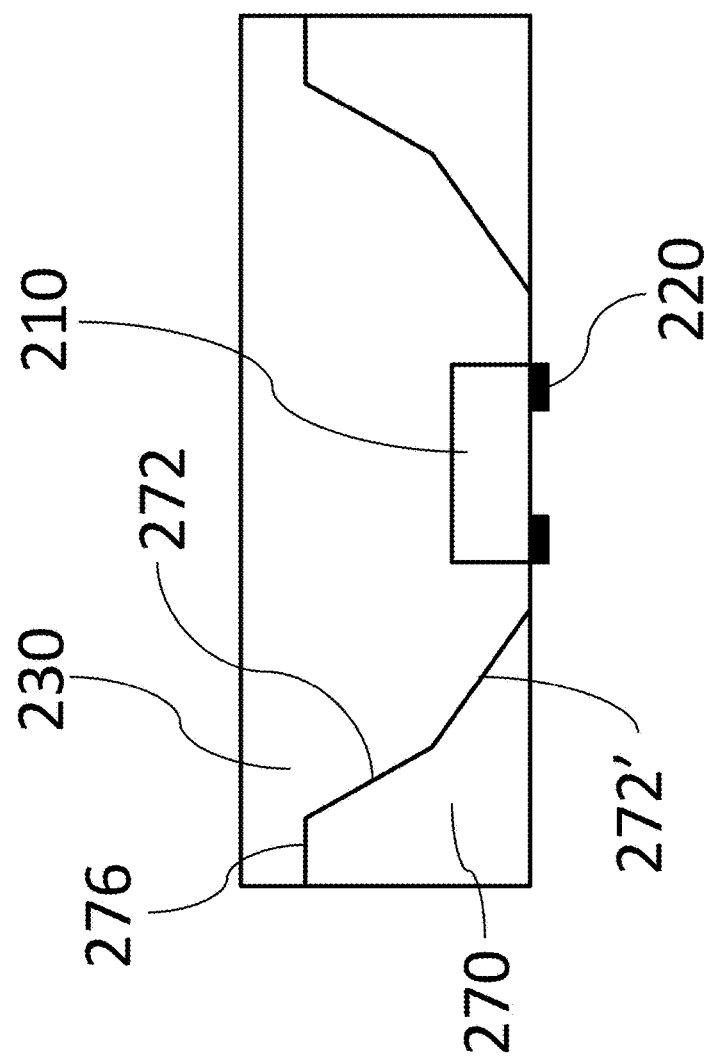

In some embodiments of the present invention, surface 272 includes or consists essentially of more than one distinct surface or facet. FIG. 1R shows an example of one embodiment in which surface 272 includes or consists essentially of two distinct portions 272 and 272'. While FIG. 1R shows two distinct portions of surface 272, this is not a limitation of the present invention, and in other embodiments surface 272 may include or consist essentially of any number of distinct portions. While FIG. 1R shows each of the two distinct portions of surface 272 being straight, this is not a limitation of the present invention, and in other embodiments surface 272 may include or consist essentially of any number of distinct portions, each of which may be straight, curved, or have any arbitrary shape. While FIG. 1R and FIG. 1Q show surface 272 shaped internally, i.e., facing LEE 210 and/or concave, this is not a limitation of the present invention, and in other embodiments an upper portion of the frame may be shaped, as shown in FIG. 1S. As discussed with respect to FIG. 1R, surface 296 in FIG. 1S may include or consist essentially of one or more portions, each of which may have any shape.

In some embodiments of the present invention, the surface 272 may be used advantageously to adjust one or more optical characteristics of frame die 200, for example angular color uniformity or light distribution pattern. For example, a frame die similar to that shown in FIG. 1R may be used to produce a relatively more collimated light output distribution than that of the frame die depicted in FIG. 1A.

Figure 1T:
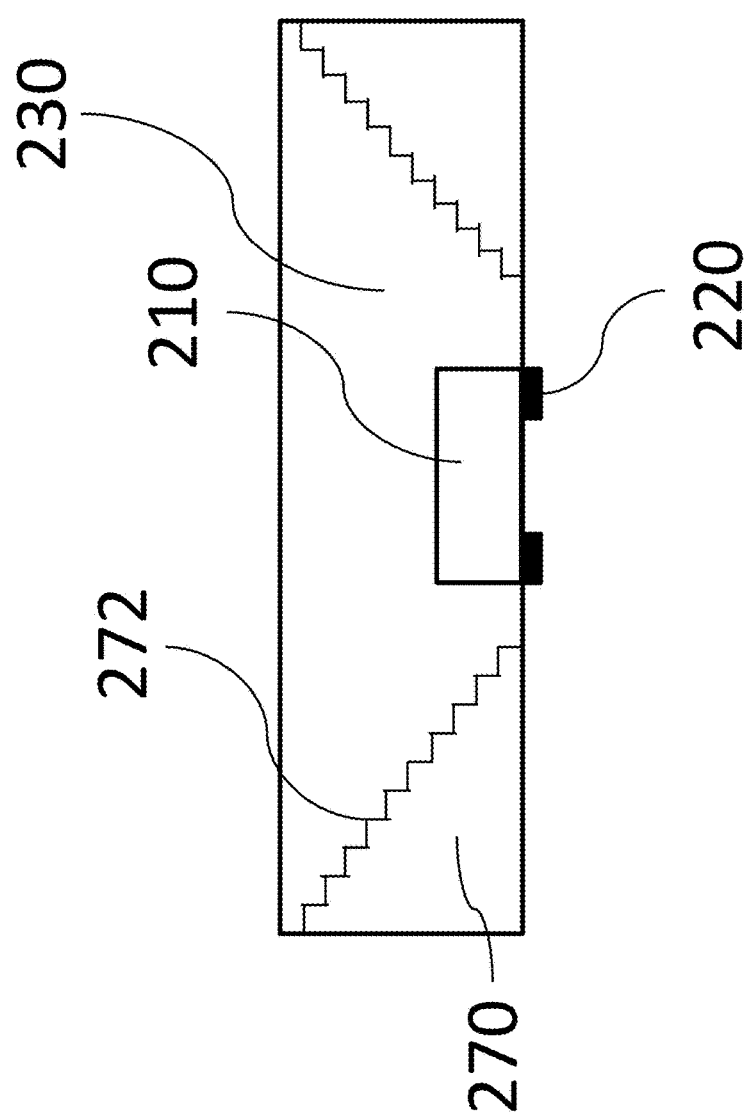

In some embodiments of the present invention, surface 272 may include or consist essentially of random or systematically designed or engineered patterns or structures. For example, FIG. 1T shows an embodiment of the present invention in which surface 272 includes or consists essentially of a number of ridges or steps. While FIG. 1T shows surface 272 including or consisting essentially of a number of regular steps or ridges, each having the same or substantially the same size and spacing, this is not a limitation of the present invention, and in other embodiments surface 272 may include or consist essentially of steps or ridges having different sizes and/or spacing. Such patterns and structures may be engineered to improve the frame die performance, for example uniformity of the light intensity distribution, or color uniformity, for example angular color uniformity; however, this is not a limitation of the present invention, and in other embodiments such patterns and/or structures may be utilized to affect and/or control other properties, for example luminous flux, correlated color temperature (CCT), or the like.

Figure 1U:
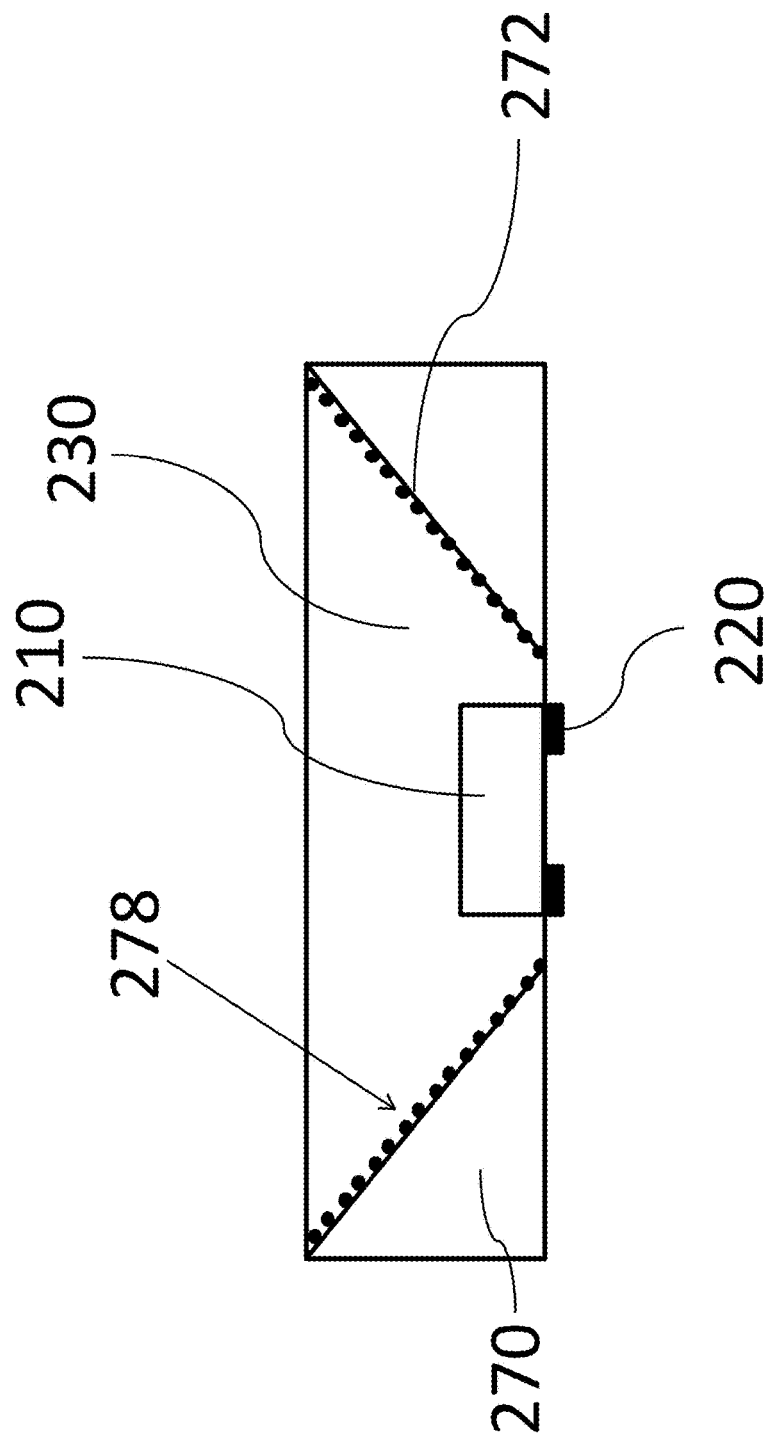

In some embodiments of the present invention, one or more materials 278 may be formed on or over surface 272, for example as shown in FIG. 1U. Material 278 may be the same as or different from the material of frame 270. Material 278 may be in the form of particles, for example as shown in FIG. 1U; however, this is not a limitation of the present invention, and in other embodiments material 278 may have other forms. For example, material 278 may include or consist of one or more layers, or may be in the form of microparticles, nanoparticles, or may have a combination of forms. Material 278 may impart advantageous optical, mechanical, and/or chemical properties to frame die 200, for example to modify the reflectance of one or more surfaces of the frame die 200. For example, in some embodiments of the present invention, material 278 may include or consist essentially of one or more dielectric layers, for example silicon oxide, silicon nitride, or the like. In some embodiments of the present invention, material 278 may include or consist essentially of one or more metal layers, for example aluminum, silver, gold, chromium, titanium, or the like. In some embodiments of the present invention, material 278 may include or consist essentially of one or more layers, for example including one or more dielectric and/or metallic layers. The specific structure of material 278 is not a limitation of the present invention. In some embodiments of the present invention, one or more layers of material 278 may form a reflecting surface, for example a Bragg reflector. In some embodiments of the present invention, the reflecting surface may be a specular or diffuse reflecting surface. In some embodiments of the present invention, the reflectance of material 278 may be engineered to have a different reflectance as a function of incident wavelength and/or angle of incidence or position along surface 272. In some embodiments, material 278, by itself or in combination with other geometrical and/or optical characteristics of other elements of frame die 200, for example angle 279, frame height 252, frame dimension 244, thickness 254 of phosphor 230 over LEE 210, or the like, may be engineered to produce specific optical characteristics of frame die 200, for example a specific light distribution pattern, an improved angular color uniformity, a specific CCT, or the like. In some embodiments of the present invention, material 278 may include or consist essentially of silicon oxide, aluminum, silver, chromium, gold, titanium oxide, or combinations of these materials. In some embodiments of the present invention, material 278 may cover all of surface 272, while in other embodiments material 278 may cover one or more portions of surface 272. In some embodiments, material 278 may cover all or one or more portions of surface 276 and/or surface 250 and/or surface 240. For example, in some embodiments of the present invention material 278 may be formed over all or one or more portions of the surface of frame 270.

Figure 1V:
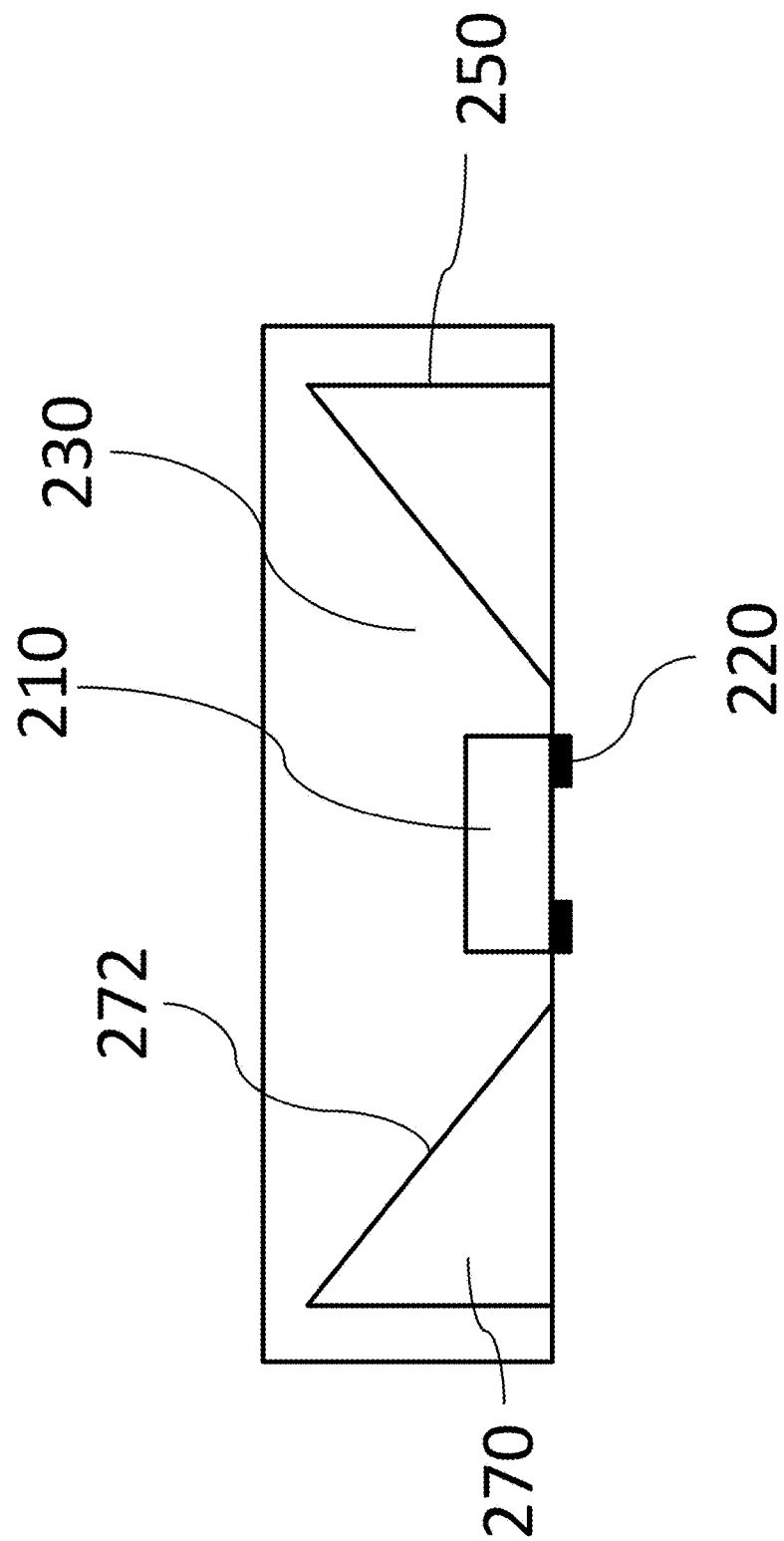
Figure 1W:
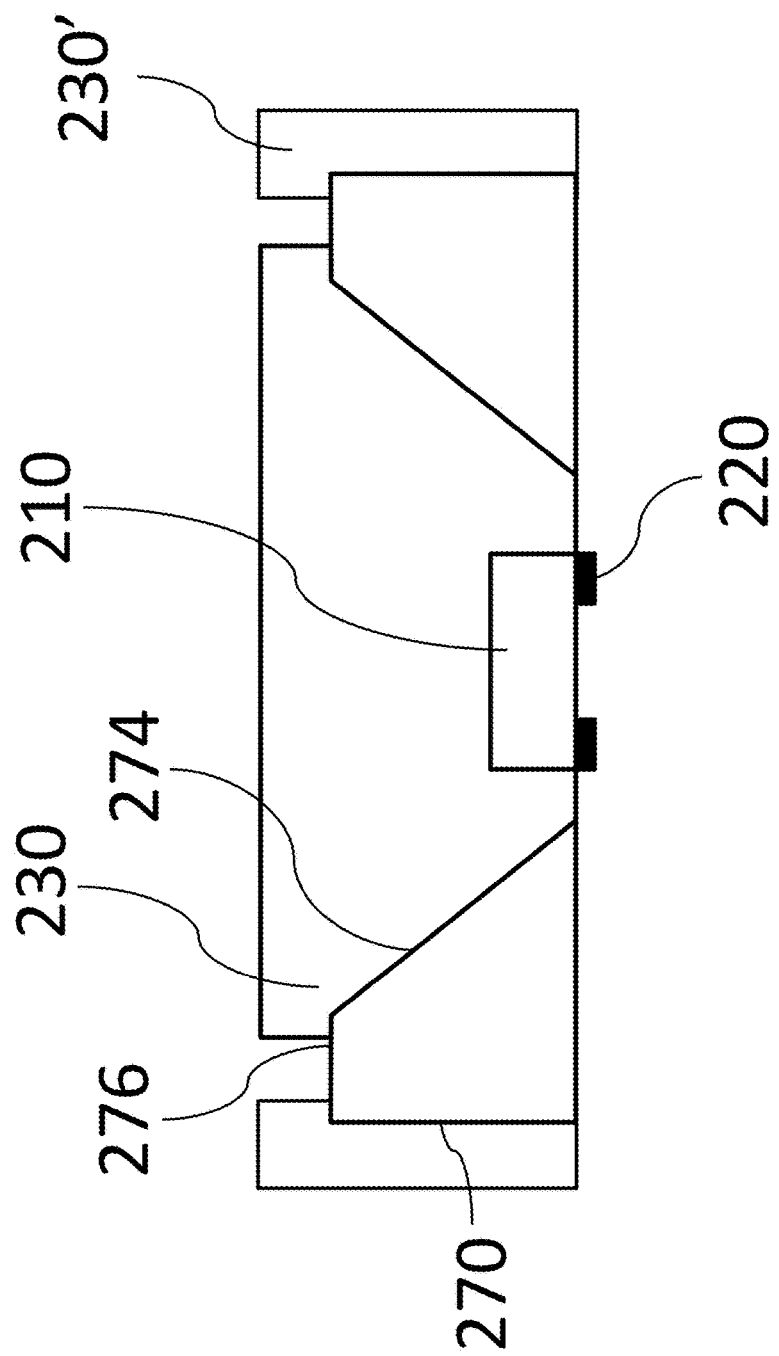

Frame die 200 is shown in FIG. 1A as having no phosphor 230 covering face 250 of frame 270; however, this is not a limitation of the present invention, and in other embodiments phosphor 230 may cover all or one or more portions of face 250. For example, FIG. 1V shows phosphor 230 covering faces 250 of frame 270. While FIG. 1V shows phosphor 230 covering all or substantially all of faces 250, this is not a limitation of the present invention, and in other embodiments phosphor 230 may only cover one or more portions of one or more faces 250. While FIG. 1V shows phosphor 230 extending above frame 270, this is not a limitation of the present invention, and in other embodiments phosphor 230 may not extend above frame 270. For example, in some embodiments of the present invention, phosphor 230 formed over all or portions of face 250 may not be contiguous with phosphor 230 formed over LEE 210. An example of this is shown in FIG. 1W, in which phosphor 230 is not continuous with a phosphor 230'. In some embodiments of the present invention, phosphor 230 formed over all or a portion of face 250 may be the same as phosphor formed over LEE 210; however, this is not a limitation of the present invention, and in other embodiments phosphor 230 formed over all or a portion of face 250 may be different from phosphor 230 formed over LEE 210.

In some embodiments of the present invention, phosphor 230 may not extend to the edge of frame 270. For example, in some embodiments of the present invention, phosphor 230 may be formed over only a portion of surface 276. For example, in some embodiments, phosphor 230 may not extend to the outer edge of surface 276, for example as shown in FIG. 1X.

FIGS. 1A-1X show examples of frame die 200 having a symmetric frame 270; however, this is not a limitation of the present invention, and in other embodiments frame 270 may be asymmetric. For example, frame 270 may have different heights 252, different frame dimensions 244, different angles 279, different phosphor heights 254 over LEE 210, or the like in different portions of frame die 200. For example, FIG. 1Y shows an embodiment of the present invention in which frame 270 has different angles 279 and 279' in different portions of frame 270, for example on opposite sides of frame 270. In some embodiments of the present invention, other aspects of frame die 200 may be asymmetric, for example the phosphor, for example as shown in FIG. 1K, position of LEE 210 within frame 270, length of frame dimension 244, gap 242, or the like.

In some embodiments of the present invention, asymmetry may not be limited to dimensions. For example, material or layer characteristics may also be asymmetric or non-uniform. For example, surfaces 272 and/or 276 may have different properties in different portions of frame die 200, and/or may be composed of different materials, or films with different thicknesses, different materials, or the like. Asymmetries in the structure of frame die 200 may alter the optical characteristics and in some embodiments of the present invention be utilized to provide frame die 200 with specific optical performances such as light output distribution or angular color uniformity or the like. In some embodiments of the present invention, asymmetries in the structure of frame die 200 may be utilized to produce similar asymmetries in the optical characteristics of frame die 200, for example an asymmetric light distribution pattern, an asymmetric spectral characteristic or color temperature or the like.

Figure 1Z:
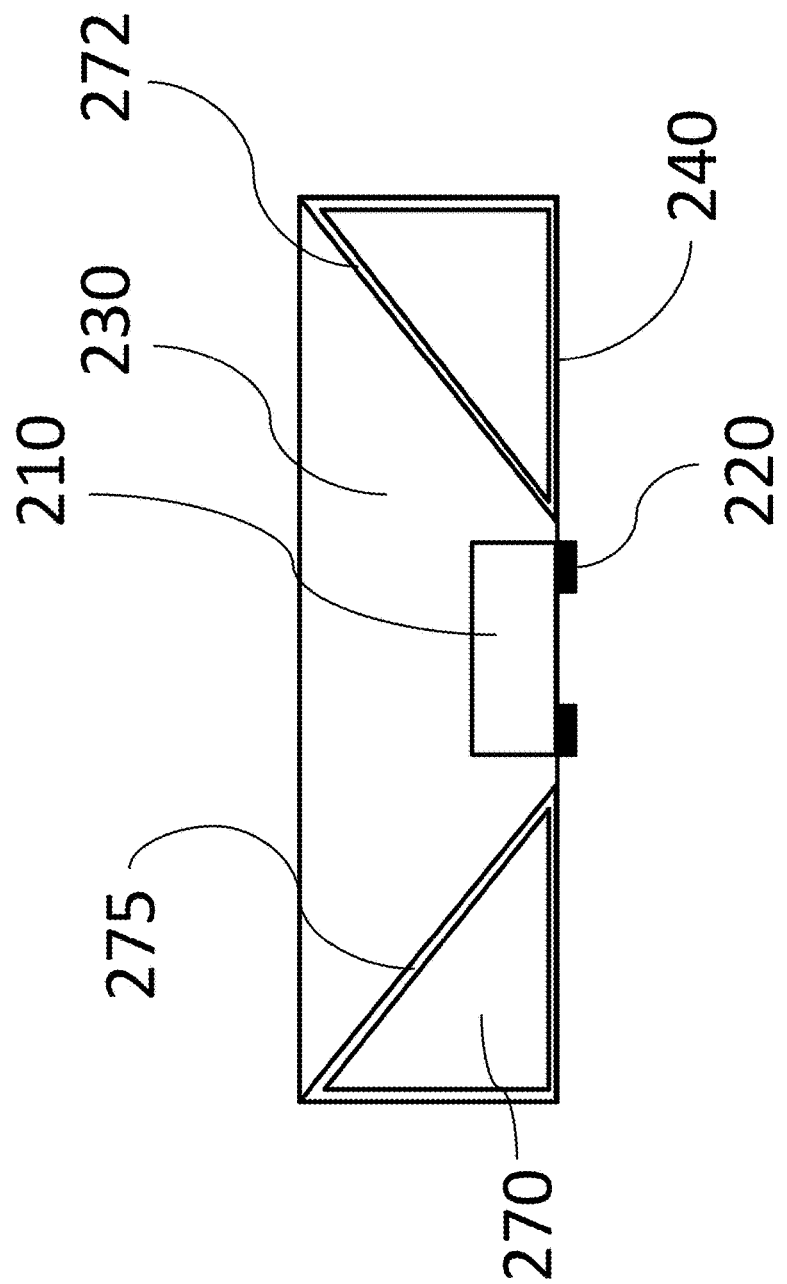
Figure 1A:
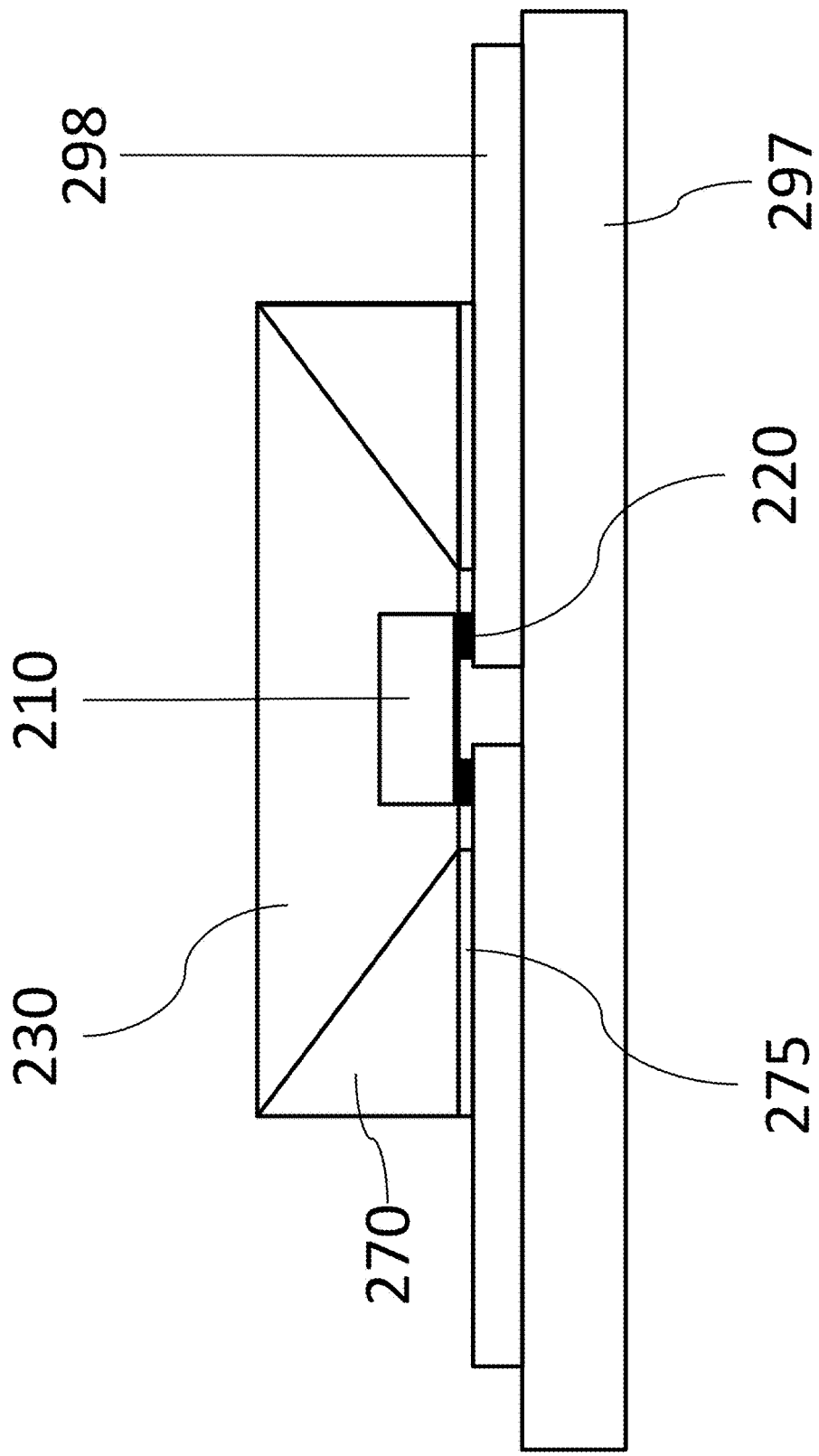

In some embodiments of the present invention, frame 270 may be electrically insulating, while in other embodiments frame 270 may be electrically conductive. In some embodiments of the present invention, all or one or more portions of frame 270 may be covered or protected, for example with a dielectric or insulating material. For example, FIG. 1Z shows material 275 covering all or substantially all of frame 270. In some embodiments of the present invention, the material 275 may reduce or eliminate exposure of frame 270 to moisture or water vapor or other potentially harmful airborne or surface contaminants. In some embodiments of the present invention, all or one or more portions of frame 270 may be covered by an insulating layer. In some embodiments of the present invention, surface 240 may include or consist essentially of one or more materials with specific electrical properties. For example, in some embodiments of the present invention, all or one or more portions of surface 240 may be formed of or covered by a dielectric material such as silicon oxide, silicon nitride, titanium oxide, aluminum oxide, or a polymer. For example, in some embodiments of the present invention, insulating layer 275 may be formed over all or one or more portions of surface 240 and/or surface 250 or other portions of frame 270. In some embodiments of the present invention, an insulating material or layer between frame 270 and underlying conductive traces may minimize or prevent the flow of electrical current from underlying conductive traces through frame 270, resulting in a reduction or elimination in current flowing to LEE 210. FIG. 1AA shows an example of layer 275 disposed over surface 240, with frame die 200 disposed over conductive traces 298, which are in turn disposed over substrate 297. In some embodiments of the present invention, insulating layer 275 may include or consist essentially of silicon oxide, silicon nitride, aluminum oxide, one or more polymers, or the like. In some embodiments of the present invention, insulating layer 275 may include or consist essentially of more than one layer. In some embodiments of the present invention, insulating layer 275 may be formed by evaporation, sputtering, chemical vapor deposition, printing, spraying, conformal coating, or the like. The method of formation of insulating layer 275 is not a limitation of the present invention. In some embodiments of the present invention, insulating layer 275 may have a thickness in the range of about 20 nm to about 10 μm, or in the range of about 100 nm to about 4 μm.

FIGS. 1A-1AA show frame die 200 as including one LEE 210; however, this is not a limitation of the present invention, and in other embodiments frame die 200 includes more than one LEE 210. FIG. 2A shows an example of an embodiment having three LEEs 210 that are all included in one frame element 270. While FIG. 2A shows three LEEs 210 in frame die 200, this is not a limitation of the present invention, and in other embodiments frame die 200 may have fewer or more LEEs 210.

FIG. 2B shows an example of an embodiment of the present invention having three LEEs 210', 210", and 210''', each of which is in its own sub-frame element 270', 270", and 270''', respectively. FIG. 2C shows a plan view of the structure of FIG. 2B; FIG. 2B is a cross-sectional view of the structure shown in FIG. 2C, along cut line 299-299'. The structure shown in FIG. 2C includes a 3×3 array of sub-frames; however, this is not a limitation of the present invention, and in other embodiments the array of sub-frames may have more or fewer sub-frames. The structure shown in FIG. 2C has a square array of sub-frames; however, this is not a limitation of the present invention, and in other embodiments the array of sub-frames may have different shapes, for example a linear array (a line of sub-frames), rectangular, or any arbitrary shape. Similar to the structure shown in FIG. 2C, LEEs 210 within the structure shown in FIG. 2A may be formed in a linear array, a square array, a rectangular array, or any arbitrary positioning of multiple LEEs 210.

In some embodiments of the present invention, multiple LEEs 210 of a single frame die 200 are all the same, while in other embodiments they are made up of at least two different types of LEEs 210. In some embodiments of the present invention, different types of LEEs 210 emit at different wavelengths. For example, frame die 200 may include one or more of each of three different types of LEEs 210, where at least one type emits in the blue wavelength range, at least one in the green wavelength range and at least one in the red wavelength range. In one embodiment, frame die 200 may include one or more of each of two different types of LEEs 210, where at least one type emits in the blue wavelength range and at least one in the red wavelength range. The specific configurations of the LEEs 210 in frame die 200, as well as their operating characteristics and properties, are not limitations of the present invention. In one embodiment of the present invention, different types of LEEs 210 have different light output powers. In one embodiment, phosphor 230 may be composed of multiple portions or volumes, where each portion or volume includes or consists essentially of one or more phosphors different from one or more phosphors in another portion. In one embodiment of this example, one or more portions include or consist essentially of only a transparent binder material, while one or more other portions include or consist essentially of a binder and one or more phosphors.

In some embodiments of the present invention, frame die 200 may emit more than one color of light, for example frame die 200 may have two or more volumes of different phosphors 230, which when excited by LEE 210 may emit light of two different colors. In some embodiments, frame die 200 may include two or more LEEs 210, and optionally two or more volumes of different phosphors 230, which may be separately stimulated (each by one or more LEES 210) to produce light of different colors.

In some embodiments of the present invention, reflecting surface 272 may include or consist essentially of one or more layers, for example a metallic layer such as gold, silver, aluminum, chromium, titanium, or the like. In some embodiments, reflecting surface 272 may include or consist essentially of one or more dielectric layers, for example a dielectric mirror or Bragg reflector. Dielectric layers may include or consist essentially of one or more of silicon dioxide, titanium oxide, silicon nitride, zinc oxide or other dielectric materials. In some embodiments, reflecting surface 272 may include or consist essentially of a combination of metallic layers and dielectric layers. In some embodiments, reflecting surface 272 may be the surface of frame 270, for example when frame 270 is formed of a reflective material, for example a white polymer or plastic material. In various embodiments, reflecting surface 272 has a reflectivity to a wavelength of light emitted by LEE 210 and/or phosphor 230 of at least 80%, at least 90%, at least 95%, or at least 98%.

Figure 3A:
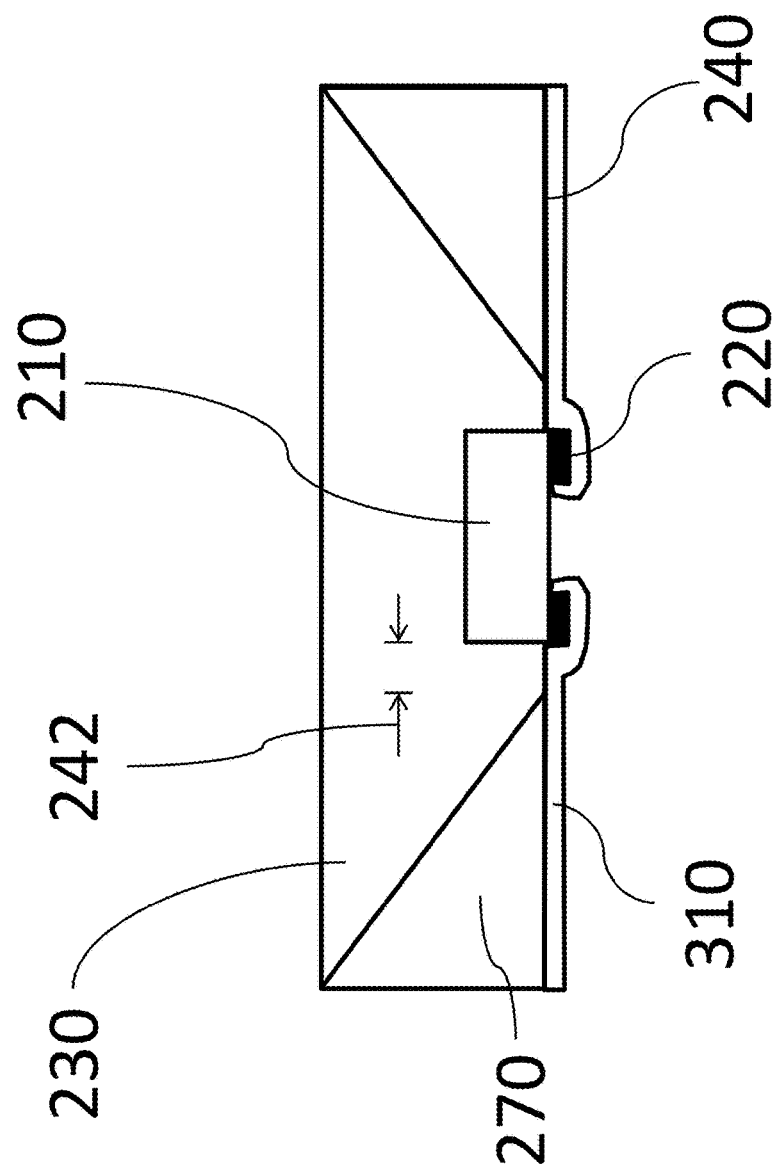

FIG. 3A shows an embodiment of the present invention similar to that of FIG. 1A, but including a contact layer 310. In some embodiments, contact layer 310 covers all or a portion of LEE contact 220 and all or a portion of surface 240 of frame 270. In some embodiments, contact layer 310 is electrically coupled to contact 220 and provides a contact region larger than that of contact 220 for subsequent attachment of frame die 200 to, e.g., one or more conductive traces. In some embodiments, contact layer 310 includes or consists essentially of one or more electrically conductive layers, for example chromium, titanium, gold, silver, aluminum, nickel, or the like. Contact layer 310 may be formed using a variety of different techniques, for example evaporation, sputtering, plating, chemical vapor deposition, lamination, or the like. The specific materials and means of formation of contact layer 310 are not limitations of the present invention. In some embodiments of the present invention, contact layer 310 may have a thickness in the range of about 10 nm to about 50 μm. In some embodiments, contact layer 310 may have a thickness in the range of about 100 nm to about 5 μm. In some embodiments, contact layer 310 may have a thickness in the range of about 20 μm to about 40 μm.

Figure 3B:
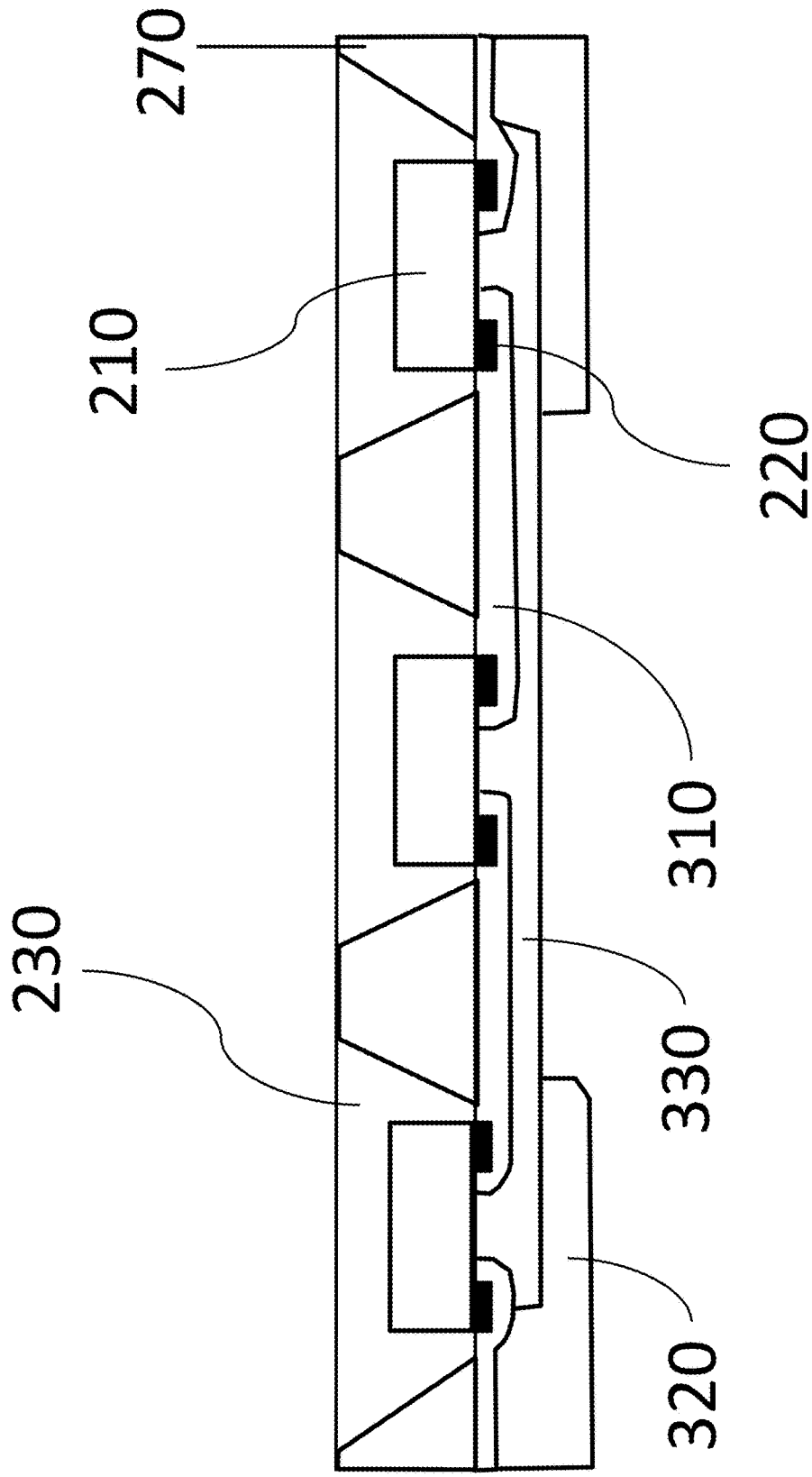

In some embodiments, contact layer 310 is reflective to a wavelength of light emitted by LEE 210 and/or phosphor 230. As shown in FIG. 3A, contact layer 310 covers all or a portion of gap 242, and may, in embodiments where contact layer 310 is reflective to a wavelength of light emitted by LEE 210 and/or phosphor 230, reduce or substantially eliminate light loss through gap 242 between LEE 210 and frame 270. In some embodiments, contact layer 310 has a reflectivity greater than about 50%, greater than about 75%, or greater than about 90% to a wavelength of light emitted by LEE 210 and/or phosphor 230. In some embodiments, contact layer 310 may be both electrically conductive and reflective. In some embodiments, contact layer 310 may include or consist essentially of more than one layer to achieve electrical conductivity and optical reflectivity. In some embodiments, contact layer 310 may be used to interconnect one or more LEEs of structures shown in FIGS. 2A-2C having multiple LEEs 210, such that the frame die 200 has only two contacts, for example as shown in FIG. 3B. FIG. 3B shows multiple contact layers 310 electrically interconnecting LEEs 210. LEEs 210 may be electrically connected in series, parallel, or any fashion. FIG. 3B shows two optional elements, a contact 320 and an insulating layer 330. Insulating layer 330 may be used to cover all or a portion of contact layer 310 and/or all or a portion of the bottom of frame die 200. Insulating layer 330 may be used to prevent undesired electrical coupling between contacts 220 on LEE 210 and underlying layers or materials, for example when attached to a package or circuit board. Contact 320 is an additional contact layer that is electrically conductive and electrically coupled to one or more contact layers 310 and/or one or more contacts 220. Contact 320 may provide a larger pad area for subsequent contact to a package or circuit board, for example making mounting easier or providing for a reduced contact resistance. In various embodiments, contact structures such as those including contact layer 310, insulating layer 330, and contact 320 may be used to interconnect multiple LEEs 210 and to permit a smaller number of contacts to a single frame die 200 that incorporates multiple LEEs 210.

Figure 4B:
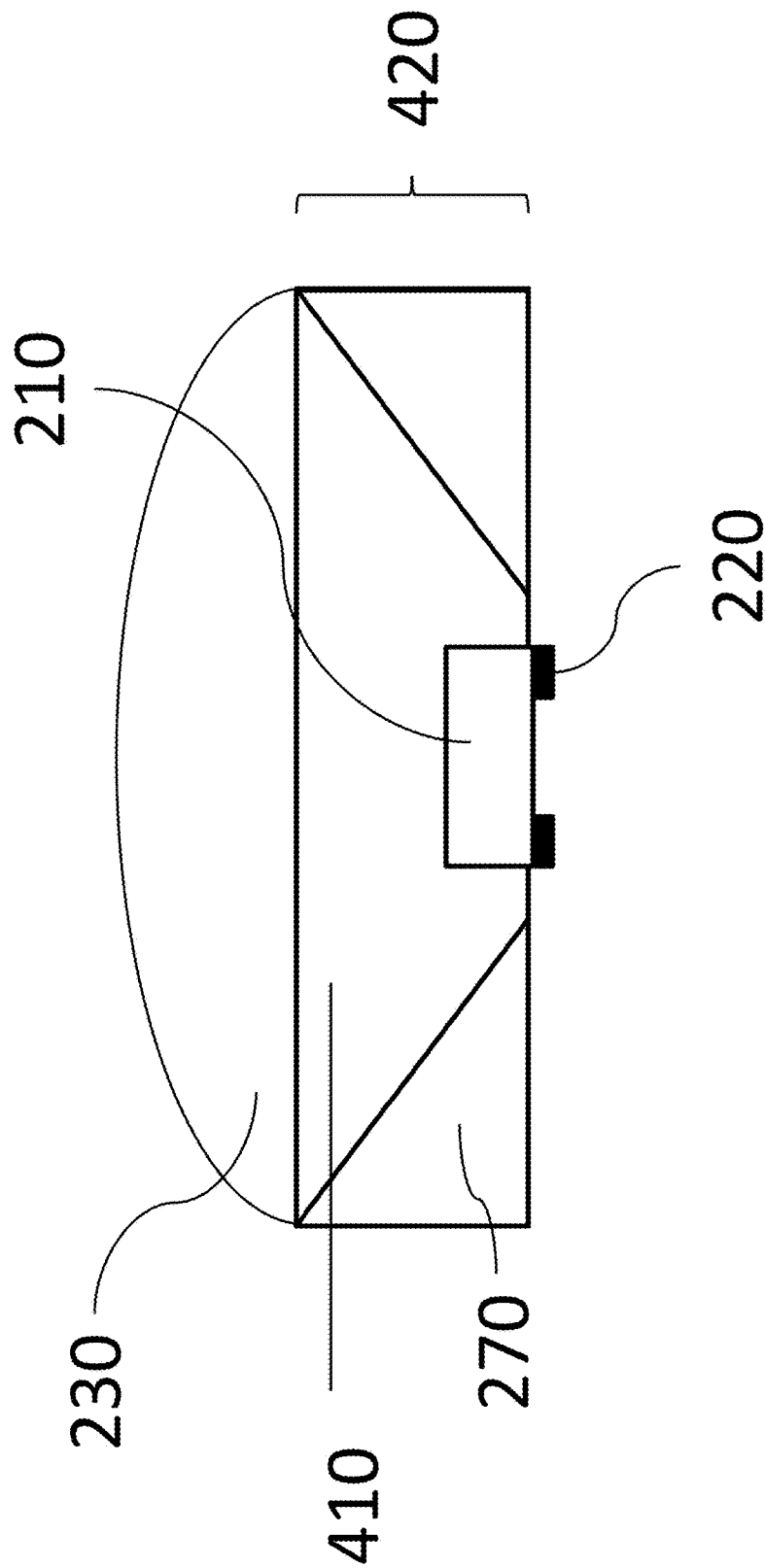
Figure 4C:
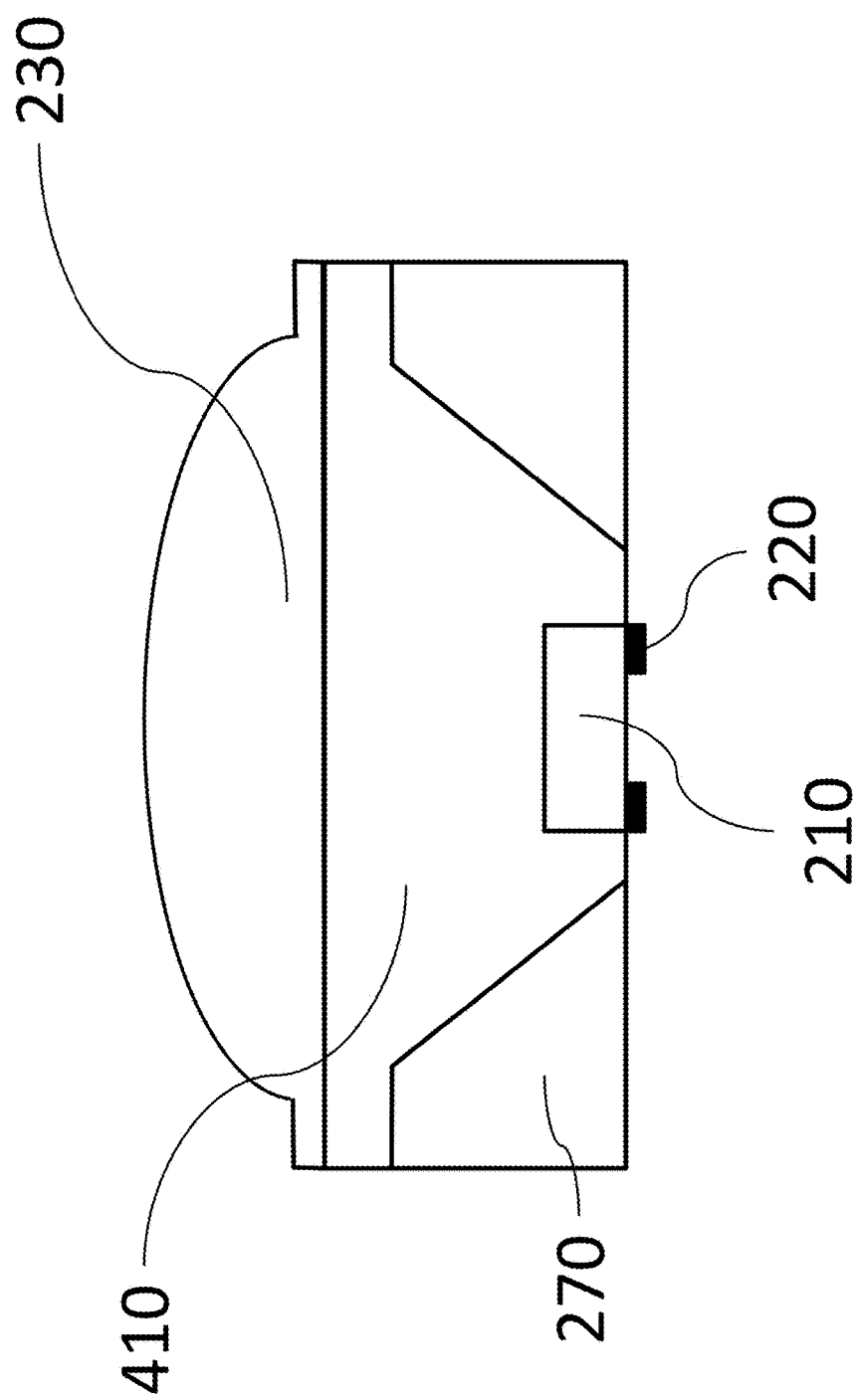

FIG. 4A shows another embodiment of the present invention that features a transparent material 410 between phosphor 230 and LEE 210. In some embodiments, transparent material 410 surrounds LEE 210 and fills or partially fills the interior region of frame 270. In such embodiments, phosphor 230 is spaced apart from LEE 210 by material 410. In some embodiments, this separation reduces heating of phosphor 230 and thus may result in an increased phosphor efficiency. In some embodiments, phosphor 230 may be formed separately from the process of formation of portion 420 of the structure (FIG. 4A). For example, this may simplify the manufacture and/or permit increased control and uniformity in the formation of phosphor 230, resulting in improved uniformity of optical characteristics, for example color temperature, CRI, and the like. While the structure in FIG. 4A has a flat slab of phosphor 230, this is not a limitation of the present invention, and in other embodiments phosphor 230 may have different shapes, for example as shown in FIG. 4B and FIG. 4C. In some embodiments, frame die 200 may be formed using only transparent material 410 (i.e., without any phosphor 230), for example as shown in FIG. 4D. In various embodiments, the structure of FIG. 4D may be used as a package for non-phosphor-converted light-emitting structure. In the structure shown in FIG. 4A the interface between phosphor 230 and material 410 is shown as flat and substantially parallel to the top surface of LEE 210; however, this is not a limitation of the present invention, and in other embodiments the interface between phosphor 230 and material 410 may be curved (as shown in FIG. 4E) or have other shapes. While FIG. 4E shows the top of material 410 as having a concave shape, this is not a limitation of the present invention, and in other embodiments material 410 may have a convex top surface or may have any shape. In some embodiments, the relative positions of transparent material 410 and phosphor 230 may be modified such that phosphor 230 surrounds LEE 210 and transparent material 410 is disposed over at least a portion of phosphor 230. In some embodiments, transparent material 410 may be substantially a slab form, while in other embodiments transparent material may be shaped, for example have a hemispherical shape, a partial hemisphere shape, a pyramid shape, or may be shaped to form an optic, for example a refractive optic or a Fresnel lens.

FIG. 4F shows a structure similar to that of FIG. 4A; however, in FIG. 4F material 410 covers frame 270, such that phosphor 230 does not contact frame 270 and is only in contact with material 410.

Figure 4G:
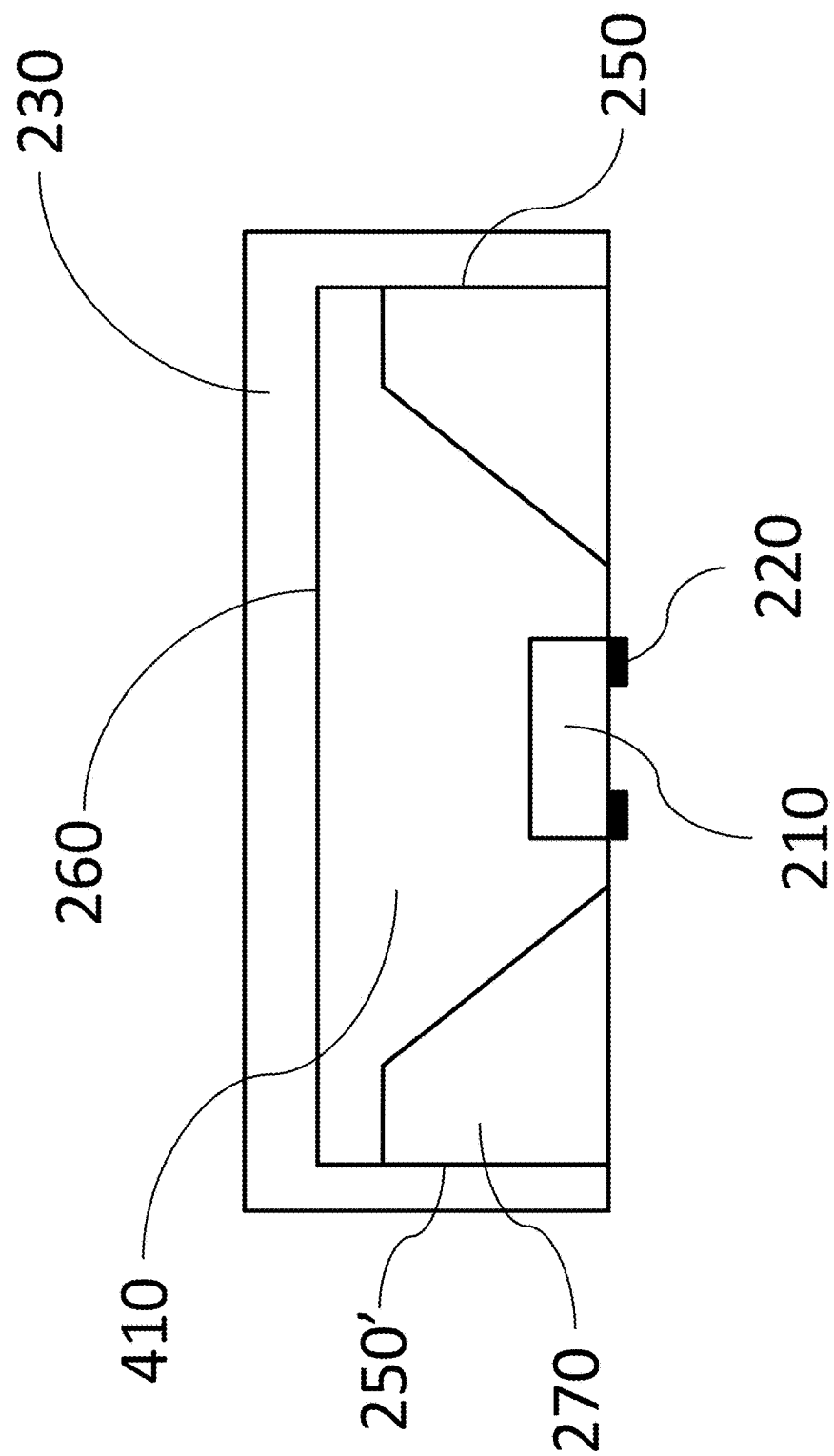

While FIGS. 4A-4F show embodiments of the present invention in which phosphor 230 is formed within the lateral extent of frame 270, this is not a limitation of the present invention, and in other embodiments phosphor 230 may cover all or one or more portions of sidewall 250. For example, FIG. 4G shows a structure similar to the structure of FIG. 4A; however, in the structure of FIG. 4G phosphor 230 extends beyond the lateral edge of frame 270 and is disposed over sidewalls 250. In some embodiments of the present invention, phosphor 230 is uniformly disposed over sidewalls 250; however, this is not a limitation of the present invention, and in other embodiments phosphor 230 may have different thickness or different concentration or different properties on different portions of sidewalls 250. For example, in some embodiments of the present invention, phosphor 230 may be different on sidewall 250 that it is on sidewall 250'.

In some embodiments of the present invention, transparent material 410 may include or consist essentially of binder, for example silicone or epoxy. In some embodiments, phosphor 230 or transparent material 410 may include additional materials or particles, for example material to scatter or diffuse light, e.g., fumed silica, fumed alumina, $TiO_2$, or the like.

In the structure described in reference to FIG. 4A, transparent material 410 is disposed over LEE 210 and phosphor 230 is disposed over transparent material 410; however, this is not a limitation of the present invention, and in other embodiments phosphor 230 may be disposed over LEE 210 and transparent material 410 may be disposed over phosphor 230. For example, FIG. 4H shows an embodiment of the present invention in which phosphor 230 is disposed over LEE 210 and surface 272, and transparent material 410 is disposed over phosphor 230.

Figure 4I:
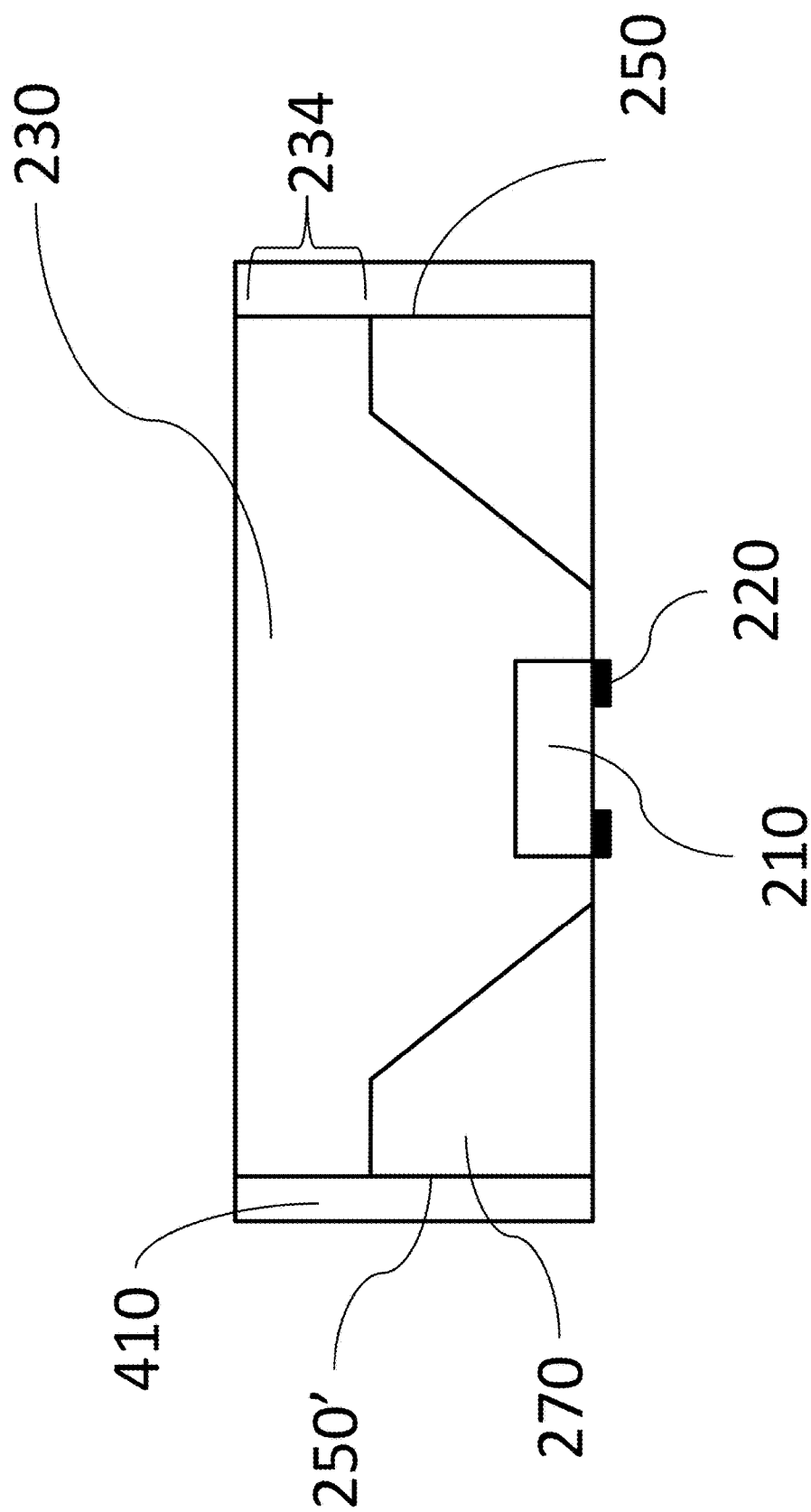

In some embodiments of the present invention, transparent material 410 may cover all or a portion of sidewalls 250. For example, FIG. 4I shows an embodiment of the present invention in which transparent material 410 covers all or substantially all of sidewalls 250. In such embodiments, transparent material 410 covers all or substantially all of the portion of the sidewall 234 of phosphor 230 extending above the top of frame 270; however, this is not a limitation of the present invention, and in other embodiments transparent material 410 may only cover sidewalls 250 of frame 270, or may only cover portions of sidewalls 250 of frame 270.

Figure 4J:
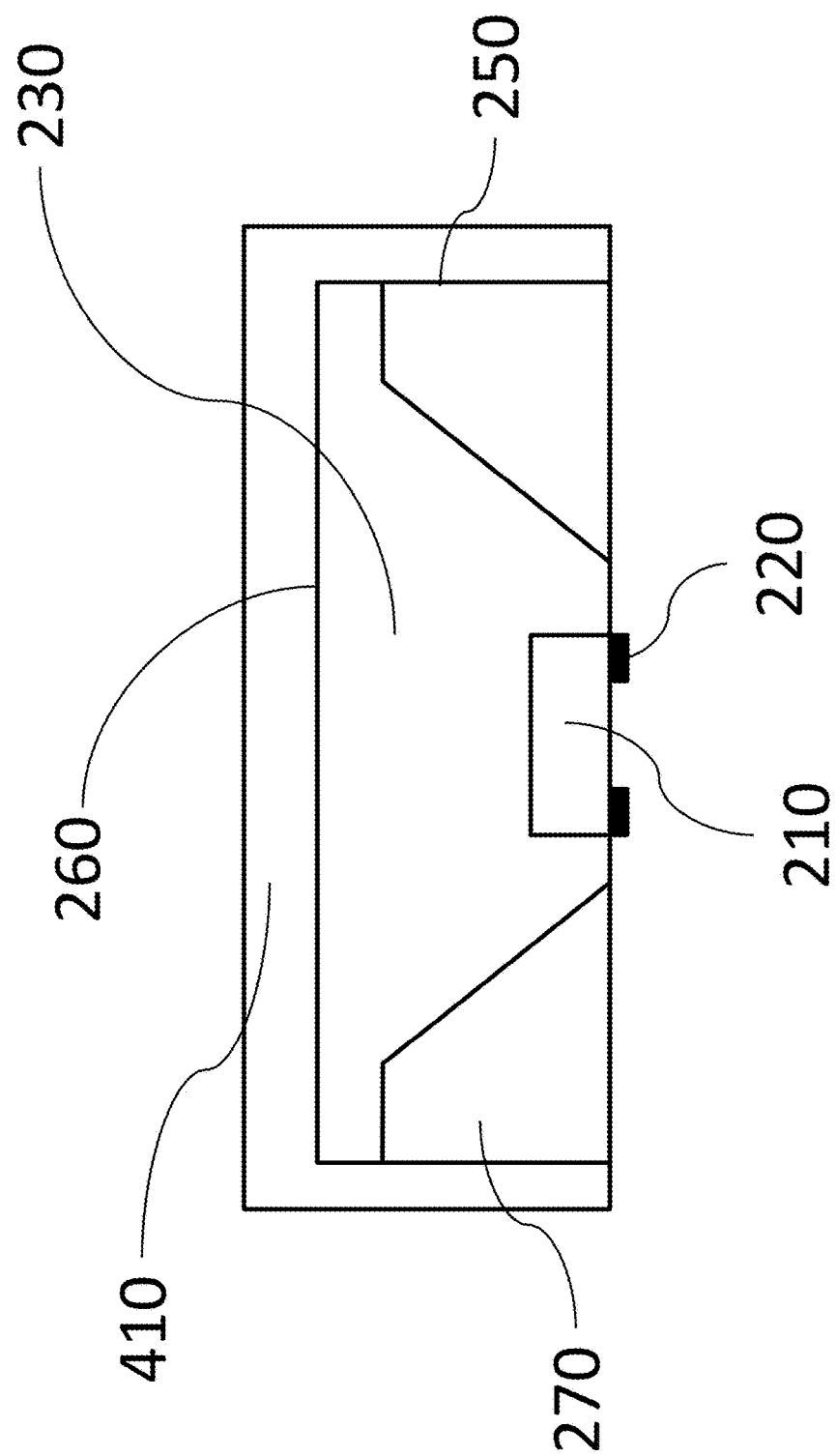
Figure 4K:
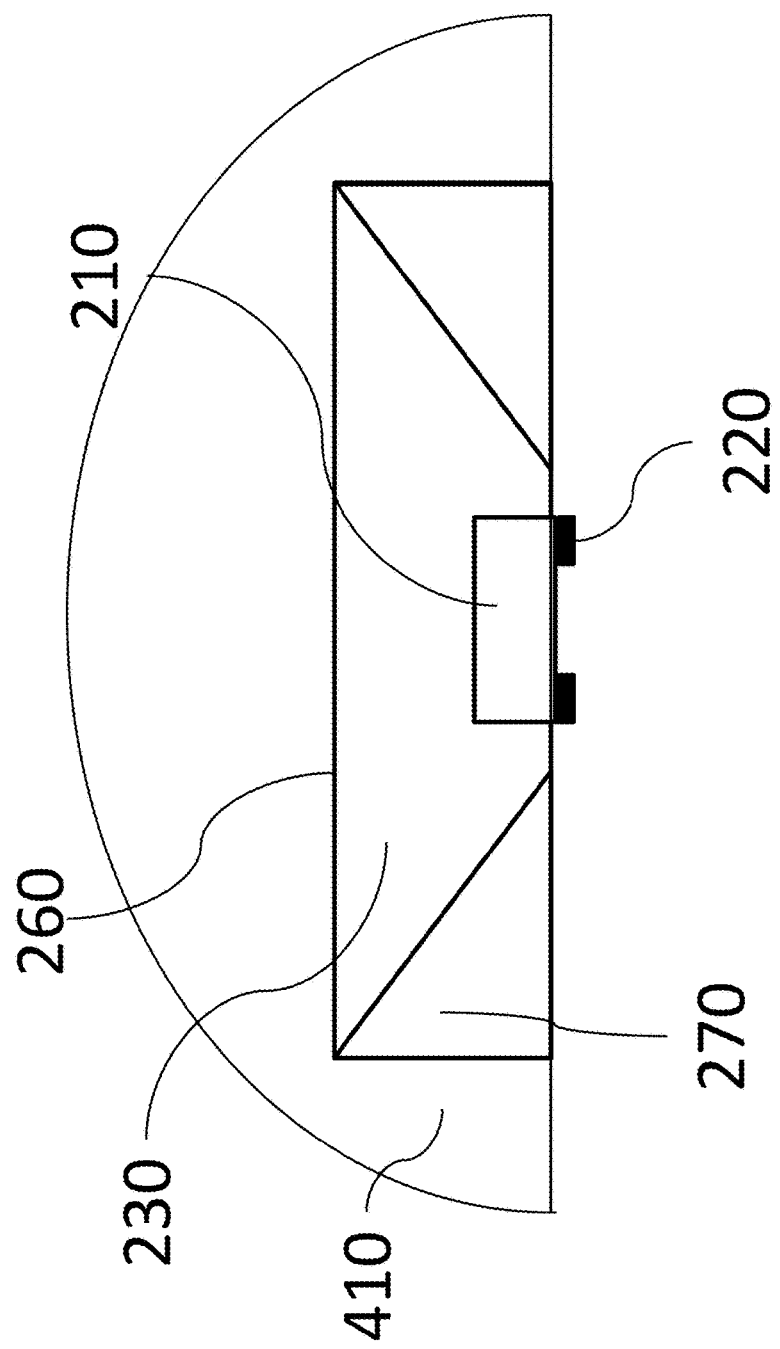

In some embodiments of the present invention, transparent material 410 may be disposed over phosphor 230 and all or one or more portions of sidewalls 250. For example, FIG. 4J shows an embodiment of the present invention in which transparent material 410 is disposed over sidewalls 250 and surface 260 of phosphor 230. While FIGS. 4H and 4I show transparent material 410 having a substantially rectangular shape and substantially conforming to the underlying shape of frame 270 and phosphor 230, this is not a limitation of the present invention, and in other embodiments transparent material 410 may have a different shape from that of frame 270 and/or phosphor 230. For example, in some embodiments of the present invention transparent material may have a hemispherical shape, a parabolic shape, a triangular shape or any arbitrary shape. FIG. 4K shows an example of one embodiment of the present invention in which transparent material 410 has a hemispherical shape that is disposed over surface 260 of phosphor 230 and sidewalls 250.

In some embodiments of the present invention, transparent material 410 may protect frame die 200, for example, by encapsulating all or substantially all of phosphor 230. In some embodiments, transparent material 410 may reduce or eliminate exposure of phosphor 230 and/or frame 270 to moisture or water vapor or other potentially harmful airborne or surface contaminants. In some embodiments of the present invention, transparent material 410 may be utilized to modify the optical and/or structural and mechanical characteristics of frame die 200. For example, transparent material 410 may be engineered to provide a specific light distribution pattern, a specific angular color uniformity, and/or a specific CCT; however, the shape of transparent material 410 is not a limitation for present invention, and material 410 may be formed in any arbitrary shape.

Figure 5A:
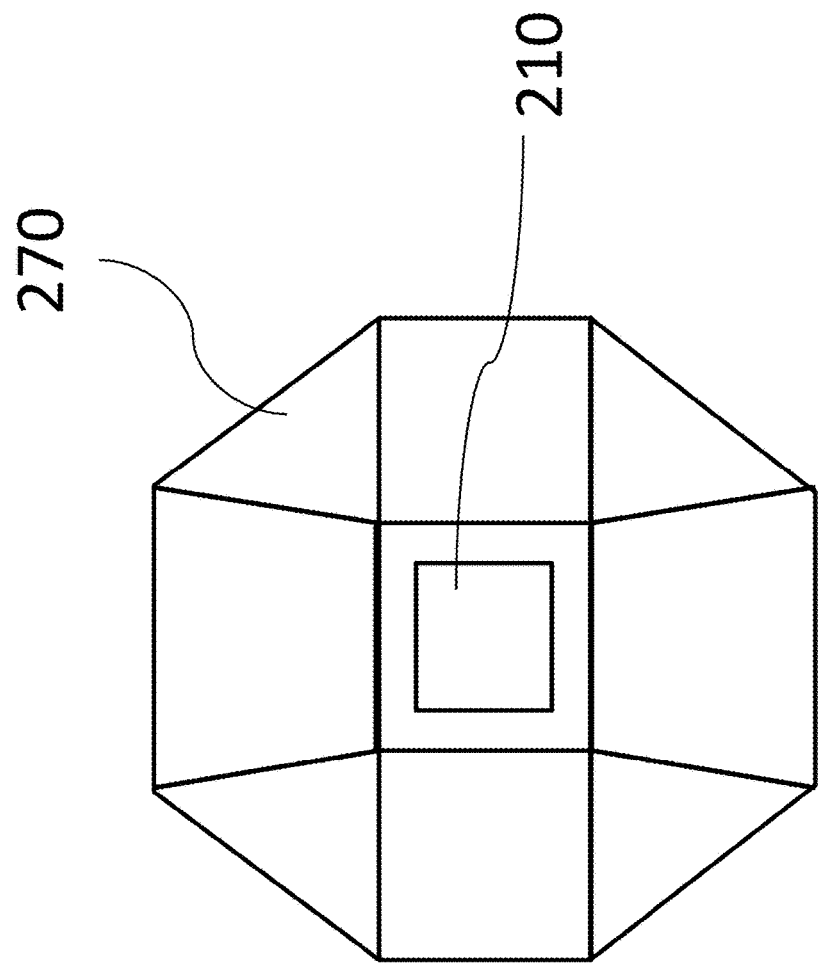
FIGS. 5A and 5B are plan views of frame dies in accordance with various embodiments of the invention.
Figure 5B:
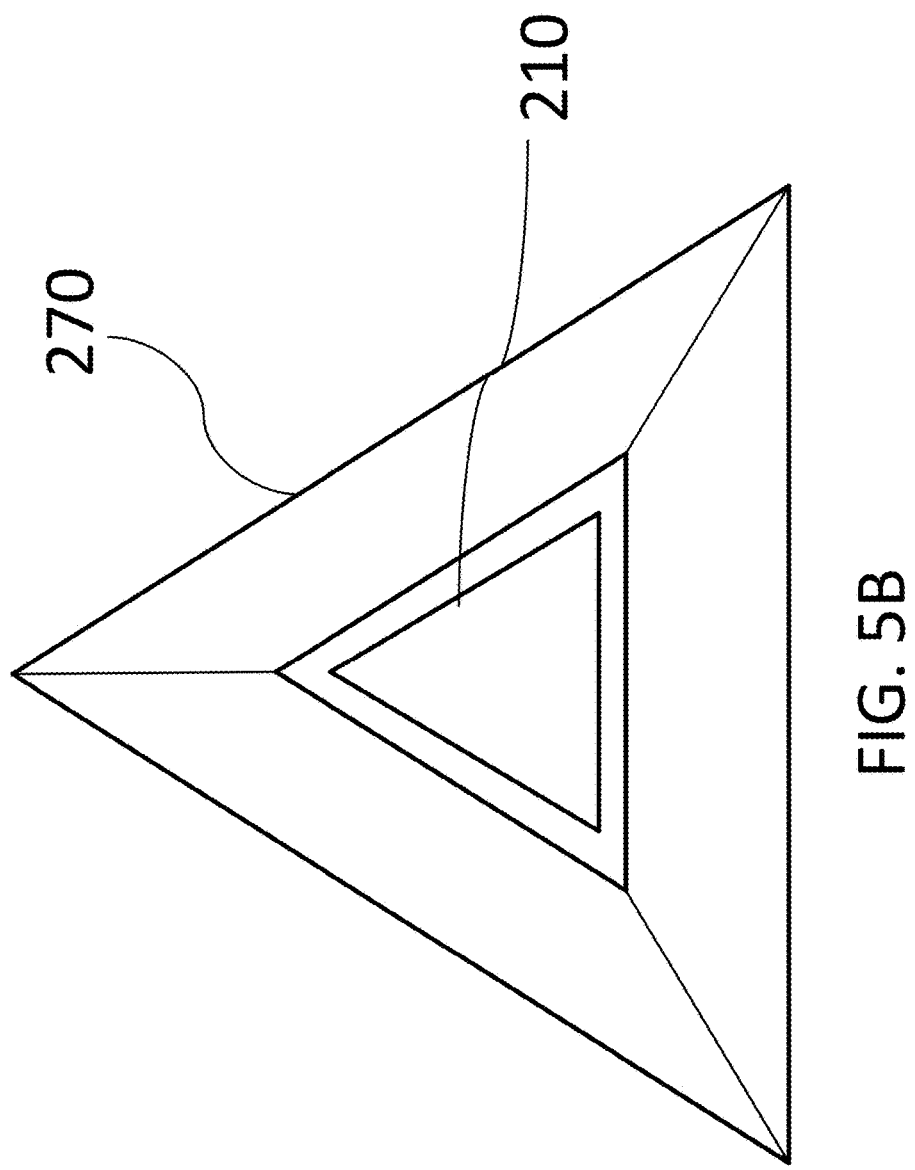

In some embodiments of the present invention, the interior of frame 270 is a square, as shown in FIG. 1A, or a rectangle; however, this is not a limitation of the present invention, and in other embodiments the interior and/or the exterior shape of frame 270 may have other geometries, for example octagonal as shown in FIG. 5A, or hexagonal, or any arbitrary shape. Differently shaped frames 270 may be used in combination with differently shaped LEEs 210, as shown for example in FIG. 5B.

In some embodiments of the present invention, frame die 200 is formed before attachment (electrical and/or mechanical) to a package or substrate. In some embodiments, frame die 200 may itself function as a package, while in other embodiments frame die 200 may be incorporated into additional packaging components. In some embodiments of the present invention, frame die 200 may be attached directly to a circuit board, substrate or the like without intermediate packaging. A key element of embodiments of the present invention is that frame die 200 does not incorporate a second level contact to LEE 210, as contacts 220 of LEE 210 are the contacts for frame die 200.

FIG. 6 is a flow chart of a process 600 for forming a frame die 200. Process 600 is shown having eight steps; however, this is not a limitation of the present invention, and in other embodiments the invention has more or fewer steps and/or the steps may be performed in different order. In step 610, a first surface or base is provided. In step 620, one or more LEEs are placed or formed on the base. In step 630, a frame wafer is provided. In step 640, the frame wafer is mated to the base. In step 650, the phosphor is provided. In step 660, the phosphor is formed over the LEE and base, resulting in a composite frame wafer. In step 670, the phosphor is cured. In step 680, the composite frame wafer containing the phosphor-coated LEEs is separated or singulated into frame dies 200. A step to remove the base (not shown in FIG. 6) may be implemented at different points in the process, as discussed herein. Various approaches to manufacturing and using frame dies 200 are discussed below. The terms "frame wafer" and "composite frame wafer" are used to identify elements of the structure during manufacture, before singulation step 680. In some embodiments of the present invention, singulation step 680 is optional. In some embodiments, step 620 may take place after step 640, i.e., the frame wafer is provided (step 630) and mated to the base (step 640) and then LEEs are placed on the base in the through-holes in the frame wafer (step 620).

Figure 7A:
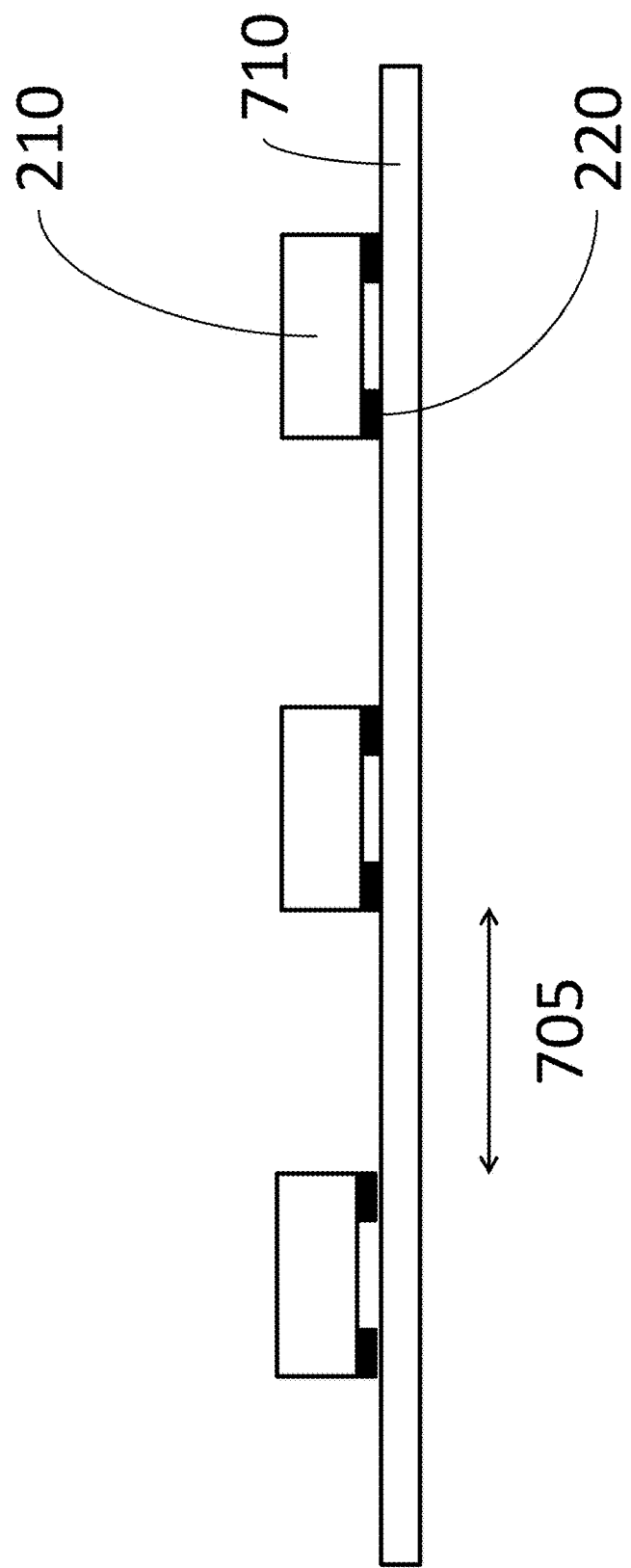

FIGS. 7A-7F depict one embodiment of process 600. In this embodiment of the present invention, a base 710 is provided (step 610) and LEEs 210 are placed on or adhered to base 710 (step 620) with contacts 220 adjacent to base 710 (FIG. 7A). Base 710 may also be referred to as a "mold substrate." In some embodiments of the present invention, base 710 includes or consists essentially of an adhesive film or tape. In some embodiments, base 710 includes or consists essentially of a material which has a relatively low adhesion to phosphor 230, that is, it permits removal of cured phosphor 230 from base 710. In some embodiments of the present invention, the base material deforms such that contacts 220 of LEEs 210 penetrate below the surface of base 710, for example the contacts 220 may be embedded into base 710. In some embodiments of the present invention, base 710 is the same as or similar to dicing or transfer tapes used in the semiconductor industry for singulation and/or transfer of dies, for example Revalpha from Nitto Denko Corporation or tapes from Semiconductor Equipment Corporation. In some embodiments of the present invention, base 710 includes or consists essentially of a water-soluble material or adhesive, or may be covered or be partially covered with a water-soluble material. For example, the adhesive of base 710 or the liner or both may be water-soluble. In some embodiments of the present invention, the water-soluble material includes or consists essentially of a water-soluble tape, for example 3M type 5414. In some embodiments of the present invention, base 710 includes or consists essentially of a silicone or a silicone-based material, for example PDMS or GelPak material from the Gel-Pak Corporation.

In some embodiments of the present invention, base 710 includes or consists essentially of a material with variable adhesive force. In such embodiments, the adhesive force may be changed after formation and curing of the phosphor, to make it easier to remove the frame die or frame die wafer from base 710. (A composite frame wafer is herein defined as multiple semiconductor dies suspended in a binder and surrounded by a frame. The frame may have multiple openings, and one or more semiconductor dies suspended in a binder within each opening.) In some embodiments of the present invention, such a variable adhesive force material may achieved using a thermal release tape or a UV release tape. In some embodiments of the present invention, the variable adhesive force material may be achieved by using an electrostatic chuck (LEEs 210 are formed or placed on the electrostatic chuck, similar to the structure shown in FIG. 7A). In such embodiments, LEEs 210 are held in place on the electrostatic chuck by electrostatic forces that may be activated or deactivated electrically.

In some embodiments of the present invention, it is desirable for all or a portion of the face of contact 220 to be exposed after formation of frame die 200, that is, to not be covered by phosphor 230. In some embodiments of the present invention, placing or adhering all or a portion of the face of contact 220 adjacent to base 710 prevents coverage or formation of phosphor 230 over all or a portion of contact 220 or over all or a portion of the face of contact 220. In some embodiments of the present invention, the thickness, hardness and/or other properties of a coating on base 710, or the properties of base 710, for example an adhesive thickness, chemical composition, surface energy, hardness, elasticity, etc., may be varied to ensure the desired level of exposure of contacts 220, for example by proximity to base 710 or partial or full embedding of contacts 220 into base 710.

In some embodiments of the present invention, base 710 includes or consists essentially of a surface or a mold (e.g., a non-flat surface). Base 710 may include or consist essentially of one or more of a variety of materials, for example glass, PET, PEN, plastic film, tape, adhesive on plastic film, metal, acrylic, polycarbonate, polymers, silicone, polytetrafluoroethylene (Teflon), or the like. In some embodiments, base 710 is rigid or substantially rigid, while in others base 710 is flexible. In some embodiments of the present invention, it is advantageous for base 710 to include or consist essentially of a "non-stick" material such as polytetrafluoroethylene, or a fluorinated material such as Fluon ETFE produced by Asahi Glass, or to include a non-stick coating over the surface or portion of the surface that may come in contact with phosphor 230 (for example the binder in phosphor 230) so that phosphor 230 does not stick to base 710. In some embodiments of the present invention, base 710 includes or consists essentially of a layer of material that does not adhere well to the binder material. In some embodiments of the present invention, base 710 includes or consists essentially of a water-soluble material or adhesive, or base 710 is partially or completely lined with a water-soluble material to aid in the release of base 710 from the material formed in base 710. In some embodiments of the present invention, base 710 includes or consists essentially of or is partially or fully lined with a water-soluble tape, for example 3M type 5414. In some embodiments, base 710 is transparent to light, for example to visible, infrared, and/or UV radiation. In some embodiments of the present invention, the area of base 710 is in the range of about 0.25 mm$^2$ to about 900 cm$^2$; however, the area of base 710 is not a limitation of the present invention, and in other embodiments the area of base 710 is smaller or larger to accommodate the size of the frame (provided in step 630 of process 600).

In some embodiments of the present invention, contacts 220 of LEEs 210 have a thickness of between about 0.1 μm and about 5 μm. In other embodiments, contacts 220 have a larger thickness, for example between about 5 μm and about 50 μm. In some embodiments of the present invention, contacts 220 having a larger thickness may include or consist essentially of stud bumps. Larger contact thickness may be advantageous for some embodiments in which it is desirable to ensure that the light emitting region of the LEE is buried deeper within the phosphor.

A spacing 705 between adjacent LEEs 210 may be adjusted so that each LEE 210 is surrounded by (and optionally centered or substantially centered within the aperture) a portion of the frame wafer 720 (FIG. 7B) after step 640 of process 600. As will be discussed herein, spacing 705 may be mainly determined by the frame wafer dimensions.

Figure 7B:
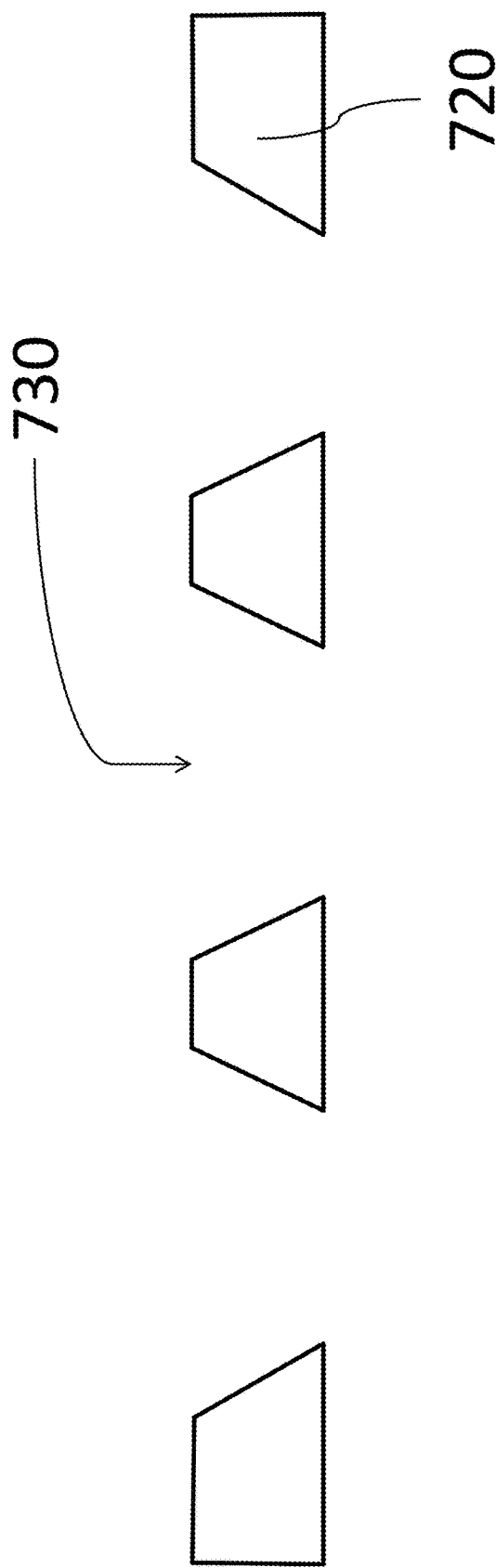

The next step (step 630) in process 600 is to provide frame wafer 720 as shown in FIG. 7B. Frame wafer 720 includes or consists essentially of one or more materials having at least one through-hole (or "aperture") 730. In some embodiments of the present invention, frame wafer 720 has a large number of through-holes 730, to permit batch fabrication of a large number of frame dies 200. Additional detail regarding the dimensions, materials and manufacture of frame wafer 720 are described herein.

In step 640 frame wafer 720 is mated to base 710, as shown in FIG. 7C. FIG. 7C shows one LEE 210 in each through-hole 730 of frame wafer 720; however, this is not a limitation of the present invention, and in other embodiments more than one LEE 210 may be disposed within each through-hole 730. In various embodiments, during the manufacturing process one or more through-holes 730 may be processed without an LEE 210 within the through-hole.

The next step (step 650) in process 600 provides a phosphor (uncured or partially cured phosphor 740). In one embodiment, phosphor 740 includes or consists essentially of a wavelength-conversion material and a binder. In some embodiments of the present invention, the wavelength-conversion material and binder are mixed prior to application, for example in a centrifugal mixer, with or without a partial vacuum over the mixture.

Figure 7D:
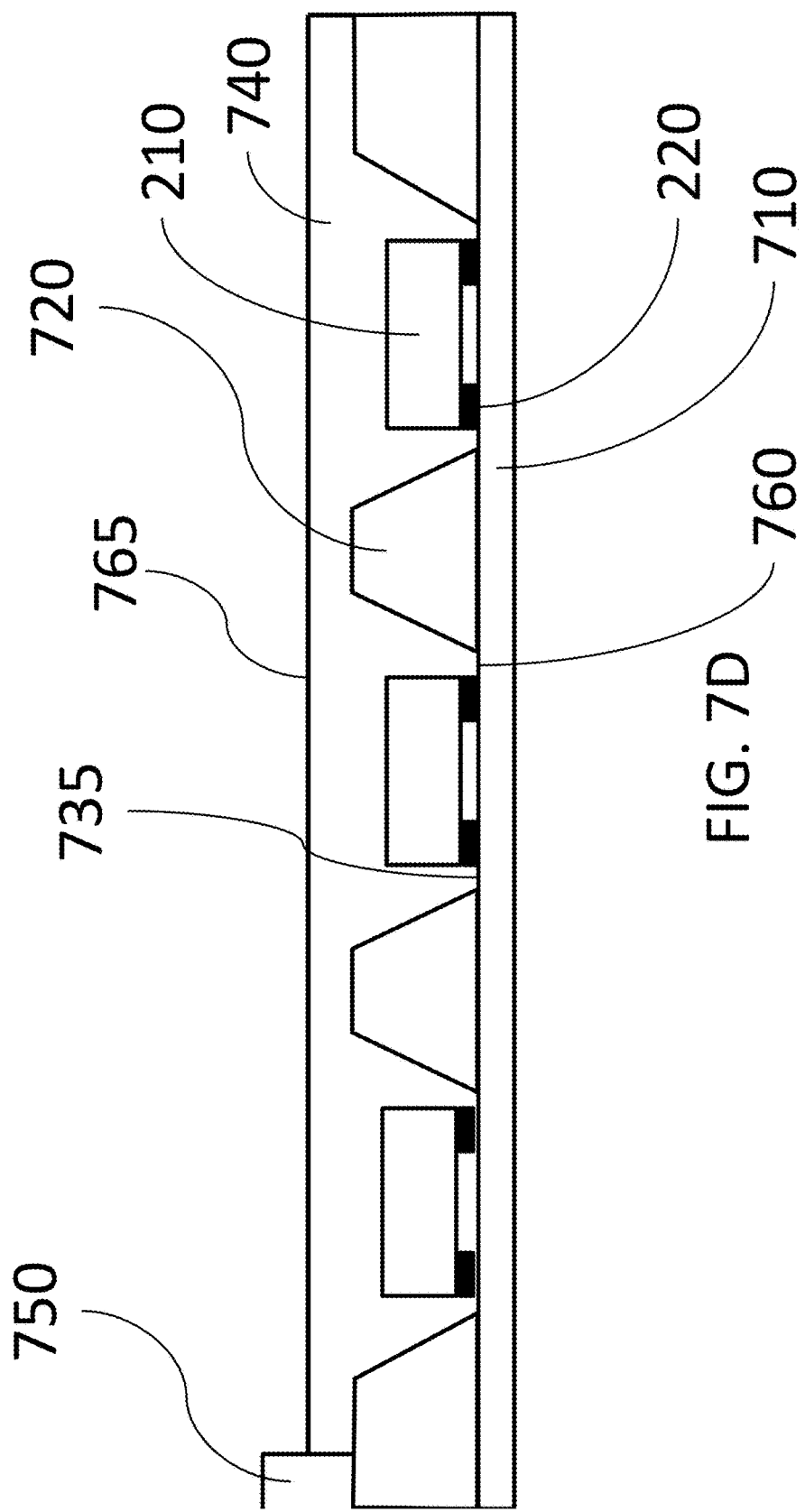

In the next step (step 640) in process 600, phosphor 740 is formed over base 710, frame wafer 720 and LEEs 210 as shown in FIG. 7D. In some embodiments of the present invention, phosphor 740 is contained or bounded by surface 735 of base 710 and optional sides or barriers 750 as shown in FIG. 7D. In some embodiments of the present invention, barriers 750 may be parts of base 710; however, this is not a limitation of the present invention, and in other embodiments barriers 750 may be separate from base 710. In embodiments in which barrier 750 is not a part of base 710, barrier 750 may include or consist essentially of a material similar to that or different from that of base 710. In some embodiments of the present invention, barrier 750 may be a ring or stencil surrounding frame wafer 720. In such embodiments, phosphor 740 has a bottom surface or face 760 and a top surface or face 765. In some embodiments of the present invention, surfaces 760 and 765 are substantially parallel to each other. In some embodiments of the present invention, surfaces 760 and 765 are substantially flat and parallel.

Phosphor 740 may be formed by a variety of techniques, for example casting, dispensing, spraying, pouring, injecting, injection, compression, transfer or other forms of molding, Mayer bar or draw-down bar, doctor blade, etc. The method of formation of phosphor 740 is not a limitation of the present invention. In some embodiments, base 710 is positioned such that surface 735 is level, such that when phosphor 740 is formed on base 710, surface 735, bottom surface 760 of phosphor 740 and top surface 765 of phosphor 740 are parallel or substantially parallel, forming a thin layer of phosphor 740 that has a uniform or substantially uniform thickness across all or most of the area of phosphor 740. In some embodiments, one or more barriers 750 are used to prevent or partially prevent the spread of phosphor 740. In some embodiments of the present invention, surface 735 and barriers 750 form a mold for phosphor 740. In some embodiments of the present invention, barriers 750 are portions of a separate component placed over base 710 surrounding LEEs 210. In some embodiments of the present invention, barriers 750 are not used. Some embodiments of the present invention utilize a level base 710 and gravity to automatically produce phosphor layer 740 with a uniform or substantially uniform thickness. In some embodiments of the present invention, the thickness uniformity of phosphor 740 is within about ±15%, within about ±10%, within about ±5%, or within about ±1% or less. In one embodiment of the present invention, phosphor 740 covers LEEs 210 and partially fills through-holes 730 in frame wafer 720. In some embodiments of the present invention, phosphor 740 covers LEEs 210 and completely fills through-holes 730 in frame wafer 720. In some embodiments of the present invention, phosphor 740 covers LEEs 210, completely fills through-holes 730 in frame wafer 720 and extends above the top of frame wafer 720, as shown in FIG. 7D. In some embodiments of the present invention, phosphor 740 may extend above the top of frame wafer 720 by an amount in the range of about zero to about 2 mm; however, the amount that phosphor 740 extends above the top of frame wafer 720 is not a limitation of the present invention, and in other embodiments this extension may have other values.

In some embodiments of the present invention, the time between mixing phosphor 740 including or consisting essentially of binder and powdered wavelength-conversion material and disposing phosphor 740 over base 710 is relatively short compared to the time required for settling of the powder in the binder, such that the wavelength-conversion material and binder form a uniform and homogeneously distributed or substantially uniform and homogeneously distributed combination of wavelength-conversion material in the binder. In some embodiments of the present invention, the compositional uniformity of phosphor 740, that is the distribution of wavelength-conversion material in the binder, is uniform to within about ±15%, within about ±10%, within about ±5%, or within about ±1%. Other materials may also be added to phosphor 740 to advantageously modify its properties. For example, in some embodiments of the present invention, one or more materials such as fumed alumina or fumed silica may be added to phosphor 740, for example to change its viscosity or to reduce the settling rate of the wavelength-conversion particles. In some embodiments of the present invention, in mixtures of wavelength-conversion material and other optional powders, settling starts to occur within about 10 minutes to about 30 minutes, while application of phosphor 740 over base 710 occurs within about 0.25 minute to about 5 minutes after mixing. In some embodiments of the present invention, the structure shown in FIG. 7D is exposed to a partial vacuum to degas or remove all or a portion of any dissolved gases in phosphor 740, to reduce or eliminate the number of bubbles in phosphor 740. In some embodiments of the present invention, phosphor 740 is exposed to a partial vacuum before formation on base 710. In some embodiments of the present invention, phosphor 740 is formed over base 710 in a partial vacuum. In some embodiments of the present invention, base 710 is not level, resulting in phosphor 740 having a non-uniform thickness over base 710 and LEE 210, as discussed herein in more detail.

Figure 7E:
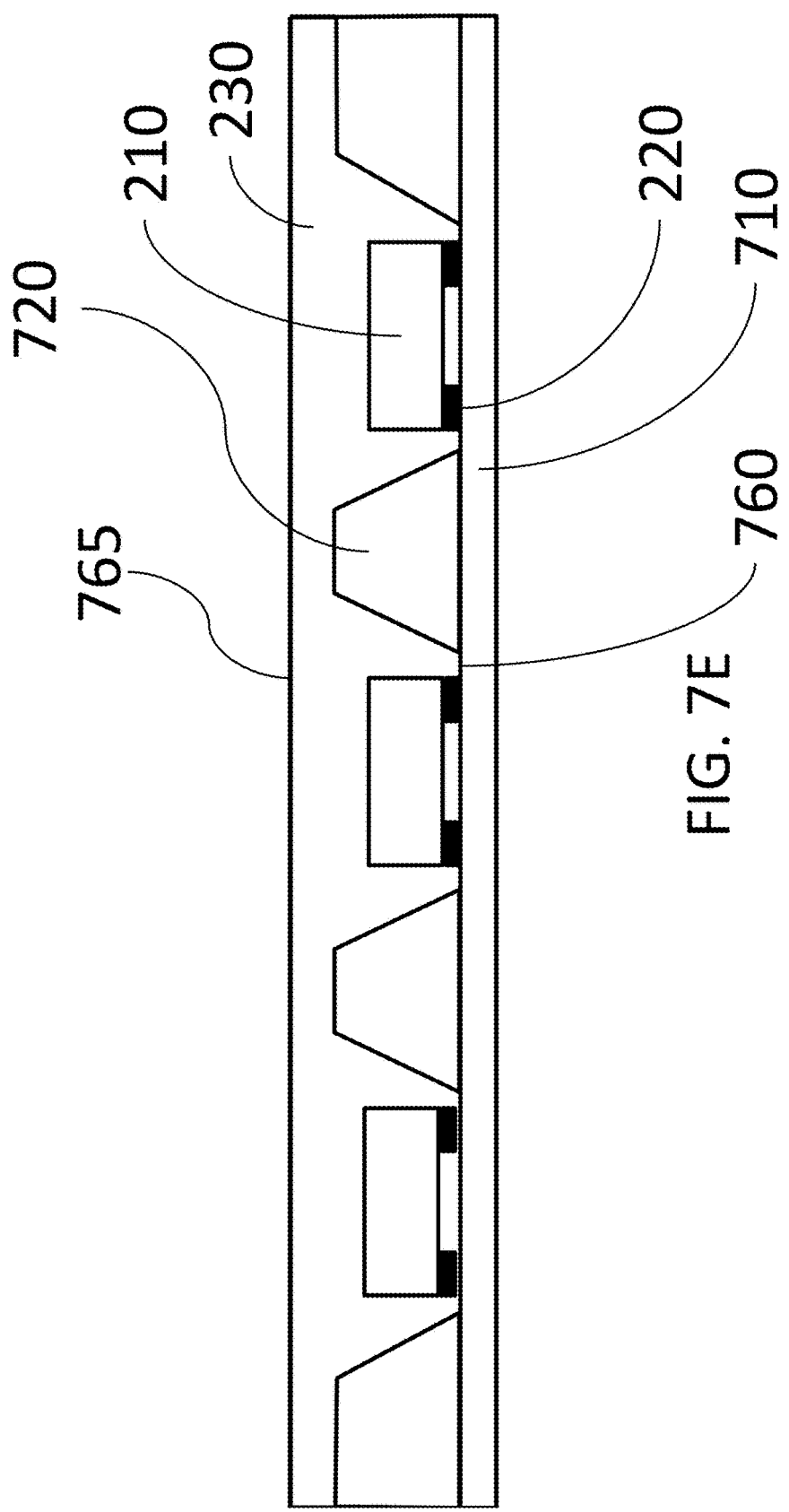

Phosphor 740 is then cured, producing cured phosphor 230 (step 670) and a composite frame wafer on base 710 as shown in FIG. 7E. Curing may include or consist essentially of heating, exposure to radiation of various sources, for example visible, UV and/or IR light, or chemical curing (i.e., introduction of a chemical agent that promotes cross-linking of the phosphor binder). In one embodiment of the present invention, phosphor 740 is cured by UV or other radiation. In one embodiment of the present invention, base 710 is held within the curing equipment prior to or just after step 670 of FIG. 6. In some embodiments of the present invention, in mixtures of binder and powder, settling starts to occur within about 10 to about 30 minutes, while curing of phosphor 740 over base 710 occurs within about 0.10 minute to about 5 minutes. In some embodiments of the present invention, steps 660 and 670 may take less than about 30 minutes, less than about 10 minutes, less than about 5 minutes, or less than about 1 minute. In some embodiments of the present invention, the curing step 670 includes or consists essentially of multiple sub-curing steps. For example, a first sub-curing step may be performed to "freeze" the phosphor particles in the matrix, and this may be followed by a second sub-curing step to fully cure the binder. In some embodiments of the present invention, the total time for forming the phosphor over the base and curing the phosphor may be within about 0.25 minute to about 15 minutes. In some embodiments of the present invention, both the formation and curing process may take less than about 4 minutes. In some embodiments of the present invention, the second sub-curing step may have a duration between about 10 minutes and about 3 hours. In some embodiments of the present invention, in the case of thermal curing, the curing process is performed at between about 100° C. and about 180° C. In some embodiments of the present invention, the curing process is performed at a low temperature of below about 100° C., for example between about 35° C. and about 100° C. In some embodiments of the present invention, the curing time for a low-temperature cure process may be between about 1 hour and about 24 hours. However, the curing time and temperature are not limitations of the present invention, and in other embodiments other cure times and temperatures may be used. In some embodiments of the present invention, curing may include multiple steps, with each step optionally having a different time and/or temperature.

Figure 7F:
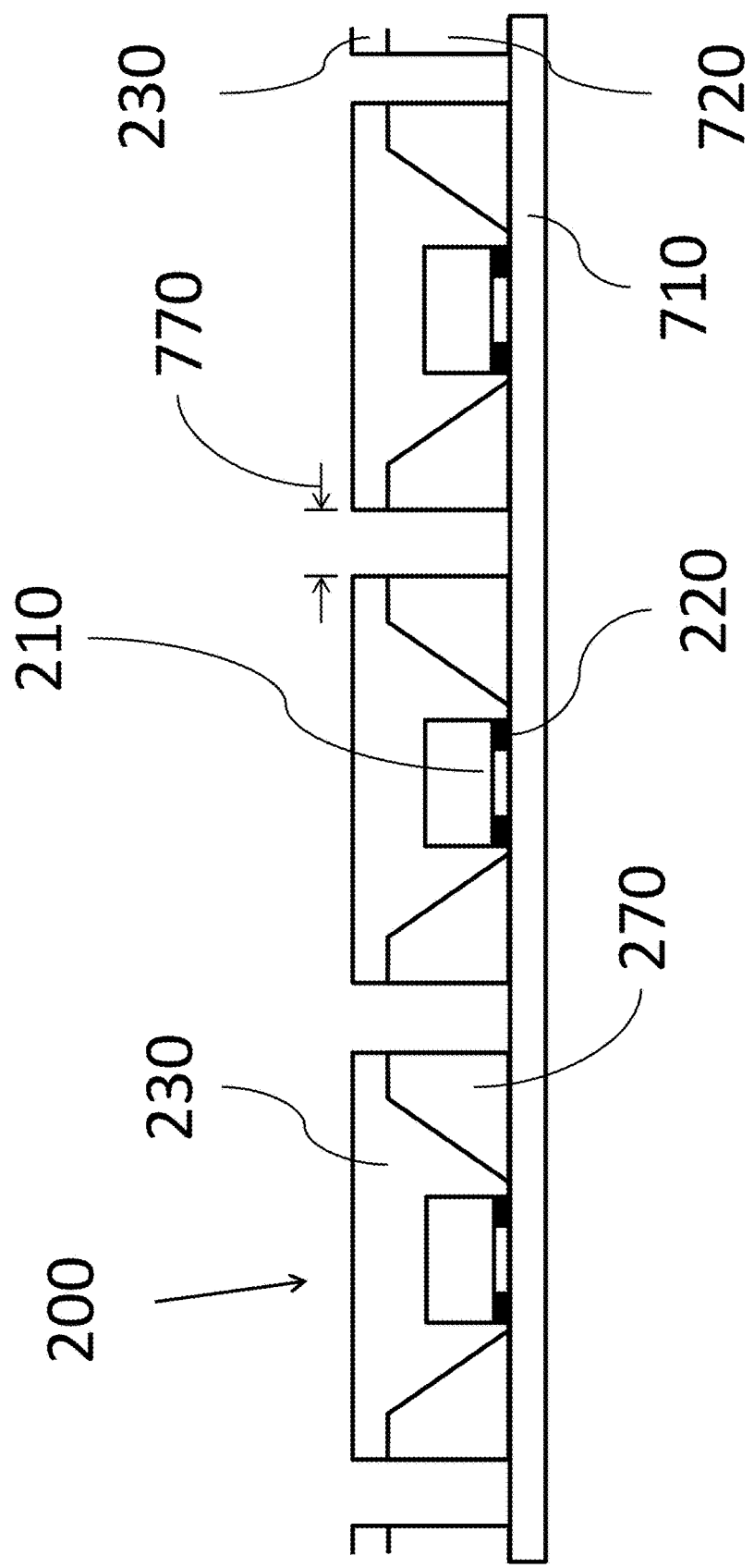

In step 680, frame dies 200 are separated or singulated from the structure shown in FIG. 7E (i.e., a composite frame wafer), resulting in the structure shown in FIG. 7F. In FIG. 7F the portions of frame wafer 720 associated with frame die 200 have been identified as 270, as in FIG. 1A. While FIG. 7F shows each frame die 200 as incorporating one LEE 210, this is not a limitation of the present invention, and in other embodiments frame die 200 includes more than one LEE 210. Frame dies 200 may have a size ranging from about 0.25 mm to about 5 mm; however, the size of frame dies 200 is not a limitation of the present invention. For example, a frame die including a large array of LEEs 210 may have a lateral dimension of at least 3 mm or at least 7 mm or at least 25 mm. For some frame dies 200, separation may be optional, for example in the case of large arrays of LEEs 210. Separation of the composite frame wafer into individual frame dies 200 may be performed by a variety of techniques, for example laser cutting, cutting with a knife, die cutting, dicing, saw cutting, water jet cutting, ablation, or the like. In some embodiments, a kerf 770 between frame dies may be less than about 200 μm or less than about 100 μm or less than about 50 μm or even less than 25 μm. This permits very large arrays of frame dies 200 to be formed in a relatively small area with relatively high throughput and relatively low cost. In some embodiments of the present invention, the molding process leads to very uniform phosphor thickness, resulting in uniform optical characteristics. The ability to form a very large number of frame dies 200 from a relatively small volume and area of phosphor, in a relatively short time, to avoid or minimize settling of the phosphor powder in the binder, coupled with the relatively high thickness uniformity, leads to very large arrays of frame dies 200 having relatively narrow distribution of optical characteristics, such as chromaticity, color temperature, color rendering index (CRI), luminous flux, etc. and very low manufacture cost. In some embodiments of the present invention, an entire wafer of LEEs 210 may be batch processed simultaneously using this approach. For example LEEs 210 may be produced on a 2" or 4" or 6" or larger diameter wafer. After LEEs 210 are fabricated and singulated (here singulation refers to singulation of the substrate on which LEEs 210 are formed), they may be transferred to mold substrate 710 for a frame die process detailed herein. In some embodiments of the present invention, the entire wafer amount of LEEs 210 may be transferred in batch mode (i.e., together) to mold substrate 710, for example using a tape-to-tape transfer process. In other embodiments, LEEs 210 may be transferred to mold substrate 710 die-by-die or in groups of dies.

In some embodiments of the present invention, separation (i.e., of the frame dies) takes place before removal from base 710 while in other embodiments base 710 is removed before separation, as discussed in more detail herein. In some embodiments of the present invention, phosphor 230 includes or consists essentially of only a transparent binder that is transparent to a wavelength of light emitted by LEEs 210.

Figure 7G:
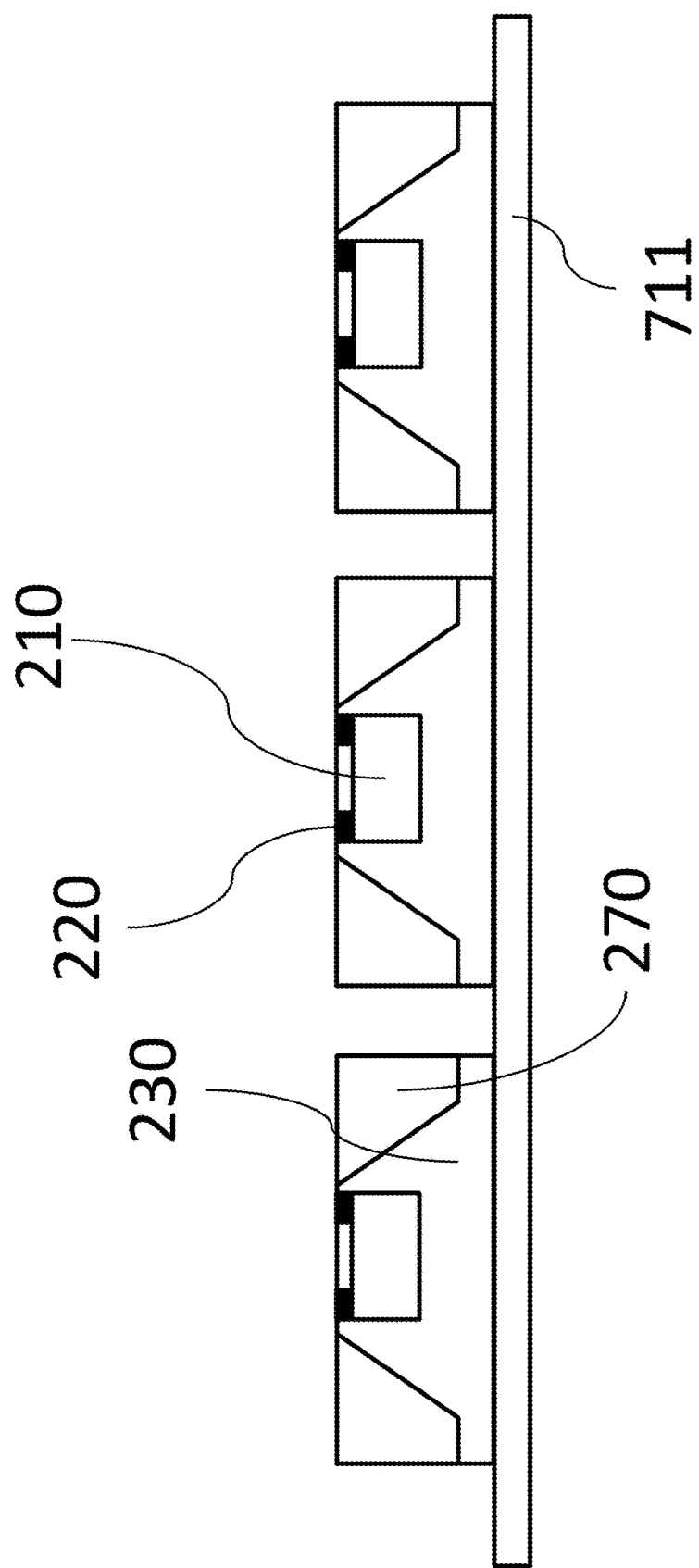

In some embodiments of the present invention, the frame die 200 shown in FIG. 7F may be transferred to another substrate 711 such that contacts 220 are accessible, as shown in FIG. 7G. Such a transfer may be performed using transfer tape, a pick-and-place tool with a die flipper, or any other technique. In some embodiments of the present invention, this transfer may be done in batch mode, while in other embodiments it may be done die-by-die or in groups of dies. In some embodiments of the present invention, the transfer may be performed before singulation of the frame wafer. The result of this process is one or more frame die 200, as shown in FIG. 1A. In various embodiments, the process provides a batch method to produce dies integrated with phosphor, with uniform phosphor over each die, in a cost-effective way.

Frame dies 200 may then be removed from base 710 or substrate 711 for placement on a substrate or circuit board. In some embodiments of the present invention, frame dies 200 may be mounted into a separate package.

In some embodiments of the present invention, only one phosphor 740 is used; however, this is not a limitation of the present invention, and in other embodiments multiple phosphors are used. In some embodiments of the present invention, phosphor 740 may include or consist essentially of multiple different phosphor powders. In some embodiments of the present invention, a first phosphor 740 is deposited and cured or partially cured, followed by the deposition and curing of one or more successive phosphors. In some embodiments of the present invention, a binder is deposited and cured or partially cured, and the binder is transparent to a wavelength of light emitted by LEE 210 and/or phosphor 740 or 230, followed by the deposition and curing of one or more phosphors 740, to form a layered structure in which one or more layers may have a phosphor composition, type and/or thickness different from each other. In this way, a remote-phosphor frame die may be fabricated, for example as shown in FIGS. 4A-4C.

FIG. 7H shows a portion of an alternate process embodiment in which frame 720 is mated to base 710 before placement of LEEs 210 on base 710. FIG. 7H shows the process at an early stage of manufacture, at which point frame 720 has been mated to base 710. The next step is to place LEEs 210 on base 710 in through-holes 730, resulting in the structure shown in FIG. 7C. In some embodiments of the present invention, LEEs 210 may be placed within through-holes 730 on base 710 one at a time, for example using a pick-and-place operation. In some embodiments of the present invention, LEEs 210 may be placed within through-holes 730 in a batch process.

Figure 7I:
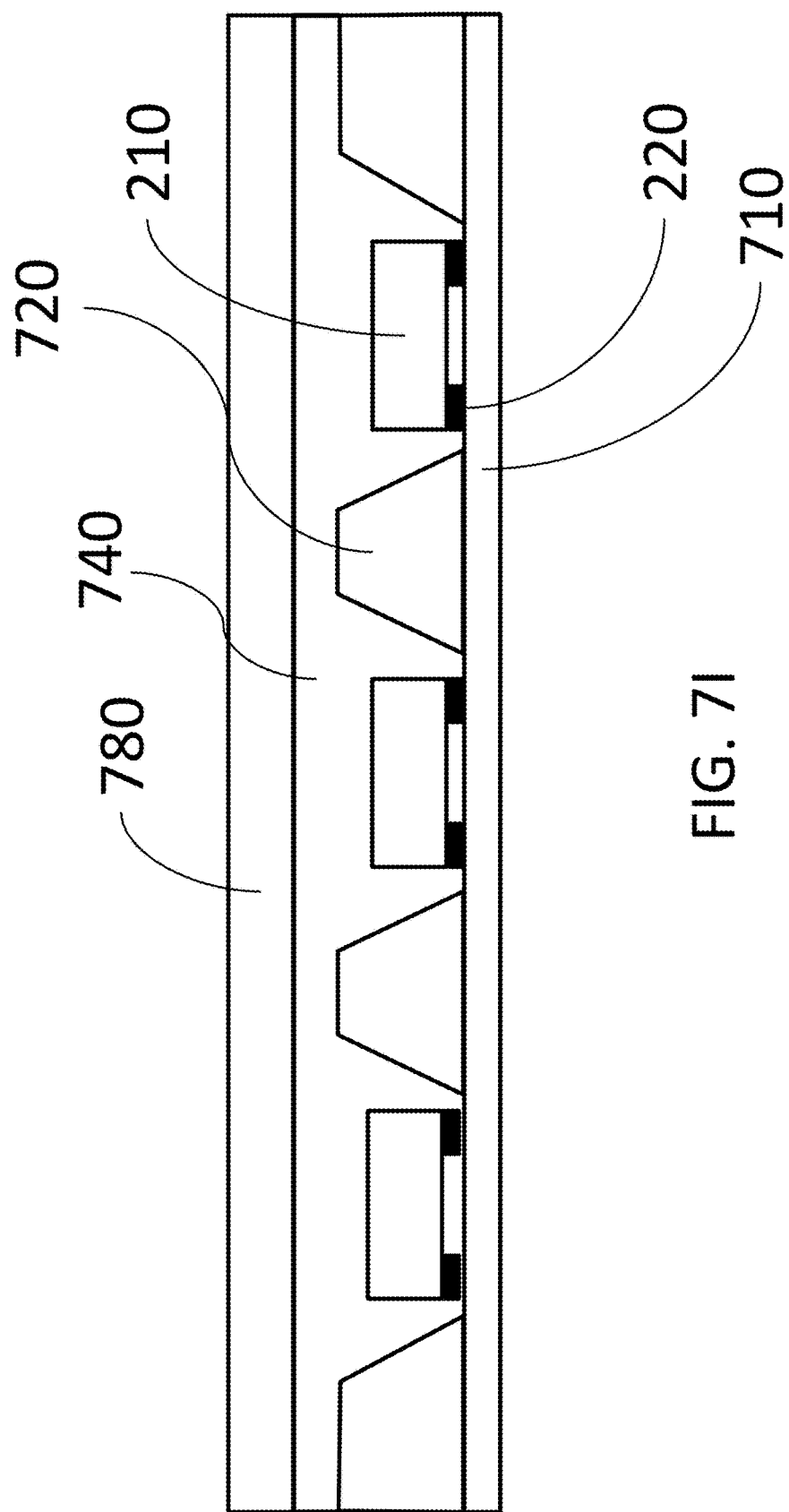
FIGS. 7I-7L are cross-sectional views of steps for the fabrication of frame dies utilizing mold covers in accordance with various embodiments of the invention.

In some embodiments of the present invention, the structure shown in FIG. 7D may have a cover 780 over and in contact with uncured phosphor 740, as shown in FIG. 7I. In some embodiments, cover 780 may be flat or substantially flat, as shown in FIG. 7I, to produce a structure similar to that shown in FIG. 1A. However, this is not a limitation of the present invention, and in other embodiments cover 780 may be shaped to produce structures having a shaped phosphor 230, for example similar to structures shown in FIGS. 1H, 1I, 1J, and 1K. Some examples of different shapes include a hemisphere, a portion of a hemisphere, a paraboloid, a Fresnel optic, or a photonic crystal; however, the specific shape is not a limitation of the present invention, and in other embodiments the phosphor may have any shape.

Figure 7J:
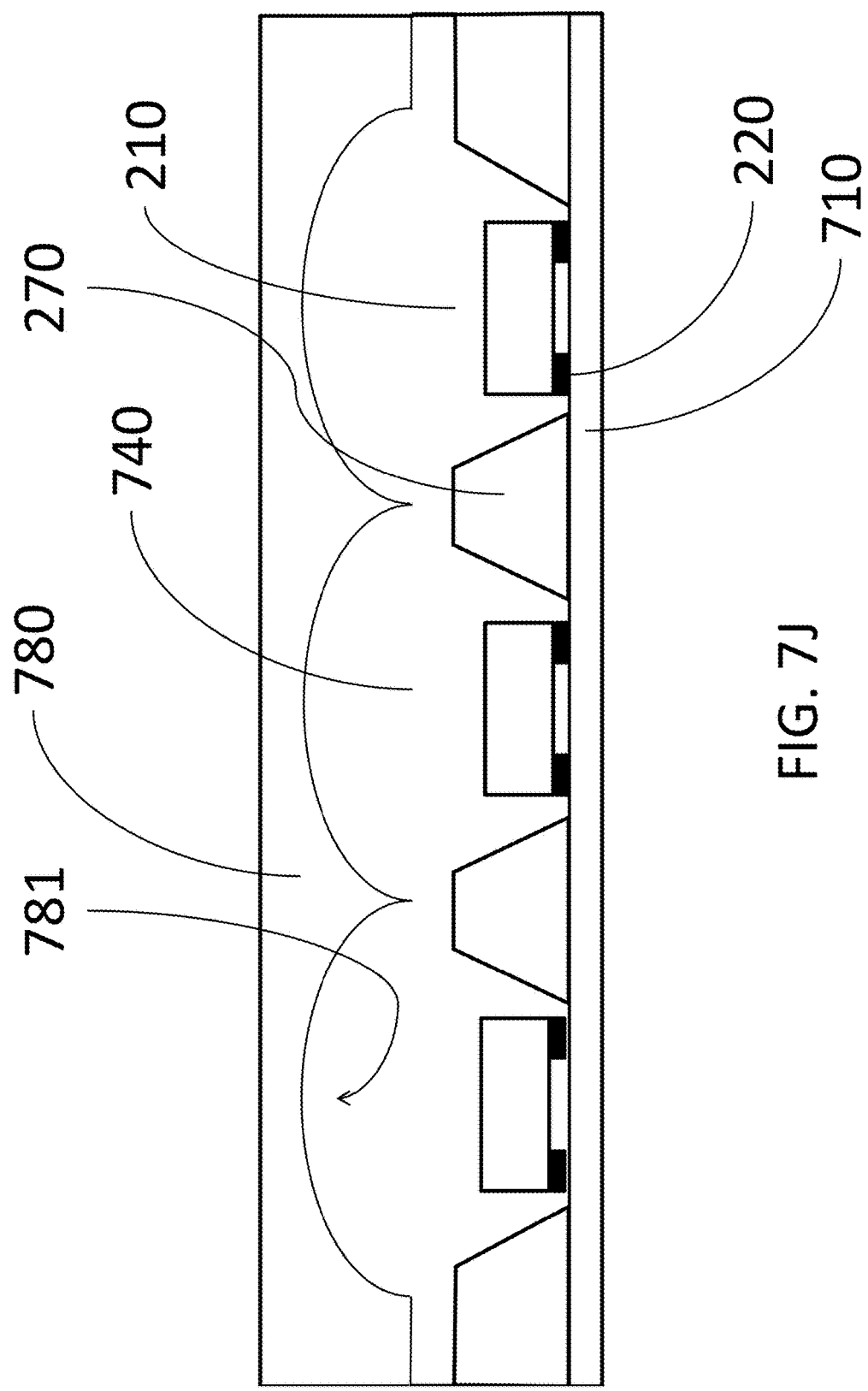
Figure 7K:
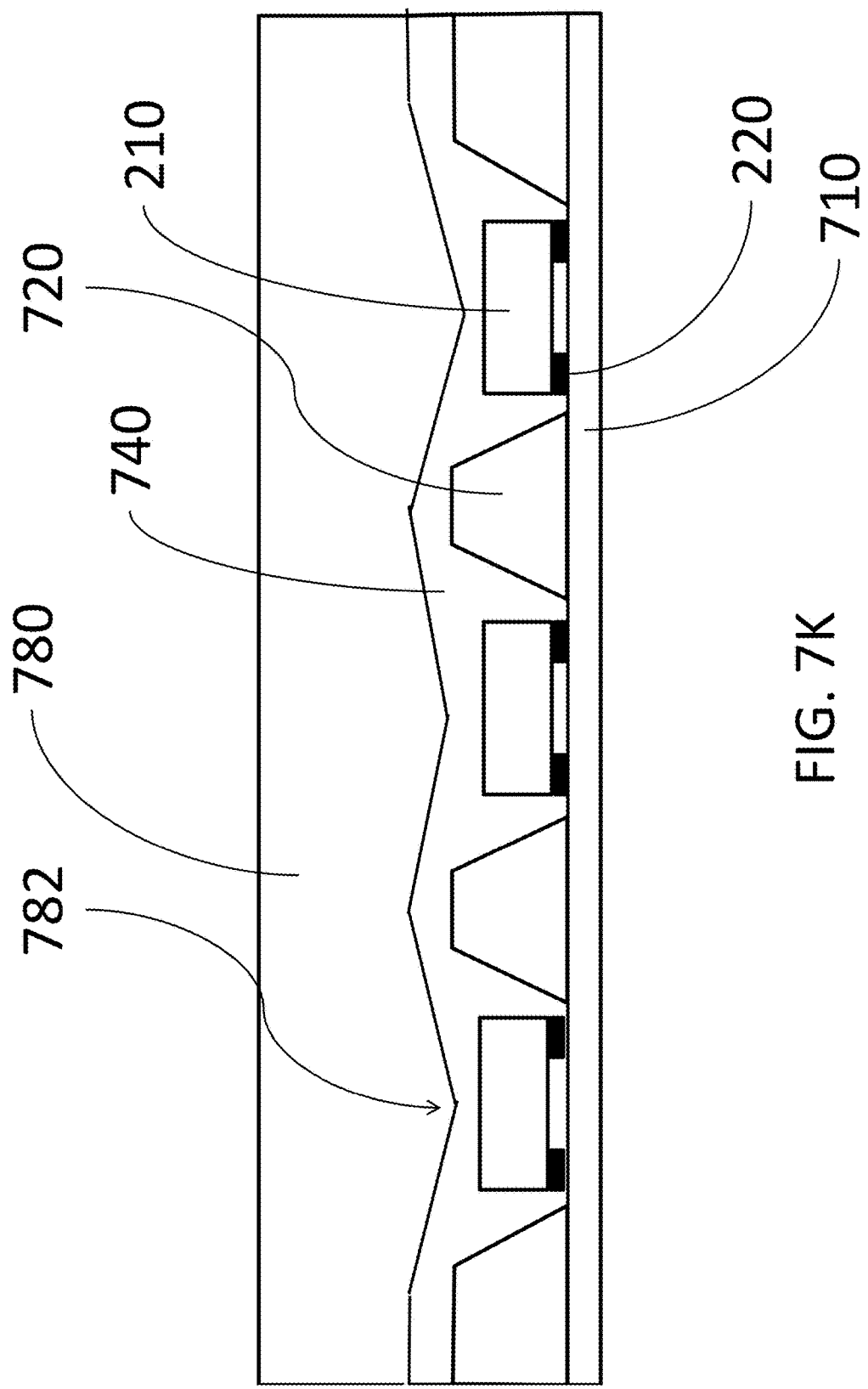

FIG. 7J shows an embodiment of the present invention similar to the structure of FIG. 7I but with a mold cover 780 featuring depressions 781 that may be used to form a frame die similar to that shown in FIG. 1H. As shown, depressions 781 are regions recessed below the remaining surface of mold cover 780. While each depression 781 in FIG. 7J is shown as having a smooth, curved surface, this is not a limitation of the present invention, and in other embodiments depressions 781 may include or consist essentially of one or more flat surfaces or have any shape. In some embodiments of the present invention, mold cover 781 may include protrusions 782 (i.e., regions extending beyond the remaining surface of mold cover 780), as shown in FIG. 7K, that may be used to produce a frame die similar to that shown in FIG. 1O. While each protrusion 782 in FIG. 7K is shown as having a flat surface, this is not a limitation of the present invention, and in other embodiments, protrusions 782 may include or consist essentially of one or more curved surfaces or have any shape.

In some embodiments, all or a portion of cover 780 or mold substrate 710 adjacent to phosphor 740 may be covered by (e.g., coated with) a mold release material. In some embodiments, the mold release material is a mold release film. In some embodiments, the mold release material or mold release film may be patterned, roughened, or textured to, e.g., impart similar features on all or portions of the outer surface of phosphor 230. In some embodiments, the mold release material or mold release film may be smooth or substantially smooth.

In some embodiments of the present invention, a textured or non-smooth surface of phosphor 230 reduces total internal reflection (TIR) within phosphor 230 and achieves improved light extraction. In some embodiments of the present invention, a non-smooth surface of phosphor 230 may have a periodic structure; however, this is not a limitation of the present invention, and in other embodiments the structure may be random. In some embodiments of the present invention, a non-smooth surface of phosphor 230 may include light-extraction features (e.g., raised bumps and/or depressions) having a dimension in the range of about 0.25 µm to about 15 µm. In some embodiments of the present invention, the light-extraction features may be hemispherical or pyramidal in shape; however, this is not a limitation of the present invention, and in other embodiments the light-extraction features may have any shape. In some embodiments of the present invention, the light-extraction feature is a random texture or roughness with an average roughness in the range of about 0.25 µm to about 15 µm.

In some embodiments of the present invention, providing and curing phosphor 740 to form cured phosphor 230 may be performed in a molding tool. For example, the process may include or consist essentially of injection molding, transfer molding, compression molding, casting etc. Compression molding may be carried out using equipment such as a LCM1010 manufactured by Towa Corporation.

In some embodiments of the present invention, a partial vacuum may be used to enhance transport of phosphor 740 into and to fully fill the depressions formed by through-holes 730 on mold substrate 710, and to partially or fully degas phosphor 740 before curing.

In some embodiments of the present invention, the phosphor may be shaped by the process described in reference to FIGS. 7I-7L. In other embodiments of the present invention, the phosphor may be shaped by forming a composite frame wafer as shown in FIG. 7E or a frame die as shown, for example in FIG. 1A, 1D, or 1E, and then removing one or more portions of the phosphor to produce a shape different from the starting shape. Removal of one or more portions of the phosphor may be accomplished using a variety of techniques, for example knife cutting, dicing, laser cutting, die cutting, or the like.

Figure 7L:
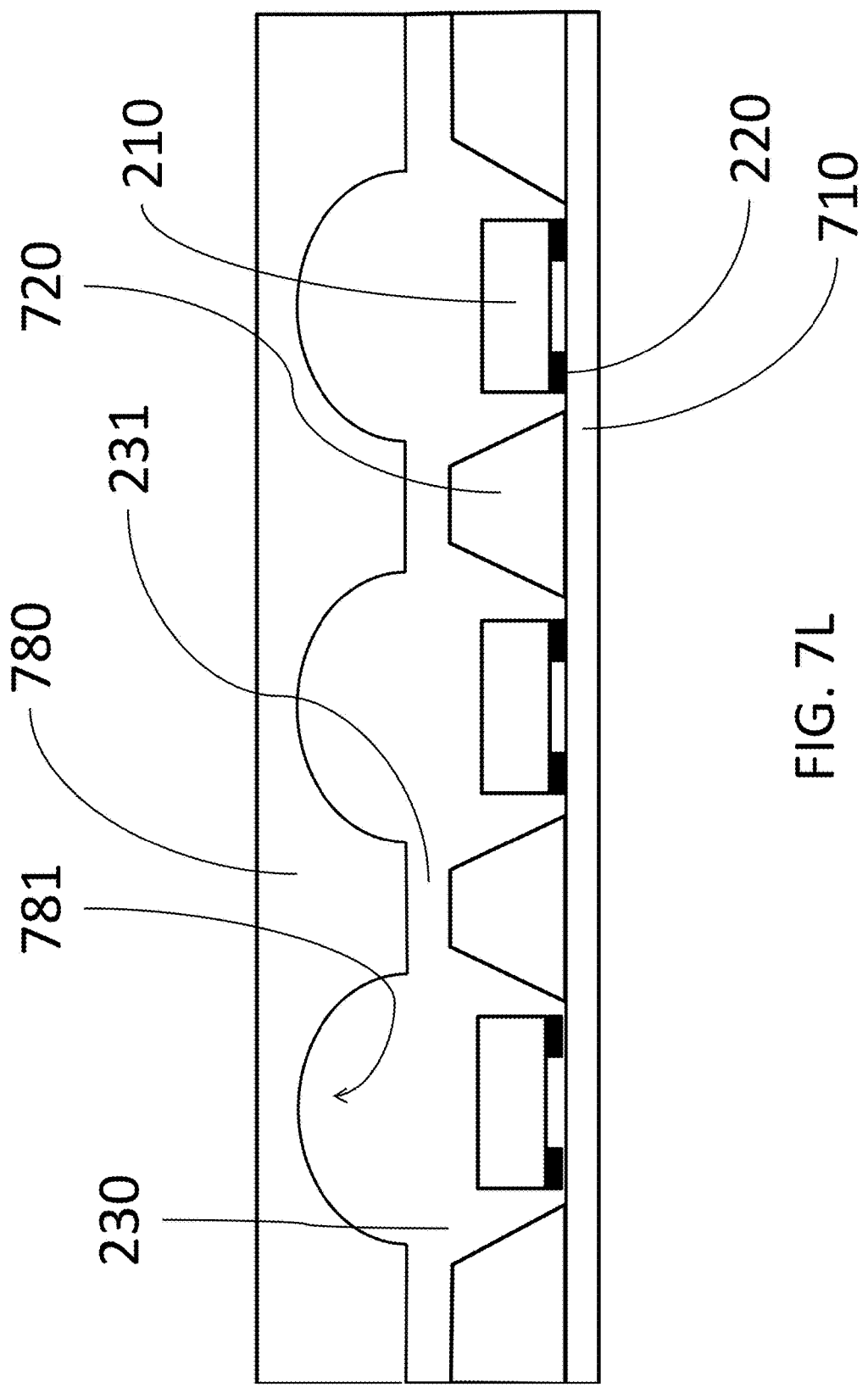

In some embodiments of the present invention, a thin portion or web 231 of phosphor 230 may be formed between adjacent frame dies, as shown in FIG. 1P and FIG. 7L. In some embodiments of the present invention, this may ease singulation by reducing the amount of phosphor that needs to be singulated with the material of frame wafer 720. In some embodiments of the present invention, singulation may be performed in more than one step, for example initially singulating the phosphor and then singulating frame wafer 720.

Figure 7M:
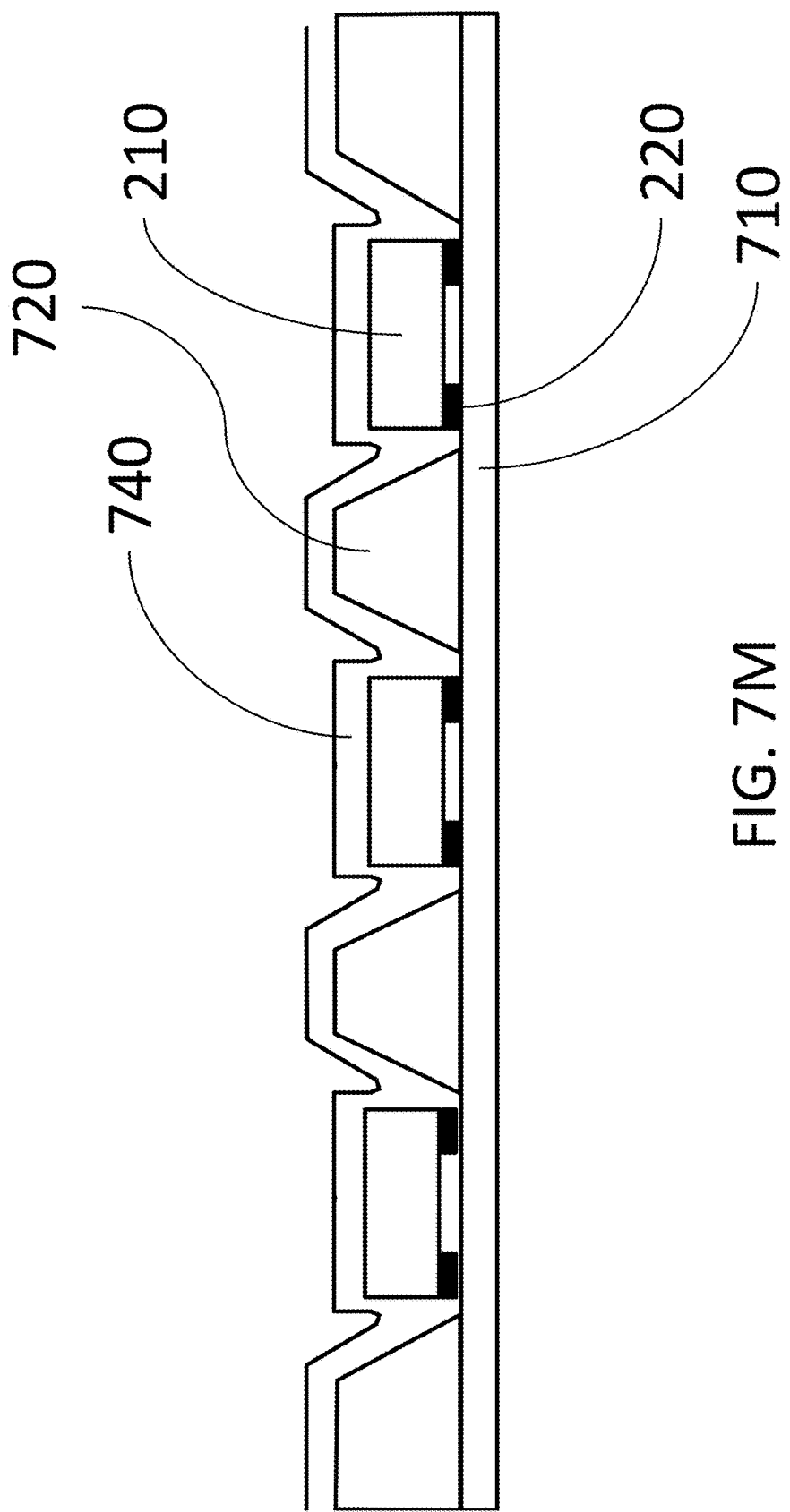
FIGS. 7M-7O are cross-sectional views of steps utilized to fabricate frame dies incorporating multiple phosphor layers in accordance with various embodiments of the invention.
Figure 7N:
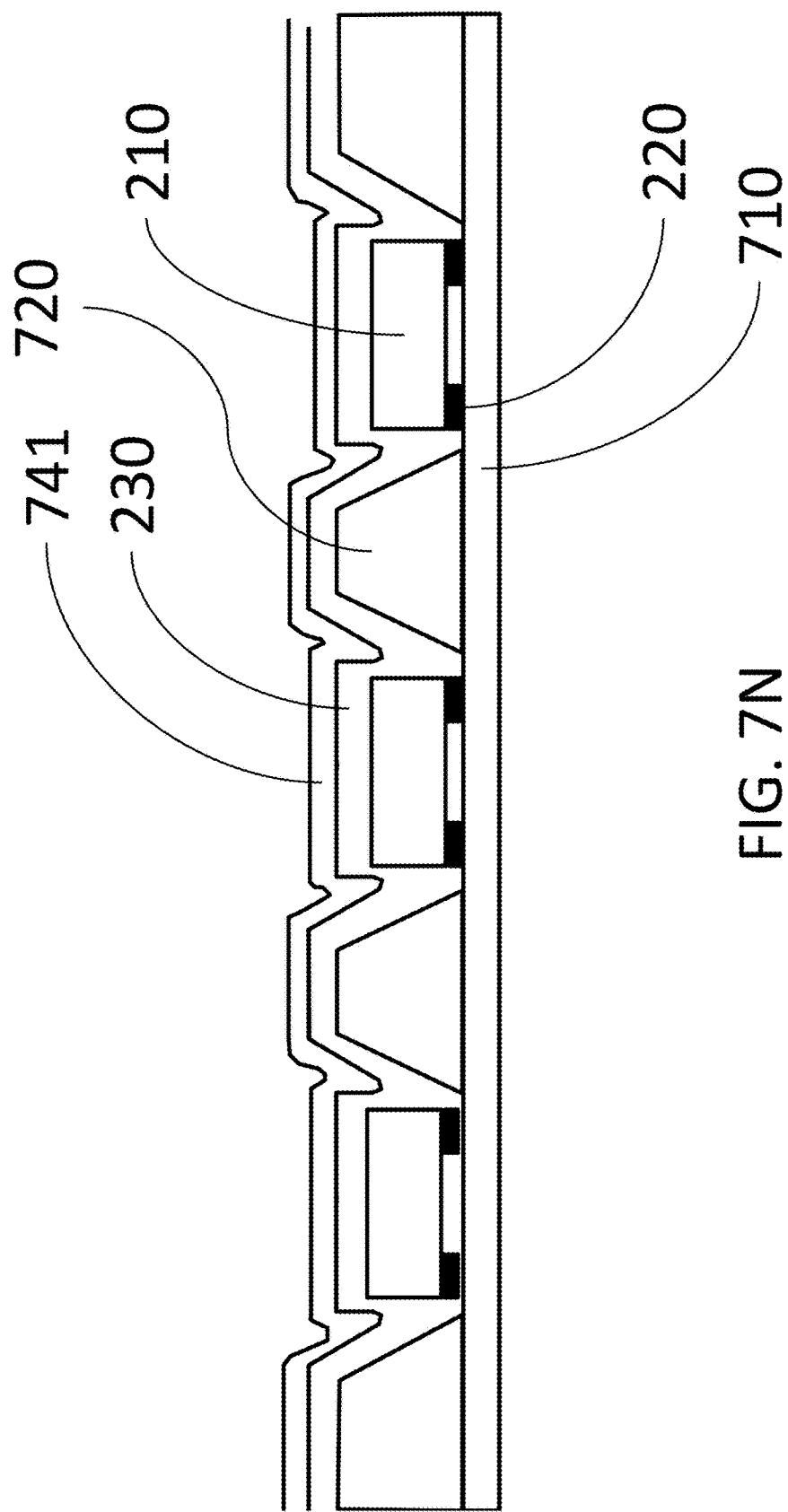
Figure 7O:
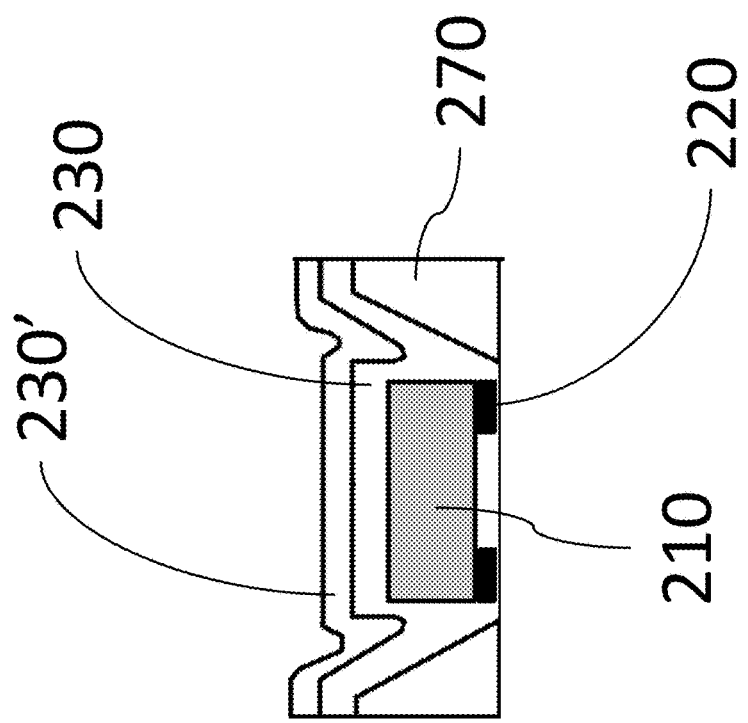

In some embodiments of the present invention, formation of phosphor 740 in step 660 may not completely fill up the recess in frame 720. For example, FIG. 7M shows the structure of FIG. 7C at a later stage of manufacture, in which phosphor 740 coats portions of frame 720 and LEE 210, but does not completely fill up the recess in frame 720. In some embodiments the structure of FIG. 7M may be cured and singulated, while in other embodiments one or more additional phosphor layers may be formed over cured or partially cured phosphor 740, for example identified in FIG. 7N as phosphor 230. After phosphor 230 is cured, phosphor 741 may be formed over cured or partially cured phosphor 230, resulting in the structure of FIG. 7N. The structure of FIG. 7N may then be cured to cure phosphor 741 and subsequently singulated, resulting in the structure of FIG. 7O, where phosphor 230 corresponds to phosphor 740 after curing and phosphor 230' corresponds to phosphor 741 after curing.

Figure 7P:
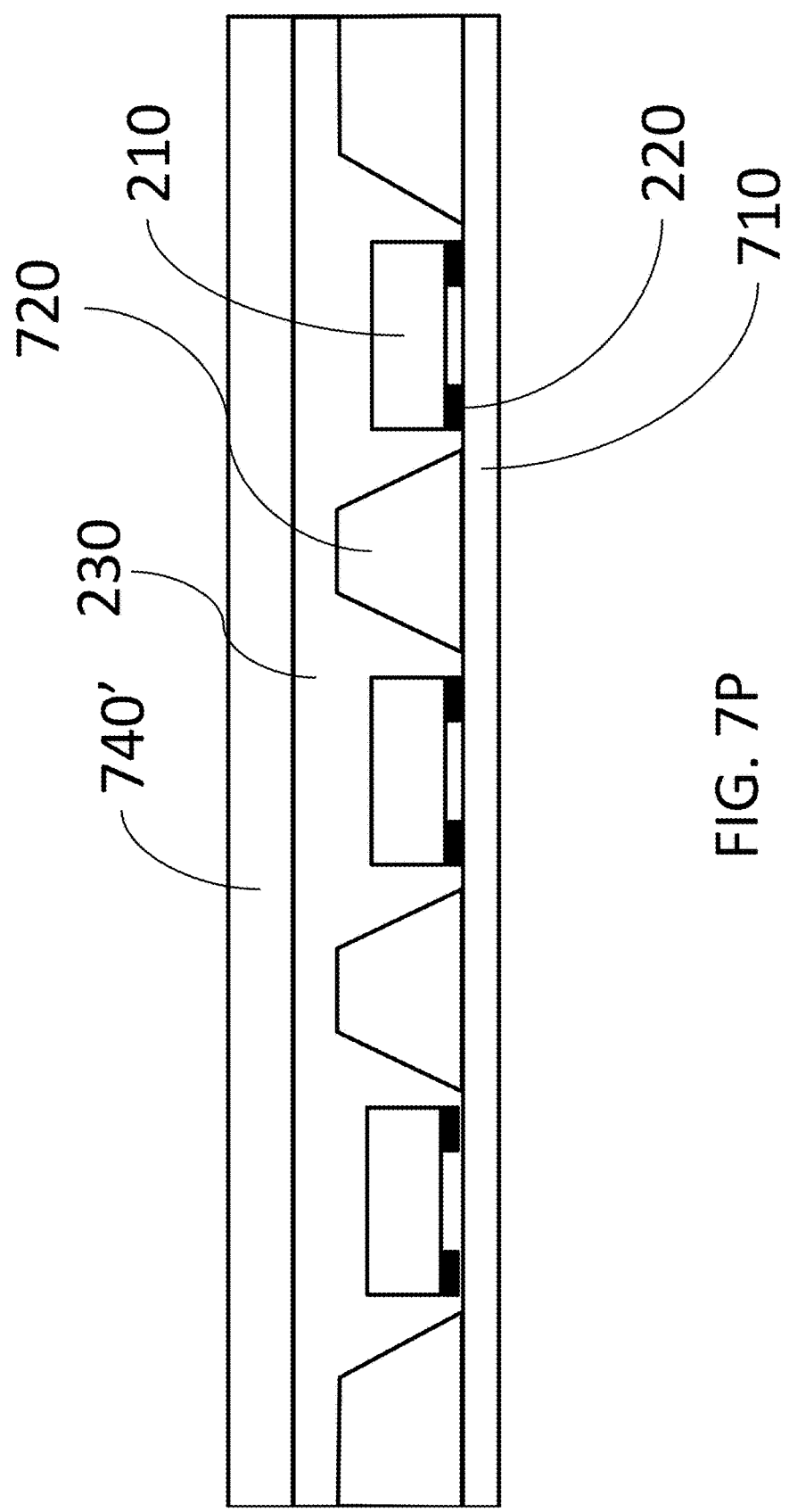
FIGS. 7P-7R are cross-sectional views of steps utilized to fabricate frame dies incorporating multiple phosphor layers in accordance with various embodiments of the invention.

In some embodiments of the present invention, more than one layer of phosphor may be formed over LEE 210 within frame 270, as shown in FIG. 7P. In some embodiments of the present invention, the structure of FIG. 7P shows the structure of FIG. 7E at a later stage of manufacture. After phosphor 740 of FIG. 7E is cured or partially cured, identified as phosphor 230 in FIG. 7P, phosphor 740' may be formed over phosphor 230 and cured, resulting in the structure shown in FIG. 4A after singulation. Referring to FIG. 4C, in some embodiments of the present invention phosphor 410 may include or consist essentially of transparent binder, without any wavelength-conversion material, while phosphor 230 includes or consists essentially of binder and wavelength-conversion material. In some embodiments of the present invention, phosphors 230 and 410 both include or consist essentially of binder and wavelength-conversion material, where binder and/or the wavelength-conversion material in phosphor 230 is different from that in phosphor 410.

In some embodiments of the present invention, frame dies 200 including or consisting essentially of two or more types of phosphor may be manufactured in stages. In the first stage a process similar to that shown in FIGS. 7A-7E is carried out. Following this, a second stage of phosphor formation is implemented. In some embodiments of the present invention, in a second stage a flat or shaped portion of phosphor is formed separately, for example using similar techniques described herein with respect to phosphor formation in frame wafer 720, for example including casting, molding, transfer molding, injection molding, compression molding, or the like. In some embodiments, binder is formed first. In a separate process the binder containing wavelength-conversion material, identified as a phosphor sheet, is formed. The phosphor sheet is then mated to the frame structure.

Figure 7Q:
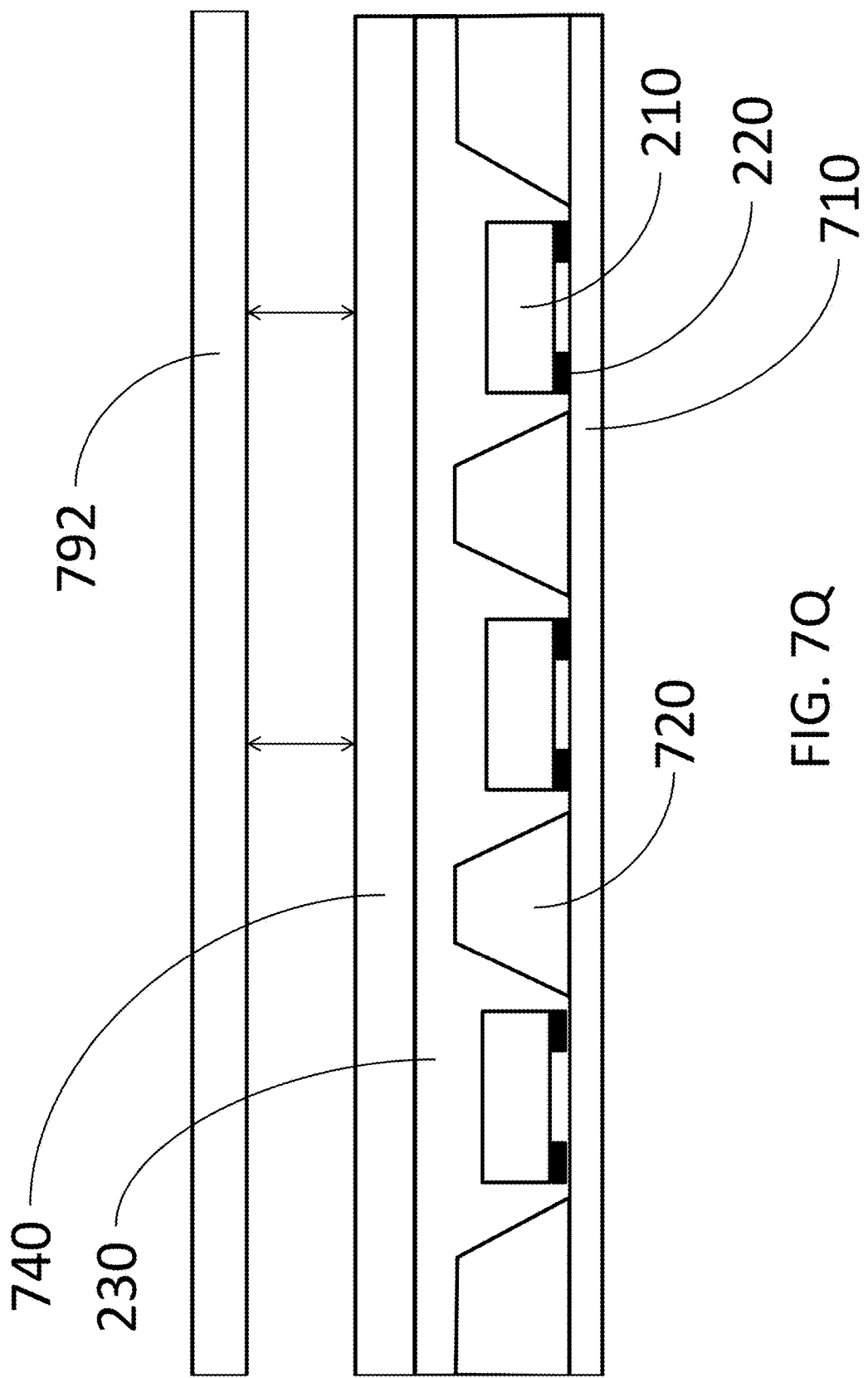

In some embodiments of the present invention, the process starts with the structure of FIG. 7D. In a separate process, a second phosphor sheet is formed. In some embodiments of the present invention, phosphor 740 of FIG. 7D is partially cured and phosphor sheet 792 is mated to uncured, partially cured or cured phosphor 740, as shown in FIG. 7Q. The structure of FIG. 7Q is then cured, causing phosphor sheet 792 to adhere to cured phosphor 740, and singulated, resulting in the structure of FIG. 4F. In some embodiments of the present invention, a transparent optical adhesive or glue, or thin intermediate layer of binder may be used to attach phosphor sheet 792 to phosphor 740. While the structure shown in FIG. 7Q produces frame dies as shown in FIG. 4F, the flat shape of phosphor sheet 792 is not a limitation of the present invention, and in other embodiments phosphor sheet 792 may be shaped, as shown for phosphor sheet 793 in FIG. 7R. In a variation of this embodiment of the present invention, the recesses in frame 720 may only just be filled with phosphor 740, as shown in FIG. 7R, and mated with phosphor sheet 793 to produce the structure of FIG. 4B after singulation.

Figure 7R:
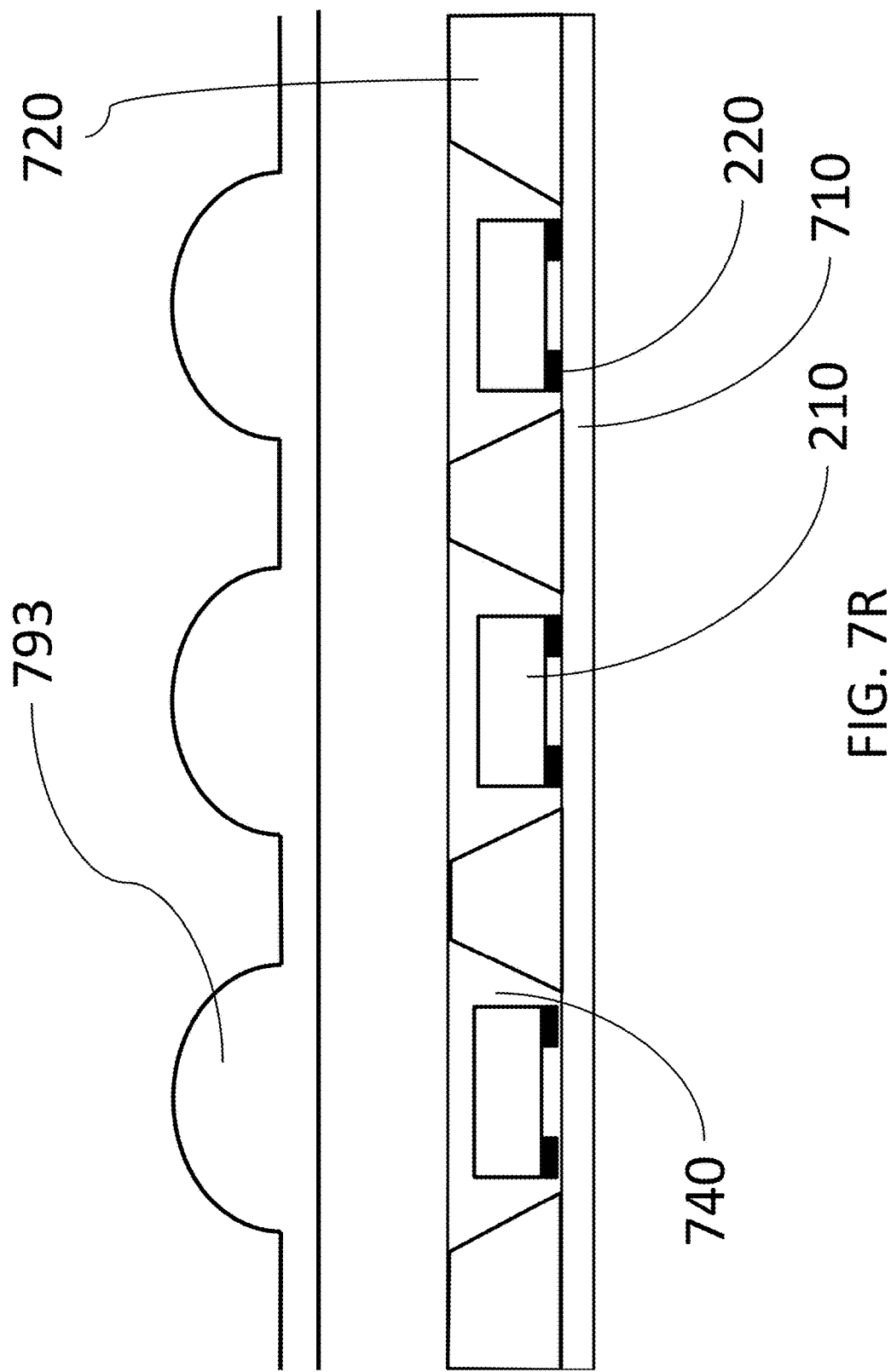

While the processes described with reference to FIGS. 7Q and 7R are for a two-stage approach, this is not a limitation of the present invention, and in other embodiments more than one phosphor sheet may be utilized. For example, two or more phosphor sheets may be made in separate processes and then mated together as discussed herein. This staged approach has the advantage of separating the formation of the wavelength-conversion material from the remainder of the process. The thickness and concentration of wavelength-conversion material within the binder may strongly impact the optical characteristics of frame die 200, for example CCT, CRI, angular color uniformity, R9, and the like. Thus, making the phosphor sheet, which includes or consists essentially of binder and wavelength-conversion material, in a separate process may lead to a relatively more uniform concentration of wavelength-conversion material in the binder and a relatively more uniform thickness, resulting in improved uniformity of optical characteristics, within a composite frame wafer and between different composite frame wafers, and thus among an entire population of frame dies.

Figure 8B:
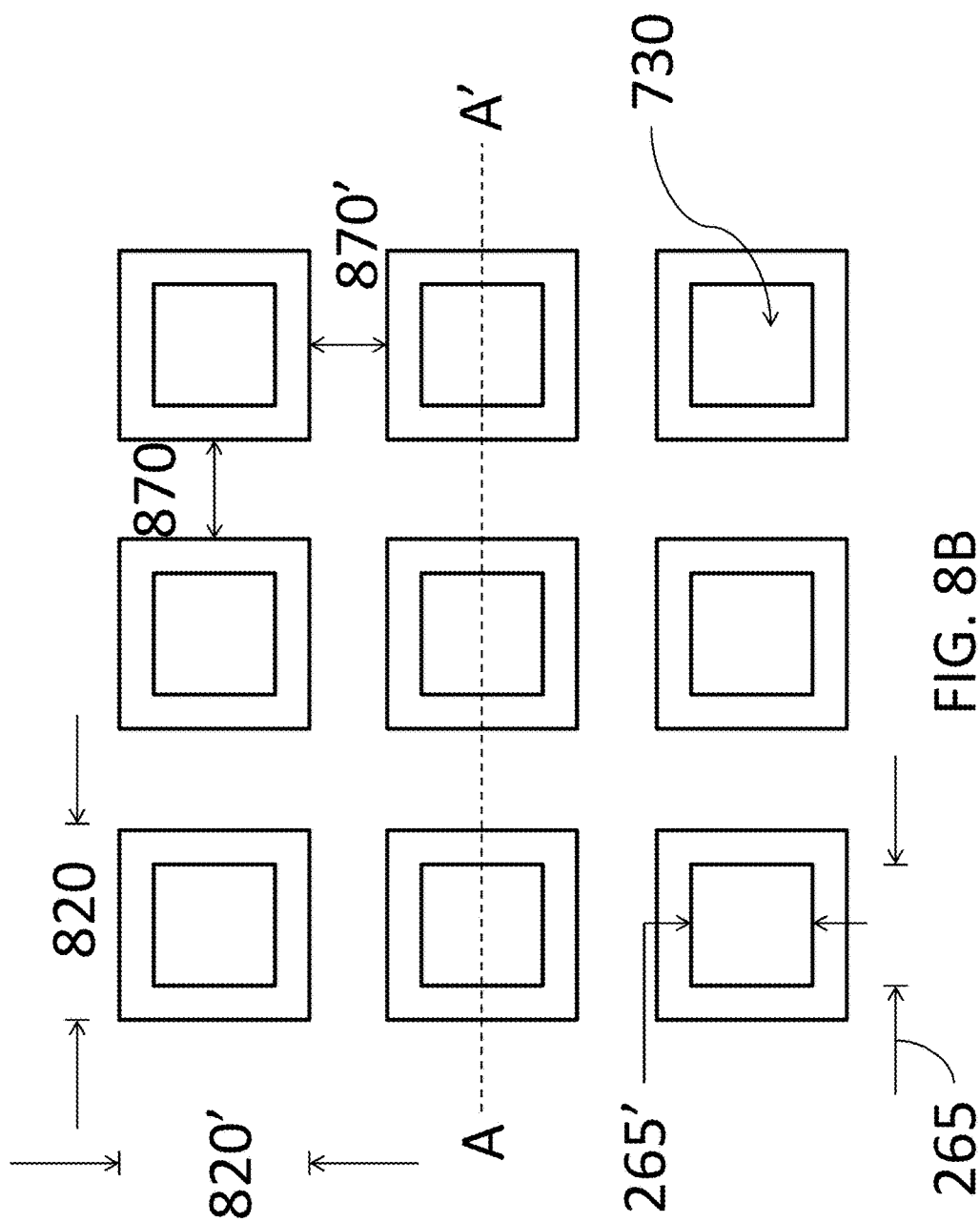
FIG. 8B is a plan view of a frame wafer in accordance with various embodiments of the invention.

FIG. 8A shows a cross-sectional view of the structure of FIG. 8B along cut line A-A'. Frame wafer 720 may include or consist essentially of one or more of a variety of materials. Various techniques for manufacture and materials for frame wafer 720 are discussed herein. In some embodiments of the present invention, frame wafer 720 includes an array of through-holes 730. In some embodiments, all through-holes 730 have the same shape and size; however, this is not a limitation of the present invention, and in other embodiments frame wafer 720 may include through-holes 730 having different sizes and shapes. In some embodiments of the present invention, through-holes 730 are arranged in a regular array, with the same distance between each through-hole 730, as shown in FIG. 8B; however, this is not a limitation of the present invention, and in other embodiments through-holes may be arranged in any type of array or pattern. The example shown in FIG. 8B shows a 3×3 array of through-holes 730; however, this is not a limitation of the present invention, and in other embodiments other array sizes may be employed. In some embodiments of the present invention, frame wafer 720 may have more than 100 through-holes 730, more than 1000 through-holes 730, or more than 10,000 through-holes 730. The number of through-holes 730 in frame wafer 720 is not a limitation of the present invention.

Through-holes 730 have sidewalls 272, which form an angle 279 with surface 810 of frame wafer 720. Angle 279 may have a wide range of values, for example from just above zero degrees to just below 180 degrees. In one embodiment, angle 279 has a value in the range of about 10° to about 90°. In another embodiment, angle 279 has a value in the range of about 10° to about 60°.

Frame 270 has a top opening and a bottom opening. In some embodiments of the present invention, top and bottom openings may have the same or substantially the same shape. In some embodiments, as shown in FIGS. 8A and 8B, the top opening is rectangular, having a length and width of 820 and 820', and the bottom opening is rectangular and has a length and width of 265 and 265', respectively. In some embodiments of the present invention, dimensions 820 and 820' are the same or substantially the same as dimensions 267 and 267' respectively of FIG. 1B. In some embodiments of the present invention, the top opening is square, in which case dimensions 820 and 820' are the same or substantially the same. In some embodiments of the present invention, the bottom opening is square, in which case dimensions 265 and 265' are the same or substantially the same.

In some embodiments of the present invention, the bottom dimension 265, 265' of through-hole 730 may be given approximately by the sum of dimension 212, 212' of LEE 210 and twice the gap 242 (FIGS. 1A-1C). For example, for LEE 210 having dimension 212 of about 180 µm and gap 242 having a value of about 5 µm, bottom dimension 265 of through-hole 730 is about 190 µm. In some embodiments of the present invention, LEE 210 has dimension 212 of about 1000 µm and gap 242 has a value of about 10 µm, resulting in a bottom dimension 265 of through-hole 730 of about 1020 µm. In some embodiments of the present invention, bottom dimension 265 may have a value in the range of about 150 µm to about 5 mm.

In some embodiments of the present invention, through-holes 730 are arranged in a regular periodic array having a distance between the tops of through-holes 730 of 870 in one direction and 870' in an orthogonal direction, as shown in FIG. 8B. In some embodiments, the value of distance 870 is the same as or substantially the same as the value of distance 870'. In some embodiments, distances 870 and/or 870' may have a value in the range of about zero (in which case through-holes 730 abut each other) to about 1 mm, e.g., in the range of about zero to about 0.5 µm. In some embodiments of the present invention, distances 870 and 870' are determined by the amount of space required between through-holes 730 for subsequent singulation. In some embodiments of the present invention, dimensions 870, 870' may be substantially zero, in which case each through-hole abuts its neighbor(s). In some embodiments of the present invention, dimensions 870, 870' may be in the range of about 10 µm to about 2000 µm, or preferably in the range of about 25 µm to about 500 µm.

In some embodiments of the present invention, through-holes 730 may have a square shape, or a rectangular shape, while in other embodiments through-holes 730 may have any arbitrary shape. In some embodiments of the present invention, the shape of the bottom of through-hole 730 is substantially the same as that of the LEE(s) 210 that will be disposed within through-hole 730. FIGS. 8A and 8B show the shape of the top and bottom of through-hole 730 as being the same or substantially the same; however, this is not a limitation of the present invention, as shown in FIG. 8C. FIG. 8C shows an embodiment of the present invention in which the bottom of through-hole 730 has a square shape and the top of through-hole 730 has a circular shape. The relative shapes of the top and bottom of through-hole 730 are not limitations of the present invention, and in other embodiments the top of through-hole 730 may have any shape and may be different than the shape of the bottom of through-hole 730, which may also have any shape.

Figure 9:
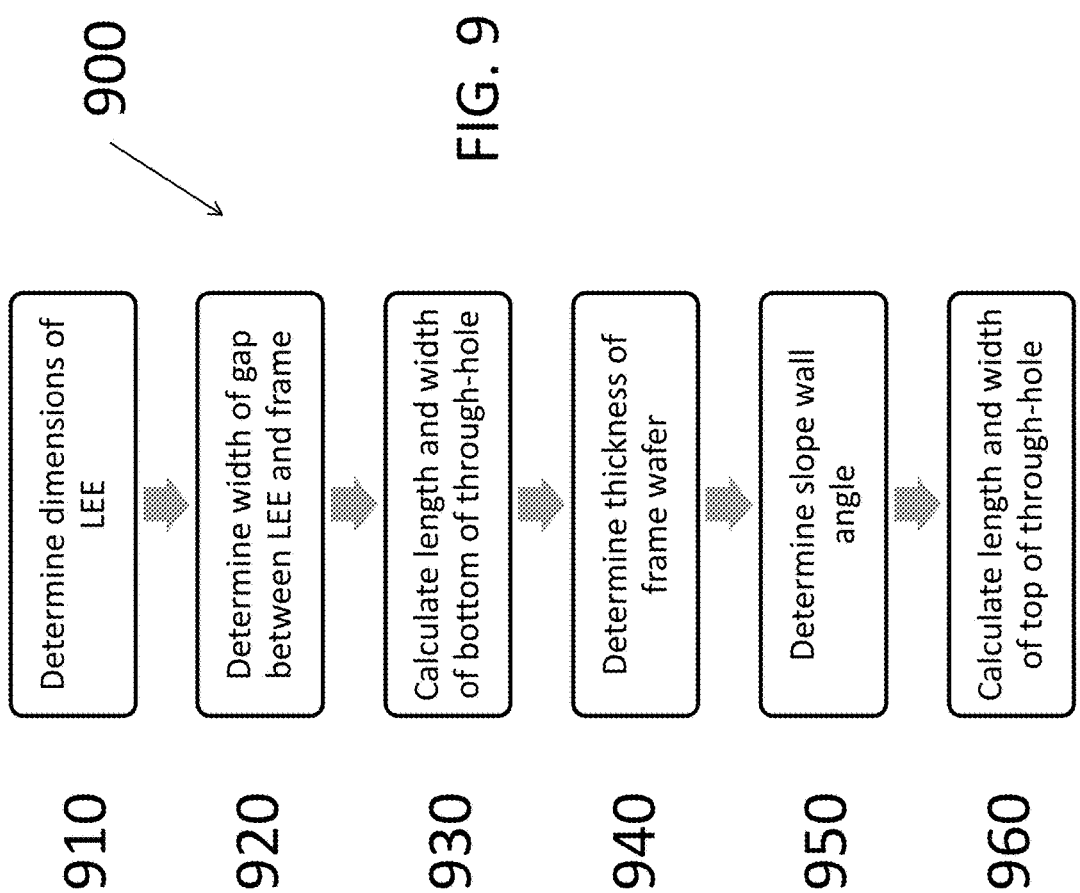
FIG. 9 is a flow chart of a process for determining the size of through-holes of a frame wafer in accordance with various embodiments of the invention.
Figure 10:
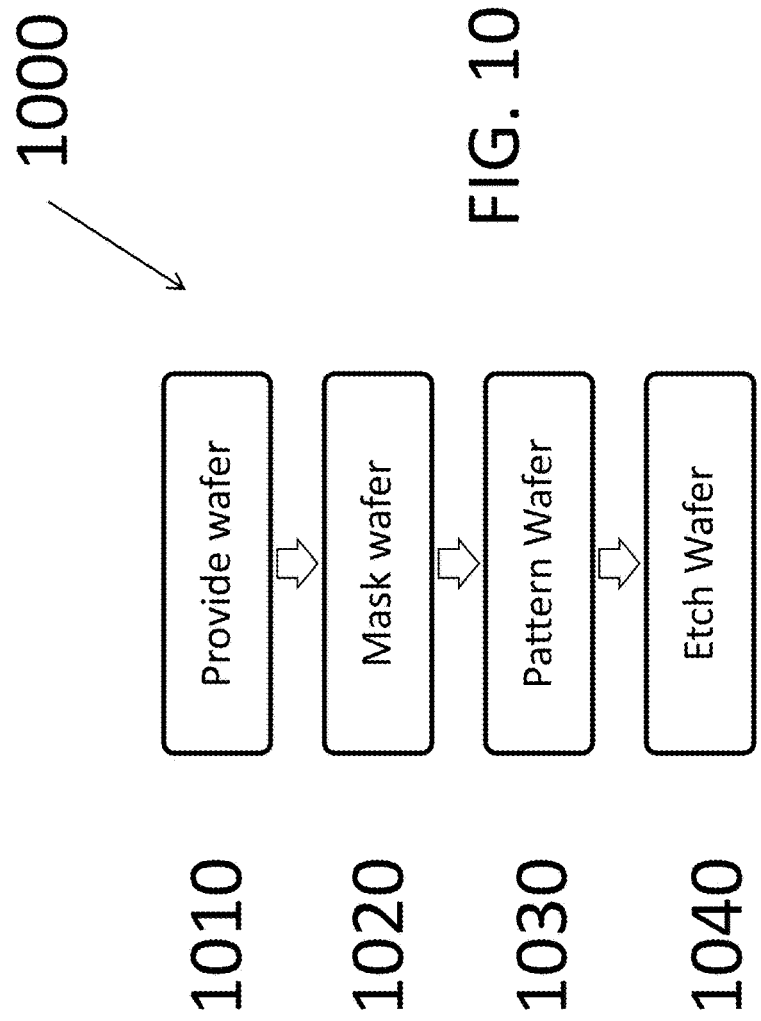

In some embodiments of the present invention where sloped walls 272 have a flat surface forming an angle 279 with surface 810, and where LEE 210 has a square or rectangular shape, the process shown in FIG. 9 may be used to determine the size and spacing of through-holes 730. Process 900 is shown having six steps; however, this is not a limitation of the present invention, and in other embodiments the invention has more or fewer steps and/or the steps may be performed in different order. The process starts in step 910 with the determination of the dimensions of the LEE 210 to be utilized. For example, LEE 210 may have length and width of 212 and 212' respectively. In step 920, the gap width 242 is determined. In step 930, the length 265 and width 265' of the bottom of through-hole 730 is determined as follows:

Length 265(Length of bottom of through-hole 730)= $2 \times GW_{242} + L_{LEE210}$ Width 265'(Width of bottom of through-hole 730)= $2 \times GW_{242} + W_{LEE210}$ where $GW_{242}$ represents gap width 242 and $W_{LEE210}$ and $L_{LEE210}$ represent the width 212' and length 212 of LEE 210 respectively. In step 940, the thickness 252 of frame wafer 710 is determined. In step 950, the value of angle 279 is determined. In step 960, the length 820 and width 820' of the top of through-hole 730 are determined. In one embodiment this is determined from the equations:

820(Length of top of through-hole 730)=Length 265+2×(Thickness 252/tan(Angle 279))

820'(Width of top of through-hole 730)=Width 265'+ 2×(Thickness 252/tan(Angle 279))

In these examples, the gap width 242 is the same on all sides of LEE 210; however, this is not a limitation of the present invention, and in other embodiments the gap width 242 may be different on different sides of LEE 210.

In some exemplary embodiments of the present invention, frame wafer 720 has a thickness 252 in the range of about 10 µm to about 3000 µm, a bottom hole length 265 and bottom hole width 265' in the range of about 100 µm to about 5000 µm, a top hole length 820 and a top hole width 820' in the range of about 100 µm to about 7000 µm, and/or an angle 279 in the range of about 10° to about 75°. As discussed herein, interactions between various dimensions may result in changes in optical performance and optimal or relatively optimal combinations of various dimensions may result in relatively improved electrical, optical, and mechanical characteristics.

Frame wafer 720 and frame 270 may be formed using a variety of techniques and from a variety of materials. In some embodiments of the present invention, frame 270 and/or frame wafer 720 may include or consist essentially of at least one of sapphire, fused quartz, borosilicate glass, glass, ceramic, metal, polymer, polymer, acrylonitrile butadiene styrene (ABS), acrylic, thermoplastics such as polyoxymethylene (e.g., Delrin), high-density polyethylene (HDPE), polycarbonate (e.g., Lexan), poly(methyl methacrylate) (e.g., Lucite), a blend of polyphenylene ether (PPE) resin and polystyrene (e.g., Noryl), nylon, polyethylene terephthalate (PET), polyether ether ketone (PEEK), polyethylene, polyimide, polypropylene, polystyrene, polyvinyl chloride (PVC), silicone, epoxy, or the like.

In some embodiments of the present invention, frame 270 and/or frame wafer 720 may include or consist essentially of a polymer or plastic. In some embodiments of the present invention, plastic frame 270 may be manufactured using one or more of the following techniques: ablation, molding, injection molding, compression molding, transfer molding, machining, rapid prototyping, three-dimensional printing, or the like.

In various embodiments of the present invention, frame 270 and/or frame wafer 720 may include or consist essentially of glass, quartz, sapphire, aluminum oxide, aluminum oxynitride (AlON), silicon carbide, and/or other transparent oxides or polymers, for example silicone or epoxy. In various embodiments of the present invention, frame 270 and/or frame wafer 720 may include or consist essentially of low-temperature glass, an example of such material is Hitachi Chemical's low-melting vanadate glass series. In various embodiments of the present invention, a glass frame 270 may be manufactured using one or more of the following techniques: wet chemical etching, dry etching, reactive ion etching, molding, casting, ablation, bonding, machining, rapid prototyping, three-dimensional printing, ultrasonic machining, abrasive machining, or the like.

In some embodiments of the present invention, frame 270 and/or frame wafer 720 may include or consist essentially of a metal, for example aluminum (Al), copper (Cu), silver (Ag), gold (Au), or the like. In some embodiments of the present invention, a metal frame 270 may be manufactured using one or more of the following techniques: ablation, molding, stamping, machining, rapid prototyping, casting, or the like.

In some embodiments of the present invention, frame 270 and/or frame wafer 720 may be formed from a crystalline semiconductor material, for example silicon, gallium arsenide, indium phosphide or the like. In some embodiments of the present invention, frame 270 and/or frame wafer 720 may be formed using semiconductor micromachining techniques, for example lithographic patterning, wet chemical etching, dry etching, anisotropic etching, isotropic etching, or material deposition by, for example, evaporation, sputtering, chemical vapor deposition, or the like.

In some embodiments of the present invention, frame 270 and/or frame wafer 720 may be processed after formation to improve characteristics such as surface smoothness, mechanical and chemical properties and the like. In some embodiments of the present invention, said process may include or essentially consist of thermal processes such as heating to near glass transition temperature or rapid thermal annealing.

In some embodiments of the present invention, frame 270 and/or frame wafer 720 may include or consist essentially of silicon and be formed from a substantially single crystal-silicon wafer using silicon micro-machining techniques. In some embodiments of the present invention, frame 270 may be manufactured from a (001)-oriented silicon wafer using anisotropic etching (e.g., wet etching with an etchant including or consisting essentially of potassium hydroxide (KOH), EDP (an aqueous mixture of ethylene diamine and pyrocatechol), and/or tetramethylammonium hydroxide (TMAH) to form the sloped surfaces of the frame, having an angle 279 of about 54.7°, formed by the intersection of (111) and (001) planes in the crystal structure of the silicon wafer.

Figure 10:
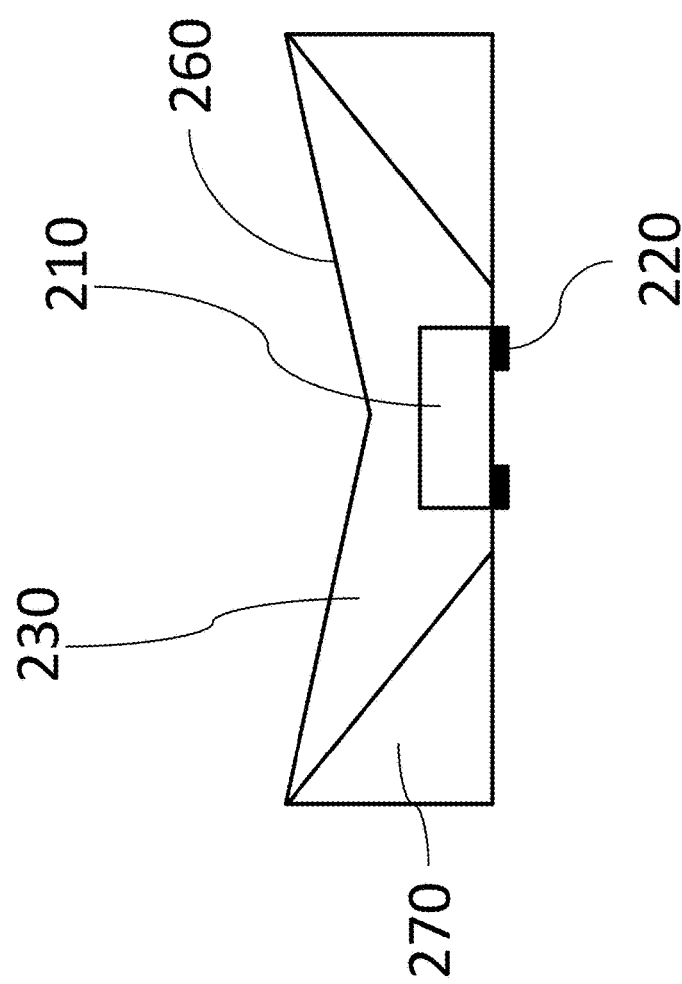
FIG. 10 is a flow chart of a process for forming a frame wafer in accordance with various embodiments of the invention.

FIG. 10 is a flow chart of a process 1000 for forming a frame wafer 720 using anisotropic etching of a semiconductor wafer. Process 1000 is shown having four steps; however, this is not a limitation of the present invention, and in other embodiments the invention has more or fewer steps and/or the steps may be performed in different order. In step 1010, a semiconductor wafer is provided. In step 1020, the wafer is masked with a masking agent such as, e.g., photoresist. In step 1030 the mask is patterned to provide openings in the masking agent for etching the wafer in step 1040. In step 1040, the wafer is etched at the openings to form through-holes 730. Optionally, the masking agent may be removed or partially removed from the frame wafer.

Figure 11A:
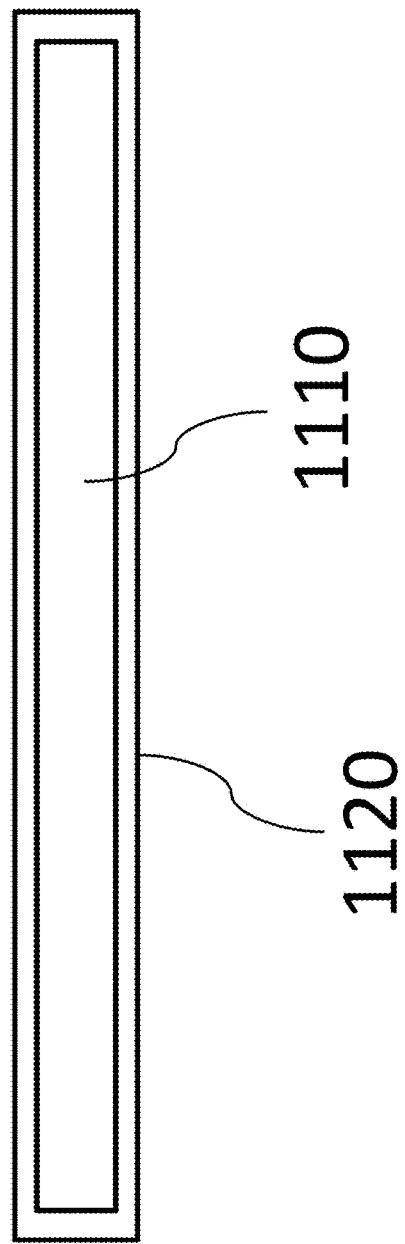

FIG. 11A shows one embodiment of the present invention of a process to produce a frame wafer 720 using an anisotropic etchant. In this embodiment, the process starts with a (001)-oriented silicon wafer 1110 as shown in FIG. 11A. The wafer is coated with an etch mask 1120, as shown in FIG. 11A. Etch mask 1120 may include or consist essentially of one or more of the following: photoresist, silicon oxide, silicon nitride, polyimide, metal, or the like. In one embodiment of the present invention, etch mask 1120 includes or consists essentially of silicon nitride. In one embodiment of the present invention, etch mask 1120 includes or consists essentially of a layer of silicon oxide overcoated with a layer of silicon nitride. The required thickness of etch mask 1120 may be determined without undue experimentation, based on the etchant used in subsequent steps. In some embodiments of the present invention, layer 1120 has a thickness in the range of about 10 nm to about 4 µm, or in the range of about 100 nm to about 2 µm. In FIG. 11A the back and edges of silicon wafer 1110 are coated with etch mask 1120; however, in other embodiments this may not be necessary.

Figure 11B:
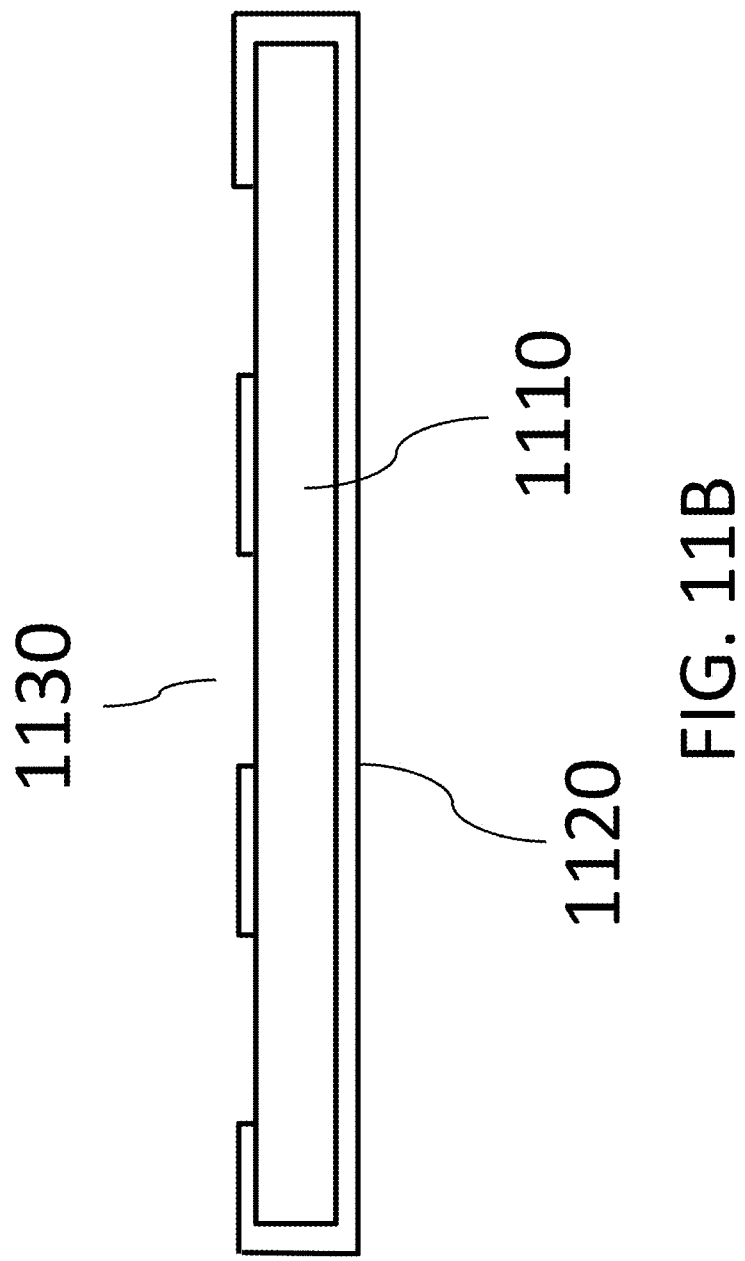

FIG. 11B shows the structure of FIG. 11A at a later stage of manufacture, in which openings 1130 have been formed in etch mask 1120. In one embodiment, openings 1130 may have a square or rectangular shape; however, in other embodiments openings 1130 may have different shapes. When anisotropic etchants such as KOH, TMAH and or EDP are used it may be preferable for openings 1130 to have square or rectangular shapes.

FIG. 11C shows the structure of FIG. 11B at a later stage of manufacture, in which silicon wafer 1110 has been etched using an anisotropic etchant to create holes 1140, corresponding to through-holes 730 in FIG. 7B. In FIG. 11C, portions of mask 1120 remain covering the bottoms of holes 1140, while in other embodiments these portions of mask 1120 may be removed during the etching process. If they are not removed during the etching process, they may be removed subsequently, leaving the frame wafer structure 720 of FIG. 11D. In this embodiment, holes 1140 are shaped like truncated pyramids, having angle 279 with a value of about 54.7°. Mask 1120 is shown as having been removed in FIG. 11D; however, in other embodiments mask 1120 may remain in place or partially in place on the surface of silicon wafer 1110, as long as it does not cover the bottoms of holes 1140. In some embodiments of the present invention, silicon wafer 1110 may be thinned before or after formation of holes 1140. The thinning process may be performed chemically, mechanically, or physically or by using a combination of said methods, and may include or essentially consist of etching, polishing, grinding, chemical mechanical polishing (CMP) or the like; however this is not a limitation, and in some embodiments of the present invention thinning may be performed by other techniques.

Figure 11D:
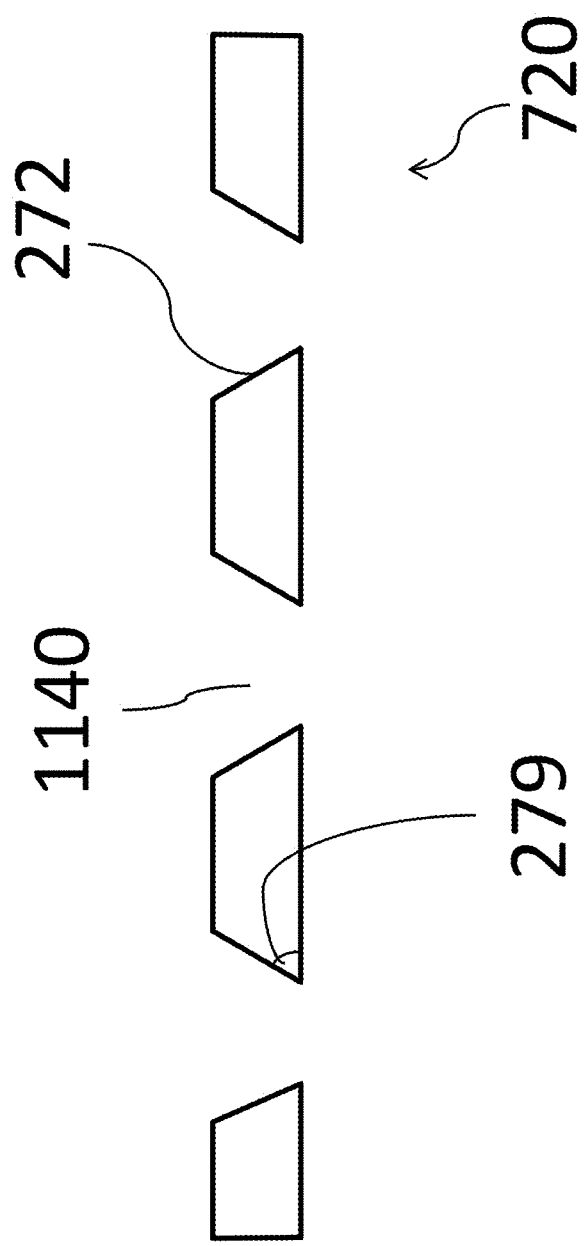
FIG. 11D is a cross-sectional view of a frame wafer in accordance with various embodiments of the invention.

FIG. 11E shows a plan view of the structure of FIG. 11D, where the structure of FIG. 11D is a cross-section of the structure shown in FIG. 11E through cut line A-A'. As may be seen in FIG. 11E, after the process shown in FIG. 11D, the silicon wafer has an array of through-holes 1140 with sloped sidewalls 272.

In some embodiments of the present invention, silicon wafer 1110 may have a relatively high resistivity, for example greater than about 100 ohm-cm or greater than about $10^4$ ohm-cm. In some embodiments of the present invention, silicon wafer 1110 may be conductive and may be p-type or n-type. In some embodiments of the present invention, if silicon wafer 1110 is conductive, it may be desirable to cover all or a portion of the bottom of frame 270 such that current does not conduct through frame 270, as discussed herein. In some embodiments of the present invention, frame 270 and/or frame wafer 720 may include or consist essentially of a material or materials other than silicon. In some embodiments of the present invention, frame wafer 720 may include or consist essentially of a different crystalline material, for example semiconductors based on gallium arsenide, aluminum arsenide, indium arsenide, gallium nitride, aluminum nitride, indium nitride, indium phosphor, gallium phosphor, or alloys of these materials or the like.

In some embodiments of the present invention, frame 270 and/or frame wafer 720 may be manufactured by other means than anisotropic etching using a wet chemical anisotropic etchant. For example, in some embodiments of the present invention, frame 270 and/or frame wafer 720 may be manufactured from silicon or other semiconductors using one or more of the following techniques; isotropic etching, wet chemical etching, dry etching reactive ion etching, ablation, wafer bonding, chemical vapor deposition, or epitaxy. The method of forming frame 270 and/or frame wafer 720 is not a limitation of the present invention.

While examples herein have described frame 270 and/or frame wafer 720 as including or consisting essentially of a semiconductor, metal, glass or plastic, the material of construction of frame 270 and/or frame wafer 720 is not a limitation of the present invention, and in other embodiments other materials may be used. While examples herein have described frame 270 and/or frame wafer 720 as including or consisting essentially of a single material, this is not a limitation of the present invention, and in other embodiments frame 270 and/or frame wafer 720 may include or consist essentially of more than one material. For example, in one embodiment of the present invention, frame 270 and/or frame wafer 720 may include or consist essentially of layers of different materials. In some embodiments of the present invention, frame 270 and/or frame wafer 720 may include or consist essentially of combinations of more than one material. In some embodiments, frame 270 and/or frame wafer 720 may be formed by molding, casting, or the like.

In some embodiments of the present invention, it may be desirable for portions of frame 270 that are exposed to light emitted from LEE 210 and phosphor 230 to have a high reflectance to a wavelength of light emitted by LEE 210 and/or phosphor 230. In some embodiments of the present invention, the reflectance may be greater than 80%, greater than 90%, greater than 95%, or greater than 98%. In general, the higher the reflectance, the less light loss occurs within frame die 200, resulting in a higher efficacy.

In some embodiments of the present invention, frame 270 is formed of a material having a high reflectance to a wavelength of light emitted by LEE 210 and/or phosphor 230. For example frame 270 may include or consist essentially of one or more high reflectance polymer or plastic materials, for example MS2002 manufactured by Dow Corning or CEL-W-7005 or CEL-W-8000 white molding compound manufactured by Hitachi Chemical, or the like. MS2002 has a reflectance over substantially all of the visible wavelength range of about 97%, while CEL-W-7500 has a reflectance over substantially all of the visible wavelength range of about 93%.

In some embodiments of the present invention, the material of frame 270 may have a reflectance that is not sufficiently high, and in some of these embodiments all or portions of frame 270 may be coated with a reflective (or "reflecting") coating having sufficient reflectivity for a wavelength of light emitted by LEE 210 and/or phosphor 230. In some embodiments of the present invention, the coating may include or consist essentially of one layer, while in other embodiments the coating may include or consist essentially of more than one layer. In some embodiments of the present invention, the reflecting coating may include one or more metal layers, for example including or consisting essentially of one or more materials including aluminum, copper, gold, silver, chromium, or the like. In some embodiments of the present invention, the reflecting coating may include one or more dielectric layers, for example silicon dioxide, titanium dioxide, silicon nitride, or the like. In some embodiments of the present invention, the reflecting coating may include or consist essentially of a Bragg reflector. In some embodiments, the reflecting coating may include or consist essentially of one or more metal layers and one or more dielectric layers. The materials of the reflecting coating and the methods of forming the reflecting coating are not a limitation of the present invention.

In some embodiments of the present invention, LEEs 210 are fabricated in wafer form (i.e., as portions of a semiconductor wafer). A wafer may include about 5000 or more LEEs 210. In some embodiments, a wafer includes over about 20,000, over 100,000, or over 500,000 LEEs 210. After fabrication of LEEs 210, all or some of the LEEs 210 are tested and sorted into bins based on one or more characteristics, for example optical or electrical characteristics, where each bin includes a portion of the total population. Bins may include, for example, emission wavelength, forward voltage, light output power, or the like. The particular choice of one or more bins or range of values within the one or more bins is not a limitation of the present invention. In one embodiment, LEEs 210 are binned by emission wavelength. The process shown in FIG. 6 may then be carried out on each bin of LEEs 210. The composition and amount of phosphor applied over base 710 and LEE 210 is determined in advance to achieve the desired color point, chromaticity, color temperature, CRI or other optical properties, based on the emission wavelength of each bin. In this embodiment, each bin may have a different composition and/or thickness of phosphor to achieve the desired optical properties. In one embodiment, the phosphor composition and thickness are adjusted based on the bin information to achieve a relatively more narrow distribution in optical properties (for example, color temperature) than would be achievable without binning.

In some embodiments of the present invention, LEEs 210 are fabricated in wafer form (i.e., as portions of a semiconductor wafer). A wafer may include over about 5000 or more LEEs 210. In some embodiments, a wafer may include over about 20,000 or over 100,000 LEEs 210. After fabrication of LEEs 210, all LEEs 210 are tested, or some of LEEs 210 on one or more wafers are tested. In one embodiment, the process shown in FIG. 6 is then carried out on all LEEs 210 from the wafer, or at least all LEEs 210 determined to be functional and/or within desired specifications. The composition and amount of phosphor applied over base 710 and LEE 210 is determined in advance to achieve the desired color point, color temperature, CRI or other optical properties, based on the test results of all or some LEEs 210 on that wafer. This phosphor may include or consist essentially of one or more phosphor powders or wavelength-conversion materials.

In some embodiments, there is no testing done on LEEs 210 prior to application of the phosphor over LEEs 210. In some embodiments, the starting wafer is applied to dicing tape, after which the wafer is singulated into LEEs 210. The tape preferably has the ability to expand and is expanded to provide the required spacing between LEEs 210 to match the through-hole spacing in frame wafer 720. In one embodiment, the spacing between LEEs 210 is such that after expansion, each LEE 210 fits into a through-hole 730 in frame wafer 720 during step 640 of process 600. An example of such an expansion tape is SWT20+ manufactured by Nitto Denko.

In some embodiments of the present invention, the singulation is performed with the contacts down on (i.e., adjacent to) the tape, and the tape may be used as base 710. If the singulation is performed with the contacts up (not adjacent to the tape), LEEs 210 may be transferred using transfer tape or other transfer methods to flip their orientation. In the tape-transfer operation, a second substrate or tape is applied to the exposed side (here contact side) of LEEs 210 and the first tape is removed. A variety of techniques may be used for such transfer, for example using tapes of different tack levels, thermal release tape, and/or UV release tape. An advantage of this approach is that LEEs 210 are then positioned correctly on base 710 without any need for a serial pick-and-place process, saving time and expense. In another embodiment, LEEs 210 may be placed on base 710 at the correct spacing, using semi-batch or serial techniques, for example pick-and-place.

Figure 12C:
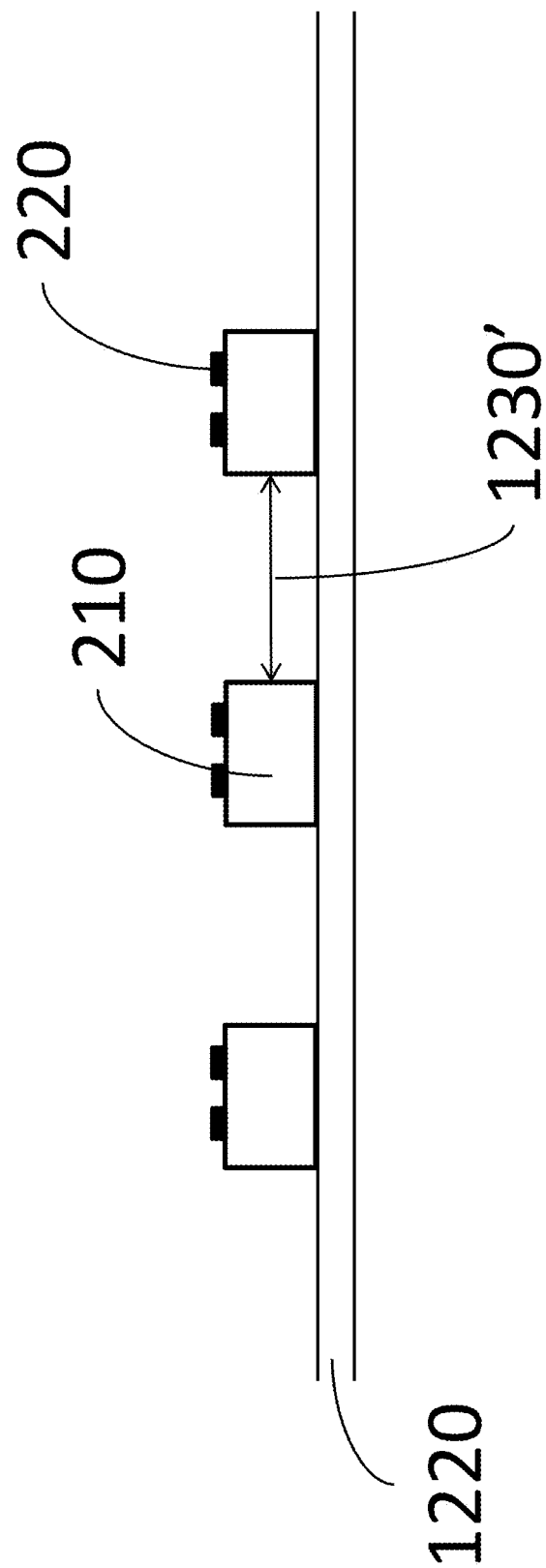

FIGS. 12A-12D depict a schematic of one embodiment of this process. In FIG. 12A, a tape 1220 is applied to the back of a wafer 1210 (in this example the contacts 220 are face up). FIG. 12B shows the structure of FIG. 12A at a later stage of manufacture. In FIG. 12B wafer 1210 has been singulated, resulting in LEEs 210 on tape 1220. A spacing 1230 between LEE 210 may be determined by the singulation process, as described herein. In some embodiments, spacing 1230 is in the range of about 5 μm to about 200 μm. FIG. 12C shows the structure of FIG. 12B at a later stage of manufacture. In FIG. 12C, the tape 1220 has been expanded or stretched. Spacing 1230, identified as spacing 1230' after expansion, is set to the desired value for making frame dies, as described above, by the expansion process.

Figure 12D:
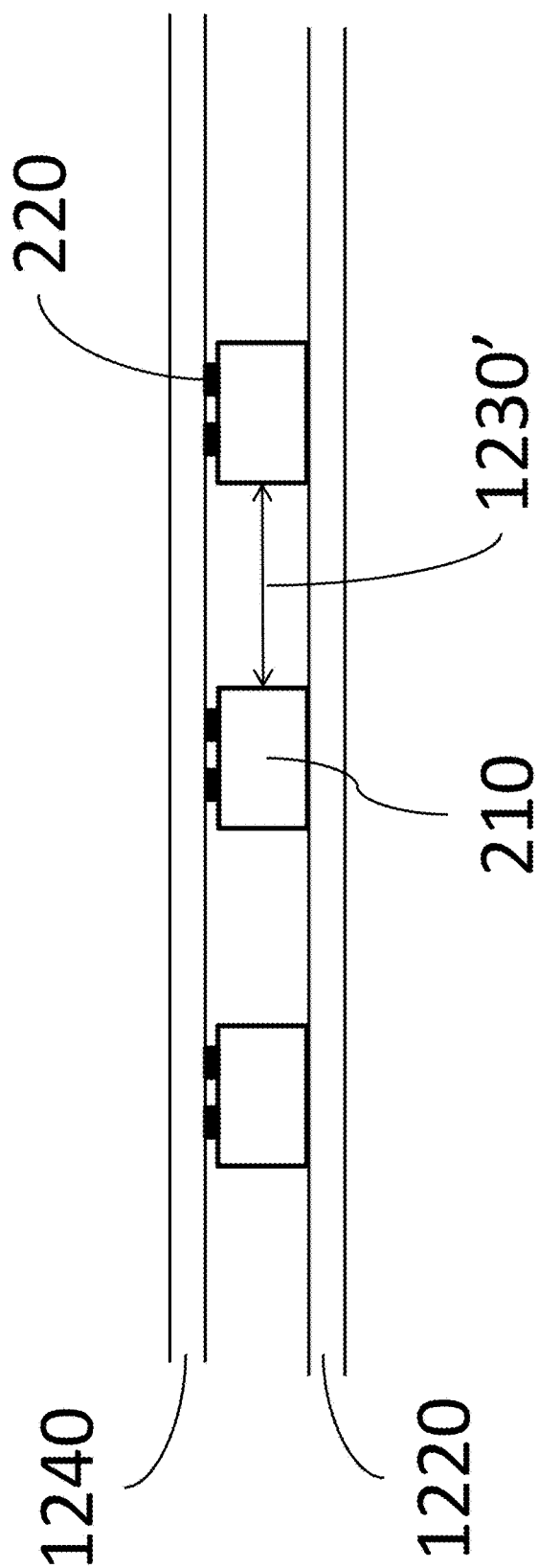

That is, tape 1220 is expanded until the spacing between adjacent LEEs 210 (identified as 1230' in FIG. 12C) is appropriate to make frame dies 200 having a desired thickness of phosphor thereon. FIG. 12D shows the structure of FIG. 12C at a later stage of manufacture. In FIG. 12D a second tape 1240 is applied to the contact side of LEEs 210. Finally, first tape 1220 is removed, leaving the structure shown in FIG. 7A (spacing 1230' in FIG. 12D corresponds to spacing 705 in FIG. 7A), whereupon the process described in reference to FIGS. 7A-7F or other processes may be carried out. In some embodiments of the present invention, tape 1240 is the base or mold substrate 710 shown in FIG. 7A.

In some embodiments of the present invention, the process begins with the structure shown in FIG. 7E or FIG. 7F. In some embodiments, LEEs 210 have been binned, while in other embodiments LEEs 210 have not been binned or may have not been tested. In some embodiments one or more portions of LEEs 210 have been tested. The process by which LEEs 210 are selected for the structure shown in FIG. 7E is not a limitation of the present invention. The structure shown in FIG. 7E may be called a "composite frame wafer," including or consisting essentially of multiple LEEs 210, frames 720, and phosphors 230 before singulation. The structure in FIG. 7F depicts a composite frame wafer after singulation, including multiple frame dies 200 on mold substrate 710.

In some embodiments, frame dies 200 are tested either in composite frame wafer form (shown, for example, in FIG. 7E) or in singulated form (shown, for example, in FIG. 7F). Testing may be performed by applying a current and voltage to contacts 220 and measuring the emitted light. In one embodiment, contacts 220 are accessed for testing by probes or needles that poke or penetrate through tape 710. In other embodiments, testing is performed by first transferring the structure in FIG. 7E or frame dies 200 in FIG. 7F to another carrier such that contacts 220 are face up and directly accessible. Such a transfer may be performed in a batch process, similar to that using transfer tape described in conjunction with FIGS. 12A-12D, or may be performed in a semi-batch process or a serial process, such as pick-and-place. Once the structure from FIG. 7E or frame dies 200 (for example as depicted in FIG. 7F) are oriented with the contacts accessible, they may be tested using conventional test equipment, for example manual, semi-automatic or fully automatic test equipment that applies a current and voltage to LEEs 210, and measuring the light properties of frame dies 200. In some embodiments of the present invention, characteristics that may be measured include CCT, CRI, spectral power density, R9, voltage, current luminous flux, radiant flux, angular color uniformity, or the like. In some embodiments of the present invention, the composite frame wafer of FIG. 7E or frame dies 200 of FIG. 7F may be characterized in wafer form, similar to what is done with conventional semiconductor wafers. In some embodiments, the composite frame wafer may be sufficiently rigid for such processing, while in other embodiments an additional backing material or plate or carrier may be used provide additional rigidity so that the composite frame wafer may be handled and tested in a fashion and using equipment similar to that used for wafers of semiconductor devices.

In some embodiments of the present invention, after testing, frame dies 200 are physically sorted and binned. This may result in multiple bins having different optical properties that may then be used for different products. In some embodiments, the bins correspond to different values of color temperature, luminous flux, forward voltage (at a specific current), CCT, CRI, R9, or the like.

In some embodiments of the present invention, after testing, frame dies 200 are virtually sorted and binned. In accordance with preferred embodiments, virtual sorting and binning means that a map of the characteristics of each frame die 200 on the wafer (that is for example depicted in FIG. 7E or FIG. 7F) is produced, and frame dies 200 are put into, or assigned, to virtual bins based on their optical and/or electrical properties, for example color temperature, luminous flux or forward voltage. In some embodiments, the bin map of the wafer is (i.e., a map of the specific characteristic as a function of location on the wafer) used to select frame dies 200 having specific characteristics for a particular product. The remaining frame dies 200 from other bins may then be used in a different product at a different time. In some embodiments, frame dies 200 are used without testing or binning.

In some embodiments of the present invention, if the starting point of the process is the structure shown in FIG. 7E, the structure may be singulated to form frame dies 200 before or after testing. Furthermore, before either physical or virtual frame die 200 binning, the composite frame wafer (FIG. 7F) may also be binned, either physically or virtually.

Figure 13A:
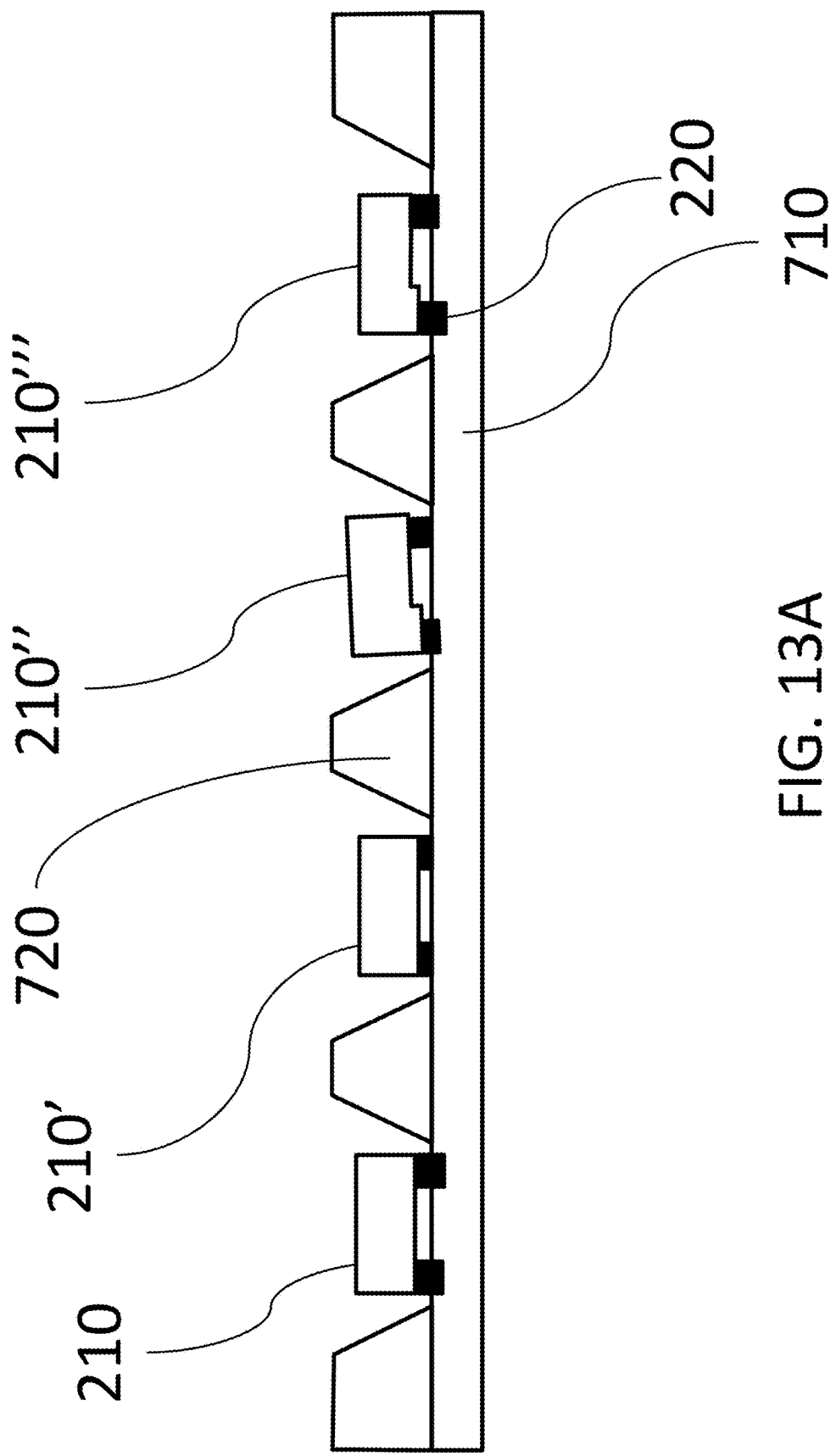
FIG. 13A is a cross-sectional view of light-emitting elements disposed on a base or tape in accordance with various embodiments of the invention.
Figure 13B:
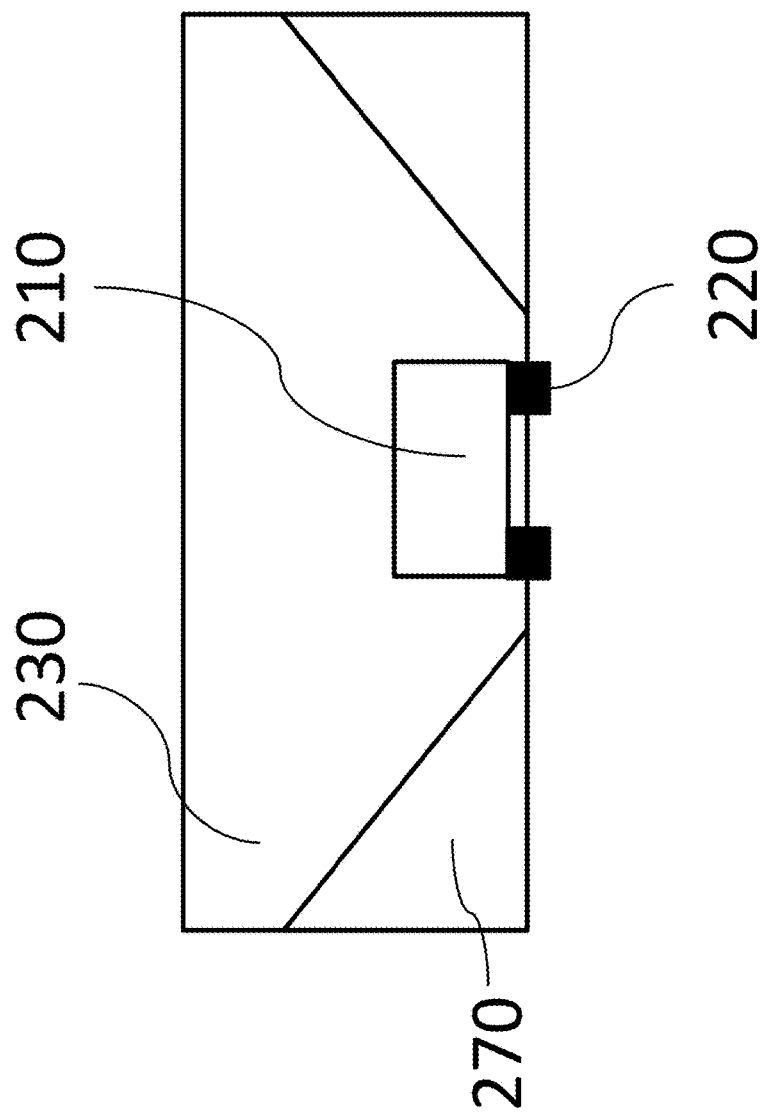

In some embodiments of the present invention, LEEs 210 are formed or placed on base or tape 710, as shown in FIG. 13A. After formation of the phosphor, a frame die structure may include a portion of phosphor 230 around and covering all or a portion of the edges of the LEEs 210, as shown in FIG. 13B, which depicts a single frame die, e.g., after singulation of the structure depicted in FIG. 13A. In some embodiments of the present invention, tape or mold substrate 710 is deformable or flexible such that portions of one or more contacts 220 are embedded into base or tape 710, for example as shown for LEE 210 in FIG. 13A. In other embodiments, one or more of the contacts 220 may not be embedded into base or tape 710, for example as shown for LEE 210' in FIG. 13A. In some embodiments of the present invention, LEE 210 has coplanar or substantially coplanar contacts; however, this is not a limitation of the present invention, and in other embodiments LEE 210 has non-coplanar contacts, as depicted by LEE 210" and LEE 210''' in FIG. 13A. In some embodiments of the present invention LEE 210 may be tilted, as depicted by LEE 210" in FIG. 13A, resulting in a frame die structure similar to that shown in FIG. 13C. The structures shown in FIGS. 13B and 13C show phosphor 230 over a portion of the surface of LEE 210 between contacts 220; however, this is not a limitation of the present invention, and in other embodiments this region may only be partially covered with phosphor 230 or may not be covered by phosphor 230.

A frame die structure including a portion of phosphor 230 around and covering all or a portion of the edges of the LEEs 210 may result in enhanced yield, for example because the die-singulation process, e.g., when the semiconductor wafer is separated into individual dies, may result in chipping or other damage to the passivation at the edge of the dies. If the chipping or damage to the passivation at the edge permits exposure of underlying conductive semiconductor material, undesirable electrical coupling to this conductive semiconductor material may occur in the attachment process of a frame die 200, resulting in poor device performance and/or shorting of the device.

Figure 13D:
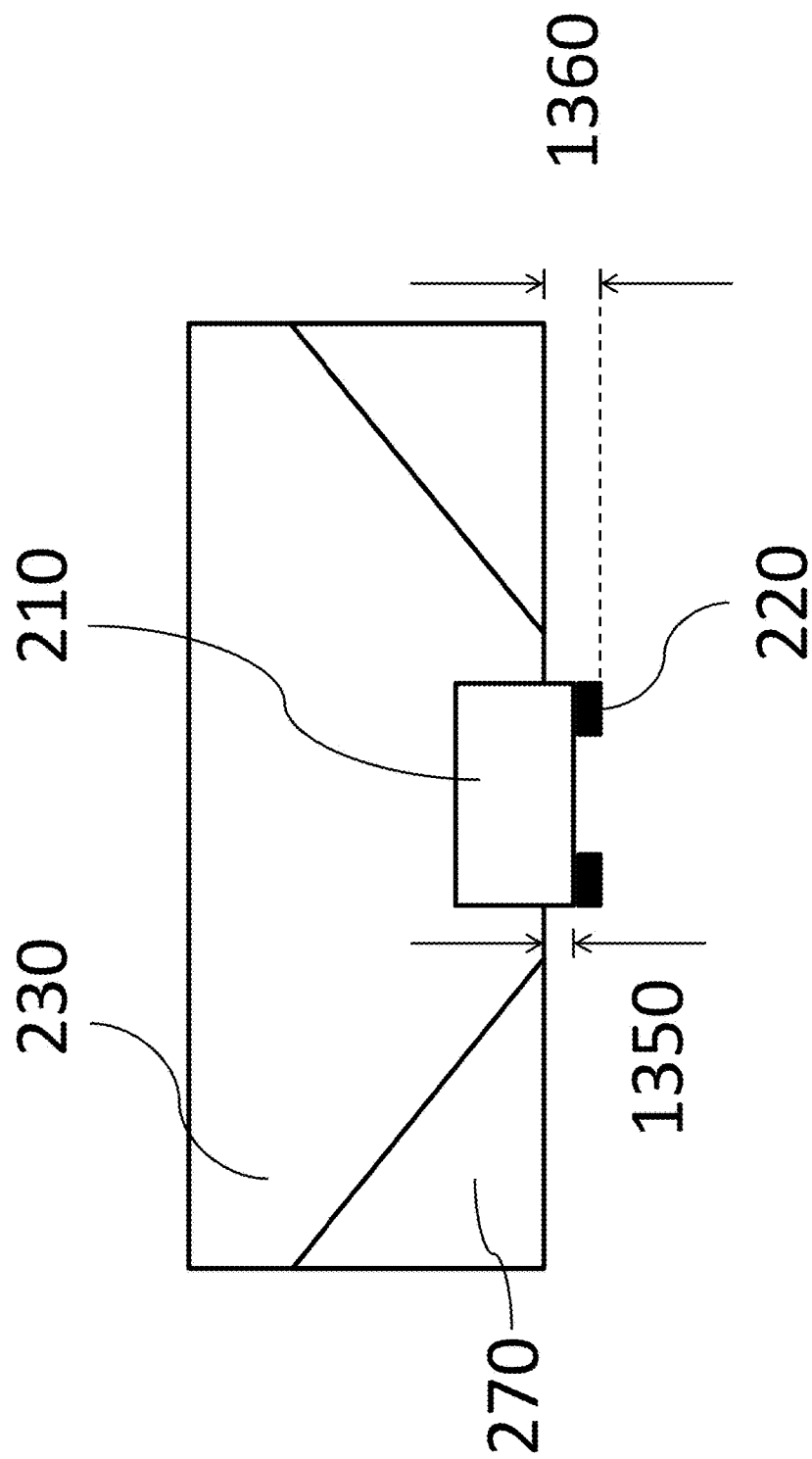
Figure 13E:
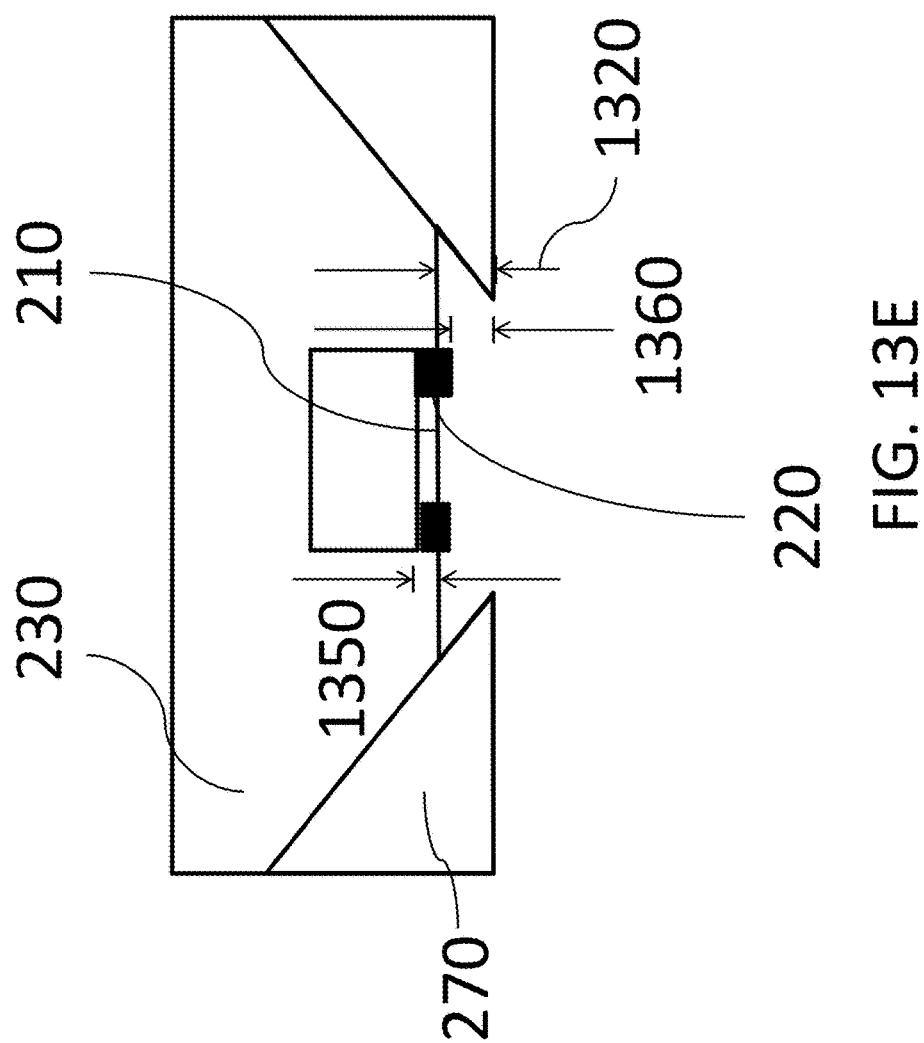

In some embodiments of the present invention, one or more portions of LEE 210 are not covered with phosphor 230, as shown in FIG. 13D. FIG. 13D depicts a frame die 200, similar to that shown in FIG. 1A, but with a portion of the sidewall of the body of LEE 210 not covered with phosphor 230. The amount that LEE 210 extends beyond the edge of phosphor 230 may be identified as the die relief 1350. In some embodiments of the present invention, the die relief 1350 is positive, as shown in FIG. 13D, but in other embodiments die relief 1350 may be substantially zero, as shown in FIG. 1A, or even negative, as shown in FIG. 13E. In some embodiments of the present invention, die relief 1350 may be in the range of about 0 to about 30 μm, or in the range of about 0 to about 5 μm.

In various embodiments it may be advantageous that contacts 220 are within mechanical and electrical contact range of the conductive traces to which they will be attached. In some embodiments of the present invention, the contacts are not recessed in from the bottom surface of phosphor 230 and bottom surface of frame 270.

Another dimension of frame die 200 that may be advantageously controlled is a frame-contact relief 1360, as shown in FIG. 13D. The frame-contact relief 1360 is the amount that the contact protrudes from the adjacent surface of frame 270 (i.e., the surface of the frame 270 adjacent to, and possibly substantially parallel to, the surface of the LEE 210 on which the contact is disposed). In some embodiments, the frame-contact relief 1360 may be positive, as shown in FIG. 1A and FIG. 13D, while in other embodiments frame-contact relief 1360 may be substantially zero; in other embodiments frame-contact relief 1360 may be negative, as shown in FIG. 13E.

Figure 13F:
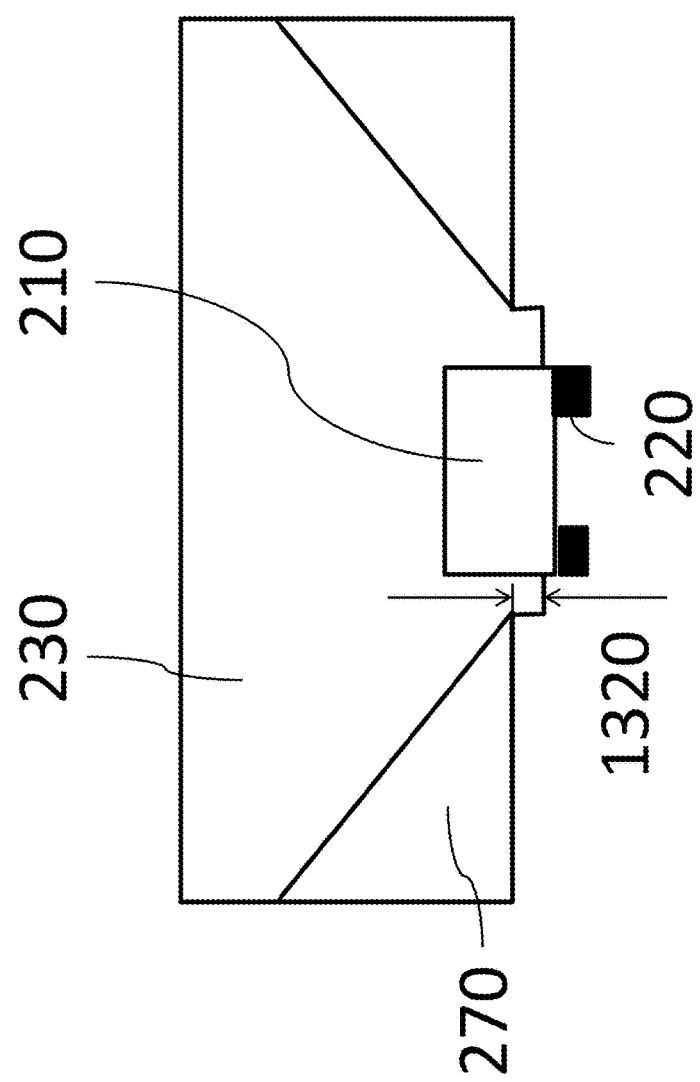

Another dimension of frame die 200 that may be advantageously controlled is frame-phosphor relief 1320, as shown in FIG. 13E. The frame-phosphor relief 1320 is the amount that frame 270 extends beyond the adjacent surface of phosphor 230. In some embodiments, the frame-phosphor relief 1320 may be positive, as shown in FIG. 13E, while in other embodiments frame-phosphor relief 1320 may be substantially zero as shown in FIG. 1A; in other embodiments frame-phosphor relief 1320 may be negative, as shown in FIG. 13F.

In various embodiments of the present invention, die relief 1350, frame-contact relief 1360, and frame-phosphor relief 1320 may occur in different combinations of positive values, substantially zero values, and negative values.

Figure 13G:
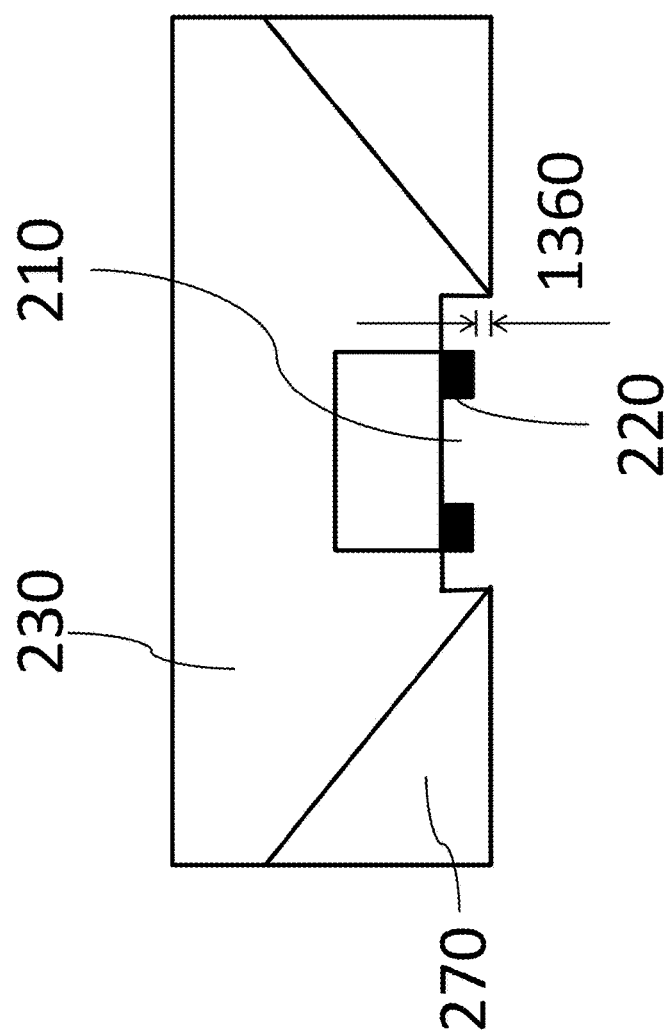
Figure 13H:
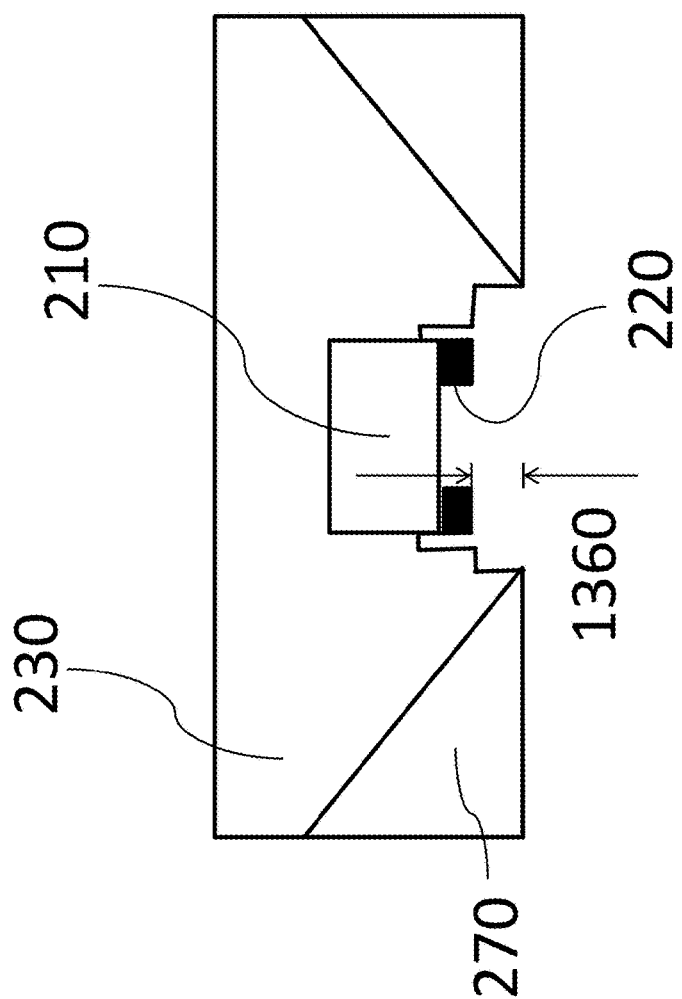

In some embodiments of the present invention, frame die 200 is attached to conductive traces formed on an underlying substrate using an anisotropic conductive adhesive (ACA); however, this is not a limitation of the present invention, and in other embodiments other techniques and materials may be used to attach frame die 200 to underlying traces, for example solder, solder paste, conductive adhesive, wire bonds, or the like. In some embodiments of the present invention, the ACA contains conductive particles (e.g., in an insulating matrix) through which conduction occurs in the z-axis (i.e., between traces and contacts above or below such traces). In some embodiments in which the contacts are recessed from the frame, for example as shown in FIGS. 13E, 13G, and 13H, the distance between the outer surface of contact 220 and the lower point of the phosphor or frame, for example the distance between contact 220 and the bottom of frame 270 (e.g., corresponding to frame-contact relief 1360 in FIG. 13E) may be less than the size of the individual ACA conductive particles or less than the minimum size of the individual ACA conductive particles. In some embodiments of the present invention, the ACA particles have a size of about 10 μm and the distance between the outer surface of contact 220 and the lower point of the phosphor or frame is less than about 7 μm. In some embodiments of the present invention, the ACA particles have a size distribution and the distance between the outer surface of contact 220 and the lower point of the phosphor or frame is less than the maximum particle size in the distribution. In some embodiments of the present invention, the ACA particles have a size distribution and the distance between the outer surface of contact 220 and the lower point of the phosphor or frame is less than the minimum particle size in the distribution. In some embodiments of the present invention, the distance between the outer surface of contact 220 and the lower point of the phosphor or frame is less than about 75% of the size of the ACA particle, or less than about 50% of the size of the ACA particle, or less than about 25% of the size of the ACA particle. In such embodiments, if the contacts are not recessed, for example as shown in FIG. 1A, FIGS. 13B-13D, and FIG. 13F, contacts 220 may be protrude from frame 270 and phosphor 230, as shown in FIG. 1A or protrude from phosphor 230 as shown in FIG. 13F. In some embodiments of the present invention, the thickness of contacts 220 may be extended by forming additional conductive material over or on contacts 220 prior to LEE placement step 620 (placement of LEE 210 on mold substrate 710). Such conductive material may be formed by plating, for example electroplating or electroless plating, film deposition (e.g., including evaporation, chemical vapor deposition, physical vapor deposition), bump or stud bump formation, for example through a wire bonding process or the like. In some embodiments of the present invention, said conductive material may be formed using solder paste or stencil printing, followed by thermal treatment. For example, FIG. 13I depicts a conductive material 225 formed over all or a portion of contacts 220, extending the effective end of the contact below (or protruding) from the bottom of frame 270. By modifying the thickness of material 225, the various dimensional characteristics, such as frame-phosphor relief 1320, frame-contact relief 1360, die relief 1350 or the like may be engineered to have specific dimensions. In some embodiments of the present invention, material 225 may be include or consist essentially of an electrically conductive material, for example gold, silver, aluminum, tin, copper, solder, or combinations of these materials or the like; however, this is not a limitation of the present invention, and in other embodiments any electrically conductive material may be used.

In some embodiments of the present invention, phosphor 230 absorbs a portion of light emitted by LEE 210 and re-emits it at one or more different wavelengths (i.e., as "converted light") and the combination of light emitted by LEE 210 and phosphor 230 (or the "combined light") defines one or more optical characteristics of frame die 200, for example color temperature, CRI, R9, spectral power density, or the like. In some embodiments of the present invention, it is advantageous to control the die relief and/or frame-phosphor relief such that multiple frame dies 200 have the same or substantially the same optical characteristics. For example, in some embodiments of the present invention, if the die relief is relatively large, then a relatively larger proportion of light emitted by LEE 210 may be observed directly, without passing through phosphor 230; thus, in some embodiments a relatively small positive die relief is advantageous because it reduces the amount of light emitted directly from LEE 210 that does not pass through phosphor 230. In some embodiments of the present invention, the die relief may be in the range of about 0 to about 30 μm, while in other embodiments, the die relief may be in the range of about 0 to about 10 μm or 0 to about 5 μm. In some embodiments of the present invention, the die relief is less than about 20% of the height of LEE 210, while in other embodiments the die relief is less than about 10% or less than about 5% or less than about 1% of the height of LEE 210. In some embodiments of the present invention, it may be advantageous to reduce the variation in die relief within a composite frame wafer and/or between composite frame wafers because it reduces the variation in one or more optical characteristics of the frame dies. In some embodiments of the present invention, the variation in die relief is less than about 25%, or less than about 10% or less than about 5%, or even less than about 1%.

A positive contact relief (the amount the contacts protrude from the frame die bottom surface, including frame 270 and phosphor 230, identified as dimension 1360 in FIG. 13D) may be advantageous from the perspective of making electrical contact to contacts 220. If the contact relief is negative, it may be difficult to make electrical contact to contacts 220, for example between contacts 220 and conductive traces or pads on an underlying substrate. In some embodiments of the present invention, the contact relief is positive and in the range of about 0 to about 30 μm. In some embodiments, the contact relief is positive and in the range of about 1 μm to about 8 μm, or less than about 4 μm. In some embodiments of the present invention, the contact relief is at least the height of contacts 220; that is, the height that contacts 220 extend above the surrounding surface of LEE 210. As discussed herein, in some embodiments of the present invention the die relief is negative, but not larger than the size of ACA particles used to electrically couple the contact to a conductive trace.

In some embodiments of the present invention, the frame-die relief, the frame-phosphor relief, and/or the die relief may be determined or optimized and controlled to minimize the amount of light emitted by LEE 210 that does not pass through phosphor 230 while providing sufficient contact and/or die relief to produce a reliable and robust electrical contact to LEE contacts 220, as well as to produce a reliable and robust mechanical attachment of the frame die 200, for example to an underlying substrate or circuit board.

In some embodiments of the present invention, it is advantageous to control the variation in frame-die relief, the frame-phosphor relief, and/or the die relief on a single composite frame wafer or from composite frame wafer to composite frame wafer. For example, in some embodiments, the variation in frame-die relief, the frame-phosphor relief, and/or the die relief is less than about 30%, or less than about 15%, or less than about 10%. Frame-die relief, frame-phosphor relief, and/or die relief may be controlled by a number of different techniques. In some embodiments, contacts 220 and/or LEEs 210 are partially embedded in mold substrate 710, as shown in FIG. 13A for LEE 210, and the amount of embedding may be used to control the frame-die relief, the frame-phosphor relief, and/or the die relief.

In one example, frame wafer 720 is formed using anisotropic etching of a silicon wafer, as described in reference to FIGS. 11A-11E. In the example, an LEE 210 has a length and width of about 180 μm and about 350 μm respectively. Gap 242 is about 10 μm, resulting in a bottom and top hole size of about 200 μm and about 370 μm respectively. Three different silicon wafer thicknesses were evaluated: 150 μm, 200 μm, and 300 μm. Table 1 shows values and dimensions for each of the three different wafer thicknesses (configurations 1-3). Table 1 also shows the approximate number of frames 270 that may be fabricated on a 150 mm diameter silicon wafer, including a edge exclusion of about 2.5 mm. Table 2 shows results for a larger size square die, having a side length of about 1 mm. Increasing the size of the wafer and decreasing the spacing between frame dies may further increase the number of frame dies 200 manufactured on one wafer, as shown in configuration 4 of Table 1 and 2. As may be seen, a large number of frames 270 may be produced in batch on each silicon wafer. In some embodiments of the present invention, a wafer may include over about 20,000, over 100,000, or over 500,000 LEEs 210.

TABLE 1

| Configuration | | 1 | 2 | 3 | 4 |
|---|---|---|---|---|---|
| Wafer thickness | mm | 0.150 | 0.200 | 0.300 | 0.150 |
| LEE dimension x | mm | 0.180 | 0.180 | 0.180 | 0.180 |
| LEE dimension y | mm | 0.350 | 0.350 | 0.350 | 0.350 |
| Gap 242 | mm | 0.010 | 0.010 | 0.010 | 0.005 |
| Bottom hole size-x | mm | 0.200 | 0.200 | 0.200 | 0.190 |
| Bottom hole size-y | mm | 0.370 | 0.370 | 0.370 | 0.360 |
| Top hole size-x | mm | 0.412 | 0.483 | 0.625 | 0.402 |
| Top hole size-y | mm | 0.582 | 0.653 | 0.795 | 0.572 |
| Spacing between top holes | mm | 0.400 | 0.400 | 0.400 | 0.100 |
| Wafer diameter | mm | 150 | 150 | 150 | 300 |
| Edge exclusion on wafer | mm | 2.5 | 2.5 | 2.5 | 2.5 |
| Usable wafer area | mm | 16513 | 16513 | 16513 | 68349 |
| Die + street area | mm | 0.80 | 0.93 | 1.22 | 0.34 |
| # dies per wafer | | 20689 | 17751 | 13485 | 202319 |

TABLE 2

| Configuration | | 1 | 2 | 3 | 4 |
|---|---|---|---|---|---|
| Wafer thickness | mm | 0.150 | 0.200 | 0.300 | 0.150 |
| LEE dimension x | mm | 1.000 | 1.000 | 1.000 | 1.000 |
| LEE dimension y | mm | 1.000 | 1.000 | 1.000 | 1.000 |
| Gap 242 | mm | 0.010 | 0.010 | 0.010 | 0.050 |
| Bottom hole size-x | mm | 1.020 | 1.020 | 1.020 | 1.100 |
| Bottom hole size-y | mm | 1.020 | 1.020 | 1.020 | 1.100 |
| Top hole size-x | mm | 1.232 | 1.303 | 1.445 | 1.312 |
| Top hole size-y | mm | 1.232 | 1.303 | 1.445 | 1.312 |
| Spacing between top holes | mm | 0.400 | 0.400 | 0.400 | 0.100 |
| Wafer diameter | mm | 150 | 150 | 150 | 300 |
| Edge exclusion on wafer | mm | 2.5 | 2.5 | 2.5 | 2.5 |
| Usable wafer area | mm | 16513 | 16513 | 16513 | 68349 |
| Die + street area | mm | 2.66 | 2.90 | 3.40 | 1.99 |
| # dies per wafer | | 6196 | 5692 | 4851 | 34261 |

Figure 14A:
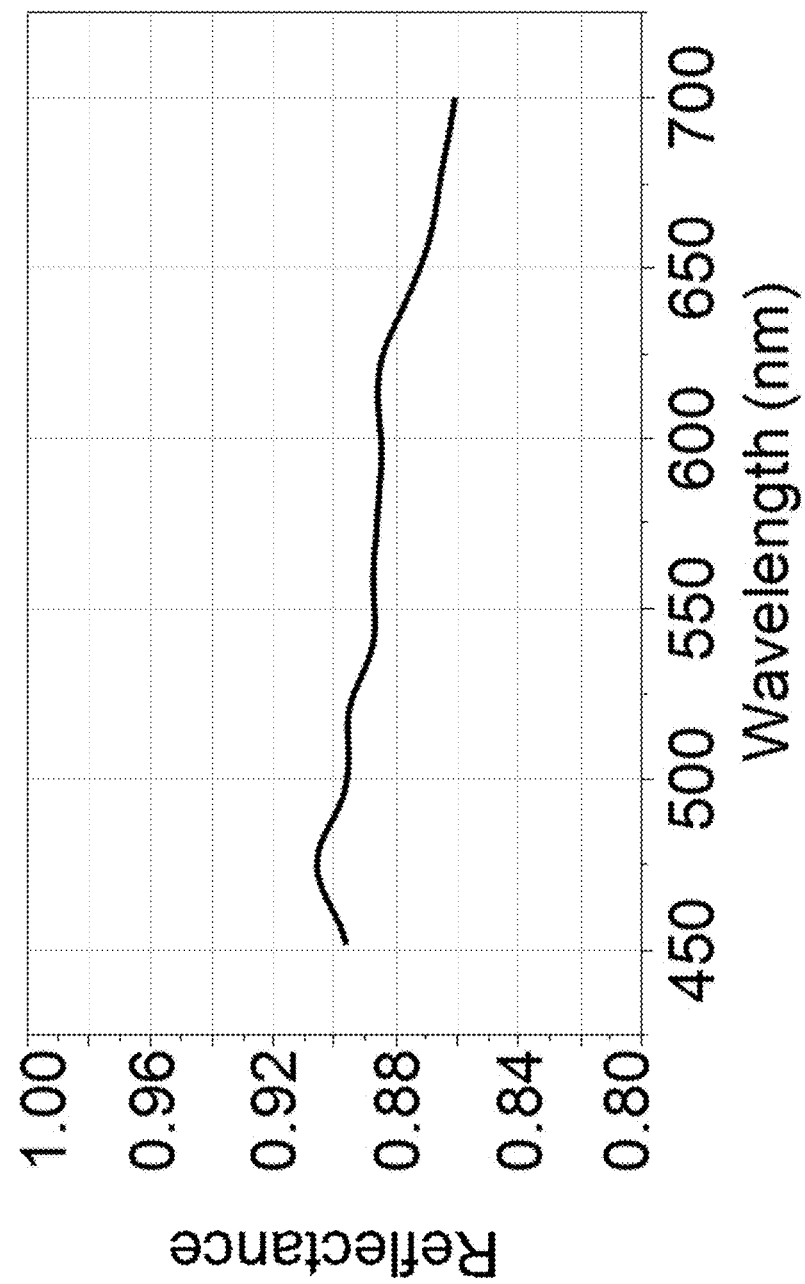
FIGS. 14A and 14B are graphs of reflectance as a function of wavelength for reflective coatings in accordance with various embodiments of the invention.
Figure 14B:
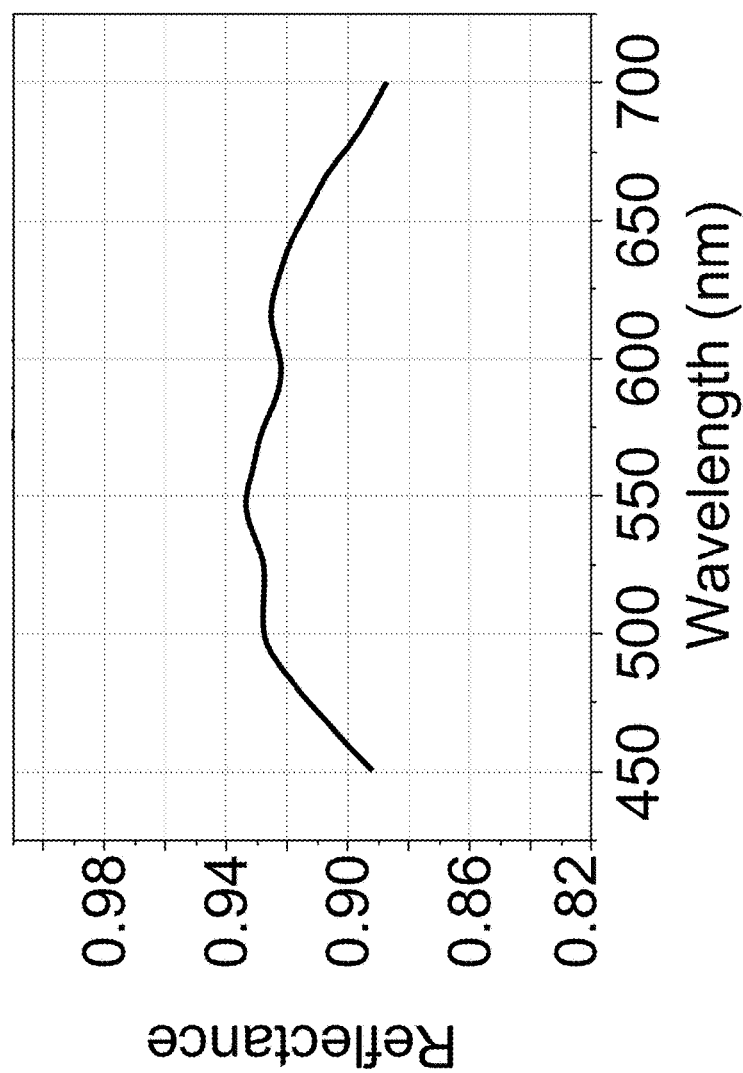

Frame wafer 720 having a thickness of about 0.3 mm was fabricated from a (001) silicon wafer using micro-machining techniques described herein. The dimensions of the top and bottom hole were substantially the same as for Configuration 3 in Table 1. Two reflective coatings were evaluated: (1) about 300 nm of aluminum and (2) about 300 nm of aluminum followed by about 83 nm of $SiO_2$ and about 60 nm of $TiO_2$. FIGS. 14A and 14B show the measured reflectance as a function of wavelength for each of these coatings, as deposited on a monitor wafer. From FIG. 14A, the reflectance of the aluminum-only mirror (coating 1) is at least about 85% over the visible wavelength range, while the enhanced aluminum mirror (with the dielectric films) (FIG. 14B) had a reflectance of at least about 92% over the visible wavelength range.

These frames were used in the manufacture of frame dies 200 having the structure shown in FIG. 1E. LEE 210 had substantially the same dimensions as listed in Configuration 3 of Table 1. The overall length and width of frame die 200 was about 0.94 mm and about 0.82 mm respectively. Dimension 245 (FIG. 1E) was about 0.1 mm and about 0.074 mm in width and length respectively. The height of the phosphor above the top of the frame was about 138 μm. Frame dies 200 were attached to aluminum conductive traces formed on a plastic sheet for characterization. The luminous efficacy for the structure with the enhanced aluminum mirror (coating 2 described above) was about 92 lumen per watt at a current drive of 5 mA and a temperature of 50° C. The temperature was kept substantially constant by mounting the plastic sheet on a thermoelectric cooler. The optical characterization was performed in an integrating sphere.

Advantageously, embodiments of the present invention produce frame dies 200 having controlled binder thickness, uniformity and distribution of phosphor particles in the binder around LEE 210, for example a uniform or substantially uniform thickness and uniform or substantially uniform distribution of phosphor particles in the binder, or an engineered thickness and distribution of phosphor particles to achieve uniform or otherwise specified optical characteristics. In some embodiments of the present invention, the thickness and/or distribution and/or loading of the phosphor particles may have a strong impact on the uniformity of the color temperature of the light, for example the variation in CCT from one frame die 200 to another, either within one frame wafer or between frame wafers. In conventional manufacturing approaches, for example using conventional phosphor-integration techniques such as dispensing of phosphor individually into each package, it may be difficult to achieve a desirably uniform phosphor coating over a large number of packages, resulting in non-uniform optical characteristics. In some embodiments of present invention, phosphor coatings over the frame dies may be planarized after formation, for example to improve phosphor thickness uniformity and reduce or eliminate optical characteristic variation between large numbers of frame dies. Such planarization methods may include or essentially consist of methods such as etching, polishing, grinding, chemical mechanical polishing (CMP) or the like; however this is not a limitation of the invention, and in some embodiments of the present invention thinning may be performed by other techniques.

Figure 15:
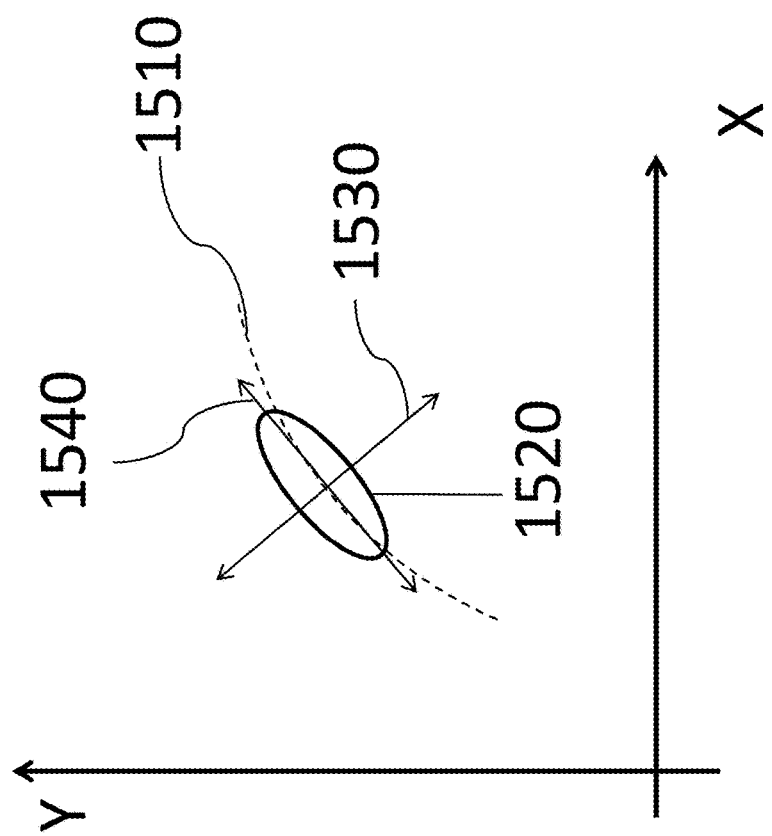
FIG. 15 is a schematic CIE chromaticity diagram in accordance with various embodiments of the invention.

FIG. 15 is a schematic of the CIE chromaticity diagram with a blackbody locus 1510 and an ellipse 1520 representing one or more MacAdam ellipses. The MacAdam ellipse 1520 has a major axis 1540 and a minor axis 1530. A MacAdam ellipse represents a region of colors on the chromaticity chart, and a one-step MacAdam ellipse represents the range of colors around the center point of the ellipse that are indistinguishable to the average human eye, from the color at the center of the ellipse. The contour of a one-step MacAdam ellipse therefore represents barely noticeable differences of chromaticity.

Multiple-step MacAdam ellipses may be constructed that encompass larger ranges of color around the center point. The black body locus is in general aligned with the major axis of a MacAdam ellipse, meaning that the eye is less sensitive to color differences along the black body line 1510, which equates approximately to red/blue shifts, than to differences perpendicular to the black body line, which equates approximately to a green/magenta shift. Furthermore, with respect to phosphor-converted white light sources, the variation in the minor axis direction 1530 is in large measure determined by the LEE (e.g., an LED) wavelength variation, while the variation in the major axis direction 1540 may be largely determined by the phosphor concentration and thickness. While there are many recommendations as to how tight the color temperature uniformity should be (as measured by MacAdam ellipses or other units), it is clear that a variation encompassed within a smaller step number of MacAdam ellipses (smaller ellipse) is more uniform than one encompassed within a larger step number of MacAdam ellipses (larger ellipse). For example, a four-step MacAdam ellipse encompasses about a 300K color temperature variation along the black body locus, centered at 3200K, while a two-step MacAdam ellipse encompasses about a 150K color temperature variation along the black body locus, centered at 3200K.

The importance of uniform and/or controlled or engineered thickness and phosphor concentration in frame die 200 may be seen in relation to the MacAdam ellipse on the chromaticity chart of FIG. 15. Since the major axis length is largely determined by the phosphor concentration and thickness, variations in these parameters result in an increase in the length of the major axis of the MacAdam ellipse and thus an increase in the variation in color temperature. The various methods for fabrication of uniform thickness and composition phosphor as part of frame die 200 described herein result in a reduction in the variation in color temperature and thus a more uniform color temperature light source within the manufacturing process, resulting in a relatively narrower distribution in color temperature. This then permits a reduction in color temperature variation within a lighting system featuring an array of phosphor-converted LEEs, as well as between such lighting systems. The use of the aforementioned LEEs in lighting systems featuring large arrays of LEE permits the manufacture of large numbers of lighting systems having uniform color temperatures. In some embodiments of the present invention, frame dies 200 are manufactured that have a distribution of color temperature less than about 500K, less than about 250K, less than about 125K, or less than about 75K. In some embodiments of the present invention, frame dies 200 are manufactured that have a variation in color temperature or chromaticity of less than about four MacAdam ellipses, or less than about two MacAdam ellipses, or less than about one MacAdam ellipse. In some embodiments of the present invention, such tight distributions are achieved within one composite frame wafer, or within a batch of composite frame wafers or within the entire manufacturing distribution of frame wafers.

One step in the method of manufacture of some embodiments of the present invention is to dispense, cast, pour, apply, or otherwise form a phosphor over one or more LEEs. In one embodiment of the present invention, the amount of phosphor formed is controlled by the amount of phosphor dispensed. In some embodiments, this may be controlled manually or under computer or tool control, for example by using a measured amount or a calibrated syringe or the like, while in other embodiments the amount dispensed may be controlled by feedback during the filling or dispensing process. In one embodiment, the amount of phosphor formed is controlled by the mold volume. The method of controlling the amount of phosphor dispensed is not a limitation of the present invention and many techniques may be used. For example, techniques described in the '864 application and in the '543 application may be utilized to control the amount of dispensed phosphor.

The specific values of the geometry of frame die 200 impact the light output power and thus luminous efficacy of frame die 200. As is discussed herein, the impact of some dimensional parameters is stronger than others, some parameters interact with others, and in general the impact of the geometry of frame die 200 on light output power is reduced as the reflectance of surface 272 (FIG. 1A) (and any other surfaces on which light from LEE 210 or phosphor 230 impinge, for example surface 276 in FIG. 1E) increases.

Figure 16A:
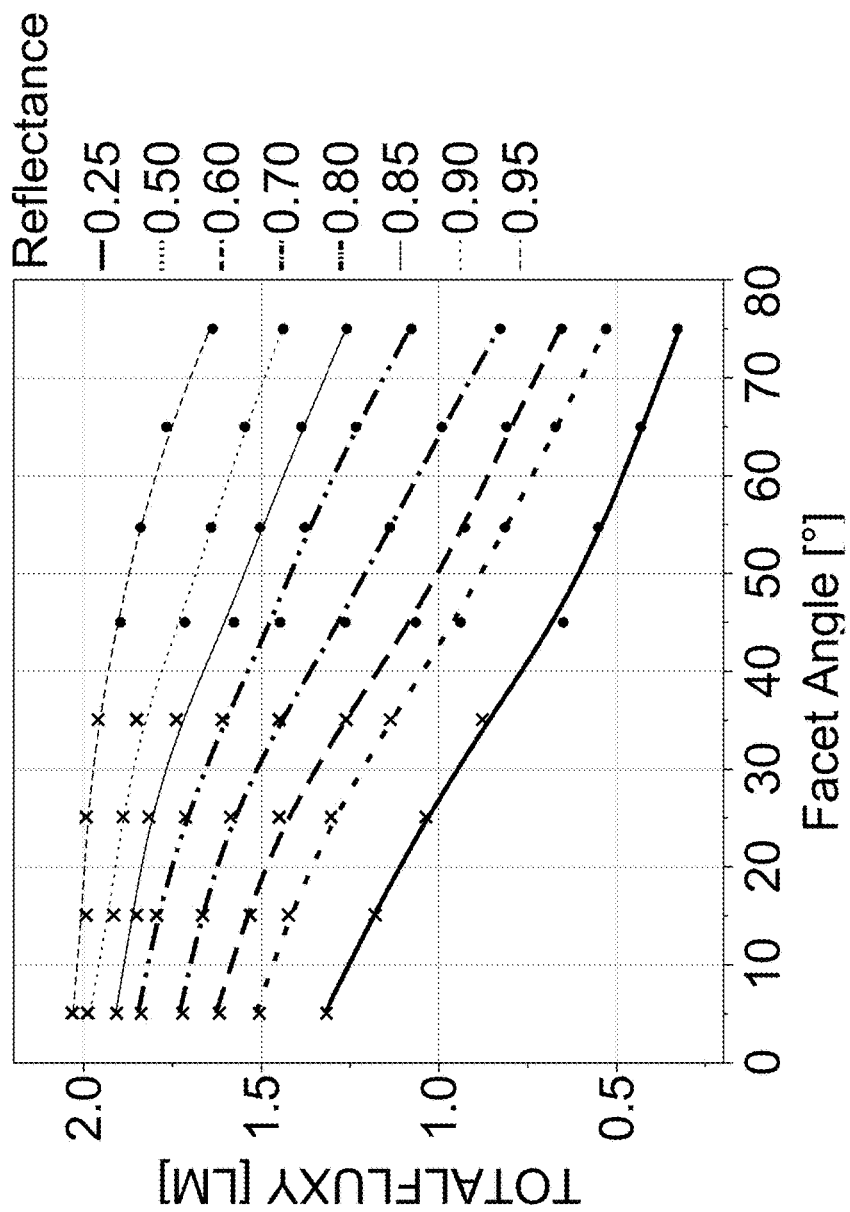
FIG. 16A is a graph of the effect of facet angle on light output power for frame dies with different reflecting surfaces in accordance with various embodiments of the invention.

FIG. 16A shows the impact of facet angle 279 on total flux, i.e., light output power, for frame dies 200 with different reflectances of surfaces 274 and 276. This data is for a structure similar to the one shown in FIG. 1E, with phosphor cap 232 of about 0.1 mm, a frame height 252 of about 0.3 mm, a gap 242 of about 5 µm, and a square frame die size 262 of about 1 mm, while reflectance of surface 274 and surface 276 vary from about 0.25 to about 0.95. The total height of the structure, which is the sum of the frame height and the height of the phosphor over surface 276, remains constant in these examples. The extent of surface 276 (dimension 245), also known as the flat top, varies as a function of angle 279. For angle 279 less than about 40°, the flat top dimension is substantially zero and frame height 252 becomes less than about 0.3 mm. As a result, in these cases, the binder cap height increases above the about 0.1 mm value to maintain the total frame die height constant at about 0.4 mm. Data points marked with an "X" on the plot indicate configurations in which there is no flat top and the frame height is less than about 0.3 mm.

Figure 16B:
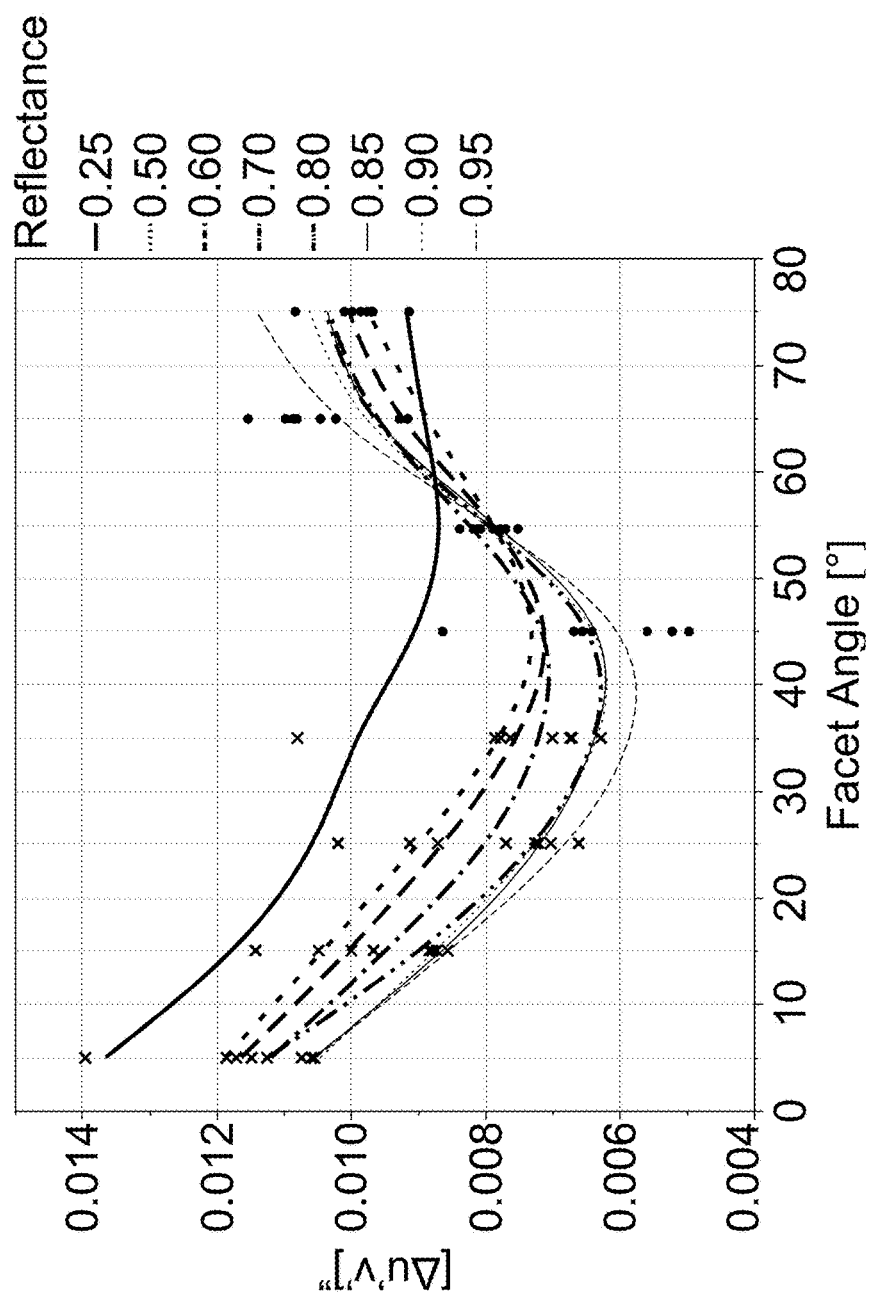
FIG. 16B is a graph of the maximum divergence of color uniformity in terms of the radially averaged Δu'v' deviation from the spatially weighted average chromaticity over a view angle of about 0° to about 70° for the structures investigated in FIG. 16A.

FIG. 16B shows simulations of the maximum divergence of color uniformity in terms of the radially averaged $\Delta u'v'$ deviation from the spatially weighted average chromaticity over a view angle of about 0° to about 70° (0° polar angle is looking directly down on the structure shown in FIG. 1A) for the structures described in reference to FIG. 16A. In other words, the average chromaticity over all polar and azimuthal angles (for example as measured in an integrating sphere) is first determined, and then the radially averaged chromaticities at angles between about 0° and about 70° in units of u'v' color coordinates are determined, and then the maximum difference of the two are plotted in FIG. 16B as a function of facet angle 279 and reflectance of surfaces 274 and 276. The spatial non-uniformity of chromaticity ($\Delta u'v'$) is measured as the maximum deviation from the spatially averaged chromaticity as defined in IES LM-79-08, "Electrical and Photometric Measurements of Solid-State Lighting Products," Illuminating Engineering Society, January 2008 (where 0° is perpendicular to the emitting face of LEE 210), the entire disclosure of which is incorporated by reference herein. The variables u' and v' are chromaticity coordinates on the CIE 1976 chromaticity diagram.

Figure 16C:
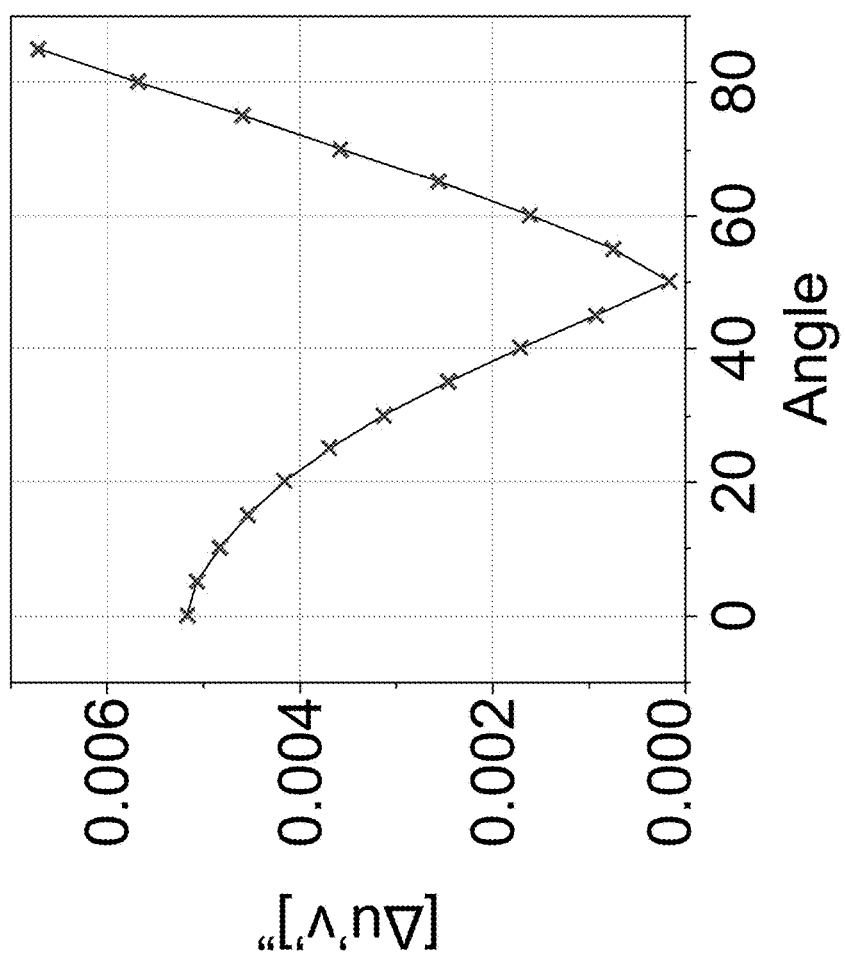
FIG. 16C is a graph of the spatial non-uniformity of chromaticity (Δu'v') as a function of polar angle for one azimuthal angle for a frame die in accordance with various embodiments of the invention.

FIG. 16C shows an exemplary plot of the spatial non-uniformity of chromaticity ($\Delta u'v'$) as a function of polar angle for one azimuthal angle. This data is for a structure similar to the one shown in FIG. 1E, with phosphor cap 232 of about 0.13 mm, a frame height 252 of about 0.3 mm, a gap 242 of about 5 µm, and a rectangular frame die size of about 0.8 mm by about 0.7 mm, facet angle 54.7, and surface 276 (dimension 245), also known as a flat top, of about 0.04 mm. In various embodiments, for example as shown in FIG. 16C, the divergence of color temperature of the white light varies, over an angular range of about 0° to about 80°, by no more than about 0.01 in terms of $\Delta u'v'$ deviation from a spatially weighted averaged chromaticity. In various embodiments, for example as shown in FIG. 16C, the divergence of color temperature of the white light varies, over an angular range of about 10° to about 75°, by no more than about 0.005 in terms of $\Delta u'v'$ deviation from a spatially weighted averaged chromaticity.

As shown in FIGS. 16A and 16B, the total flux increases with decreasing facet angle 279 and increases with increasing reflectance of surfaces 274 and 276. As the reflectance of surfaces 274 and 276 increases, the impact of facet angle decreases. Thus, frame die structures having a reflectance of at least about 85% or at least about 90% on surfaces 274 and 276 provide relative more tolerance to varying facet angles than surfaces having lower reflectance. As shown in FIG. 16B, in general higher reflectance of surfaces 274 and 276 results in an improvement in spatial color uniformity and a region of minimum $\Delta u'v'$ occurs for facet angle 279 in the range of about 25° to about 55°. In various embodiments, the maximum $\Delta u'v'$ may be less than about 0.01, or less than about 0.006, or less than about 0.005, or less than about 0.004. Combining the information from FIGS. 16A and 16B provides a design guide to the impact of structure characteristics on light output power and spatial color uniformity. In applications where high light output power is most important, the frame dies may have high reflectance surfaces and a low facet angle. In applications where spatial color uniformity is more important, the frame dies may have high reflectance surfaces and a facet angle in the range of about 25° to about 50°. Using facet angles on the low side of this range, for example in the range of about 30° to about 40°, will tend to result in higher light output power.

Figure 17A:
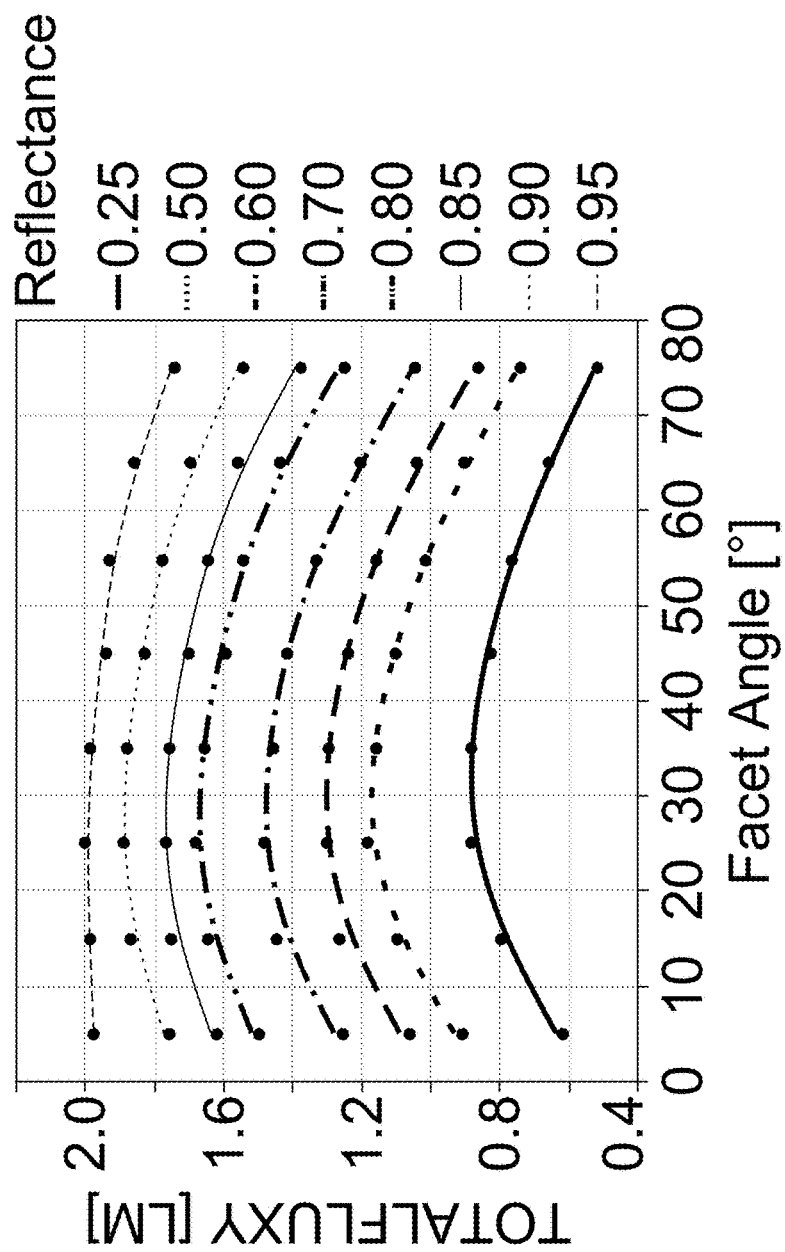
FIG. 17A is a graph of the effect of facet angle on light output power for frame dies with different reflecting surfaces in accordance with various embodiments of the invention.
Figure 17B:
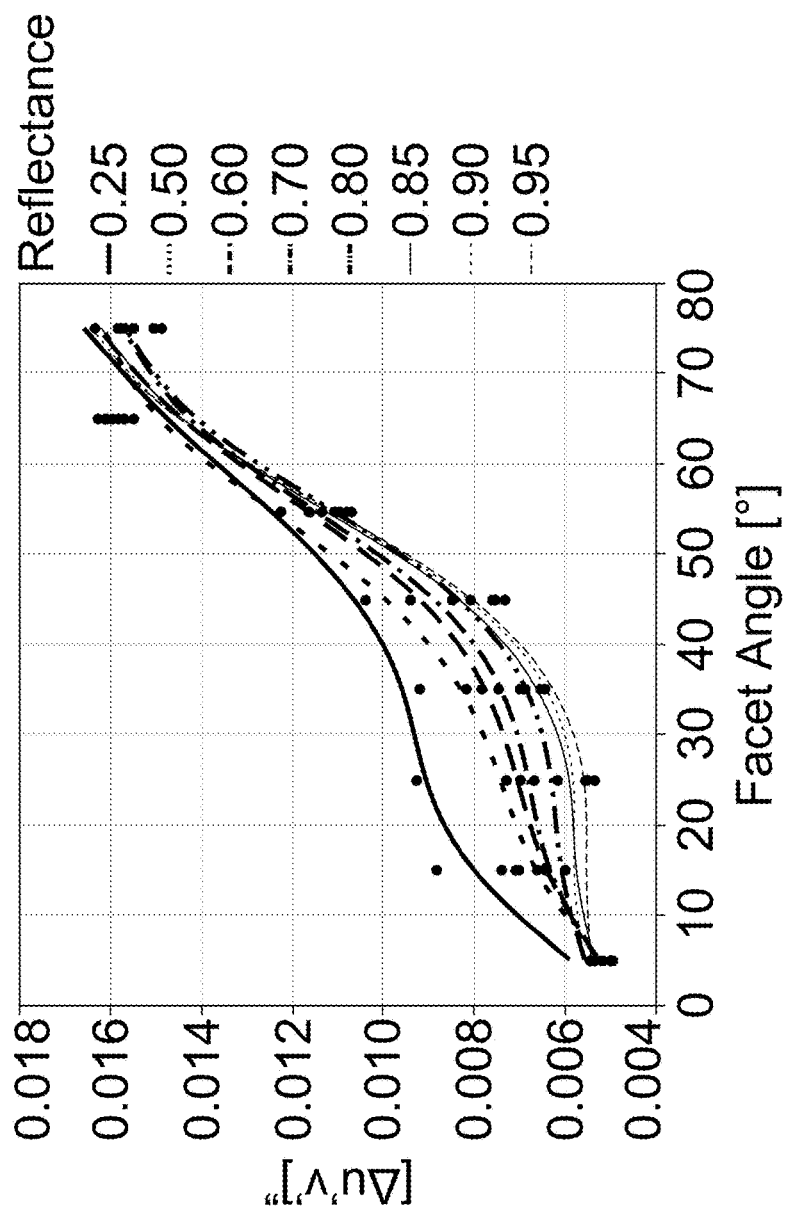
FIG. 17B is a graph of the maximum divergence of color uniformity in terms of the radially averaged Δu'v' deviation from the spatially weighted average chromaticity over a view angle of about 0° to about 70° for the structures investigated in FIG. 17A.

FIGS. 17A and 17B depicts the relationship between facet angle 279 and reflectance of surfaces 274 and 276 on light output power and maximum divergence of color uniformity in terms of the radially averaged $\Delta u'v'$ deviation from the spatially weighted average chromaticity over a view angle of about 0° to about 70° for frame dies 200 similar to the one depicted in FIG. 1A in which frame die size 262 is not fixed, but instead varies for different facet angles 279, respectively. In this simulation, phosphor cap 232 and frame height 252 are constant at about 0.1 mm and about 0.3 mm respectively, frame die size 262 ranges from about 0.5 mm to about 7.2 mm (frame die size 262 increases with decreasing facet angle 279), and flat top dimension 245 is essentially zero. As shown in FIG. 17A, maximum light output power is achieved when facet angle 279 is in the range of about 10° to about 50°, or in the range of about 20° to about 40°. As the reflectance increases, the light output power becomes relatively less dependent on facet angle. As with the structure described in reference to FIG. 16A, higher reflectance reduces the impact of facet angle 279. FIG. 17B shows that the spatial color uniformity improves with increased reflectance and decreased facet angle 279. For facet angles less than about 35°, there is relatively little change in spatial color uniformity. In various embodiments, the maximum $\Delta u'v'$ may be less than about 0.01, or less than about 0.008, or less than about 0.007, or less than about 0.006. Combining the results from FIGS. 17A and 17B, a region of facet angles between about 20° to about 30° achieves high spatial color uniformity and high light output power. For reflectances above about 90% or above about 95%, high light output power and high spatial color uniformity is achieved for facet angles less than about 30° or less than about 20° or less than about 15°.

Figure 18A:
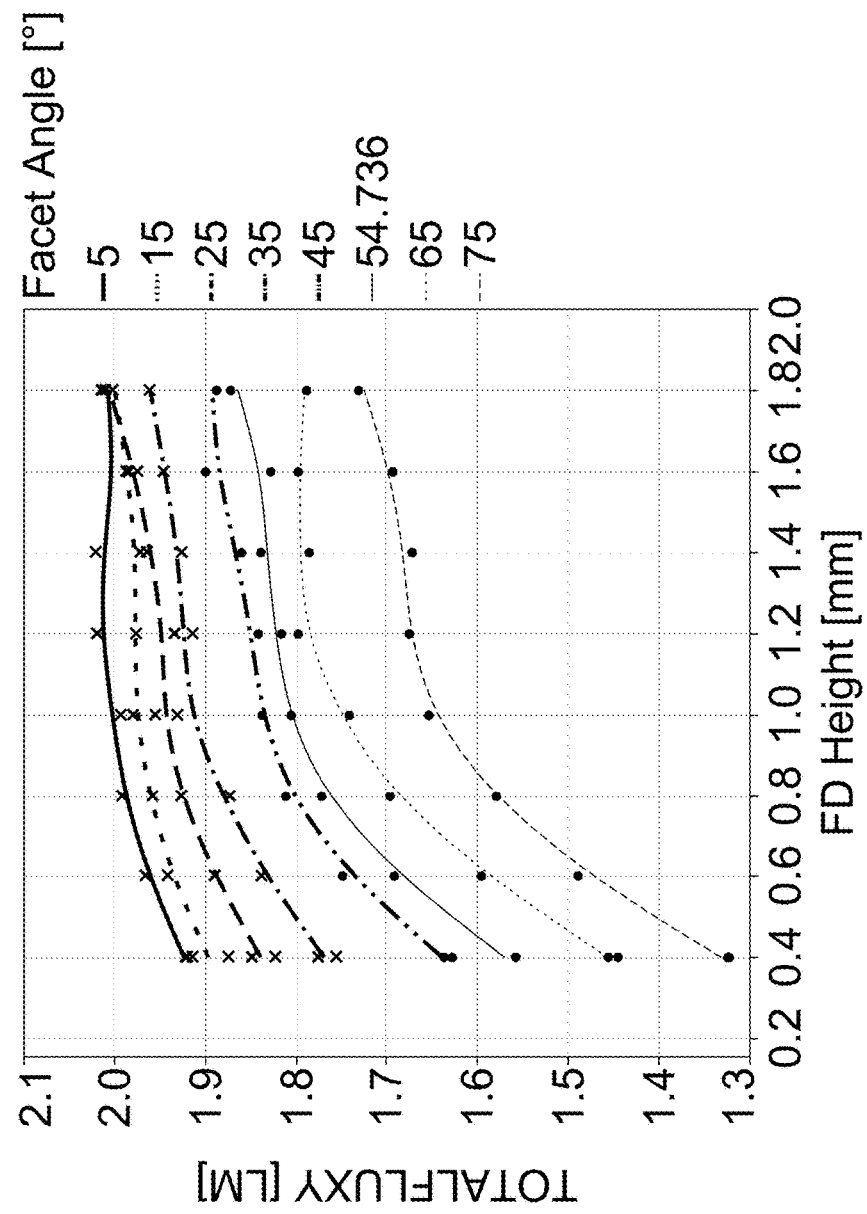
FIG. 18A is a graph of the effect of frame die height on light output power for frame dies with different facet angles in accordance with various embodiments of the invention.
Figure 18B:
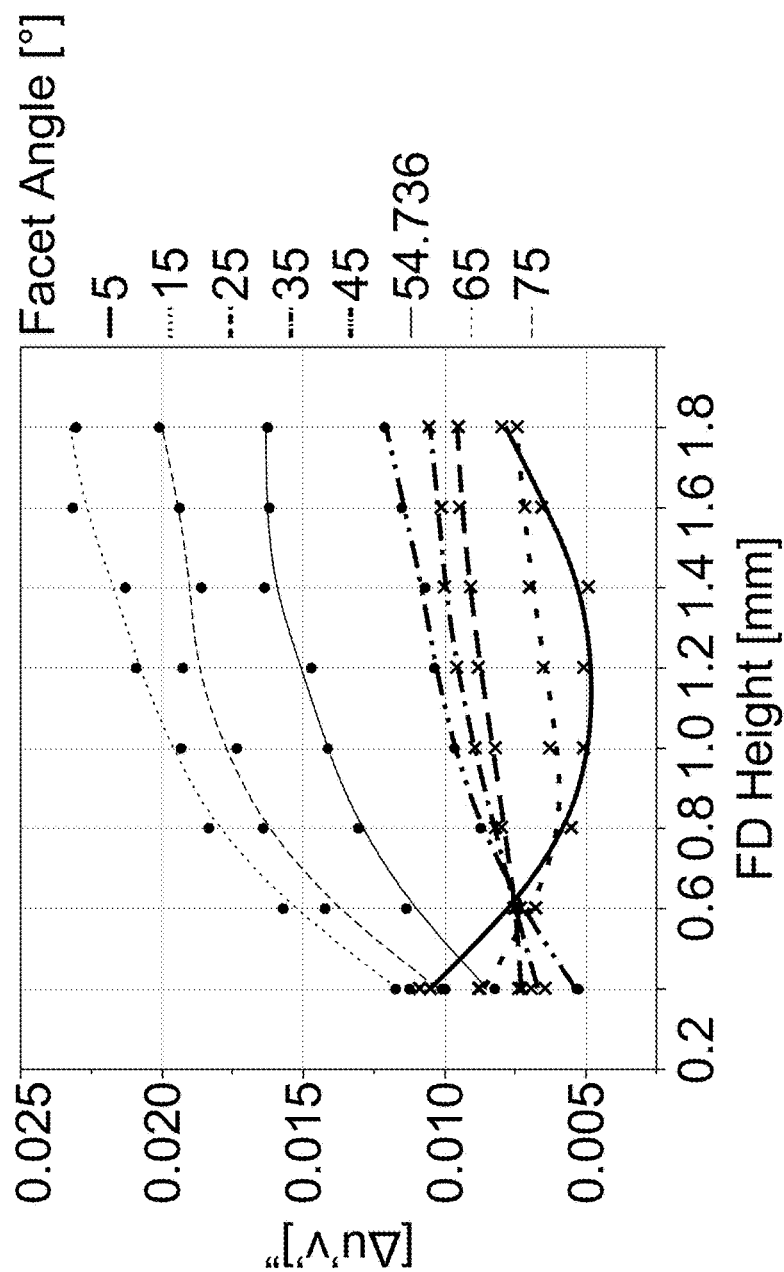
FIG. 18B is a graph of the maximum divergence of color uniformity in terms of the radially averaged Δu'v' deviation from the spatially weighted average chromaticity over a view angle of about 0° to about 70° for the structures investigated in FIG. 18A.

FIGS. 18A and 18B depict the impact of facet angle 279 and total frame die height on light output power and maximum divergence of color uniformity in terms of the radially averaged $\Delta u'v'$ deviation from the spatially weighted average chromaticity over a view angle of about 0° to about 70° respectively, for frame dies having a frame size 262 of 1 mm and aluminum-coated surfaces 274 and 276. For facet angles above about 40°, the frame height is fixed at about 300 µm and the total frame die height is varied by varying the phosphor cap thickness over the frame. For facet angles below about 40°, the frame height decreases with decreasing facet angle in addition to the phosphor cap thickness changing. Data points marked with an "X" on the plot indicate configurations in which there is no flat top and the frame height is less than 0.3 mm.

FIG. 18A indicates that higher light output power is achieved at relatively low facet angles 279 and for larger phosphor cap thicknesses. Once the total frame die height is greater than about 1 mm, or greater than frame size 262, the total light output power is relatively insensitive to further increases in the phosphor cap thickness. FIG. 18B indicates for relatively large facet angles, the best spatial color uniformity is achieved in thin frame dies, whereas for relatively small facet angles the best spatial color uniformity is achieved at frame die heights in the range of about 0.4 mm to about 1.8 mm, or in the range of about 0.4 times to about 1.8 times the frame size 262, or in the range of about 0.8 mm to about 1.6 mm or in the range of about 0.8 times to about 1.6 times the frame size 262. Additionally, there is a change in the form of the relationship between spatial color uniformity and frame die height for facet angles less than about 20°—below this value the spatial color uniformity is relatively insensitive to frame die height. Combining the information in FIGS. 18A and 18B indicates that relatively high light output power and relatively high spatial color uniformity may be simultaneously achieved by using relatively low facet angles, for example below about 25° or below about 15° or below about 5°, and frame die heights above about 0.6 mm. Note that these frame dies do not have any flat top (indicated by the "X" mark on the curves). In various embodiments, the maximum $\Delta u'v'$ may be less than about 0.01, or less than about 0.0075, or less than about 0.005, or less than about 0.0025.

Figure 19A:
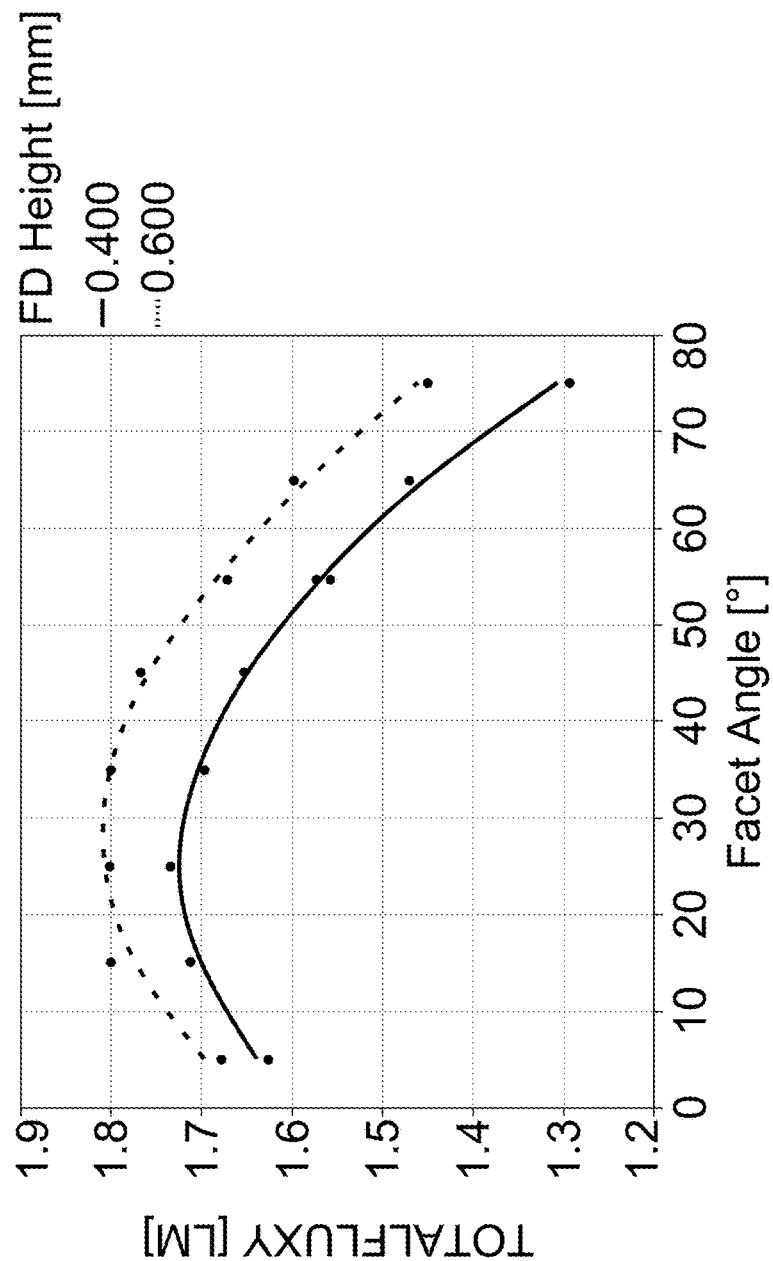
FIG. 19A is a graph of the effect of facet angle on light output power for frame dies with different phosphor cap thicknesses in accordance with various embodiments of the invention.
Figure 19B:
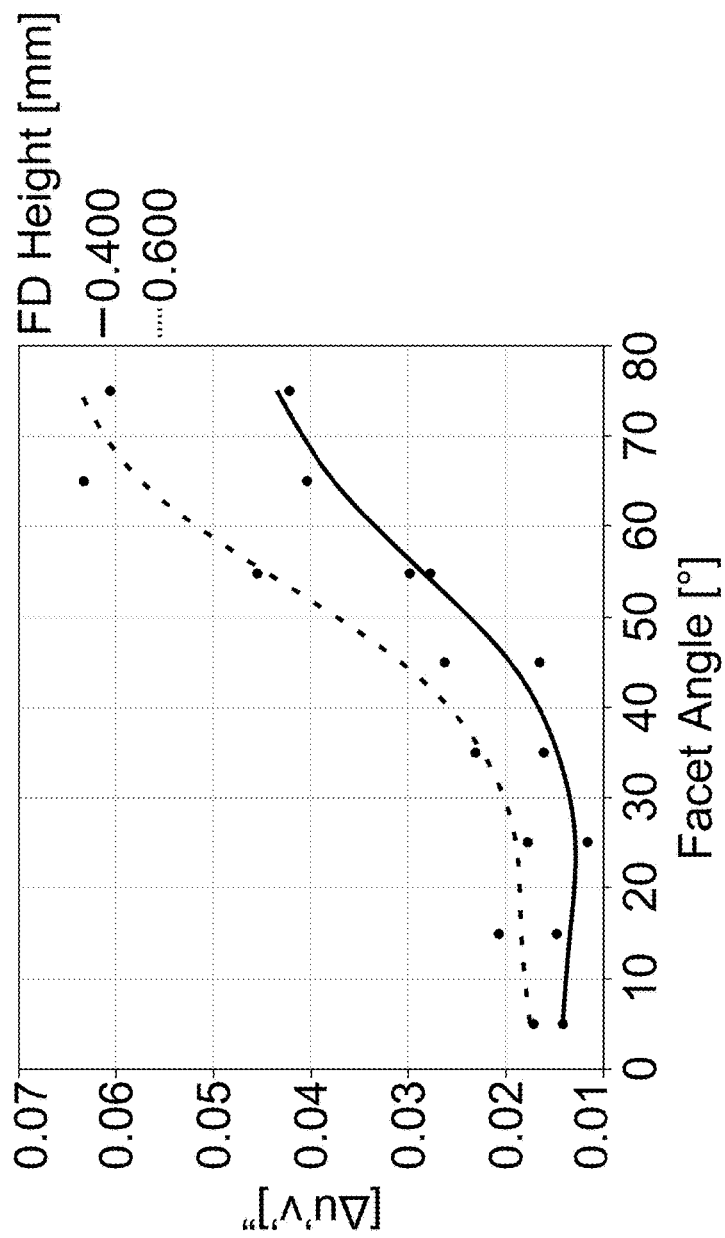
FIG. 19B is a graph of the maximum divergence of color uniformity in terms of the radially averaged Δu'v' deviation from the spatially weighted average chromaticity over a view angle of about 0° to about 70° for the structures investigated in FIG. 19A.

FIGS. 19A and 19B depict the impact of facet angle 279 on light output power and maximum divergence of color uniformity in terms of the radially averaged $\Delta u'v'$ deviation from the spatially weighted average chromaticity over a view angle of about 0° to about 70° respectively, for frame dies having a frame die height of about 0.3 mm, essentially no flat top 245, and aluminum coated surfaces 274 and 276. This is similar to the examples shown in FIGS. 16A and 16B, but for two specific phosphor cap thicknesses of about 0.1 mm and about 0.3 mm. As shown in FIGS. 19A and 19B, the thicker phosphor cap (about 0.3 mm) has higher light output power but also worse spatial color uniformity. As indicated previously, high light output power and good spatial color uniformity are achieved at relatively low facet angles, for example less than about 50°, or less than about 40°, and in some embodiments greater than about 10°. In various embodiments, the maximum $\Delta u'v'$ may be less than about 0.01, or less than about 0.006, or less than about 0.004, or less than about 0.002.

Figure 20A:
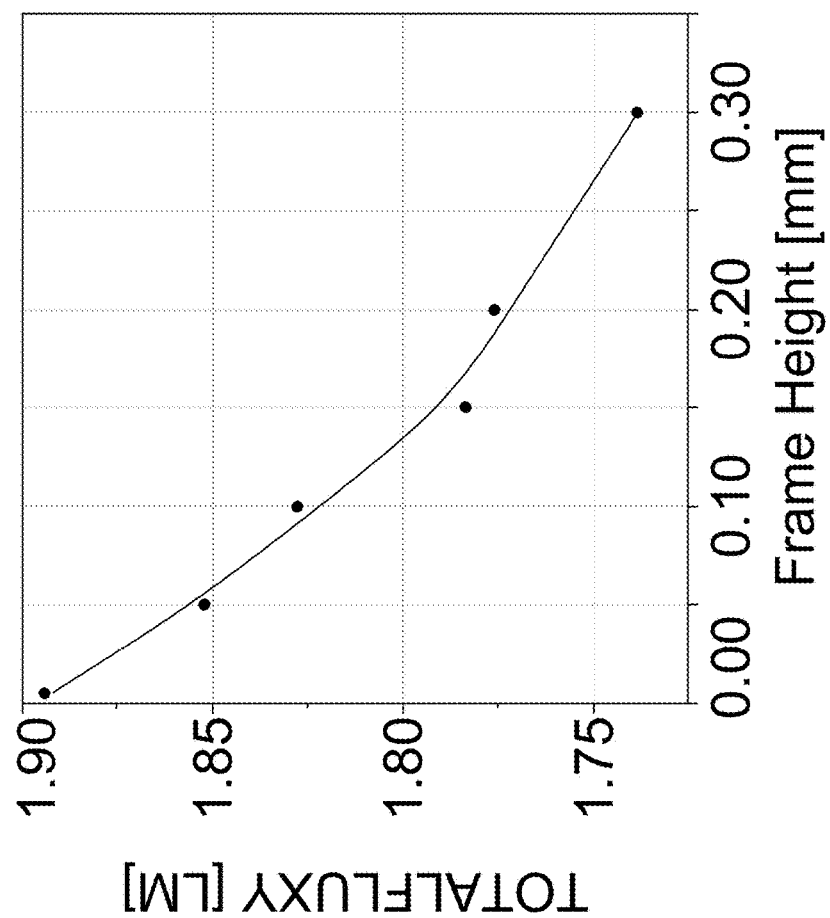
FIG. 20A is a graph of the effect of frame height on light output power for frame dies with different phosphor cap thicknesses in accordance with various embodiments of the invention.
Figure 21A:
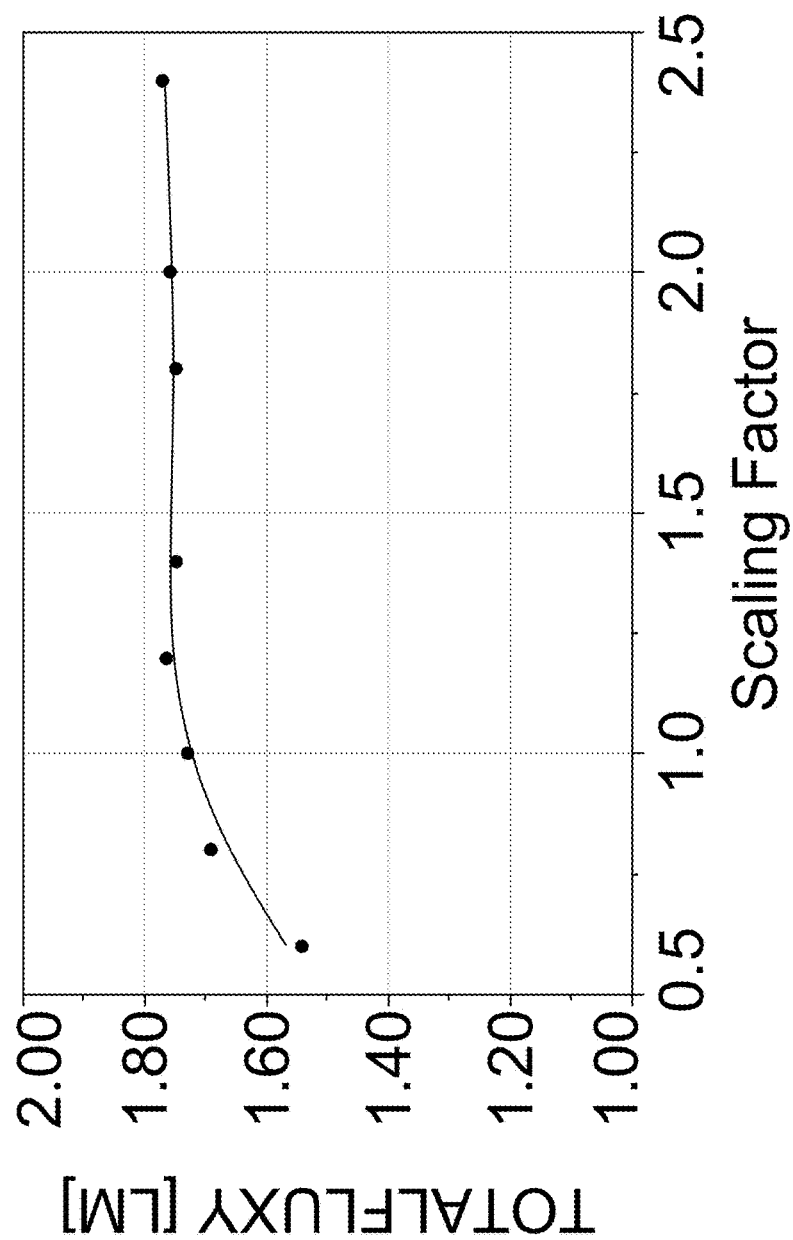
FIG. 21A is a graph of the effect of geometric scaling factor on light output power for frame dies in accordance with various embodiments of the invention.
Figure 21B:
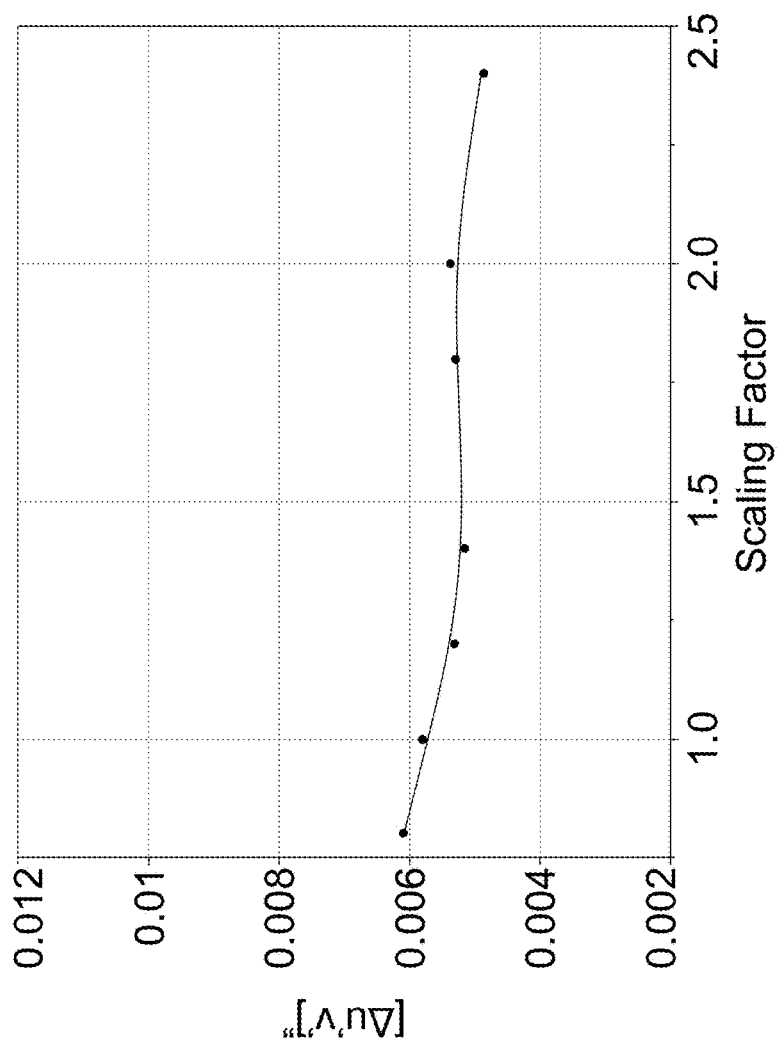
FIG. 21B is a graph of the maximum divergence of color uniformity in terms of the radially averaged Δu'v' deviation from the spatially weighted average chromaticity over a view angle of about 0° to about 70° for the structures investigated in FIG. 21A.
Figure 21C:
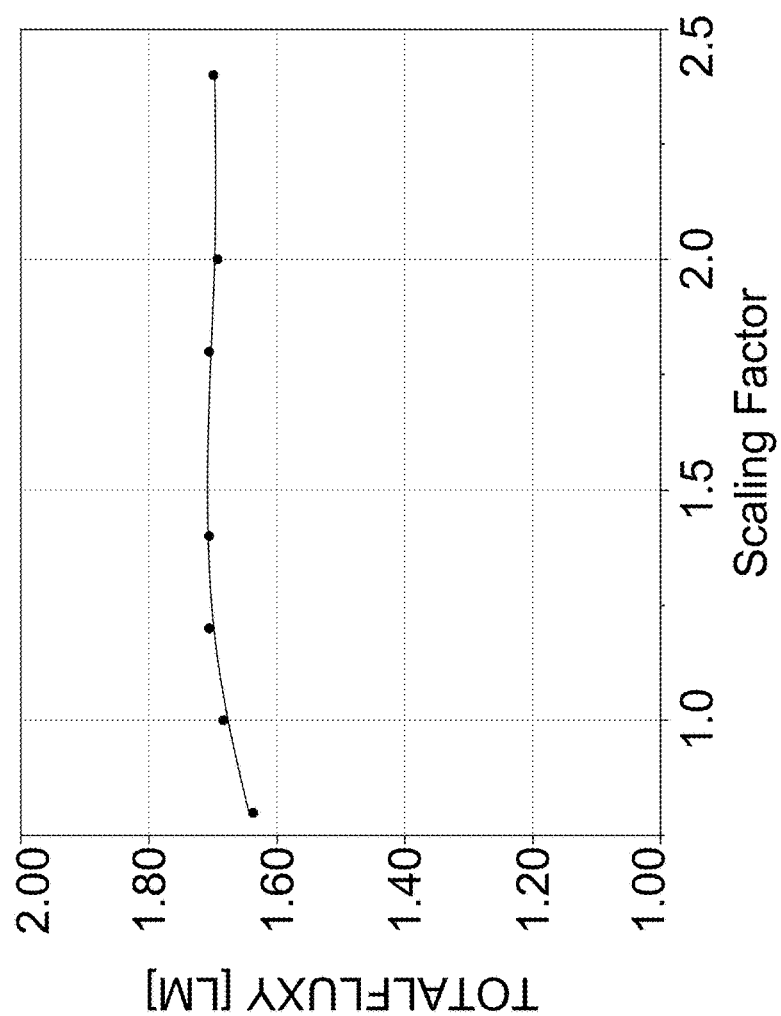
FIG. 21C is a graph of the effect of geometric scaling factor on light output power for frame dies in accordance with various embodiments of the invention.
Figure 21D:
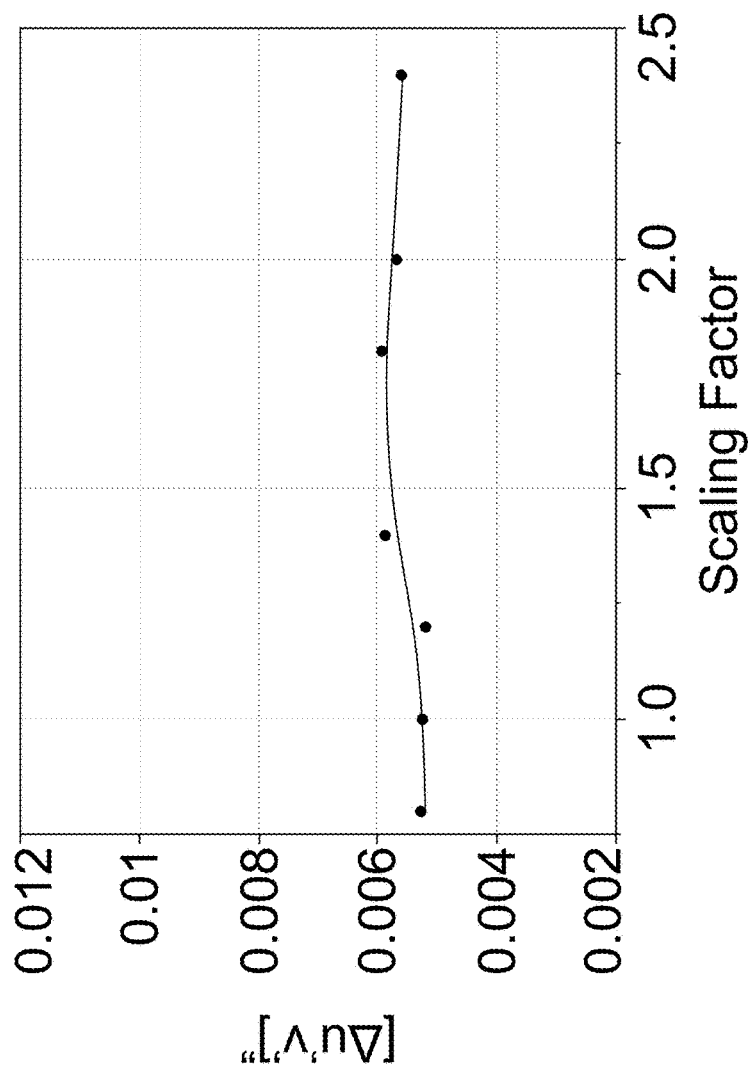
FIG. 21D is a graph of the maximum divergence of color uniformity in terms of the radially averaged Δu'v' deviation from the spatially weighted average chromaticity over a view angle of about 0° to about 70° for the structures investigated in FIG. 21C.

FIGS. 20A and 20B depict the impact of frame height on light output power and maximum divergence of color uniformity in terms of the radially averaged $\Delta u'v'$ deviation from the spatially weighted average chromaticity over a view angle of about 0° to about 70° respectively, for frame dies having a total height of about 0.4 mm, facet angle 279 of about 30°, frame die size 262 of about 1.4 mm, and aluminum coated surfaces 274 and 276. In these examples, the phosphor cap varies from about 0.005 mm to about 0.3 mm, to keep the total height substantially constant at about 0.4 mm. FIGS. 20A and 20B indicate that, in various embodiments, lower frame height results in relatively higher light output power, but worse spatial color uniformity. In various embodiments, the maximum $\Delta u'v'$ may be less than about 0.01, or less than about 0.006, or less than about 0.004, or less than about 0.002.

FIGS. 21A-21D show the impact of frame die scaling on the total light output intensity and maximum divergence of color uniformity in terms of the radially averaged $\Delta u'v'$ deviation from the spatially weighted average chromaticity over a view angle of about 0° to about 70°. In these examples, the size of LEE 210 is kept constant, as is the facet angle 279 (30°), and frame height 252, phosphor cap 232, and frame width 242 are scaled with the same scaling factor. Increasing the width of frame 244 results in an increase in the total frame die size 262 and also results in an increase in the frame height because facet angle 279 is fixed. Note that frame die size 262 does not scale with the scale factor, because it is determined by the sum of twice the frame dimension 244 and the size of the opening for LEE 210 (265 and 265' in FIG. 1C). In these examples, the phosphor cap thickness is also scaled with the same scaling factor. Table 3 summarizes the dimensions for a structure with no flat top region (data shown in FIGS. 21A and 21B) while Table 4 summarizes the dimensions for a structure with a flat top region (data shown in FIGS. 21C and 21D).

TABLE 3

| Facet Angle 279 | Scale Factor | Frame Height 252 (mm) | Frame die height 264 (mm) | Frame die size 262 (mm) | Phosphor Cap 232 (mm) | flat top dimension 245 (mm) | Ratio of Frame die size 262 to LEE size | Ratio of Frame height 252 to LEE size |
|---|---|---|---|---|---|---|---|---|
| 30.00 | 0.60 | 0.11 | 0.17 | 0.74 | 0.06 | 0.000 | 4.1 | 0.61 |
| 30.00 | 0.80 | 0.15 | 0.23 | 0.87 | 0.08 | 0.000 | 4.8 | 0.83 |
| 30.00 | 1.00 | 0.18 | 0.28 | 1.00 | 0.10 | 0.000 | 5.6 | 1.00 |
| 30.00 | 1.20 | 0.22 | 0.34 | 1.13 | 0.12 | 0.000 | 6.3 | 1.22 |
| 30.00 | 1.40 | 0.26 | 0.40 | 1.26 | 0.14 | 0.000 | 7.0 | 1.44 |
| 30.00 | 1.80 | 0.33 | 0.51 | 1.51 | 0.18 | 0.000 | 8.4 | 1.83 |
| 30.00 | 2.00 | 0.37 | 0.57 | 1.64 | 0.20 | 0.000 | 9.1 | 2.06 |
| 30.00 | 2.40 | 0.44 | 0.68 | 1.90 | 0.24 | 0.000 | 10.6 | 2.44 |

TABLE 4

| Facet Angle 279 | Scale Factor | Frame Height 252 (mm) | Frame die height 264 (mm) | Frame die size 262 (mm) | Phosphor Cap 232 (mm) | flat top dimension 245 (mm) | Ratio of Frame die size 262 to LEE size | Ratio of Frame height 252 to LEE size |
|---|---|---|---|---|---|---|---|---|
| 30.00 | 0.60 | 0.11 | 0.17 | 0.98 | 0.06 | 0.24 | 5.4 | 0.61 |
| 30.00 | 0.80 | 0.15 | 0.23 | 1.19 | 0.08 | 0.32 | 6.6 | 0.83 |
| 30.00 | 1.00 | 0.18 | 0.28 | 1.40 | 0.10 | 0.40 | 7.8 | 1.00 |
| 30.00 | 1.20 | 0.22 | 0.34 | 1.61 | 0.12 | 0.48 | 8.9 | 1.22 |

TABLE 4-continued

| Facet Angle 279 | Scale Factor | Frame Height 252 (mm) | Frame die height 264 (mm) | Frame die size 262 (mm) | Phosphor Cap 232 (mm) | flat top dimension 245 (mm) | Ratio of Frame die size 262 to LEE size | Ratio of Frame height 252 to LEE size |
|---|---|---|---|---|---|---|---|---|
| 30.00 | 1.40 | 0.26 | 0.40 | 1.82 | 0.14 | 0.56 | 10.1 | 1.44 |
| 30.00 | 1.80 | 0.33 | 0.51 | 2.23 | 0.18 | 0.72 | 12.4 | 1.83 |
| 30.00 | 2.00 | 0.37 | 0.57 | 2.44 | 0.20 | 0.80 | 13.6 | 2.06 |
| 30.00 | 2.40 | 0.44 | 0.68 | 2.86 | 0.24 | 0.96 | 15.9 | 2.44 |

As shown in FIGS. 21A-21D, scaling the frame size while keeping the size of the LEE constant has relatively little impact on light output power and spatial color uniformity, particularly for scale factors larger than 1. As the scale factor decreases below 1, the frame starts to become closer to the size of the LEE, resulting in some degradation in performance. These results demonstrate that changes in the package size, i.e., the frame size, may be made with little impact on performance, as long as the package size is not too close to the size of the LEE. In various embodiments, the maximum Δu'v' may be less about 0.006.

In the examples related to Tables 3 and 4 and FIGS. 21A-21D, the LEE has a length of 350 µm and a width of about 180 µm, and for scale factor 1.0 the frame die size 262 is about 1.4 mm. In some embodiments of the present invention, the ratio of the size of the frame die to the ratio of the size of the LEE may be used as one factor in the design of a frame die. The last column in Tables 3 and 4 show this ratio, using the short side of the LEE value, 0.18 mm. In some embodiments, the ratio of frame size to LEE size is greater than about 5 or greater than about 8. In various embodiments, the ratio of frame size to LEE size for frame dies without a flat top is greater than about 4 or greater than about 4.5 or greater than about 5. In various embodiments, the ratio of frame size to LEE size for frame die with a flat top is greater than the same ratio for frame dies without a flat top. In various embodiments, the ratio of frame size to LEE size for frame dies without a flat top is greater than about 5.5 or greater than about 6.5 or greater than about 7.5. As discussed herein, frame die size 262 does not scale directly with the scale factor—another design ratio shown in Tables 3 and 4 is the ratio of frame height 252 to LEE size. In various embodiments, the ratio of frame height to LEE size for frame dies is greater than about 0.5 or greater than about 0.6 or greater than about 1.

Figure 22:
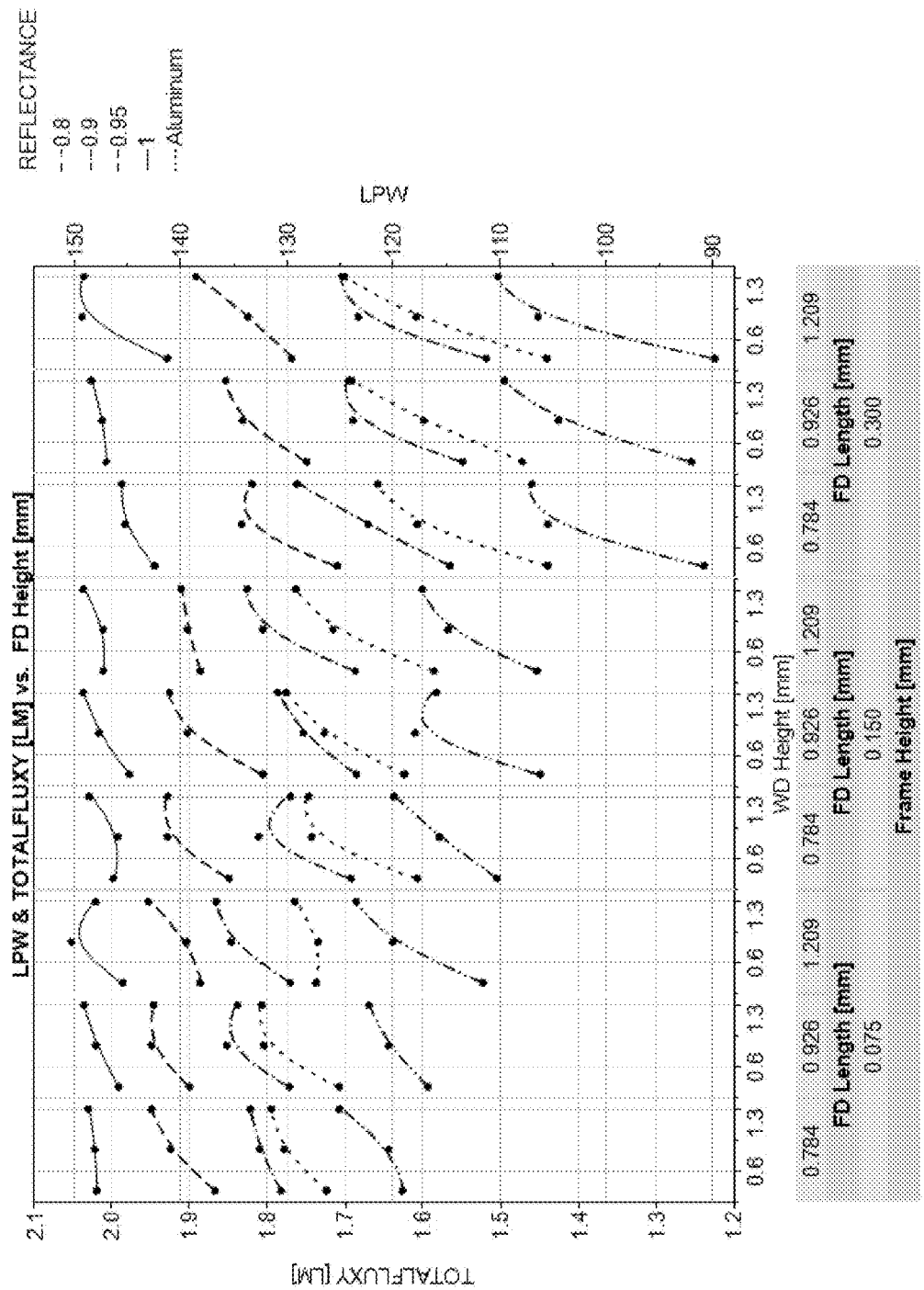
FIG. 22 is a graph of light output power for a large number of different frame die geometries in accordance with various embodiments of the invention.

FIG. 22 shows plots of light output power for a large number of different frame die geometries. The variables shown in FIG. 22 include mirror reflectance (of surface 272), frame height 252, total frame die height, which is the sum of frame height 252 and binder cap 232, and frame die size (for a square frame). In all cases, LEE 210 has a height of about 0.14 mm. As shown in FIG. 22 for a perfect mirror (reflectance=1), the geometry of the frame die has relatively very little impact on light output power, because in this case substantially all of the light is extracted from the package. As the mirror reflectance decreases, the impact of frame die geometry increases. In some embodiments, as the frame height decreases, the light output power increases. In one embodiment, the light output power generally is more strongly dependent on geometry when the frame height increases beyond the height of LEE 210 and generally less dependent on geometry when the frame height is below that of LEE 210. In some embodiments, the light output power increases as the binder cap 232 increases (this may be seen from the curves of total frame die height for a fixed frame height). In some embodiments, the frame die size 262 has less impact on light output power than frame height 252 and total frame die height. In some embodiments, as the thickness of LEE 210 becomes substantially the same as or less than that of frame 252, the light output power becomes less dependent upon total frame die height. A key aspect of embodiments like those depicted in FIG. 22 is that, in various embodiments, the mirror (i.e., the reflective frame surface) has as high a reflectance as possible, reducing the impact of frame die geometry. In some embodiments, the mirror has a reflectance greater than 90%, or greater than 95%, or greater than 98%.

The mirrors used in the examples in reference to FIGS. 16A-22 have substantially no wavelength dependence and substantially no angle of incidence dependence; in other words, the reflectance is the same for all angles of incidence and all wavelengths. Aluminum mirrors have very little angular or wavelength dependence in the visible wavelength range. However, in some embodiments of the invention, the light incident upon the mirror and emitted from LEE 210 and/or phosphor 230 is not uniform in wavelength or angle of incidence. In some embodiments of the present invention, the mirror or reflecting surfaces may be optimized to match the spectral and angular characteristics of the light emitted by LEE 210 and/or phosphor 230 to achieve relatively improved optical characteristics.

In some embodiments of the present invention, phosphor 230 absorbs a portion of the light emitted by LEE 210 and re-emits light at a different wavelength, the combination of light from LEE 210 and phosphor 230 having a different color than that of the light from LEE 210 and phosphor 230 separately. In some embodiments, the combined light is substantially white light. In some embodiments, the substantially white light has a correlated color temperature in the range of about 2500K to about 10000K. In some embodiments, LEE 210 emits light in the blue wavelength range and phosphor 230 emits light in the green/yellow/red wavelength range.

Figure 23A:
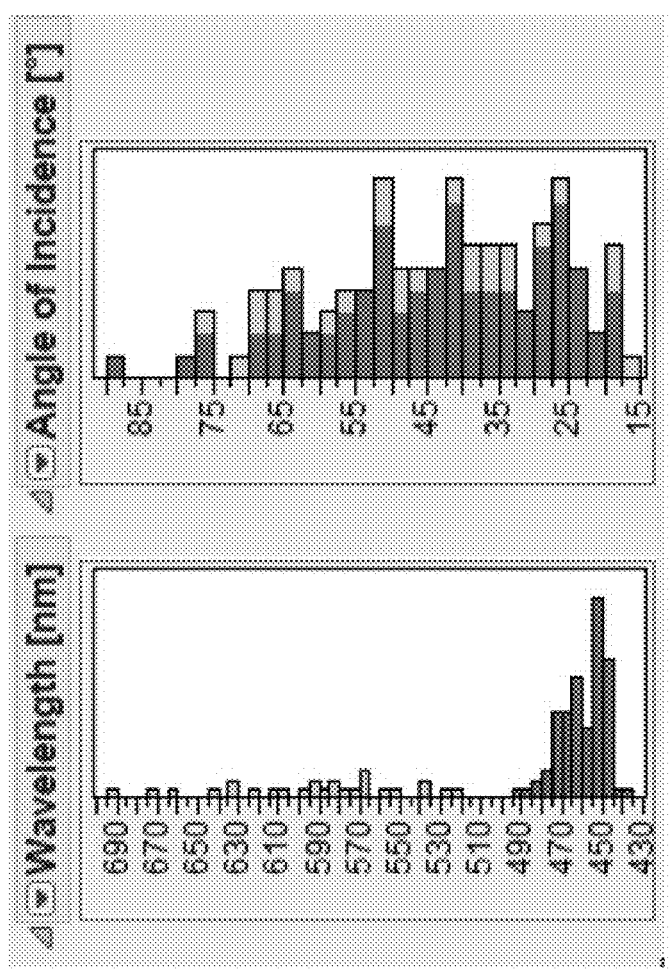
FIGS. 23A-23C are histograms of the spectral distribution of light from a series of frame dies having three different frame heights in accordance with various embodiments of the invention.
Figure 23B:
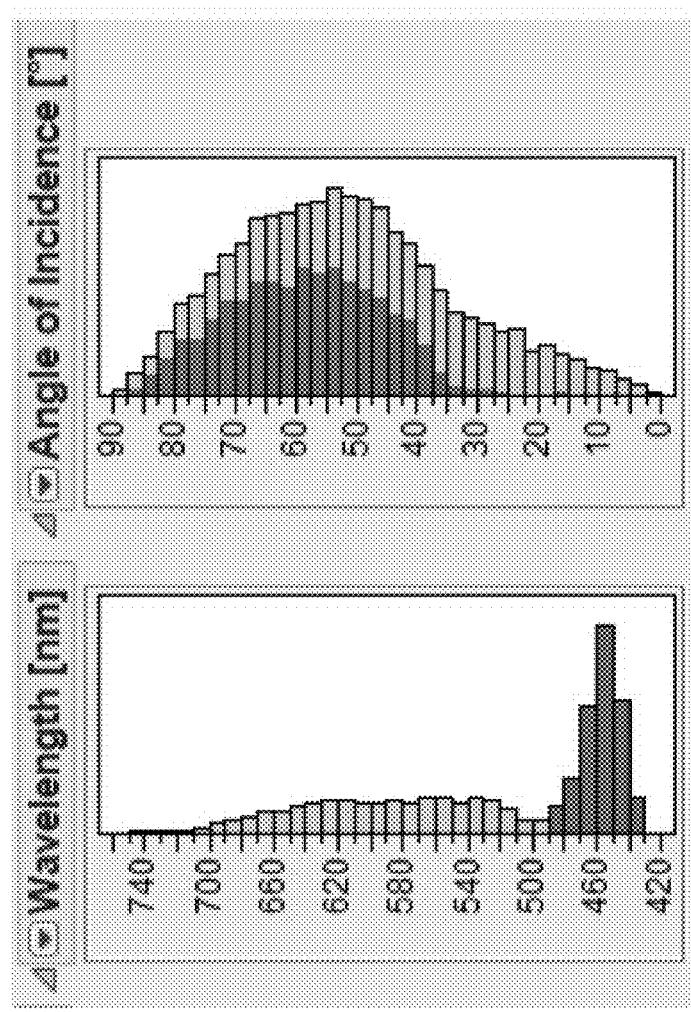
Figure 23C:
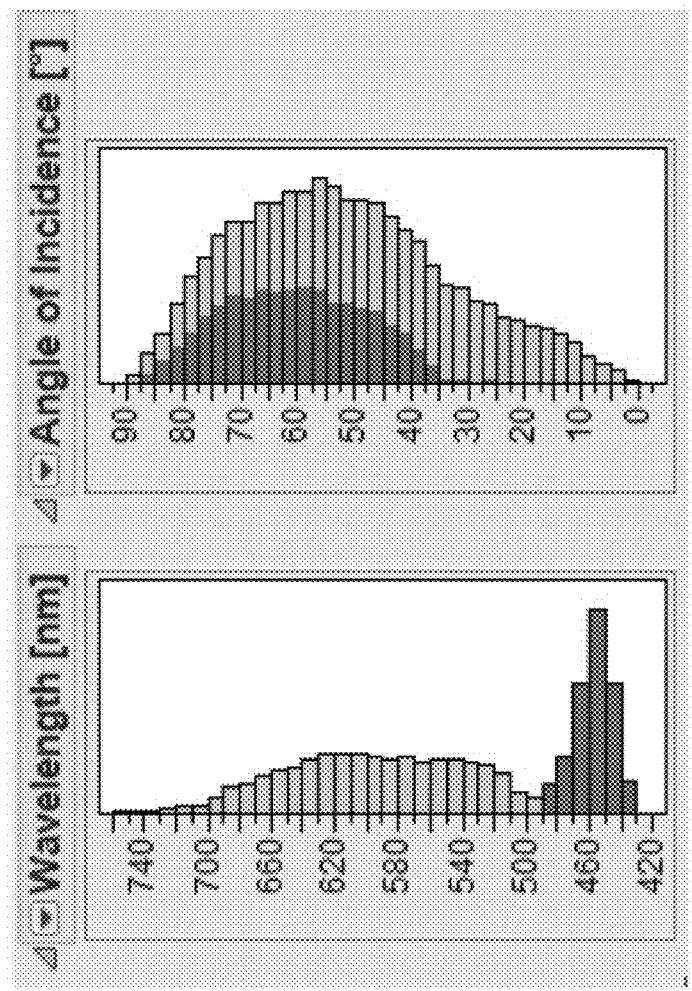

FIGS. 23A-23C show histograms of the spectral distribution of light from a series of frame dies having three different frame heights 252 (1 µm, 150 µm, and 300 µm), emitting substantially white light. In these examples, the frame dies have a facet angle 279 of about 54.7°, a gap 242 of about 5 µm, and a square frame die size 262 of about 0.98 mm. As may be seen from FIG. 23A-23C, the white light is substantially composed of a blue component (dark bars of the histogram) that is emitted from LEE 210, in the range of about 420 nm to about 490 nm, and a yellow component (light bars of the histogram) emitted from phosphor 230, in the range of about 500 to about 750 nm. FIGS. 23A-23C also show the distribution of the angle of incidence on surface 272 as a function of wavelength. As shown in FIGS. 23B and 23C, for frame thicknesses of about 150 µm and about 300

μm, the angle of incidence of the light from LEE 210 is relatively tightly distributed in the range of about 40° to about 75°, or about 50° to about 60°, while the angle of incidence of the light from the phosphor is more broadly distributed. However, as shown in FIGS. 23B and 23C, most of the light falls within an incidence angle range from about 30° to about 80° or from about 40° to about 75°. In various embodiments, the peak in the angle of incidence of light from both LEE 210 and the phosphor is in the range of about 50° to about 60°, which approximately corresponds to the facet angle produced using various anisotropic etch techniques with a silicon frame.

The dependence of the spectral and angular distribution of light for a 1 μm thick frame as shown in FIG. 23A, essentially a flat plate, is relatively different from those of the structures of FIGS. 23B and 23C. In the case of very thin frames, the spectral distribution is relatively similar to that of the other two cases; however, the angle of incidence dependence is shifted to relatively lower angles and is also more broadly distributed.

Figure 24A:
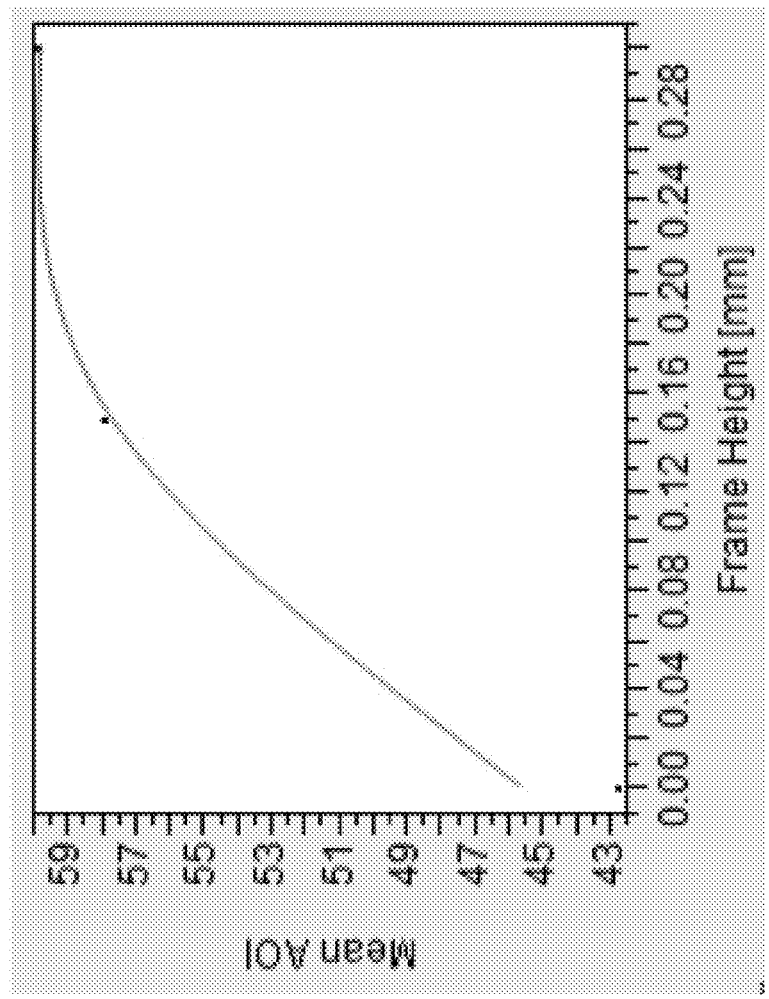
FIG. 24A is a graph of the average value of the angle of incidence of light emitted by the light-emitting element of a phosphor-containing frame die as a function of frame height in accordance with various embodiments of the invention.
Figure 24B:
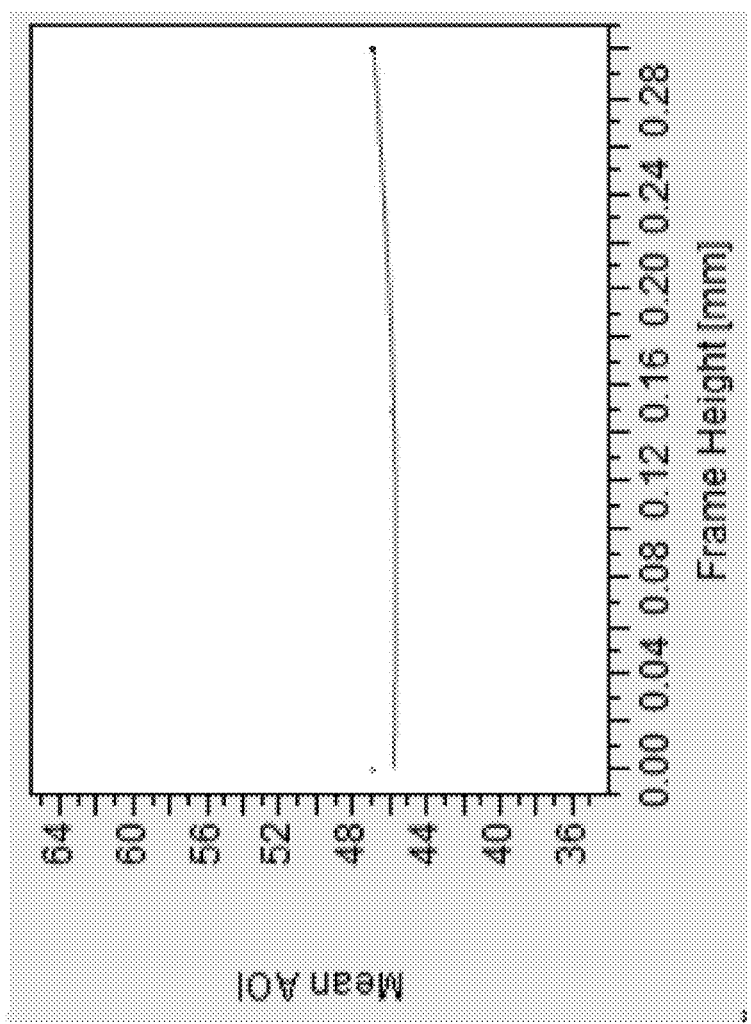
FIG. 24B is a graph of the average value of the angle of incidence of light emitted by the phosphor of a phosphor-containing frame die as a function of frame height in accordance with various embodiments of the invention.

FIG. 24A shows a plot of the average value of the blue wavelengths (i.e., light emitted by the LEE) angle of incidence (the angle of incidence of the peak value of the angle of incidence curve for blue light) as a function of frame height 252, while FIG. 24B shows a plot of the average of the yellow wavelengths (i.e., light emitted by the phosphor) angle of incidence as a function of frame height 252. As may be seen, in this embodiment, the average value of the angle of incidence for blue light varies with frame height 252. As frame height 252 increases so does the average value of the angle of incidence. In contrast, in this embodiment, the average value of the angle of incidence of the yellow light is relatively constant for different frame heights 252.

In some embodiments of the present invention, the information described in reference to FIGS. 23A, 23B, 24A, and 24B may be used to design an optimized mirror. For example, for the frame die of FIG. 23C having a frame height 252 of about 300 μm, the mirror may preferably have a peak reflectance for the blue wavelengths at an angle of incidence of about 60° and a peak reflectance for the yellow wavelengths at an angle of incidence of about 50°. For example, for the frame die of FIG. 23B having a frame height 252 of about 150 μm, the mirror may preferably have a peak reflectance for the blue wavelengths at an angle of incidence of about 57° and a peak reflectance for the yellow wavelengths at an angle of incidence of about 45°. Based on the curves of FIGS. 24A and 24B, for a frame die having a frame height 252 of about 75 μm, the mirror may preferably have a peak reflectance for the blue wavelengths at an angle of incidence of about 53° and a peak reflectance for the yellow wavelengths at an angle of incidence of about 45°.

The examples described herein are not meant to be limiting and the methodology described in reference to FIGS. 23A-23C and FIGS. 24A and 24B may be used to determine the characteristics for an optimized mirror for any frame die structure.

In some embodiments of the present invention, circuitry may be disposed in or on frame 270, for example one or more diodes, transistors, resistors, capacitors, inductors, circuits or the like. In various embodiments, frame 270 may include or consist essentially of a semiconductor material such as silicon, gallium arsenide, or the like, and one or more devices or circuits may be formed in or on the semiconductor frame 270, for example using conventional semiconductor device and circuit fabrication techniques. For example, one or more devices and/or circuits may be fabricated on frame wafer 1110, for example at a point in time before or after than shown in FIG. 11A. In various embodiments, the device(s) and/or circuit(s) may be formed in the semiconductor frame wafer before fabrication of the frame die. In various embodiments of the present invention, one or more circuit elements may be formed on frame 270, for example using hybrid semiconductor packaging techniques such as attachment and electrical coupling using solder, adhesive, conductive adhesive, ACA, or the like.

Figure 25C:
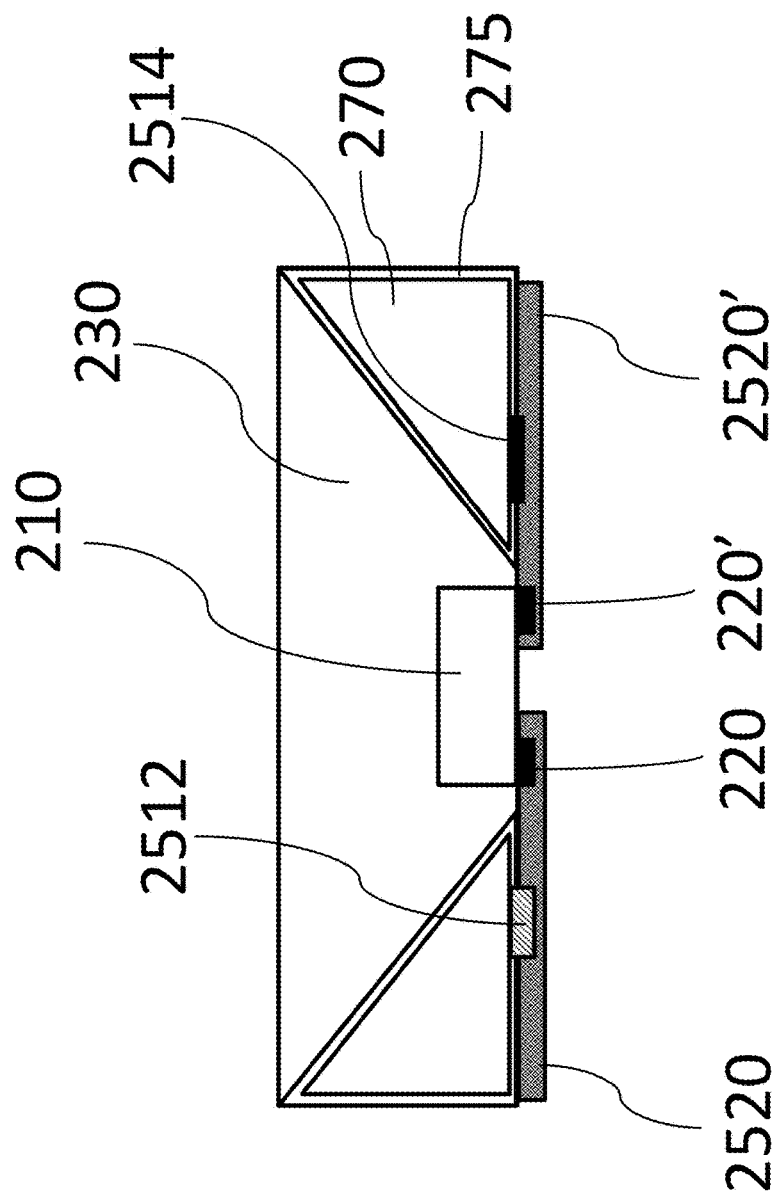
FIG. 25C is a cross-sectional view of a frame die having the electrical schematic of FIG. 25B in accordance with various embodiments of the invention.

In some embodiments of the present invention, a component (which may be a "control element") 2510 formed in or as part of frame 270 may be electrically coupled in parallel or series with LEE 210, for example in parallel as shown in FIG. 25A. In various embodiments, component 2510 may provide electrostatic protection to LEE 210; for example, in various embodiments component 2510 may include or consist essentially of a Zener diode. In some embodiments, component 2510 may include or consist essentially of one or more electrical devices or circuits. In some embodiments, component 2510 may consist essentially of a Zener diode and LEE 210 may consist essentially of a LED, as shown in FIG. 25B. FIG. 25C shows a schematic diagram of a frame die having the electrical schematic shown in FIG. 25B, in which component 2510 consists essentially of a diode having Schottky contact 2512 to semiconductor frame 270 and ohmic contact 2514 to semiconductor frame 270. Schottky contact 2512 is electrically coupled to contact 220 by conductor 2520 and ohmic contact 2514 is electrically coupled to contact 220' by conductor 2520'. In various embodiments, conductors 2520 and 2520' may be extended to cover a relatively large portion of the bottom of the frame die to, e.g., improve the electrical and/or mechanical attachment of the frame die to a substrate.

In various embodiments, control element 2510 may include or consist essentially of one electrical component, for example a resistor, capacitor, inductor, transistor or the like, or a circuit incorporating multiple electrical components. In various embodiments of the present invention, component 2510 may include current control and/or voltage control circuitry, for example a current control circuit to control or regulate the current passing through LEE 210. In various embodiments, component 2510 may protect LEE 210 from surge currents. In various embodiments of the present invention, component 2510 may include a rectifying circuit. In various embodiments of present invention, component 2510 may include one or multiple sensing elements such as temperature sensors, vibration sensors, or magnetic sensors, or the like. In various embodiments of the present invention, component 2510 may include light sensors coupled to interior and/or exterior parts of frame 270. In various embodiments of present invention, component 2510 may include one or more wireless transmitters and/or receivers. In various embodiments of present invention, component 2510 may include an energy harvesting circuit or material. In various embodiments, component 2510 may perform one function, while in other embodiments, component 2510 may perform more than one function. For example, in various embodiments, component 2510 may adjust current through LEE 210 based on operating temperature that is measured through a temperature sensor of component 2510. In various embodiment of present invention, component 2510 may include identification information for each or a group of frame dies, and said information may be utilized to address, actuate, and/or control frame dies individually or in groups. In some embodiments of present invention, component 2510 may permit communication between multiple frame dies and/or with other external components or systems. In various embodiments, control element 2510 may be fabricated using well-known semiconductor integrated circuit fabrication techniques or hybrid packaging techniques without undue experimentation.

Figure 26A:
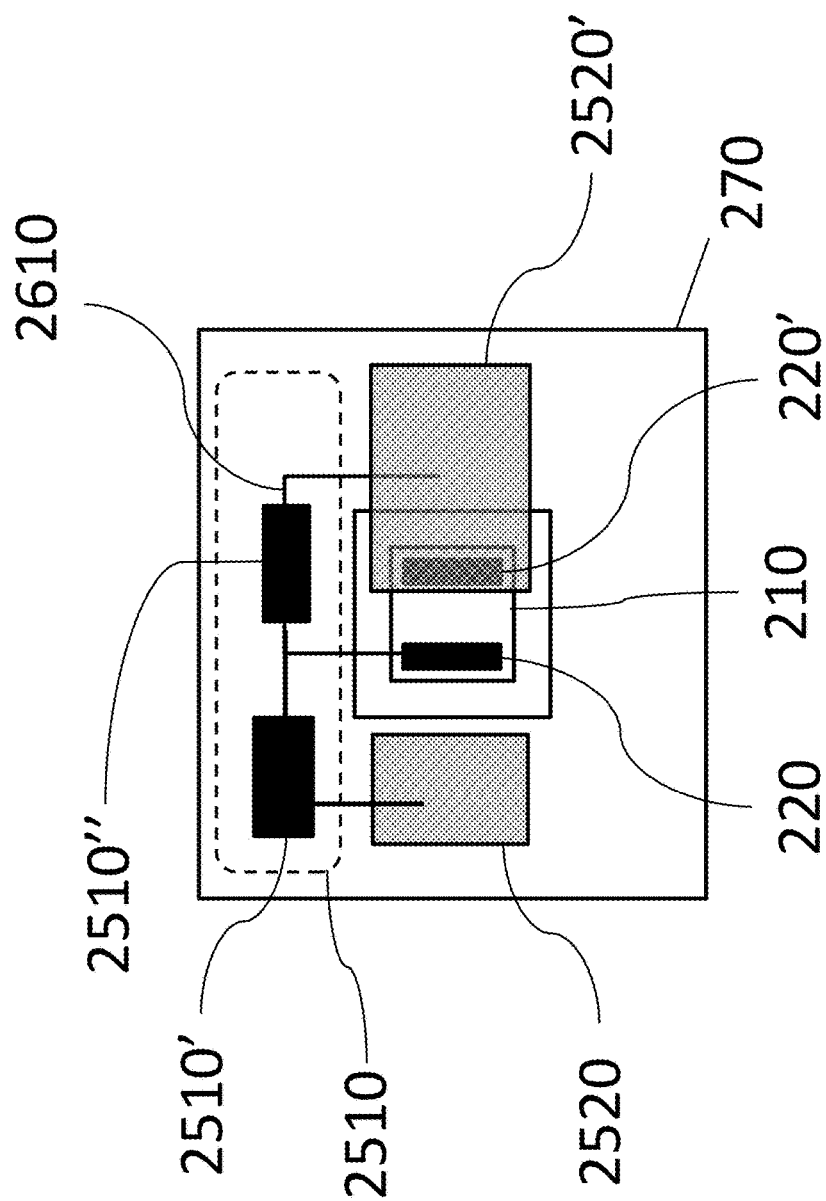
FIGS. 26A and 26B are bottom views of a frame die incorporating an additional electronic component in accordance with various embodiments of the invention.

FIG. 26A shows a schematic bottom view of an exemplary frame die including a component 2510 that includes or consists essentially of two elements 2510' and 2510" electrically coupled by conductive elements 2610. Component 2510 is electrically coupled to conductors 2520 and 2520', which act as bond pads for the frame die. Contact 220' of LEE 210 is electrically coupled to component 2510", while the connector between components 2510' and 2510" is also electrically coupled to contact 220. In various embodiments, component 2510' may be configured to monitor signals to frame die 210 to permit individual addressing of different frame dies 210. For example, if a particular frame die is desired to be energized, component 2510" may represent a switch that is opened to force or allow current to flow through LEE 210. If a particular frame die is desired to be off (i.e., not energized), component 2510" may represent a switch which is closed. Switch 2510" may have a relatively low resistance, for example significantly lower than that of LEE 210 and thus shunt current around LEE 210, resulting in LEE 210 not becoming energized. While component 2510 includes or consists essentially of two elements in FIG. 26, this is not a limitation of the present invention, and in other embodiments component 2510 may include or consist essentially of fewer or more elements. Conductive elements, for example conductive elements 2610, may include one or more conductive films, wire bonds, adhesives, conductive adhesives, ACA, or the like. In various embodiments, component 2510 may be manufactured and electrically coupled to LEE 210 using well-known semiconductor fabrication techniques and/or hybrid packaging techniques.

Figure 26B:
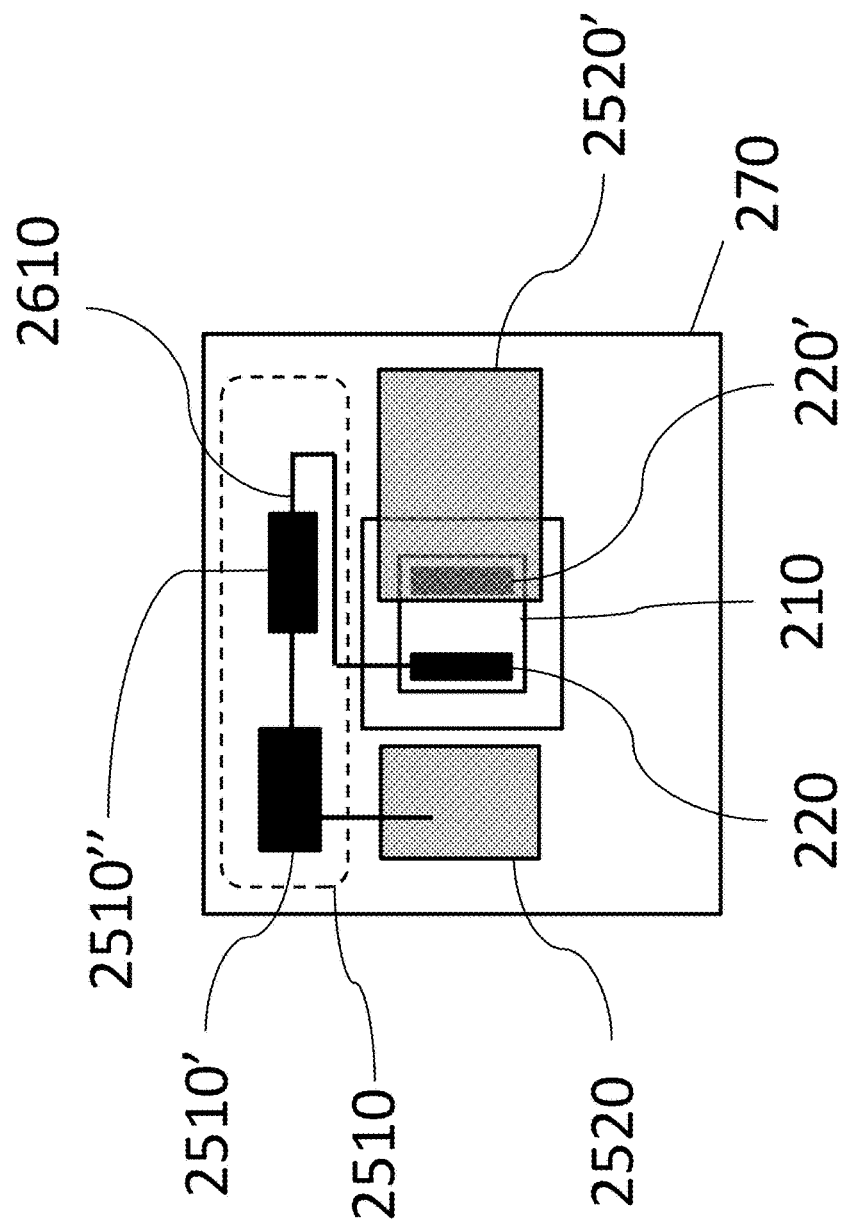

FIG. 26B shows another example of a frame die incorporating circuit elements. In various embodiments, component 2510' may be configured to monitor the signal to frame die 210 to permit modification of the current to LEE 210. For example, a signal, e.g., a high-frequency signal modulated onto the power signal to LEE 210, may be demodulated by component 2510' to determine the desired current for LEE 210, and component 2510" may include or consist essentially of a current control circuit, which provides the desired current to LEE 210. In various embodiments, either one or both of components 2510' and 2510" may include or consist essentially of multiple components, for example one or more integrated circuit or multiple discrete components.

Figure 27:
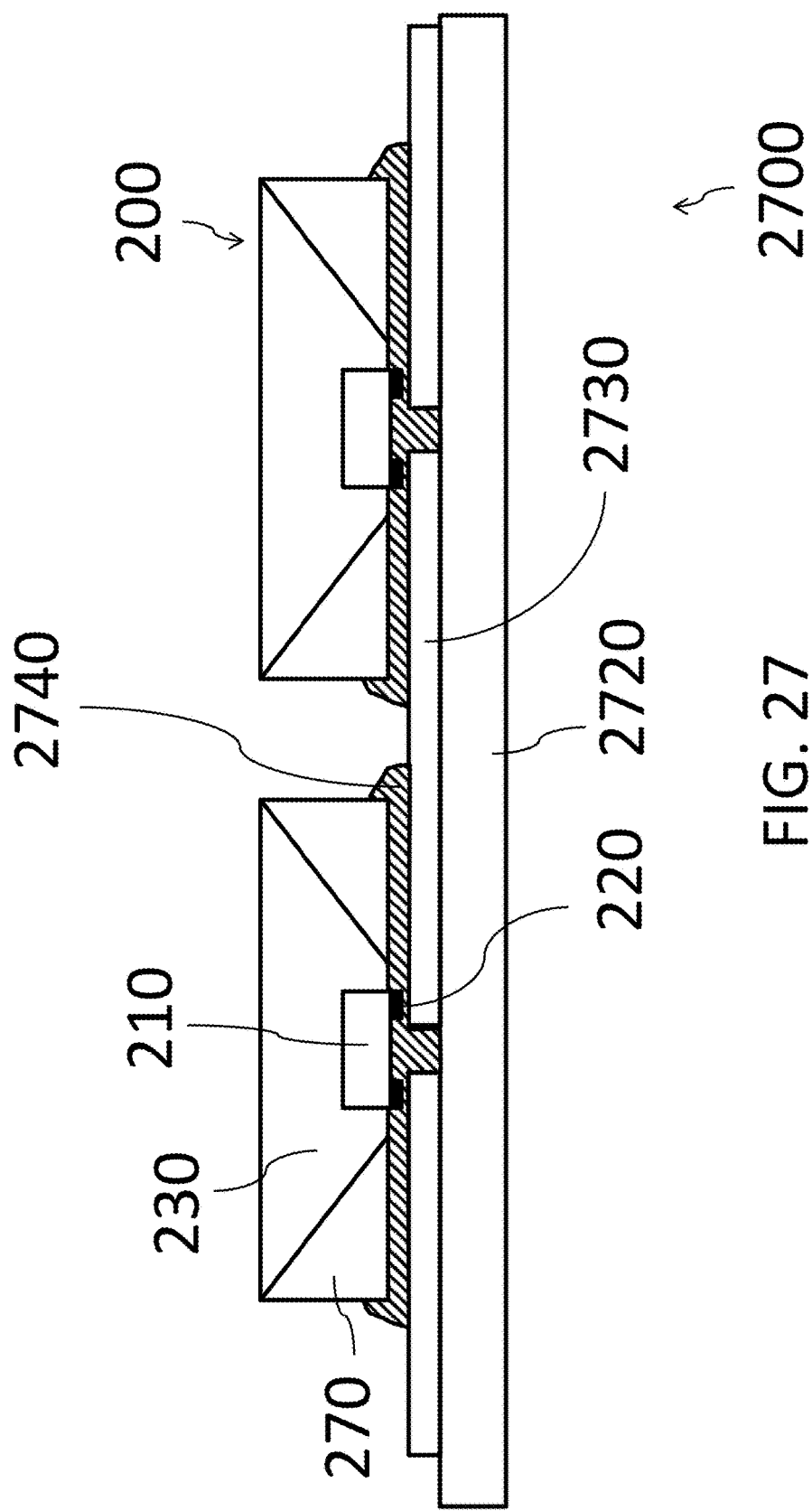
FIG. 27 is a cross-sectional view of a lighting device featuring multiple frame dies in accordance with various embodiments of the invention.

FIG. 27 shows one embodiment of a lighting system or portion of a lighting system 2700 featuring multiple frame dies 200. Lighting system 2700 includes an LEE substrate 2720 over which conductive traces 2730 have been formed. Frame dies 200 are then formed or placed over conductive traces 2730 such that contacts 220 on LEEs 210 are electrically coupled with conductive traces 2730. In the example shown in FIG. 27, frame dies 200 are electrically coupled to conductive traces 2730 using a connection material 2740, which may include or consist essentially of a conductive adhesive, an anisotropic conductive adhesive (as disclosed in U.S. patent application Ser. No. 13/171,973, filed Jun. 29, 2011, the entire disclosure of which is incorporated by reference herein), a combination of conductive and non-conductive adhesives, conductive epoxy, solder, or the like. In various embodiments, the connection material 2740 is reflective to a wavelength of light emitted by either or both of LEE 210 and phosphor 230. However, the method of electrical coupling and attachment of LEEs 210 or frame dies 200 to conductive traces 2730 is not a limitation of the present invention, and in other embodiments other methods of electrical coupling and attachment may be used, for example wire bonding.

In various embodiments the LEE substrate 2720 may include or consist essentially of a semicrystalline or amorphous material, e.g., polyethylene naphthalate (PEN), polyethylene terephthalate (PET), acrylic, polycarbonate, polyethersulfone, polyester, polyimide, polyethylene, and/or paper. LEE substrate 2720 may also include or consist essentially of a rigid or flexible circuit board, for example FR4, metal core printed circuit board (MCPCB), polyimide or the like. LEE substrate 2720 may be substantially flexible, substantially rigid or substantially yielding. In some embodiments, the substrate is "flexible" in the sense of being pliant in response to a force and resilient, i.e., tending to elastically resume an original configuration upon removal of the force. A substrate may be "deformable" in the sense of conformally yielding to a force, but the deformation may or may not be permanent; that is, the substrate may not be resilient. Flexible materials used herein may or may not be deformable (i.e., they may elastically respond by, for example, bending without undergoing structural distortion), and deformable substrates may or may not be flexible (i.e., they may undergo permanent structural distortion in response to a force). The term "yielding" is herein used to connote a material that is flexible or deformable or both.

In various embodiments, LEE substrate 2720 may include multiple layers, e.g., a deformable layer over a rigid layer, for example, a semicrystalline or amorphous material, e.g., PEN, PET, polycarbonate, polyethersulfone, polyester, polyimide, polyethylene, paint, plastic film, and/or paper formed over a rigid or substantially rigid substrate, for example including ceramic such as AlN, fiberglass such as FR-4, metal core printed circuit board, acrylic, aluminum, steel, and the like. In some embodiments, LEE substrate 2720 is rigid or substantially rigid, for example including ceramic such as AlN, fiberglass such as FR-4, metal core printed circuit board, acrylic, aluminum, steel, and the like.

Depending upon the desired application for which embodiments of the invention are utilized, LEE substrate 2720 may be substantially optically transparent, translucent, or opaque. For example, LEE substrate 2720 may exhibit a transmittance or a reflectivity greater than about 80% for optical wavelengths ranging between approximately 400 nm and approximately 700 nm. In some embodiments, LEE substrate 2720 exhibits a transmittance or a reflectivity of greater than about 80% for one or more wavelengths emitted by LEEs 210 and/or frame dies 200. LEE substrate 2720 may also be substantially insulating, and may have an electrical resistivity greater than approximately 100 ohm-cm, greater than approximately $1 \times 10^6$ ohm-cm, or even greater than approximately $1 \times 10^{10}$ ohm-cm.

Conductive traces 2730 may include or consist essentially of any conductive material, for example metals such as gold, silver, aluminum, copper, carbon, and the like, conductive oxides, etc. Conductive traces 2730 may be formed on LEE substrate 2720 by a variety of techniques, for example evaporation, sputtering, physical deposition, chemical vapor deposition, plating, electroplating, printing, lamination, gluing using an adhesive, lamination and patterning, or the like. In one embodiment, conductive traces 2730 are formed using printing, for example screen printing, stencil printing, flexo, gravure, ink jet, or the like. Conductive traces 2730 may include or consist essentially of silver, aluminum, copper, gold, carbon inks, or other conductive inks, or the like. Conductive traces 2730 may include or consist essentially of a transparent conductor, for example, a transparent conductive oxide such as indium tin oxide (ITO). Conductive traces 2730 may include or consist essentially of a plurality of materials. Conductive traces 2730 may optionally feature stud bumps to aid in electrical coupling of conductive trace 2730 to contacts 220. Conductive traces 2730 may have a thickness in the range of about 0.05 μm to about 100 μm; however, this is not a limitation of the present invention, and in other embodiments conductive traces 2730 may have any thickness. While the thickness of one or more of the conductive traces 2730 may vary, the thickness is generally substantially uniform along the length of the conductive trace 2730 to simplify processing. However, this is not a limitation of the present invention and in other embodiments the conductive trace thickness or material varies.

While the discussion above has mainly focused on frame-based light-emitting devices that include a phosphor, this approach may be used to economically make light-emitting devices without the phosphor, where the material surrounding the LEE is a transparent material that does not include a light-conversion material, for example replacing phosphor 230 in FIG. 1A with a transparent material, for example a binder or encapsulant. In various embodiments, the transparent material may include or consist essentially of epoxy and/or silicone. In various embodiments of the present invention, other materials may be present in the binder, for example material to scatter the light. Any or all of the variations discussed with respect to frame dies including light-conversion material may be used or applied to produce frame dies that do not include a light-conversion material. In some embodiments, LEE 210 may include or consist essentially of an LED. In some embodiments, LEE 210 may emit light in any visible color range, for example, red, orange, yellow, green, amber, blue, etc., or in wavelength ranges outside of the visible range, e.g., infrared and ultraviolet.

Figure 28A:
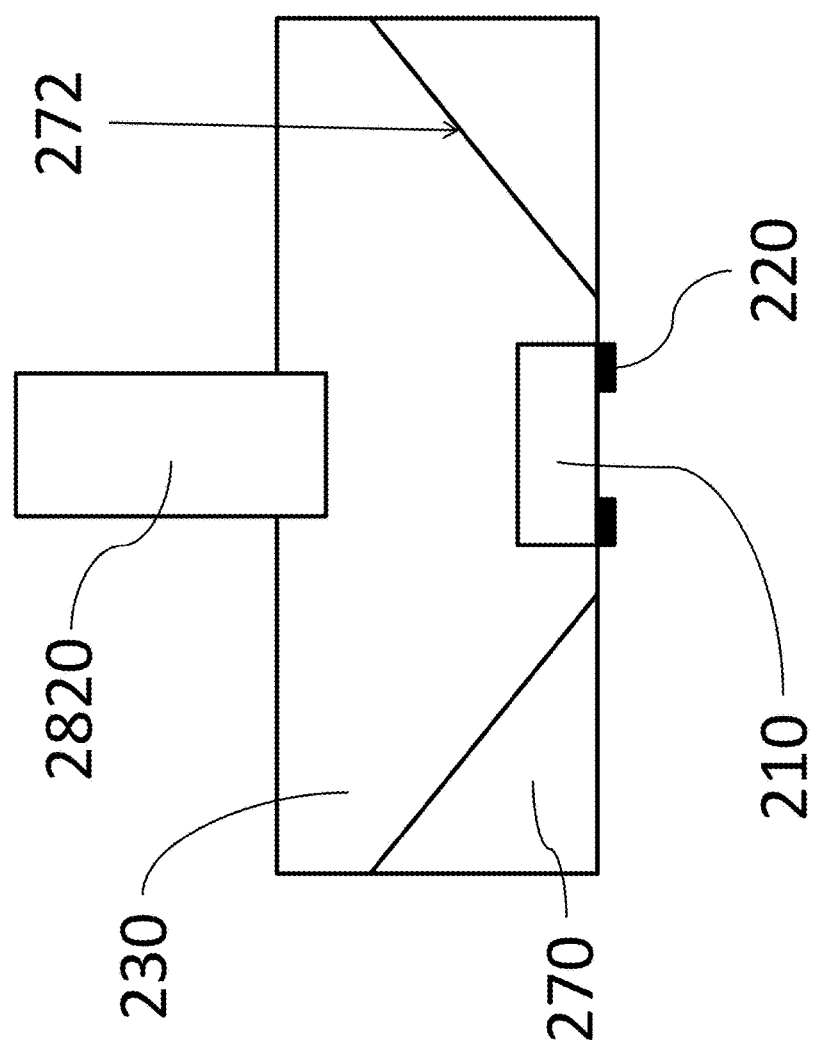
FIG. 28A is a cross-sectional view of a frame die with a co-molded optical fiber in accordance with various embodiments of the invention.

FIG. 28A shows an example of a frame die with a co-molded optical fiber 2820. Optical fiber 2820 may be used for, e.g., out-coupling of light or monitoring of LEE 210 or frame die optical characteristics. Such optical fiber coupling may be used with frame dies incorporating light-conversion materials or with transparent encapsulant materials. In various embodiments of the present invention, the optical fiber 2820 may be attached to the surface of frame die 200, for example using an optically clear adhesive or glue, or with a polymeric material, for example similar to the binder in phosphor 230. In various embodiments of the present invention, a plurality of optical fibers may be inserted into uncured or partially cured phosphor 230, and upon curing of phosphor 230, become physically and optically coupled to frame die 200.

Figure 28B:
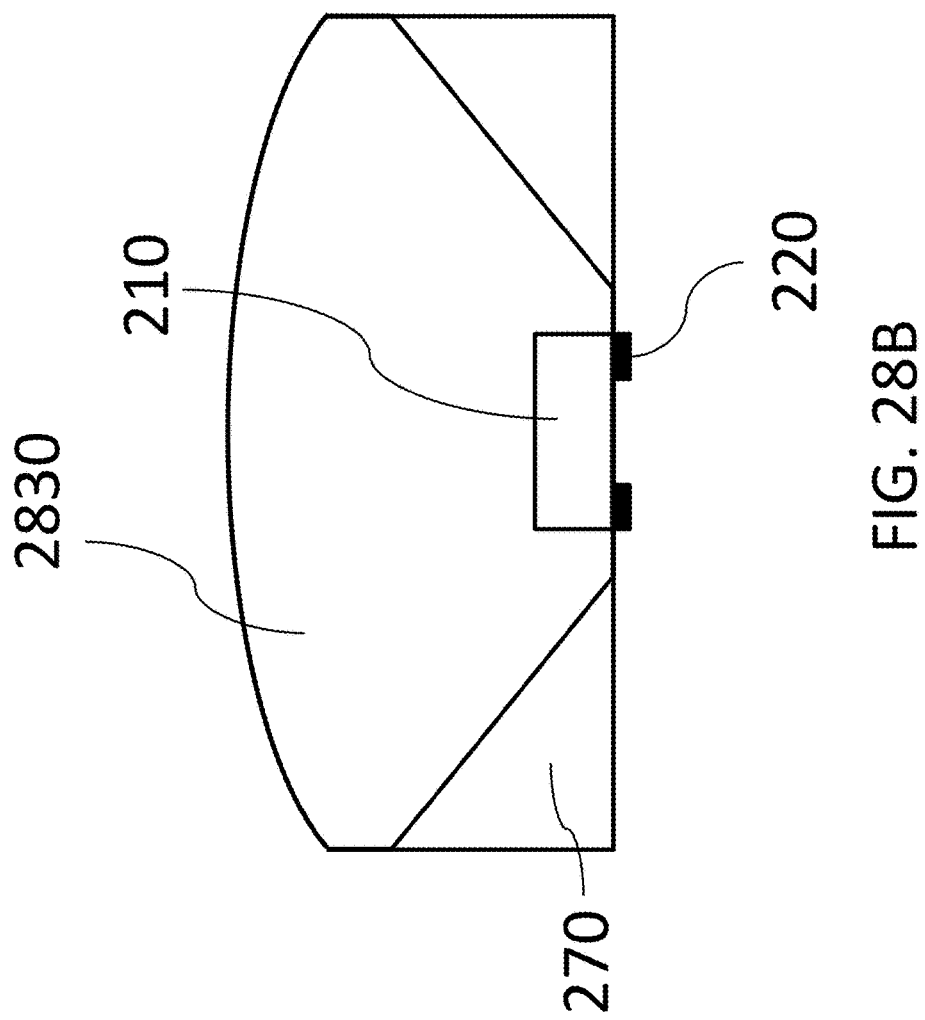
FIG. 28B is a cross-sectional view of a frame die incorporating an optic in accordance with various embodiments of the invention.

In various embodiments, a clear binder material may be shaped to form an optic over LEE 210. FIG. 28B shows one example of such a structure, in which transparent material 2830 is shaped to form a dome-shaped optic. In various embodiments, material 2830 may have different shapes, for example to act as a refractive optic, a total internal reflection (TIR) optic, a Fresnel optic, or the like.

Figure 28C:
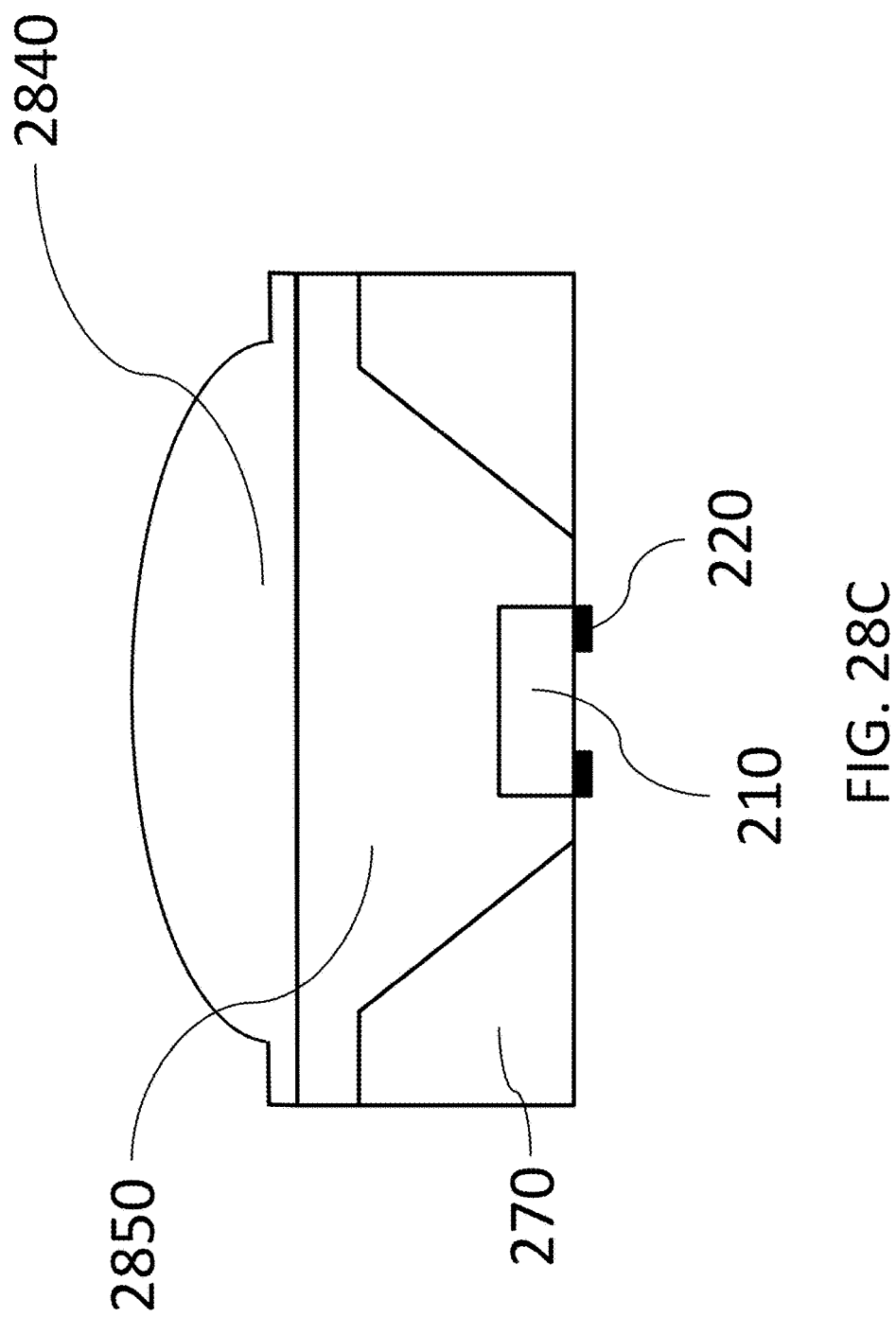
FIG. 28C is a cross-sectional view of a frame die incorporating an optical element in accordance with various embodiments of the invention.

In various embodiments, an optical element may be incorporated in a frame die with or without a light-conversion material, for example as part of the manufacturing process (for example as discussed with reference to FIG. 7R) to produce a structure as shown in FIG. 28C. The frame die in FIG. 28C includes an optical element 2840 disposed over a phosphor 2850. In various embodiments, phosphor 2850 may or may not include one or more light-conversion materials. In various embodiments, the optical element may be aligned with LEE 210 or may be offset, for example to provide a specific asymmetric light distribution, as described in U.S. patent application Ser. No. 13/693,632, filed on Dec. 4, 2012 (the '632 application), the entire disclosure of which is incorporated herein by reference.

Figure 28D:
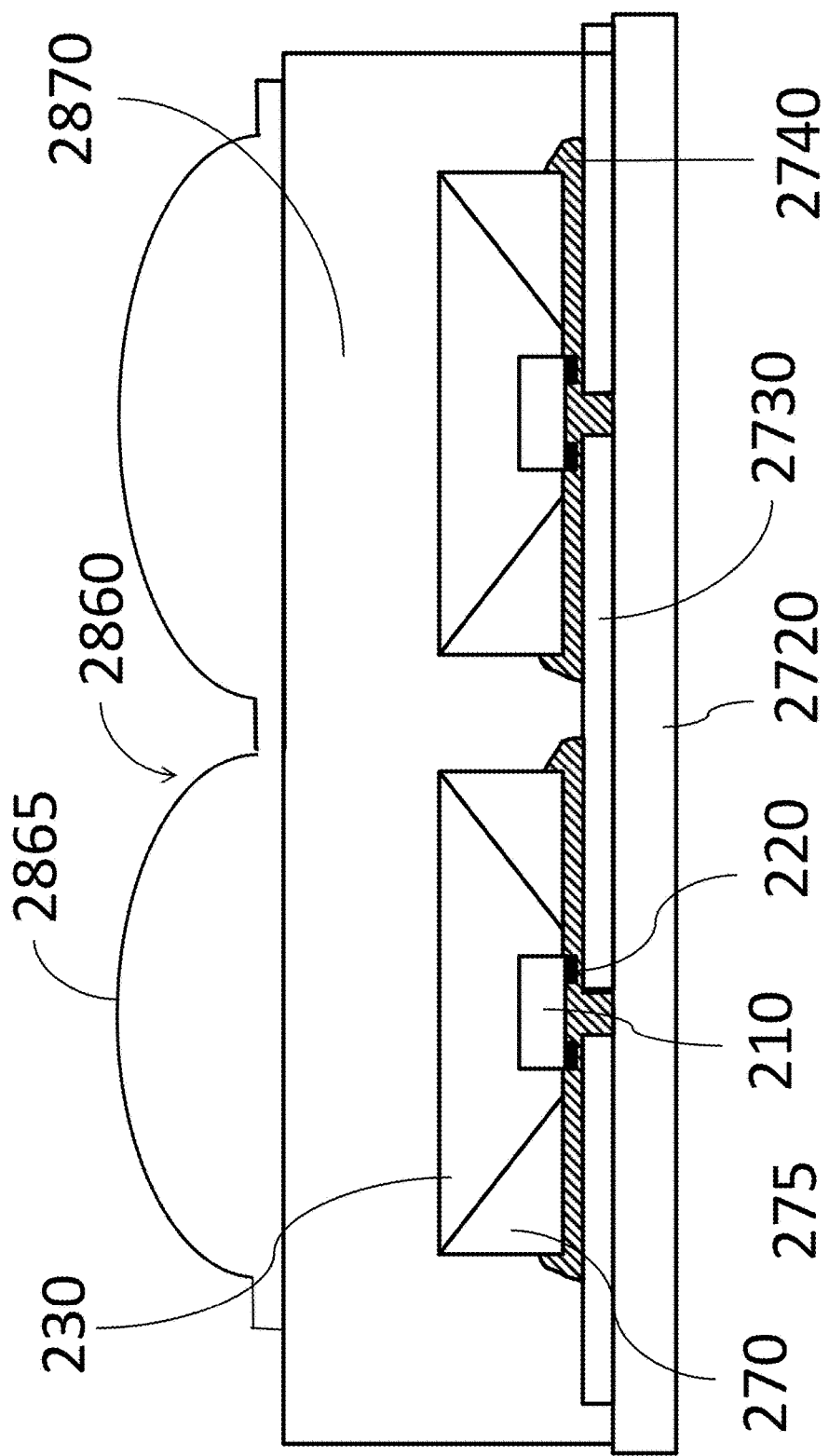
FIG. 28D is a cross-sectional view of an optic integrated with multiple frame dies in accordance with various embodiments of the invention.

In various embodiments an optic may be incorporated after manufacture of the frame dies (with or without a light-conversion material), for example to produce a structure similar to that shown in FIG. 28D. The structure of FIG. 28D is similar to that of the structure of FIG. 27, with the addition of an optic 2860. As shown in FIG. 28D, optic 2860 includes or consists essentially of one or more optical elements 2865, which in FIG. 28D are each aligned or substantially aligned with a frame die 200.

Optic 2680 typically features an array of optical elements 2685; in some embodiments, one optical element 2685 is associated with each frame die 200, while in other embodiments multiple frame dies 200 are associated with one optical element 2685, or multiple optical elements 2685 are associated with a single frame die 200, or no engineered optical element is associated with any frame die 200, for example optic 2680 may be a plate with a flat or roughened surface. In various embodiments, optic 2680 includes elements or features to scatter, diffuse and/or spread out light generated by frame dies 200. In various embodiments, optical element 2865 may be aligned with LEE 210 or may be offset, for example to provide a specific asymmetric light distribution, as described in the '632 application.

In various embodiments, optic 2860 may be substantially optically transparent or translucent. For example, optic 2860 may exhibit a transmittance greater than 80% for optical wavelengths ranging between approximately 400 nm and approximately 600 nm. In various embodiments, optic 2860 includes or consists essentially of a material that is transparent to a wavelength of light emitted by frame dies 200. In various embodiments optic 2860 may be substantially flexible or rigid. In various embodiments, optic 2860 is composed of multiple materials and/or layers. In various embodiments, optical elements 2865 may be formed in or on optic 2860. Optic 2860 may include or consist essentially of, for example, acrylic, polycarbonate, polyethylene naphthalate (PEN), polyethylene terephthalate (PET), polycarbonate, polyethersulfone, polyester, polyimide, polyethylene, silicone, glass, or the like. Optical elements 2865 may be formed by etching, polishing, grinding, machining, molding, embossing, extruding, casting, or the like. The method of formation of optical elements 2865 is not a limitation of embodiments of the present invention.

Optical elements 2865 associated with optic 2860 may all be the same or may be different from each other. Optical elements 2865 may include or consist essentially of, e.g., a refractive optic, a diffractive optic, a total internal reflection (TIR) optic, a Fresnel optic, or the like, or combinations of different types of optical elements. Optical elements 2865 may be shaped or engineered to achieve a specific light distribution pattern from the array of light emitters, phosphors and optical elements.

A space 2870 between the back side of optic 2860 and frame die 200 may be a partial vacuum or be filled with air, filled with a fluid or other gas, or filled or partially filled with one or more other materials (e.g., solid materials). In various embodiments, space 2870 may be filled or partially filled with a transparent material, similar or identical to the material that is used as the binder for phosphor 230 and/or optical element 2865, to reduce TIR losses in frame dies 200 and to provide enhanced optical coupling between frame dies 200 and optics 2865. In some embodiments, space 2870 may be filled with a material providing an index of refraction match between frame die 200 and optic 2860.

Figure 28F:
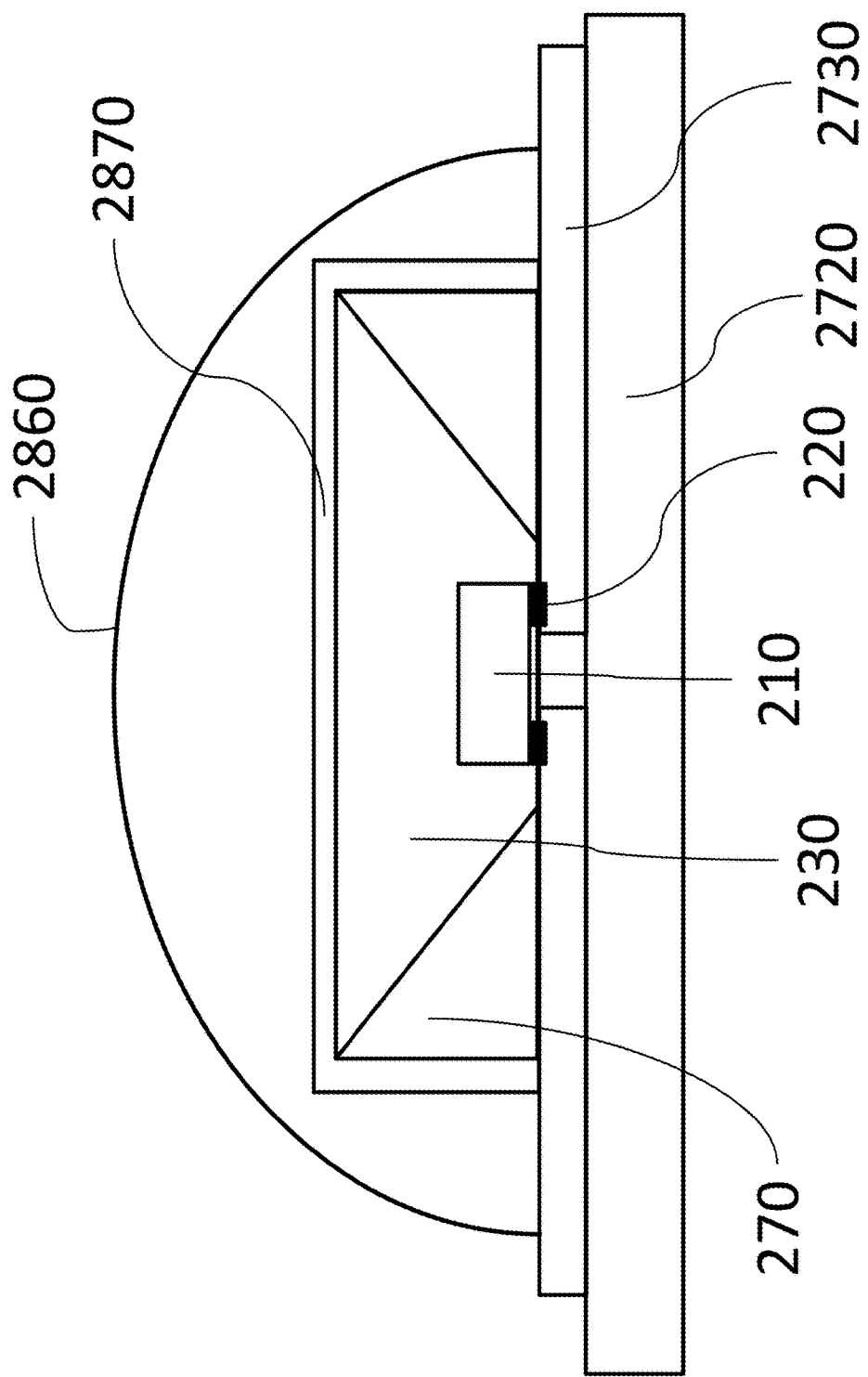
FIG. 28F is a cross-sectional view of a lighting device featuring a frame die at least partially inserted into a depression in an optic in accordance with various embodiments of the invention.

In various embodiments, the optic 2860 may define one or more depressions 2880 therein, as shown in FIG. 28E, to accommodate or partially accommodate frame dies 200. Frame dies 200 may be formed or inserted into depressions 2880, for example in a batch process or using a pick-and-place tool. Frame dies 200 may be held in depressions 2860 mechanically, or with an adhesive or glue. In various embodiments, frame dies 200 may be held in place by a transparent material similar or identical to the binder or matrix used in phosphor 230. In various embodiments, depression 2880 may be larger than frame die 200. In various embodiments, depression 2880 is sized to just accommodate frame die 200 such that frame die 200 fits snugly within the depression 2880. FIG. 28F shows an example of an embodiment of the present invention incorporating an optic 2860 having depression 2880 with a frame die therein. In various embodiments, optic 2860 may be incorporated before or after the frame die is electrically coupled to conductive traces 2730. As discussed with respect to FIG. 28D, space 2870 may be a partial vacuum or be filled with air, filled with a fluid or other gas, or filled or partially filled with one or more other materials.

Figure 29A:
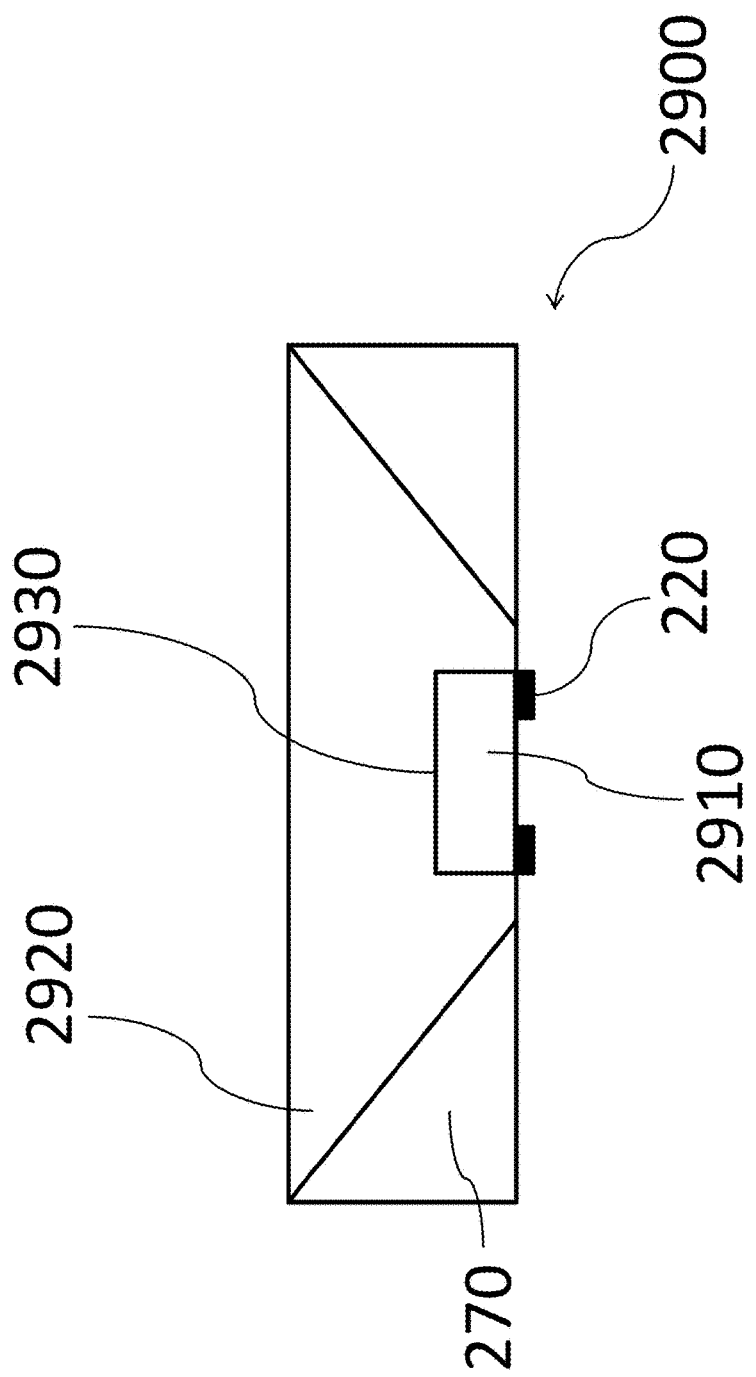
FIGS. 29A and 29B are cross-sectional views of frame dies incorporating light-absorbing elements in accordance with various embodiments of the invention.

While the discussion above has mainly focused on light-emitting devices, embodiments of the present invention may also be used for devices that absorb light, for example detectors or photovoltaic devices, as described in the '864 application and the '543 application. FIG. 29A shows an exemplary device (or "frame die") 2900 that includes a light-absorbing element (LAE) 2910 and binder 2920 with a frame 270. In one embodiment, LAE 2910 is configured with a flip-chip geometry, in which contacts 220 are positioned on a face opposite a detecting face 2930. In various embodiments, the substrate (e.g., the semiconductor substrate) for LAE 2910 is partially or completely removed. LAE 2910 may be configured to detect one or more wavelengths over a wide range of wavelength ranges, both within and/or outside the visible light spectrum. In various embodiments, LAE 2910 may be configured to detect UV light, IR light, x-rays, visible light, or any portion of the electromagnetic spectrum for which a detector is available. In some embodiments, LAE 2910 may include GaAs, InAs, AlAs, GaN, InN, AlN, GaP, InP, AlP, InGaP, InAlP, InGaAlP, ZnO, II-VI materials or the like, or various combinations of two or more of these materials. The material from which LAE 2910 is composed is not a limitation of the present invention.

In some embodiments LAE 2910 may be a Schottky detector, a p-n junction detector, a photoelectric detector, a photocell, a photoresistor, a photodiode, a phototransistor, a charge-coupled device, a CMOS imager, or the like. The type of LAE 2910 and method by which LAE 2910 operates are not limitations of the present invention.

In various embodiments, binder 2920 is transparent to a wavelength of light to be detected by LAE 2910. In one embodiment, binder 2920 may be partially absorbing and the absorption band of binder 2920 may be used to select one or more wavelength ranges to be detected by LAE 2910 from the range of incident wavelength ranges. For example, binder 2920 may effectively act as a low-pass filter, a high-pass filter, a bandpass filter, or various combinations of these.

In some embodiments, binder 2920 may further include other materials to enhance one or more aspects of the performance of device 2900. For example, in one embodiment, binder 2920 may include materials to absorb one or more wavelengths of light, to act as a filter. In one embodiment binder 2920 includes a wavelength-conversion material, similar to binders and wavelength-conversion materials described above. In one embodiment, this may be used to shift an incident wavelength to a different wavelength to be detected by LAE 2910. For example a wavelength-conversion material may be added to binder 2920 to shift one or more wavelengths of incident light (e.g., blue light) to one or more different wavelengths (e.g., yellow light) that impinge on LAE 2910. In this way, one or a small number of LAEs 2910 may be used in combination with a number of wavelength-conversion materials to produce a family of detectors spanning a wide wavelength range, without the need to have a relatively large number of different LAEs 2910.

Figure 29B:
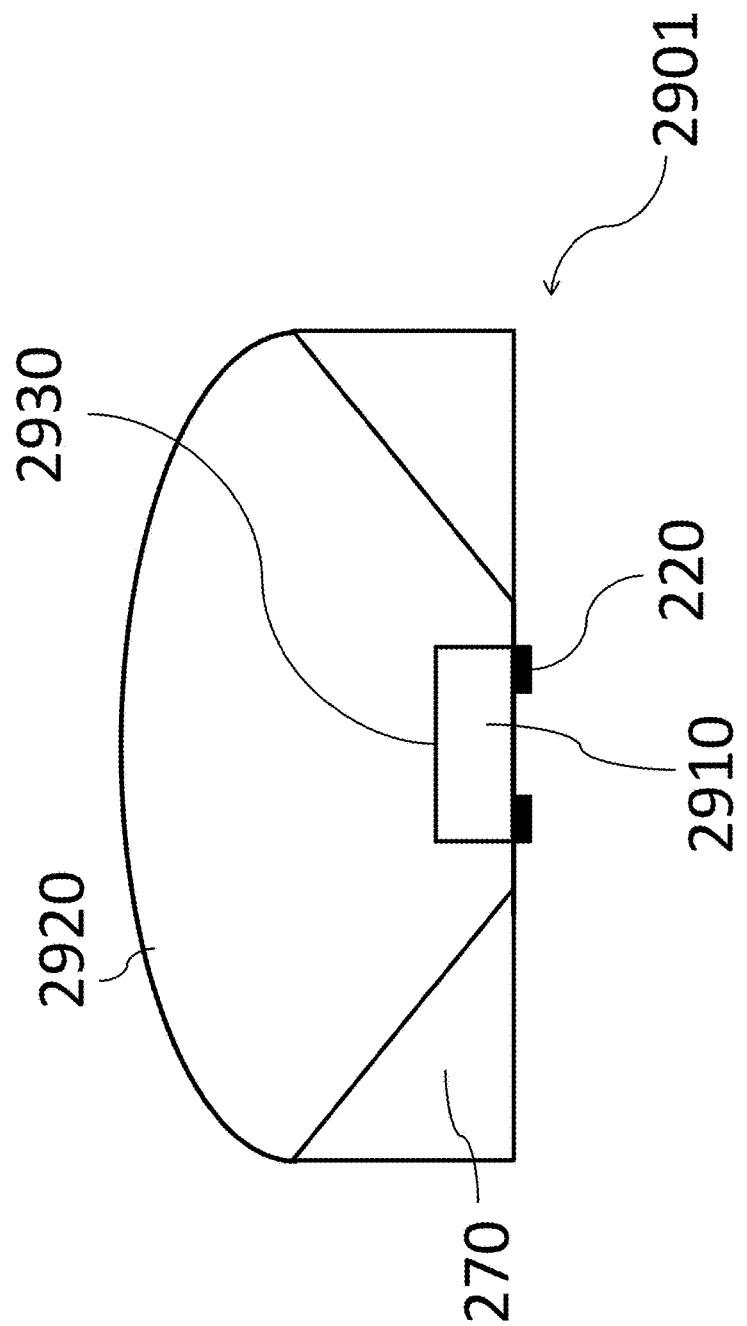

As discussed herein with respect to frame dies incorporating LEEs, binder 2920 may be shaped. In some embodiments, binder 2920 is shaped to increase the collection of light by LAE 2910. FIG. 29B shows an exemplary device 2901 having shaped binder 2920 that has a dome-like shape. In various embodiments, shaped binder 2920 is combined with one or more additives, for example a wavelength-conversion material.

Figure 29C:
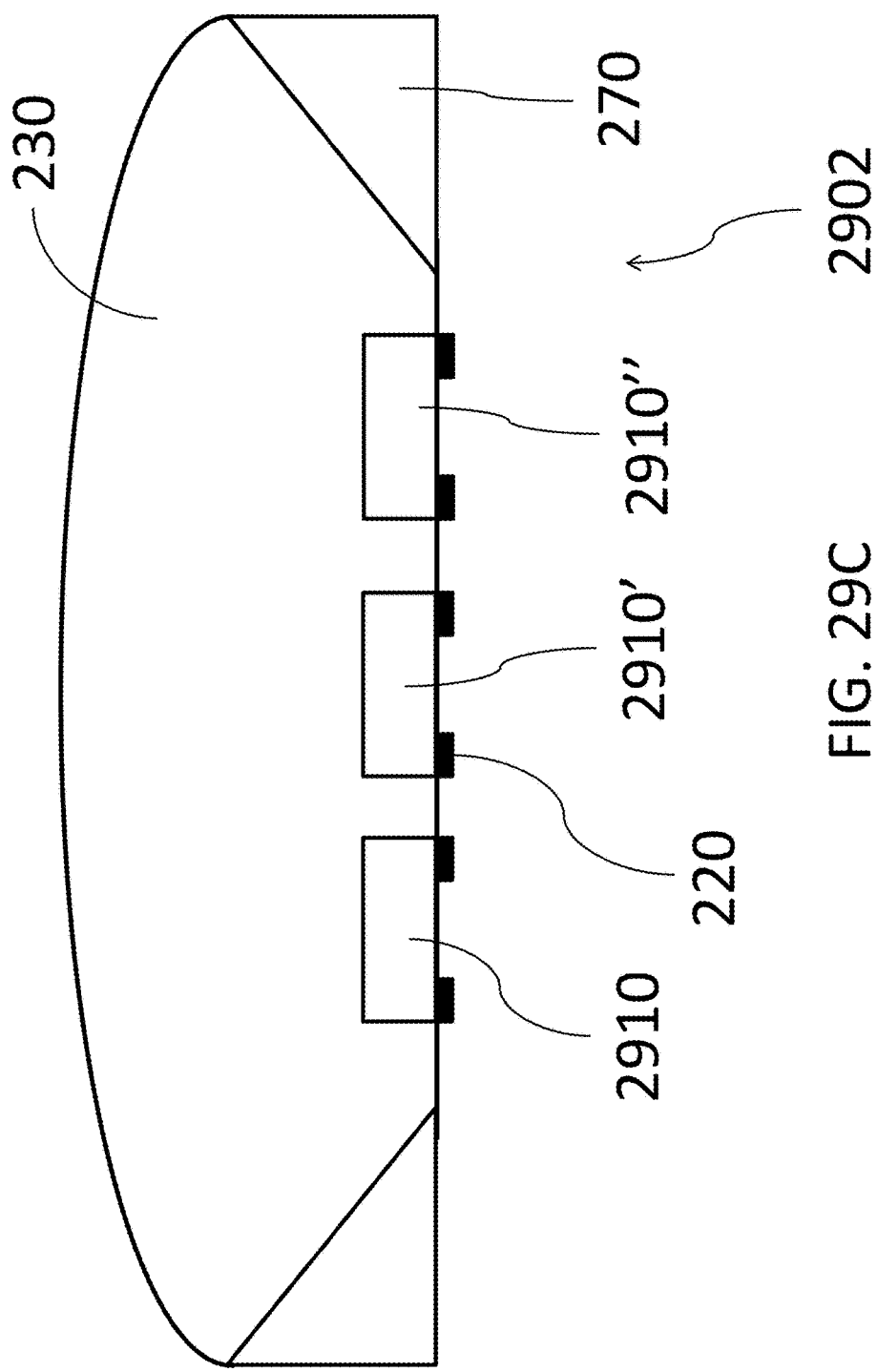
FIG. 29C is a cross-sectional view of a frame die incorporating multiple light-absorbing elements in accordance with various embodiments of the invention.

In some embodiments, a device may include more than one LAE 2910. In various embodiments, a device 2902 includes three LAEs 2910, identified as LAEs 2910, 2910', and 2910" in FIG. 29C. In various embodiments, LAE 2910 detects red wavelengths, LAE 2910' detects green wavelengths, and LAE 2910" detects blue wavelengths, and the combination may be used as a color sensor by evaluating the relative output signals from the three different LAEs.

In some embodiments, LAE 2910 is a photovoltaic device or solar cell, and is designed to produce power from incident radiation (typically, but not necessarily, in the visible range). Such a photovoltaic device may be made of a wide variety of materials. In some embodiments, LAE 2910 may include GaAs, InAs, AlAs, GaN, InN, AlN, GaP, InP, AlP, InGaP, InAlP, InGaAlP, ZnO, II-VI materials or the like or various combinations of two or more of these materials. The material from which LAE 2910 is made is not a limitation of the present invention. In some embodiments, LAE 2910 is a single-junction solar cell, while in other embodiments LAE 2910 is a multi-junction solar cell. As discussed herein with respect to light-emitting elements and detectors, photovoltaic devices produced using embodiments of the present invention may include in various embodiments a transparent binder, additives to the binder, wavelength-conversion materials, shaped binder, optics, multiple LAEs 2910 per device, and the like.

In some embodiments, a photovoltaic device made in accordance with embodiments of the invention may additionally include one or more optics to increase collection or to act as concentrators, similar to that described herein with respect to light-emitting devices. In various embodiments, the optical function for collection or concentration is carried out using a shaped binder 2920.

In some embodiments, binder 2920 may further include other materials to enhance one or more aspects of the performance of devices 2900-2092. For example, in one embodiment, binder 2920 may include materials to absorb one or more wavelengths of light, to act as a filter. In one embodiment, binder 2920 includes a wavelength-conversion material, similar to that described above with respect to devices incorporating light-emitting elements. In one embodiment, this may be used to shift an incident wavelength to a different wavelength to be absorbed by LAE 2910. For example, a phosphor may be added to binder 2920 to shift one or more wavelengths of incident light to one or more different wavelengths of light that impinge on LAE 2910. In this way a larger portion of the solar spectrum may be usefully absorbed by LAE 2910. In some embodiments, this may permit the use of a lower cost LAE 2910, for example one with fewer junctions. In one embodiment, more than one different LAE 2910, each absorbing light in a different wavelength range, may be incorporated into one packaged device.

Embodiments of the present invention may be applied to devices that neither emit nor detect light, identified as electronic-only devices, where the purpose of application of this invention is, in some embodiments, reduction in cost. In various embodiments, a relatively large number of electronic devices, specifically chips or discrete devices or integrated circuits may be packaged in a polymer-based material (like the binder detailed above) using a high-volume, low-cost, base process. In some embodiments of this approach, binder 2920 need not be transparent but may be translucent or opaque. As discussed herein with respect to light-emitting elements, detectors, and photovoltaic devices, electronic-only devices produced in accordance with embodiments of the present invention may include additives to the binder, shaped binder, multiple devices, and the like.

In various embodiments, an electronic-only device of the present invention is a packaged electronic-only device. In some embodiments, electronic-only devices may have a larger number of contacts than would a light emitter or a detector. For example, an electronic-only device may include more than ten contacts or more than 100 contacts or an even larger number of contacts.

In various embodiments of the present invention, additional elements may be incorporated, for example a heat spreader, heat pipe or a connector, or multiple dies may be stacked on top of each other, as described in the '864 application and the '543 application.

Figure 29D:
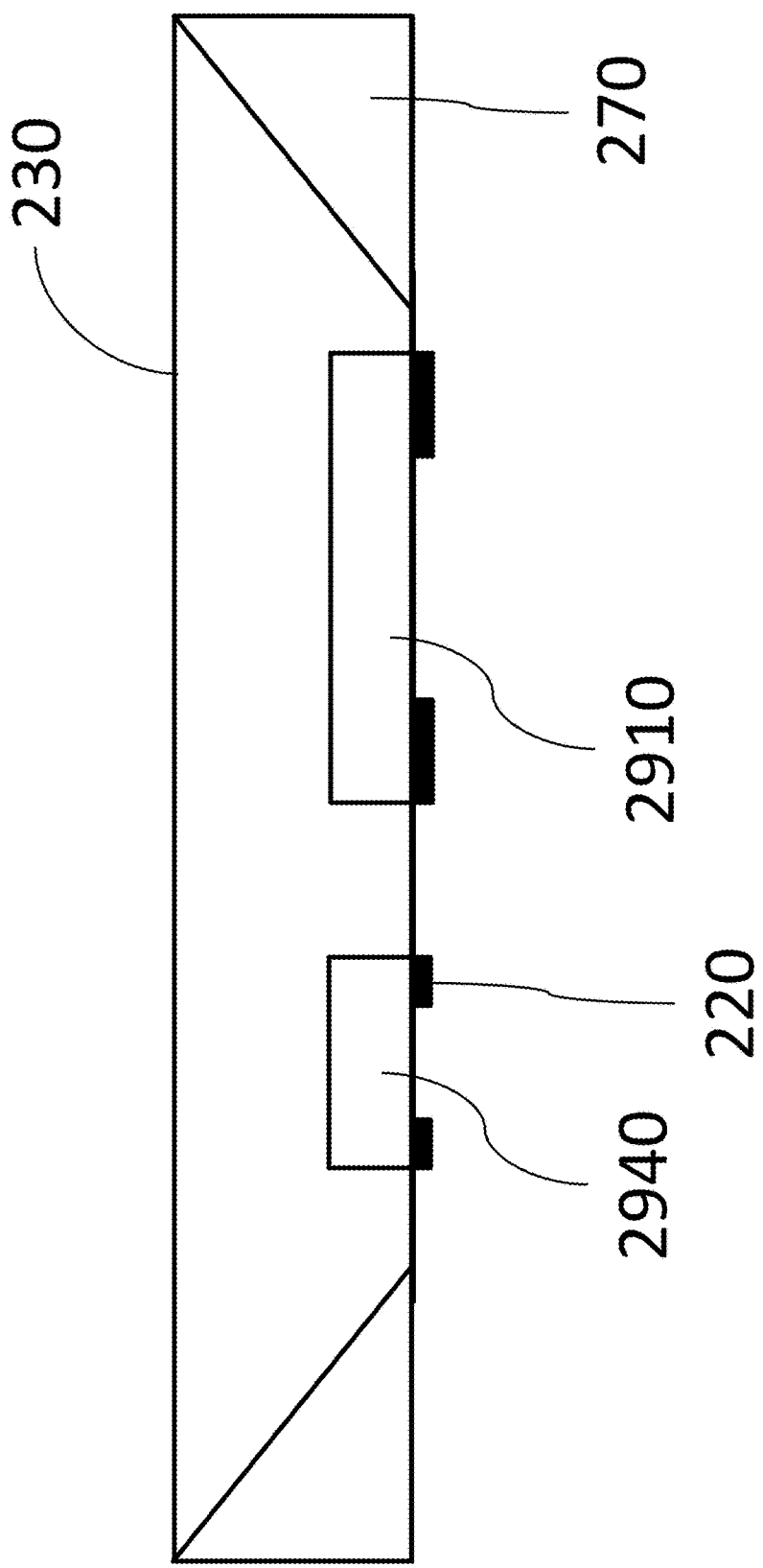
FIG. 29D is a cross-sectional view of a frame die incorporating an electronic die and a light-emitting or light-absorbing element in accordance with various embodiments of the invention.

In various embodiments, electronic-only and other (for example light-absorbing and/or light-emitting) devices may be packaged in the same binder, as shown in FIG. 29D. FIG. 29D shows electronic-only device 2940 adjacent to light-detection device 2910. This approach may be used to provide some additional capability, for example signal conditioning, communications, memory, or the like. In one embodiment, electronic-only device 2940 and light-detection device 2910 communicate through each of their respective contacts by way of connections on the circuit board to which they are ultimately mounted. In various embodiments, internal connections may be used, for example vias, wire-bonds, wireless communication links, or the like.

In various embodiments of the present invention, frame 270 and/or frame wafer 720 may include or consist essentially of a material transparent to a wavelength of light emitted by LEE 210 and/or phosphor 230, for example glass, quartz, sapphire, aluminum oxide, aluminum oxinitride (AlON), silicon carbide, other transparent oxides, or polymers, for example silicone or epoxy. In various embodiments of the present invention, frame 270 and/or frame wafer 720 may include or consist essentially of low-temperature glass, an example of such material is Hitachi chemical's low-melting vanadate glass series. In various embodiments of the present invention, glass frame 270 may be manufactured using one or more of the following techniques; wet chemical etching, dry etching, reactive ion etching, molding, casting, ablation, bonding, machining, rapid prototyping, three-dimensional printing, ultrasonic machining, abrasive machining, or the like.

Figure 30A:
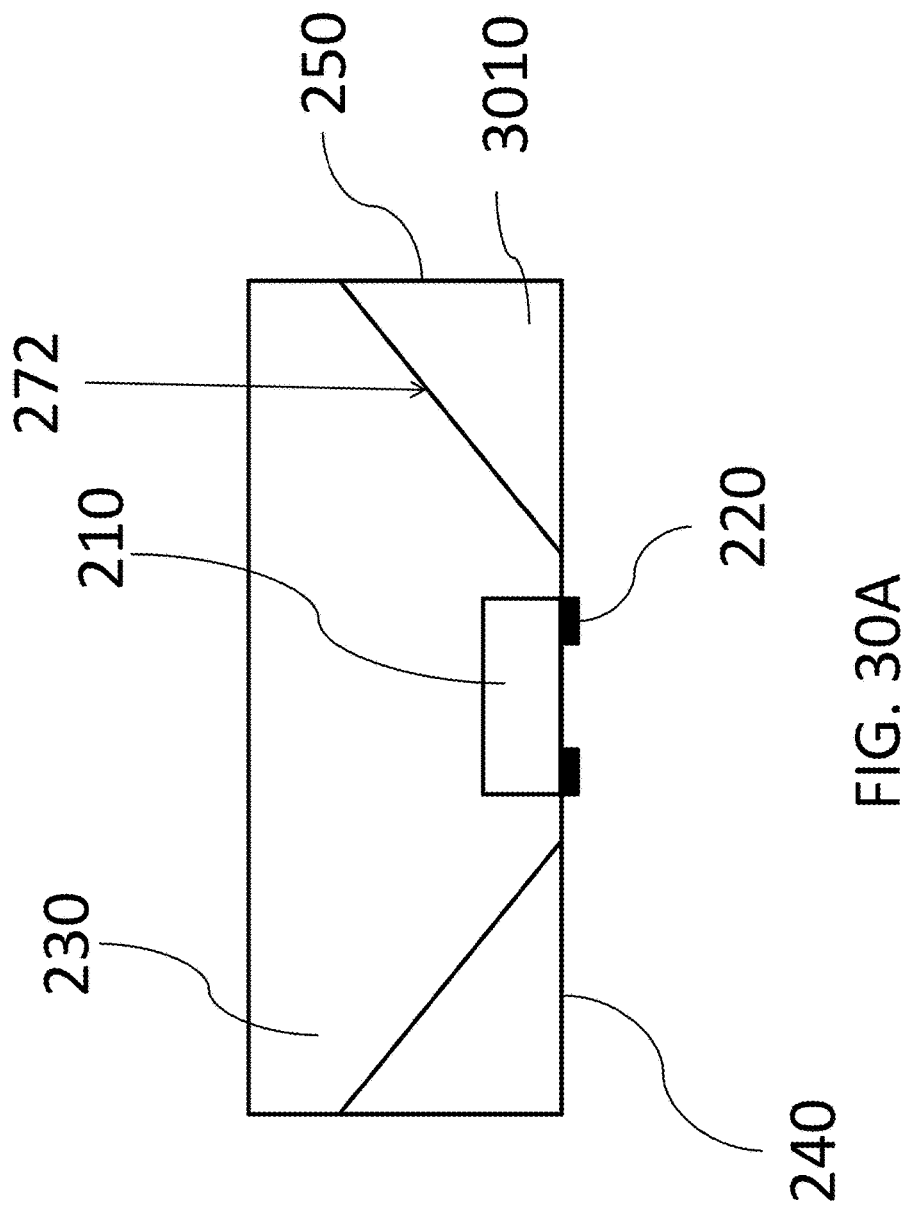
FIGS. 30A and 30B are cross-sectional views of frame dies incorporating glass and/or substantially transparent frames in accordance with various embodiments of the invention.
Figure 30B:
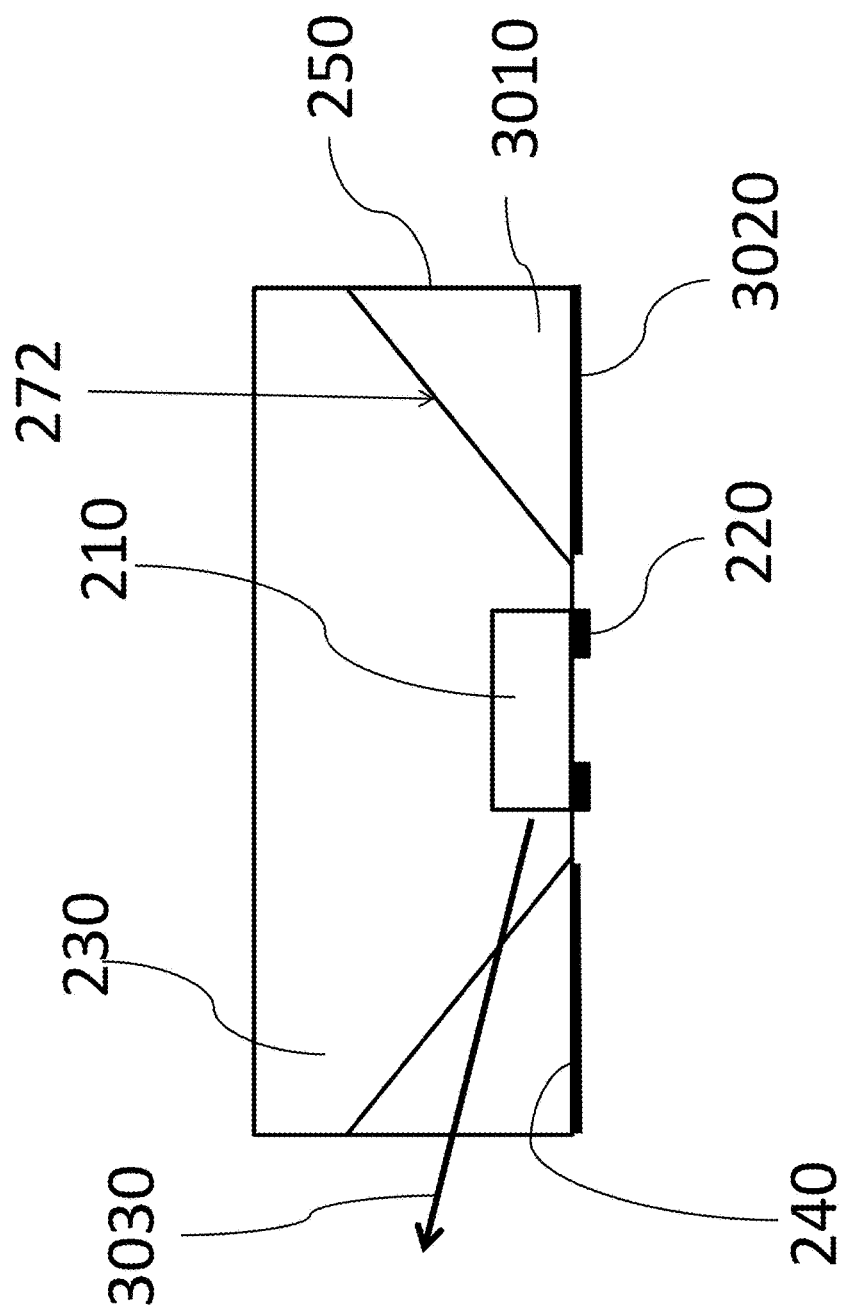

FIG. 30A shows an exemplary device of the present invention that features a glass frame 3010. In various embodiments, glass frame 3010 may be transparent to a wavelength of light emitted by LEE 210 and/or phosphor 230. In various embodiments, glass frame 3010 may have a transmittance to a wavelength of light emitted by LEE 210 and/or phosphor 230 greater than about 75%, greater than about 85%, greater than about 90%, or greater than about 95%. In various embodiments, all or portions of surfaces 240 and/or 250 may be reflective to a wavelength of light emitted by LEE 210 and/or phosphor 230. In various embodiments, all or portions of surfaces 240 and/or 250 may have a reflectance to a wavelength of light emitted by LEE 210 and/or phosphor 230 greater than about 75%, greater than about 85%, greater than about 90%, or greater than about 95%. In various embodiments, all or portions of surfaces 240 and/or 250 may be coated with a material having a reflectance greater than about 75%, greater than about 85%, greater than about 90%, or greater than about 95% to a wavelength of light emitted by LEE 210 and/or phosphor 230. FIG. 30B shows an exemplary device of the present invention featuring a glass frame 3010 and a reflective layer 3020 covering substantially all of the bottom of glass frame 3010.

In various embodiments of the present invention, reflective layer 3020 may include or consist essentially of one or more metal layers, for example aluminum, silver, gold, chromium, titanium, or the like. In various embodiments of the present invention, reflective layer 3020 may include or consist essentially of one or more layers, for example including one or more dielectric and/or metallic layers. The specific layer structure of reflective layer 3020 is not a limitation of the present invention. In various embodiments of the present invention, the layers of reflective layer 3020 may include or consist essentially of a Bragg reflector. In various embodiments of the present invention, the reflecting surface may be a specular or diffuse reflecting surface. In various embodiments of the present invention, layer 3020 may include or be covered by a dielectric material such as silicon oxide, silicon nitride, titanium oxide, aluminum oxide, or a polymer. Said insulating layer may minimize or prevent the flow of electrical current from underlying conductive traces through layer 3020, resulting in a reduction or elimination in current flowing to LEE 210. While the discussion related to reflecting layer 3020 is directed to reflecting layer 3020 formed on all or a portion of surface 240, this is not a limitation of the present invention, and in other embodiments a reflecting layer may be formed on all or a portion of other surfaces, for example surface 250, surface 272 or a portion of the surface of phosphor 230.

In various embodiments of the present invention, the index of refraction of transparent frame 3010 may be the same or substantially the same as the index of refraction of the binder material in phosphor 230. In various embodiments, such index matching leads to substantial transmission of light emitted by LEE 210 and/or by phosphor 230 through transparent frame 3010, resulting in a structure having similar characteristics to a non-transparent frame with a very low (substantially zero) facet angle 279. As shown in FIG. 30B, light 3030 from LEE 210 may be transmitted through transparent frame 3010, in essence creating a frame die structure with a facet angle 279 close to zero (for example similar to that of FIG. 1M or FIG. 1N). In various embodiments, as discussed herein, very low facet angle 279 may result in improved angular spatial color uniformity. In various embodiments, very low facet angle 279 may result in higher light output power. In various embodiments, it may be relatively more straightforward to manufacture a high reflectance coating on surface 240, which is flat, than on surface 272, which is angled.

Figure 31A:
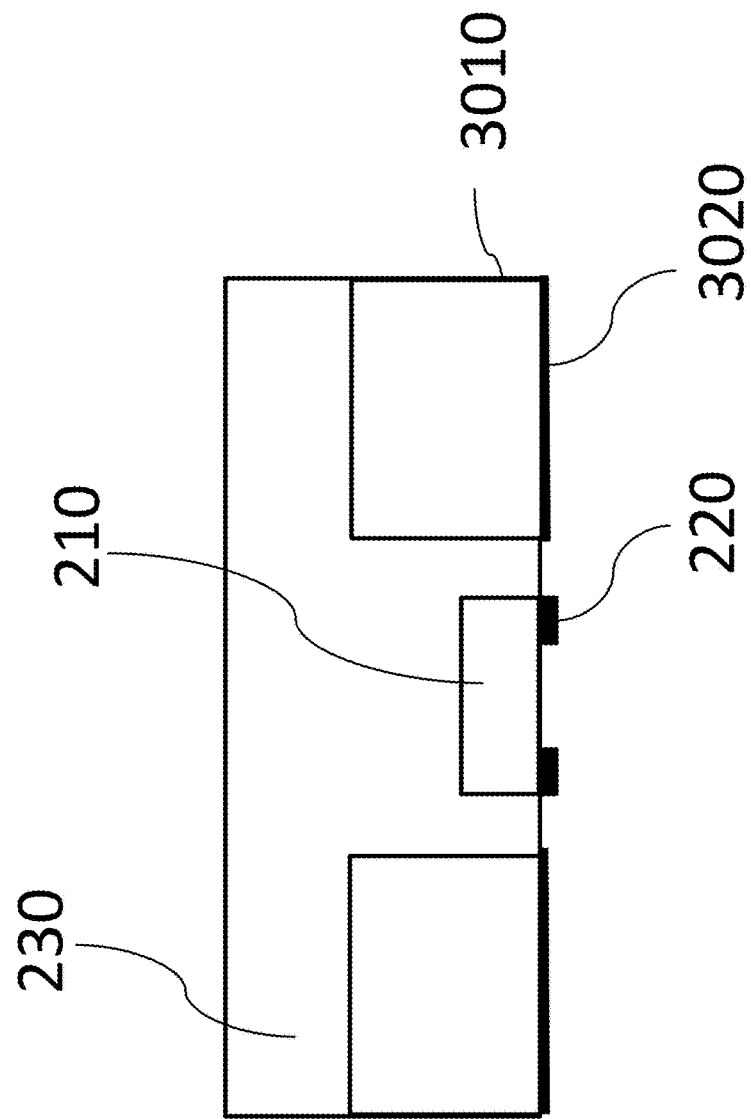
FIGS. 31A-31E are cross-sectional views of frame dies in accordance with various embodiments of the invention.

As discussed with respect to the structures of FIGS. 1A-1AA, the shape of a transparent frame may be engineered to achieve specific characteristics, for example high light output power and good angular spatial color uniformity. For example, in various embodiments in which the index of refraction of transparent frame is matched or substantially matched to that of phosphor 230, the specific shape of the frame is less critical and thus may be engineered for lower cost and/or easier manufacture. FIG. 31A shows an exemplary embodiment in which frame 3010 is essentially a rectangular solid with a through-hole for LEE 210.

Figure 31B:
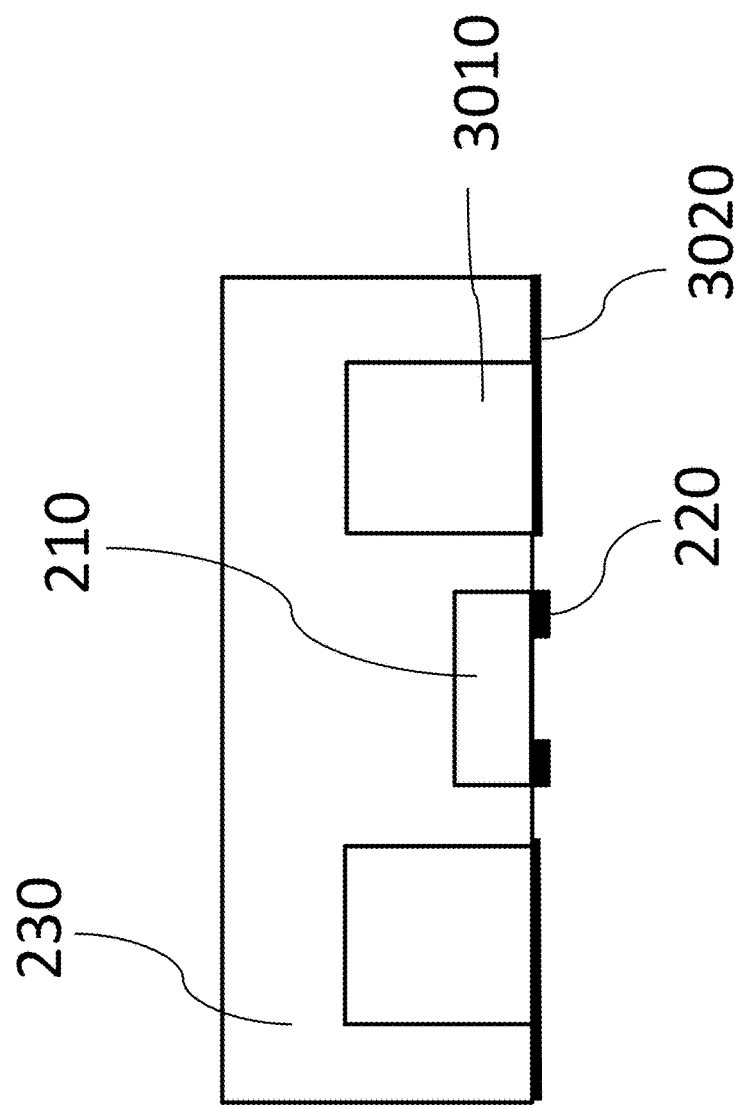
Figure 31C:
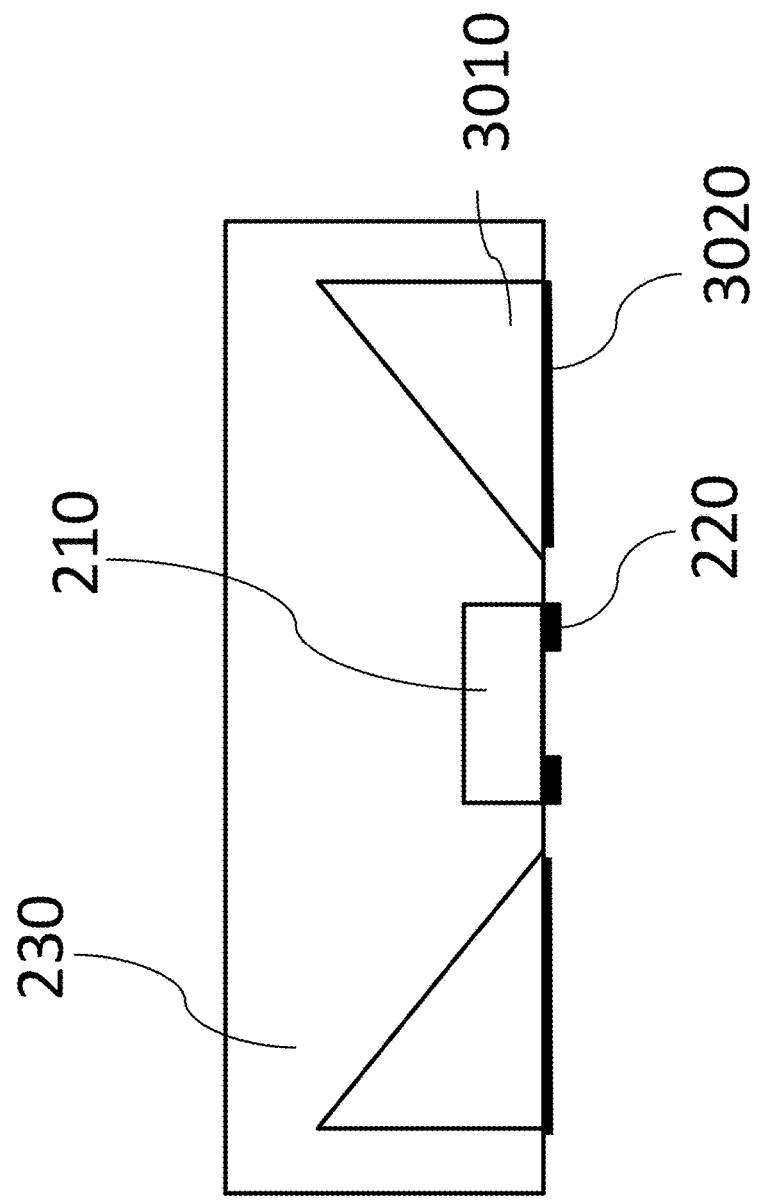
Figure 31D:
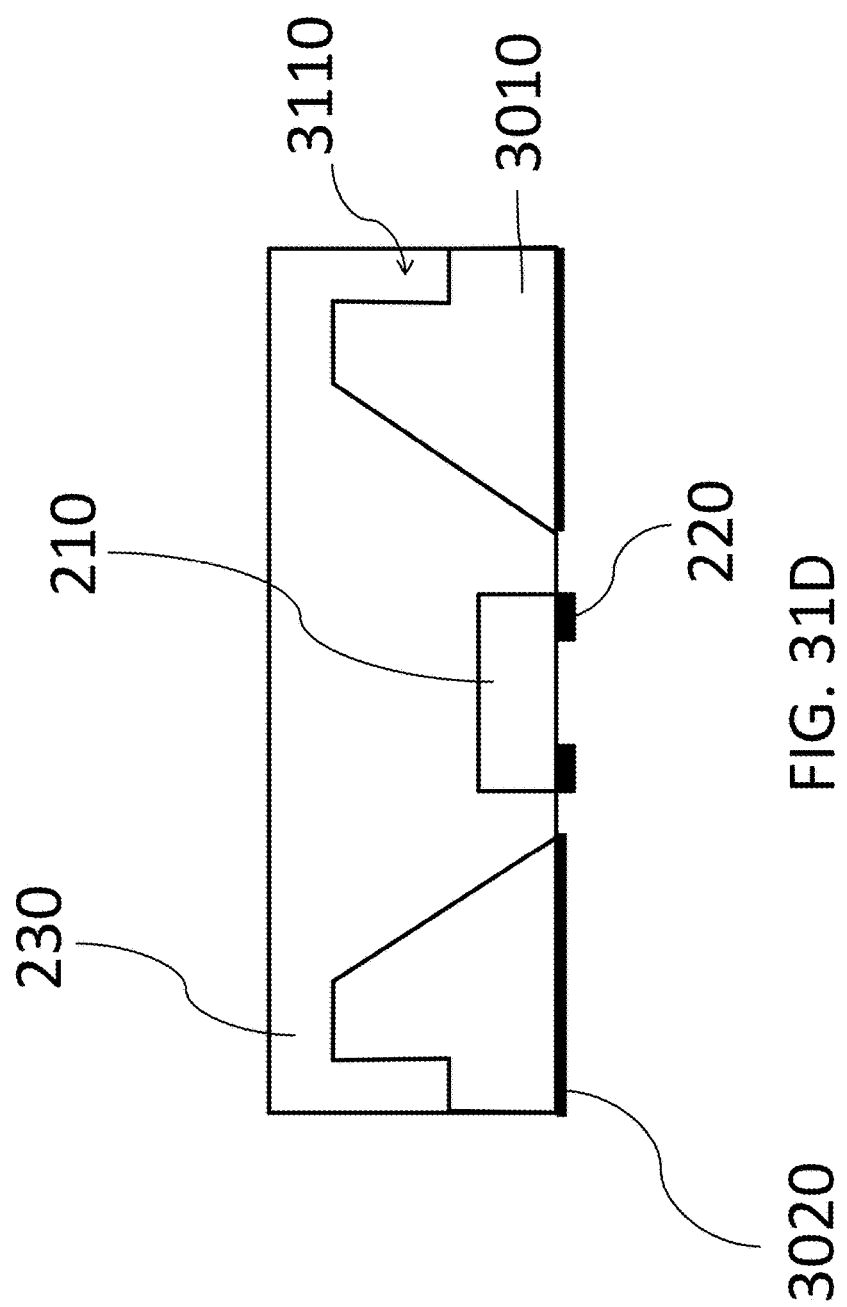
Figure 31E:
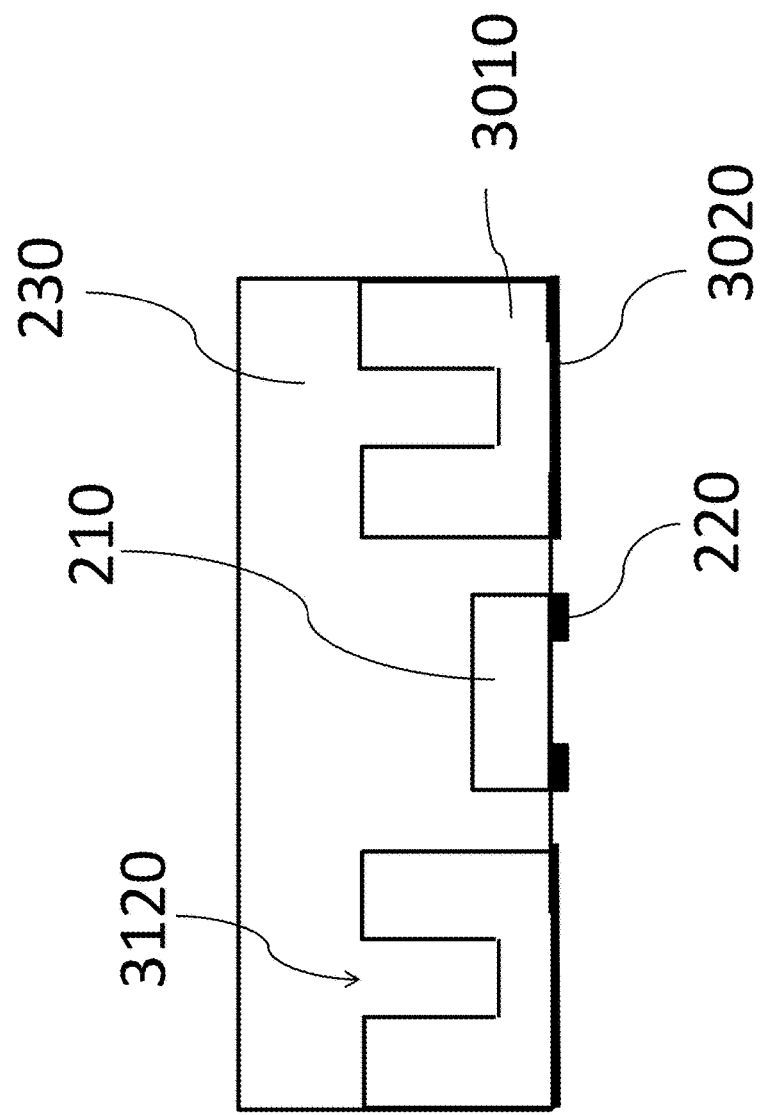
Figure 31F:
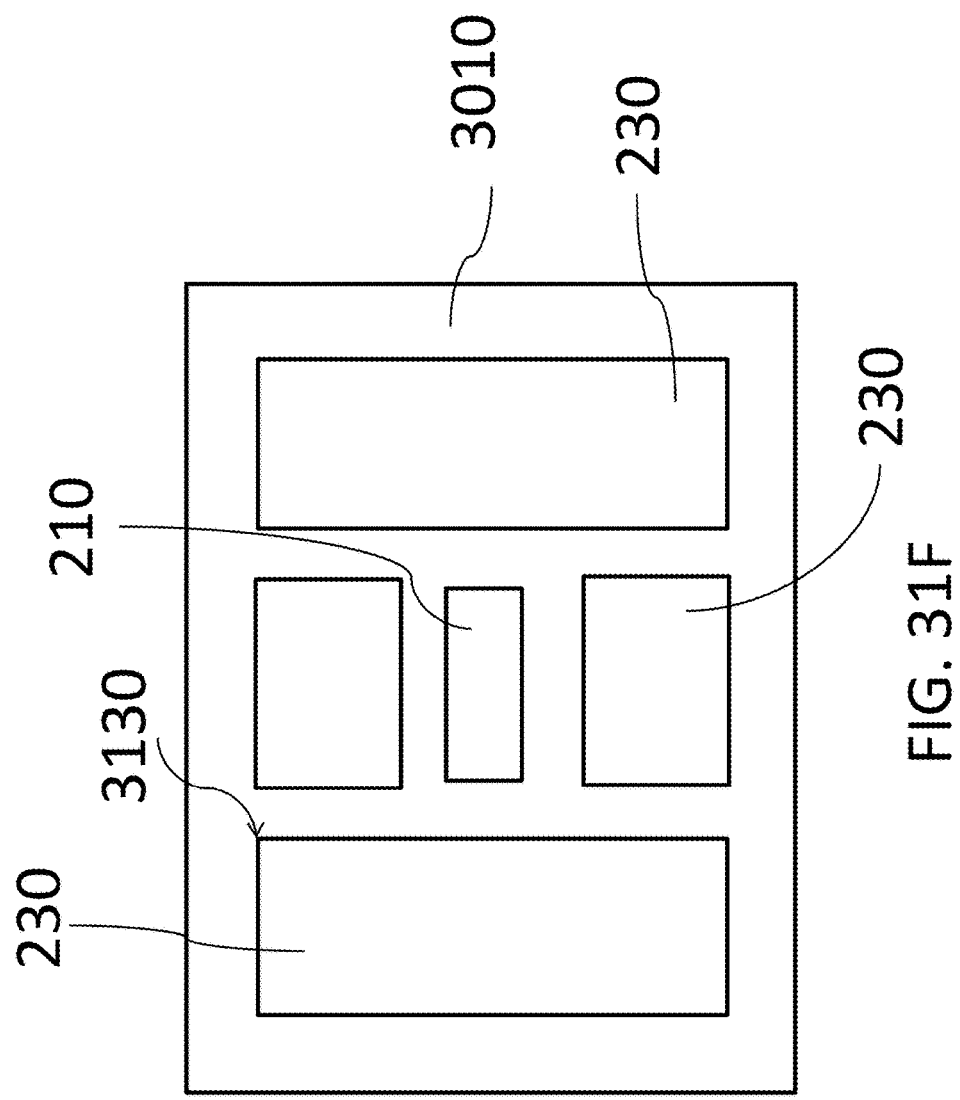

In various embodiments, phosphor may be formed on all or portions of the outside of transparent frame 3010, for example as shown in FIGS. 31B and 31C. In various embodiments of the structure shown in FIG. 31B, forming phosphor 230 on the outside of frame 3010 permits formation of a structure having phosphor 230 surrounding LEE 210, such that all or substantially all of the light emitted by LEE 210 is absorbed by phosphor 230 or exits the structure, without reflection from another surface, for example surface 272 of a non-transparent frame die. The structures of FIGS. 31B and 31C are enabled by, for example, the singulation of the frame wafer and then coating of phosphor over the cut edges. The structures of FIGS. 31D and 31E present exemplary structures to avoid a post-frame-wafer singulation step. These and similar structures incorporate recesses 3110 in the outer portion of the frame that are filled with phosphor 230 and/or grooves 3120 that are filled or partially filled with phosphor 230, both of which lead to more complete surrounding of LEE 210 by phosphor 230. FIGS. 31F and 31G show plan views of two exemplary structures in which the frame incorporates holes 3130 which penetrate completely through frame 3010, permitting formation of phosphor 230 down to the bottom of the structure, as compared to the structure of FIG. 31E in which phosphor 230 does not extend to the bottom of the structure, while maintaining a one-piece frame. The two embodiments shown in FIGS. 31F and 31G have different shapes and locations for grooves 3130. The shape and location of grooves 3130 or trenches 3120 are not limitations of the present invention.

Figure 31H:
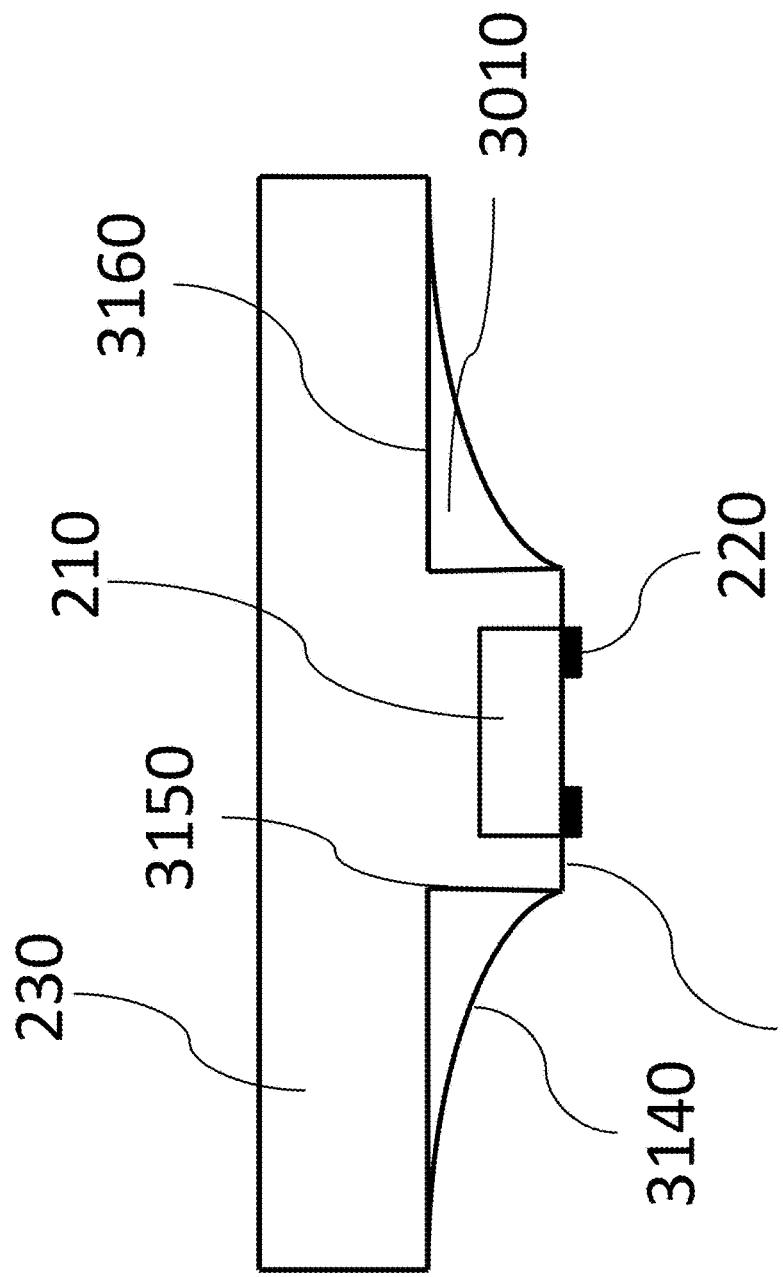
FIGS. 31H and 31I are cross-sectional views of frame dies in accordance with various embodiments of the invention.

In various embodiments, a transparent frame may be shaped to engineer specific optical characteristics, for example to control or engineer a specific spatial intensity or spatial color distribution. In various embodiments of the present invention, the shaped surfaces may be reflective, or coated with a reflective coating or may form all or portion of a total internal reflection (TIR) surface. A TIR surface is an interface between two materials having different indices of refraction, such that light is reflected at the interface, rather than being transmitted, when the light is incident at an angle greater than a critical angle determined mainly be the different indices of refraction of the two materials (for example, as may be determined by Snell's Law). FIG. 31H shows an exemplary embodiment of a structure including a TIR surface. TIR surface 3140 represents the boundary between frame 3010 and the surrounding medium, for example air. In various embodiments, the index of refraction of the surrounding medium is less than that of frame 3010, resulting in a critical angle above which light incident upon surface 3140 will be reflected (reflected internally in frame 3010). According to Snell's law, the critical angle is given by $\Theta_C = \arcsin(n_2/n_1)$ where n2 and n1 are the indices of refraction of the surrounding medium and of the frame material respectively. For example, frame material 3010 may have an index of refraction of about 1.5, resulting in a critical angle of about 41.8° (for the surrounding area being air with an index of refraction of about 1.0). In various embodiments, the shape (e.g., curvature) of surface 3140 is engineered to totally internally reflect light emitted from LEE 210 over a particular or substantial range of emission angles (and thus angles incident upon surface 3140). In various embodiments, frame 3010 and phosphor 230 have the same or substantially the same index of refraction, and thus the direction of light incident upon the boundary between frame 3010 and phosphor 230 is substantially unchanged (i.e., there is little if any reflection or refraction of light at the boundary between frame 3010 and phosphor 230). In various embodiments, surface 240 may be reflective or coated with a coating reflective to a wavelength of light emitted by LEE 210 and/or phosphor 230. In various embodiments, light from 210 and/or phosphor 230 is transmitted through transparent frame die 3010 and reflected off of TIR surface 3140 and optionally reflective surface 240. By shaping the TIR surface, the spatial intensity distribution of the structure may be engineered to have a specific distribution. Additionally, the inner sidewalls 3150 and/or top surface 3160 of frame 3010 may be reflective or partially reflective or may be coated with a material having a reflectance to a wavelength of light emitted by LEE 210 and/or phosphor 230.

Figure 31I:
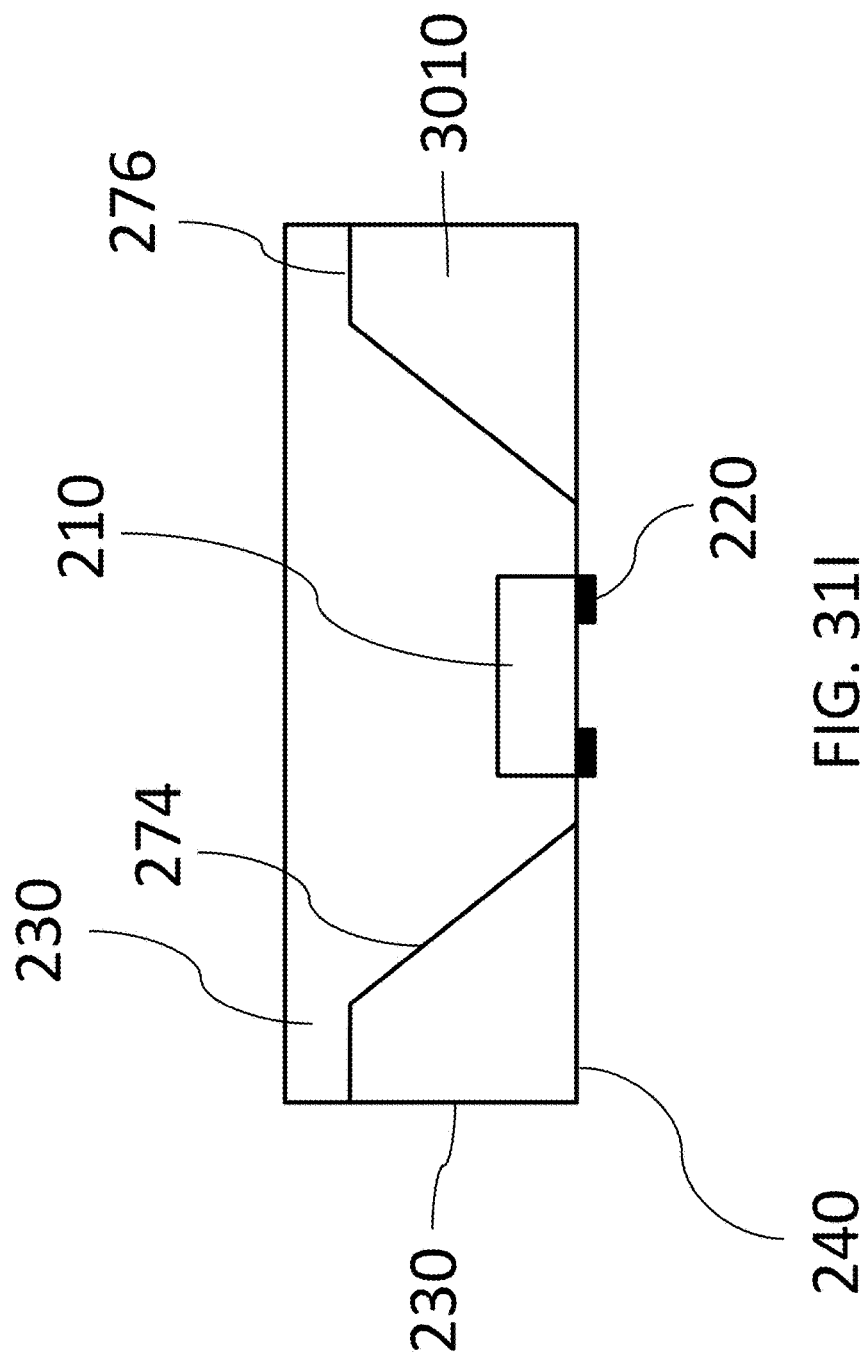

In various embodiments of the present invention, a reflective coating may be formed on all or portions of one or more faces of the transparent frame, for example faces 230, 276, 274, and 240 as shown in FIG. 31I. In various embodiments, as discussed herein, the characteristics, for example spectral regions of relatively high reflectance or angular regions of incidence, of the reflective coatings may be optimized to achieve specific frame die optical characteristics, for example light output power and spatial color uniformity.

In various embodiments of the present invention, various portions of a transparent frame may have different optical characteristics, for example to engineer a specific spatial color or intensity distribution or to improve the spatial color uniformity. For example, in various embodiments, various portions of a transparent frame may absorb or partially absorb one or more portions of the spectrum of light emitted by LEE 210 and/or phosphor 230. In various embodiments, various portions of a transparent frame may include scattering features, for example to scatter light emitted by LEE 210 and/or phosphor 230, for example isotropically or in one or more particular directions. In various embodiments, scattering features may include particles within the transparent frame, voids within the transparent frame, modifications to the surface of the transparent frame, for example indentations, protrusions or other surface features, or features formed or printed on the surface of the transparent frame.

As discussed herein, in some embodiments all or a portion of the surface of phosphor 230 may be roughened or textured, for example to reduce TIR and increase the light output or to increase adhesion between phosphor 230 and an adjacent material, for example to increase adhesion to an adjacent optic. In some embodiments, roughening or texturing may take place during the molding process. In some embodiments, all or a portion of the mold substrate surface in contact with the uncured phosphor may be roughened or textured to impart such roughened or textured features to cured phosphor 230. In some embodiments, such roughening or texturing may be accomplished after molding, for example by ablation, laser ablation, etching or chemical ablation, imprinting, indenting or the like. The method of roughening or texturing is not a limitation of the present invention.

In one embodiment, the textured features may have a size in the range of about 0.1 µm to about 50 µm and more preferably in the range of about 0.5 µm to about 25 µm. In one embodiment, the texture may be hemispherical or pyramidal in shape; however, this is not a limitation of the present invention, and in other embodiments the texture may have any shape. In one embodiment, the texture includes or consists essentially of a regular or substantially regular pattern, while in other embodiments the texture includes or consists essentially of random or substantially random features. In some embodiments, the scale of the texture is advantageously less than about 10% of the height of LEE 210, or less than 5% of the height of LEE 210 or less than 2% of the height of LEE 210, in order to reduce occlusion or absorption of light emitted by LEE 210.

In various embodiments frame dies may include a portion of the phosphor having a texture, or a portion of the phosphor covered or overlaid with a reflecting layer, or both. In some embodiments, the reflecting layer itself may be textured, while in other embodiments the texture is separate from the reflecting layer.

While the discussion herein mainly focuses on down-conversion, that is the use of a wavelength-conversion material or phosphor to shift a short wavelength to a longer wavelength, that is not a limitation of the present invention and in other embodiments up-conversion or a combination of up-conversion and down-conversion may be used.

Other embodiments of this invention may have additional or fewer steps or components or may be modified or carried out in a different order. In general in the above discussion the arrays of light emitters, wells, optics and the like have been shown as square or rectangular arrays; however, this is not a limitation of the present invention and in other embodiments these elements are formed in other types of arrays, for example hexagonal, triangular or any arbitrary array. In some embodiments, these elements are grouped into different types of arrays on a single substrate.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. An electronic device comprising:
   a polymeric binder;
   suspended within the polymeric binder, a semiconductor die having (i) a first face, (ii) a second face opposite the first face, and (iii) at least one sidewall spanning the first and second faces, the semiconductor die being a bare-die light-detecting element comprising at least one semiconductor layer configured to absorb light over a detected wavelength range and produce electrical charge therefrom;
   disposed on the first face of the semiconductor die, at least two spaced-apart contacts each (i) having a free terminal end not covered by the polymeric binder, and (ii) being available for electrical connection; and
   a frame (i) having a bottom surface, (ii) having a top surface opposite the bottom surface, (iii) having a thickness spanning the top and bottom surfaces, and (iv) defining an aperture (a) extending fully through the thickness and (b) having a sidewall, the top surface of the frame surrounding the aperture,
   wherein at least a portion of the polymeric binder is transparent to a wavelength of light within the detected wavelength range and the semiconductor die is disposed within the aperture of the frame such that (i) the second face of the semiconductor die is opposite the bottom surface of the frame, (ii) the sidewall of the aperture redirects light toward the semiconductor die, and (iii) the free terminal ends of the contacts of the semiconductor die are (a) not covered by the polymeric binder and (b) available for electrical connection.

2. The electronic device of claim 1, wherein the polymeric binder contains therein a wavelength-conversion material for absorption of at least a portion of light incident on the electronic device and emission of converted light having a different wavelength.

3. The electronic device of claim 1, wherein the polymeric binder comprises therein an absorbing material for absorption of at least a portion of the spectrum of light incident upon the electronic device.

4. The electronic device of claim 1, wherein the semiconductor die comprises at least one of a bare-die photovoltaic cell, a bare-die infrared detector, a bare-die ultraviolet detector, a bare-die visible light detector, or a bare-die x-ray detector.

5. The electronic device of claim 1, wherein the sidewall of the aperture is not perpendicular to the bottom surface of the frame.

6. The electronic device of claim 1, wherein at least portions of the contacts protrude from the polymeric binder.

7. The electronic device of claim 1, wherein the polymeric binder comprises at least one of silicone or epoxy.

8. The electronic device of claim 1, further comprising an optical element positioned to couple light to the semiconductor die.

9. The electronic device of claim 1, further comprising a first conductive pad electrically coupled to one of the two spaced-apart contacts and disposed over at least a portion of the bottom surface of the frame.

10. The electronic device of claim 1, further comprising at least one of an active or passive electronic component disposed over or on the bottom surface of the frame.

11. The electronic device of claim 1, wherein the frame comprises a semiconductor material, and at least one of an active or a passive electronic component is formed within or on the semiconductor material.

12. The electronic device of claim 1, wherein the frame comprises at least one of a semiconductor, a plastic, a polymer, a glass, a ceramic, or a metal.

13. The electronic device of claim 1, wherein the frame is substantially transparent to a wavelength of light within the detected wavelength range.

14. The electronic device of claim 2, wherein substantially all of the light absorbed by the light-detecting element is converted light.

15. The electronic device of claim 2, wherein the different wavelength of the converted light is within the detected wavelength range.

16. The electronic device of claim 2, wherein the wavelength-conversion material comprises at least one of a phosphor or quantum dots.

17. The electronic device of claim 2, wherein the polymeric binder comprises a plurality of discrete regions, at least one of which comprises the polymeric binder without wavelength-conversion material therein.

18. The electronic device of claim 2, wherein at least a portion of the sidewall of the aperture is reflective to a wavelength of light within the detected wavelength range and/or light emitted by the wavelength-conversion material.

19. The electronic device of claim 18, wherein the at least a portion of the sidewall of the aperture is coated with a reflective coating that is reflective to a wavelength of light within the detected wavelength range and/or light emitted by the wavelength-conversion material.

20. The electronic device of claim 9, further comprising a second conductive pad (i) electrically coupled to the other of the two spaced-apart contacts, (ii) electrically insulated from the first conductive pad, and (iii) disposed over at least a portion of the bottom surface of the frame.

\* \* \* \* \*